(12) United States Patent
Huang et al.

(10) Patent No.: US 12,640,755 B2
(45) Date of Patent: May 26, 2026

(54) DATA PROCESSING METHOD AND DATA PROCESSING APPARATUS

(71) Applicant: HUAWEI TECHNOLOGIES CO., LTD., Guangdong (CN)

(72) Inventors: Kechao Huang, Shenzhen (CN); Xiaoling Yang, Shenzhen (CN); Huixiao Ma, Shenzhen (CN); Wai Kong Raymond Leung, Shenzhen (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 18/783,939

(22) Filed: Jul. 25, 2024

(65) Prior Publication Data

US 2024/0388313 A1 Nov. 21, 2024

Related U.S. Application Data

(63) Continuation of application No. PCT/CN2023/072099, filed on Jan. 13, 2023.

(30) Foreign Application Priority Data

Jan. 28, 2022 (CN) ......................... 202210109956.X
Mar. 23, 2022 (CN) ......................... 202210290887.7
(Continued)

(51) Int. Cl.
*H03M 13/00* (2006.01)
*H03M 13/07* (2006.01)
*H03M 13/27* (2006.01)

(52) U.S. Cl.
CPC ....... *H03M 13/2732* (2013.01); *H03M 13/07* (2013.01)

(58) Field of Classification Search
CPC .. H03M 13/2732; H03M 13/07; H03M 13/23; H03M 13/05; H03M 13/251; H03M 13/27; H03M 13/271
See application file for complete search history.

(56) References Cited

U.S. PATENT DOCUMENTS 7,826,556 B2 * 11/2010 Ghosh ................... H04L 1/0071
375/299
8,189,627 B2 * 5/2012 Xia ......................... H04L 1/007
714/756
(Continued)

FOREIGN PATENT DOCUMENTS

CN 1559115 A 12/2004
CN 101517902 A 8/2009
(Continued)

OTHER PUBLICATIONS

Yang Ying et al:"Performance Evaluation of Time Interleaving with Inter-frame Convolutional Interleaving and Intra- frame Block Interleaving Cascade", vol. 26 No. 1, Feb. 2014, (Feb. 15, 2014), total 12 pages.
(Continued)

*Primary Examiner* — Esaw T Abraham
(74) *Attorney, Agent, or Firm* — WOMBLE BOND DICKINSON (US) LLP

(57) ABSTRACT

A data processing method includes the following operations: separately performing convolutional interleaving on n lane data streams to obtain n first data streams, where n>1, and first FEC encoding is performed on all the n lane data streams. Every a codewords obtained through the first FEC encoding are distributed in b lane data streams, where a≤b≤n, and a≥1. z consecutive symbols in each of the first data streams are from z different codewords, and z>1. Then, every K first data streams of the n first data streams are multiplexed to obtain one second data stream, so as to obtain (Continued)

a total of m second data streams. The n first data streams include G first data stream subsets, symbols in different first data stream subsets are from different codewords, m=n/K, K>1, and G>1. y consecutive symbols in each second data stream are from y different codewords, where y>z.

37 Claims, 61 Drawing Sheets

(30) Foreign Application Priority Data

| Sep. 1, 2022 | (CN) | .......................... | 202211065772.4 |
| Oct. 24, 2022 | (CN) | .......................... | 202211305113.3 |
| Nov. 18, 2022 | (CN) | .......................... | 202211448533.7 |

(56) References Cited

U.S. PATENT DOCUMENTS

| 8,243,841 B2 * | 8/2012 | Wang | ..................... H04L 1/007 |
| | | | 375/267 |
| 9,473,174 B2 * | 10/2016 | Hellge | .................. H03M 13/27 |
| 10,084,483 B2 * | 9/2018 | Hassan | ................ H04L 1/0018 |
| 10,715,859 B2 * | 7/2020 | Kwak | .................... H04N 5/445 |
| 11,557,391 B2 * | 1/2023 | Wu | ..................... G06F 18/2193 |
| 11,722,154 B2 * | 8/2023 | Grayver | ............. G06F 12/0813 |
| | | | 711/157 |
| 12,101,186 B2 * | 9/2024 | Riani | ................... H04L 1/0046 |
| 2002/0194570 A1 | 12/2002 | Birru et al. | |
| 2010/0235706 A1 | 9/2010 | Eberlein et al. | |
| 2016/0344417 A1 | 11/2016 | Jeong et al. | |
| 2019/0068322 A1 | 2/2019 | Smith et al. | |
| 2021/0288672 A1 | 9/2021 | Smith et al. | |

FOREIGN PATENT DOCUMENTS

| CN | 101779453 | A | 7/2010 |
| CN | 106464271 | A | 2/2017 |
| CN | 107005353 | A | 8/2017 |
| CN | 110730010 | A | 1/2020 |
| CN | 113132058 | A | 7/2021 |
| CN | 118368025 | A | 7/2024 |
| WO | 2021197104 | A1 | 10/2021 |

OTHER PUBLICATIONS

Alireza Kenarsari-Anhari et al:"New Designs for Bit-Interleaved Coded Modulation with Hard-Decision Feedback Iterative Decoding",IEEE Transactions on Communications, vol. 58, No. 6, Jun. 2010, total 5 pages.
800G-FR4 Technical Specification V1.0, 800G Pluggable MSA, https://www.800gmsa.com/documents/800g-fr4-2km-specification-v10, Jun. 8, 2021, total 17 pages.
800G Specification, ethernet technology consortium, https://ethernettechnologyconsortium.org/wp-content/uploads/2020/03/800G-Specification_r1.0.pdf, Mar. 10, 2020, total 17 pages.
Implementation Agreement 400ZR, OIF-400ZR-01.0, Mar. 10, 2020, total 100 pages.
Kishore Kota et al, Further considerations for 800LR Campus link specifications, oif2021.242.01, Q2 2021 meeting, May 2021, total 20 pages.
Taokai et al, FPGA Evaluation of 800G LR FEC Scheme, oif2021.415.00, Jul. 26, 2021, total 5 pages.
Kishore Kota et al, 800LR Specification Methodology Proposal, oif2021.502.00, Sep. 8, 2021, total 13 pages.
IEEE P802.3ck/D3.0, Draft Standard for Ethernet Amendment: Physical Layer Specifications and Management parameters for 100Gb/s, 200Gb/s, and 400Gb/s Electrical Interfaces Based on 100Gb/s Signaling, IEEE Computer Society, dated Dec. 10, 2021, total 323 pages.

* cited by examiner

Separately perform convolutional interleaving on n lane data streams to obtain n first data streams — 1001

Multiplex every K first data streams of the n first data streams to obtain one second data stream, so as to obtain a total of m second data streams — 1002

Separately perform second FEC encoding on the m second data streams to obtain encoded data streams — 1003

FIG. 10

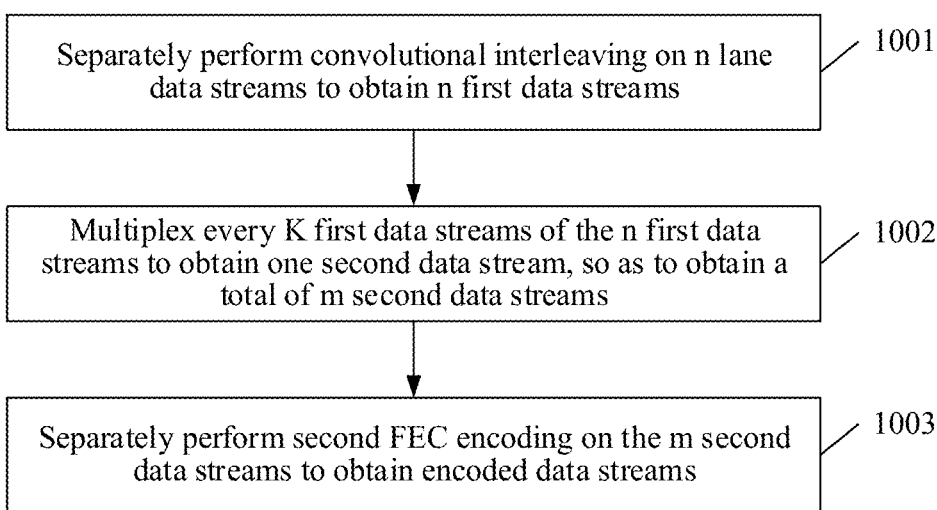

Lane data stream 0 → Convolution interleaver 0 → First data stream 0

Lane data stream 1 → Convolution interleaver 1 → First data stream 1

...    ...    ...

Lane data stream (n–1) → Convolution interleaver (n–1) → First data stream (n–1)

Convolutional interleaving

Block interleaving

S

First symbol matrix: KxB

Second symbol matrix: SxF

AM alignment

400GbE
16 PCS lane
data streams

AM 0

AM 0

Integer number
of RS symbols

400GbE
16 PCS lane
data streams

AM 0

AM 0

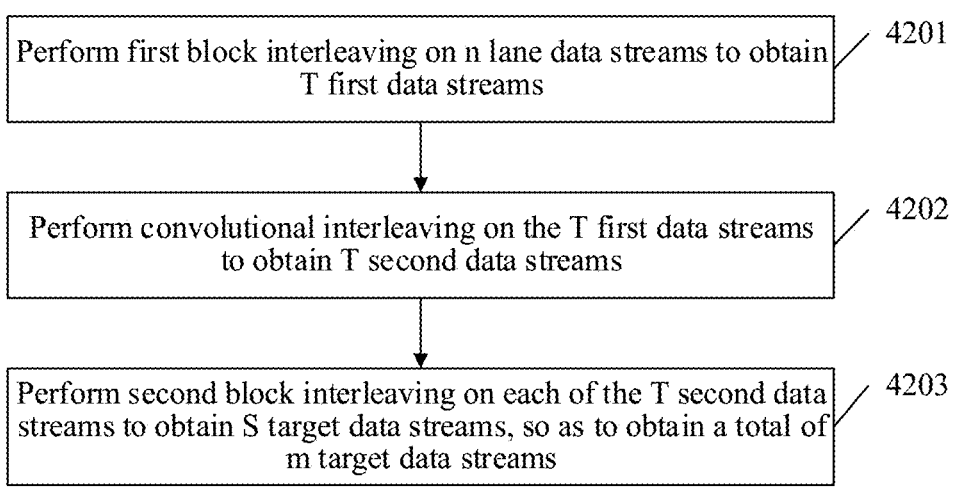

Perform first block interleaving on n lane data streams to obtain T first data streams — 4201

Perform convolutional interleaving on the T first data streams to obtain T second data streams — 4202

Perform second block interleaving on each of the T second data streams to obtain S target data streams, so as to obtain a total of m target data streams — 4203

FIG. 42

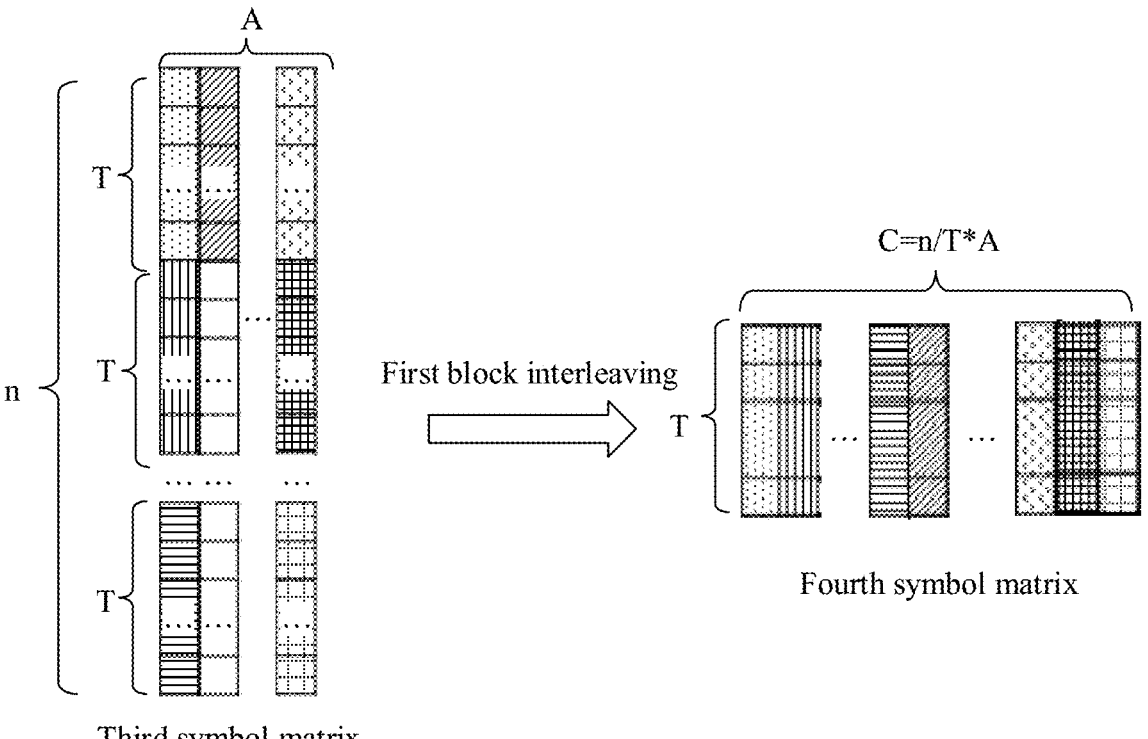

Third symbol matrix

First block interleaving $C=n/T*A$

Fourth symbol matrix

One symbol

Block interleaving

Five bits a=2 symbols d=2 symbols (b)

One symbol

Block interleaving

Five bits a=2 symbols d=2 symbols

Lane data stream 2*i $C_{2i}^0, C_{2i}^1,..., C_{2i}^{g'},...$

Lane data stream (2*i+1)

$C_{2i+1}^0, C_{2i+1}^1,..., C_{2i+1}^{g'},...$

2:1 multiplexing i $C_{2i}^0, C_{2i+1}^0, C_{2i}^1, C_{2i+1}^1,..., C_{2i}^{g'}, C_{2i+1}^{g'},...,$ First data stream i Lane data stream i Lane data stream (i+16)

Block interleaving i

First data stream i

Lane data stream i

Lane data stream (i+16)

Block interleaving i

First data stream 2*i

First data stream (2*i+1)

Lane data stream i    $C_i^0, C_i^1,..., C_i^{W},...$

Lane data stream (i+16)    $C_{i+16}^0, C_{i+16}^1,..., C_{i+16}^{W},...$

2:1 multiplexing i $C_i^0, C_{i+16}^0, C_i^1, C_{i+16}^1,..., C_i^{W}, C_{i+16}^{W},...,$ First data stream i Lane data stream 2*i Lane data stream (2*i+1)

Lane data stream (2*i+16)

Lane data stream (2*i+17)

Block interleaving i

First data stream i

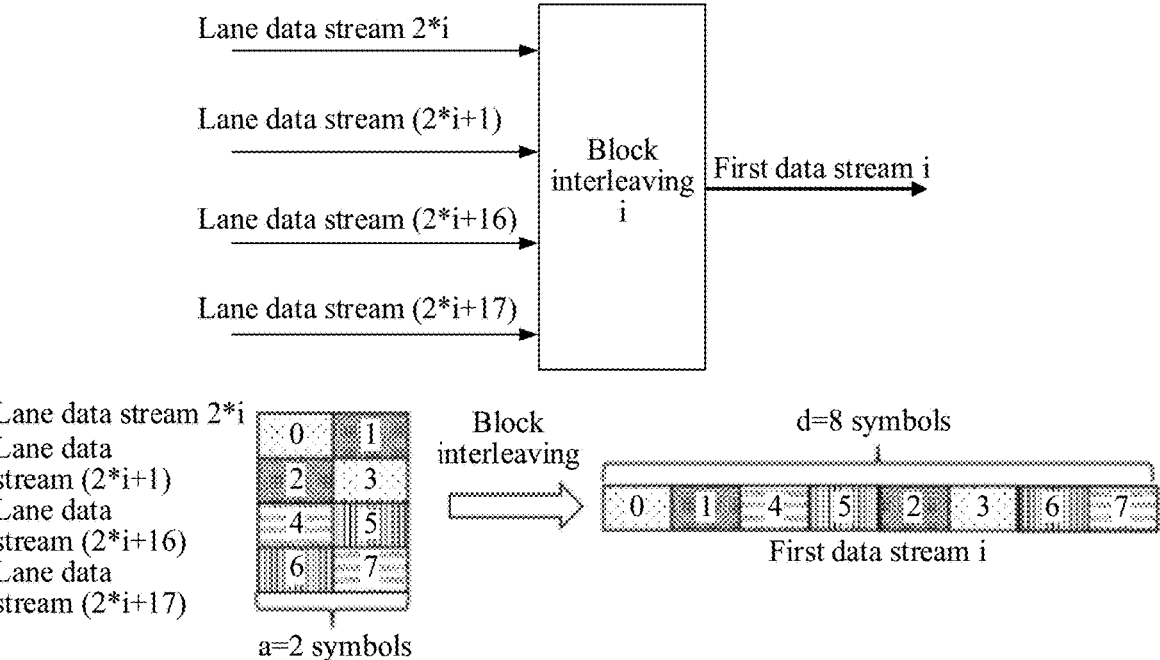

Lane data stream 2*i
Lane data stream (2*i+1)
Lane data stream (2*i+16)
Lane data stream (2*i+17)

| 0 | 1 |
| 2 | 3 |
| 4 | 5 |
| 6 | 7 | a=2 symbols

Block interleaving d=8 symbols

| 0 | 1 | 4 | 5 | 2 | 3 | 6 | 7 |

First data stream i

FIG. 61

Lane data stream 2*i    $C^0_{2*i}, C^1_{2*i}, ..., C^j_{2*i}, ...$

Lane data stream (2*i+16)    $C^0_{2*i+16}, C^1_{2*i+16}, ..., C^j_{2*i+16}, ...$ Lane data stream (2*i+1)    $C^0_{2*i+1}, C^1_{2*i+1}, ..., C^j_{2*i+1}, ...$ Lane data stream (2*i+17)    $C^0_{2*i+17}, C^1_{2*i+17}, ..., C^j_{2*i+17}, ...$ Multiplexing i First data stream i $..., C^j_{2*i}, C^j_{2*i+16}, C^1_{2*i+1}, C^j_{2*i+17}, ...$

FIG. 62

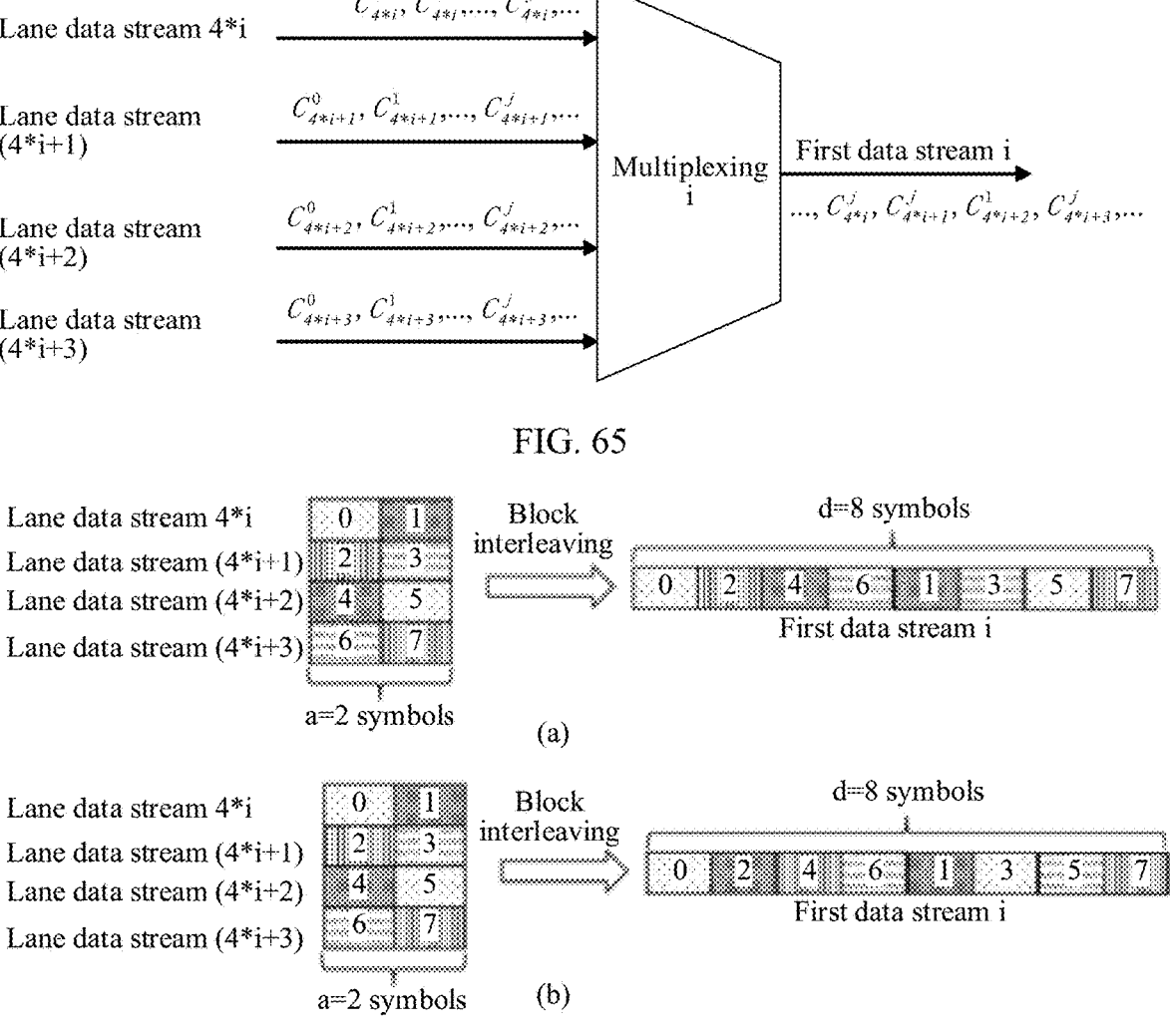

Lane data stream 4*i    $C^0_{4*i}, C^1_{4*i}, ..., C^j_{4*i}, ...$

Lane data stream (4*i+1)    $C^0_{4*i+1}, C^1_{4*i+1}, ..., C^j_{4*i+1}, ...$

Lane data stream (4*i+2)    $C^0_{4*i+2}, C^1_{4*i+2}, ..., C^j_{4*i+2}, ...$

Lane data stream (4*i+3)    $C^0_{4*i+3}, C^1_{4*i+3}, ..., C^j_{4*i+3}, ...$

Multiplexing i

First data stream i    $..., C^j_{4*i}, C^j_{4*i+1}, C^1_{4*i+2}, C^j_{4*i+3}, ...$

FIG. 65

Lane data stream 4*i
Lane data stream (4*i+1)
Lane data stream (4*i+2)
Lane data stream (4*i+3)

a=2 symbols

Block interleaving d=8 symbols

First data stream i (a)

Lane data stream 4*i
Lane data stream (4*i+1)
Lane data stream (4*i+2)
Lane data stream (4*i+3)

a=2 symbols

Block interleaving d=8 symbols

First data stream i (b)

FIG. 66

First data
stream 0 → Convolutional
interleaving 0 → Second data
stream 0 →

First data
stream 1 → Convolutional
interleaving 1 → Second data
stream 1 →

First data
stream 2 → Convolutional
interleaving 2 → Second data
stream 2 →

...          ...          ...

First data
stream (m–1) → Convolutional
interleaving (m–1) → Second data
stream (m–1) →

FIG. 73

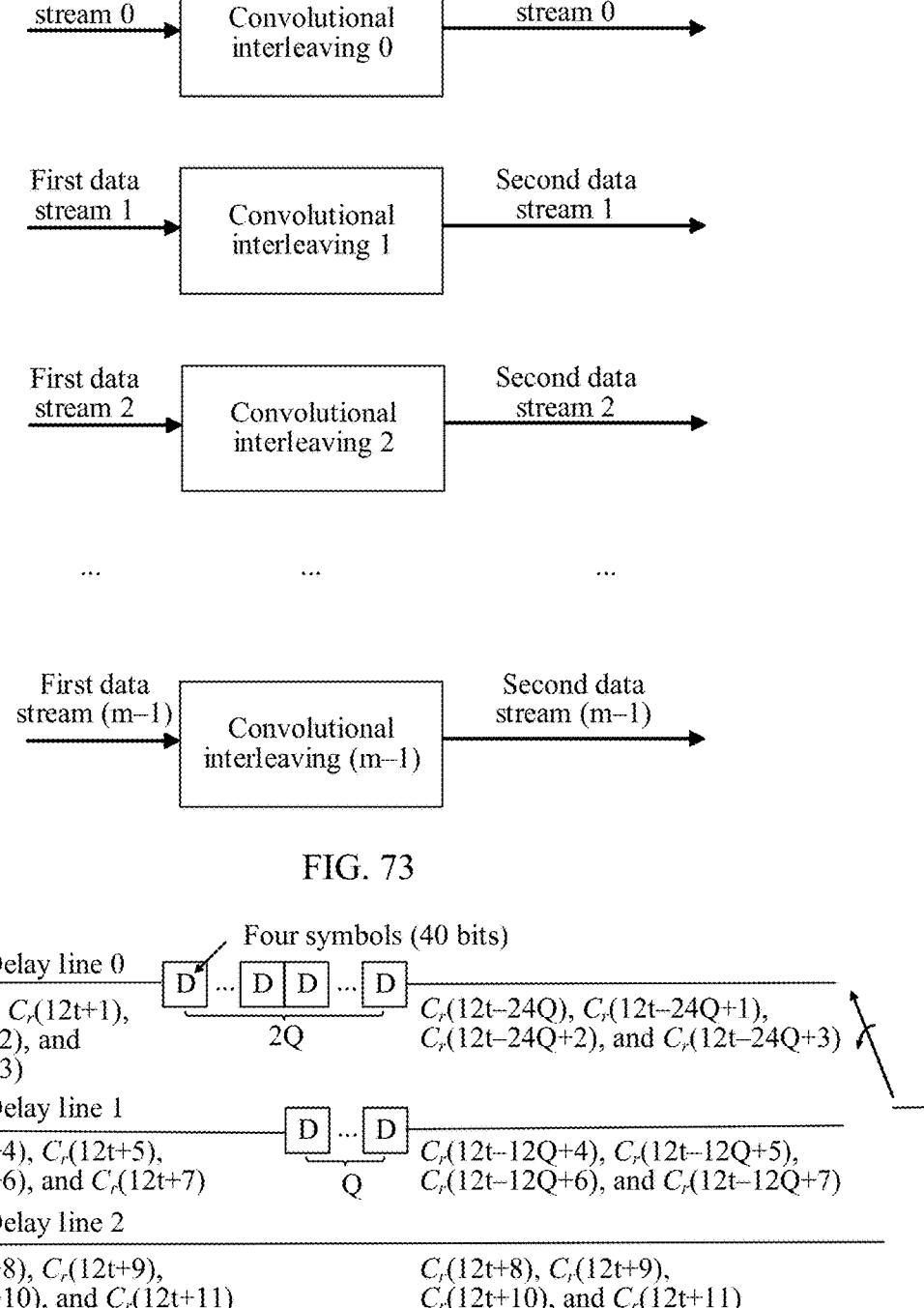

Four symbols (40 bits)

Delay line 0

$C_r(12t)$, $C_r(12t+1)$,
$C_r(12t+2)$, and
$C_r(12t+3)$

2Q $C_r(12t-24Q)$, $C_r(12t-24Q+1)$,
$C_r(12t-24Q+2)$, and $C_r(12t-24Q+3)$

Delay line 1

$C_r(12t+4)$, $C_r(12t+5)$,
$C_r(12t+6)$, and $C_r(12t+7)$

Q $C_r(12t-12Q+4)$, $C_r(12t-12Q+5)$,
$C_r(12t-12Q+6)$, and $C_r(12t-12Q+7)$

Delay line 2

$C_r(12t+8)$, $C_r(12t+9)$,
$C_r(12t+10)$, and $C_r(12t+11)$ $C_r(12t+8)$, $C_r(12t+9)$,
$C_r(12t+10)$, and $C_r(12t+11)$

FIG. 74

DATA PROCESSING METHOD AND DATA PROCESSING APPARATUS

CROSS-REFERENCE TO RELATED APPLICATIONS

This application is a continuation of International Application No. PCT/CN2023/072099, filed on Jan. 13, 2023, which claims priorities to Chinese Patent Application No. 202210109956.X, filed on Jan. 28, 2022 and Chinese Patent Application No. 202210290887.7, filed on Mar. 23, 2022 and Chinese Patent Application No. 202211065772.4, filed on Sep. 1, 2022 and Chinese Patent Application No. 202211305113.3, filed on Oct. 24, 2022 and Chinese Patent Application No. 202211448533.7, filed on Nov. 18, 2022. All of the aforementioned patent applications are hereby incorporated by reference in their entireties.

TECHNICAL FIELD

This application relates to the communication field, and in particular, to a data processing method and a data processing apparatus.

BACKGROUND

With the continuous promotion of 5G, cloud computing, big data, artificial intelligence, and the like, an optical communication system and an optical transport network (OTN) are evolving in the direction that features a large capacity and an ultra-high speed. Forward error correction (FEC) encoding is used to correct transmitted data, and resolve transmission bit errors to restore, from received data, original data sent by a transmitter.

Currently, a concatenated FEC transmission solution is proposed. In the solution, a transmitter device is connected to a transmitter processing module through an attachment unit interface (AUI). The transmitter device performs first FEC encoding on to-be-transmitted data, and sends data obtained through the first FEC encoding to the transmitter processing module. The transmitter processing module performs second FEC encoding on the data obtained through the first FEC encoding, and transmits, through a channel to a data receiver, data obtained through the second FEC encoding. Specifically, the transmitter processing module receives a plurality of data streams, first separately performs convolutional interleaving on the plurality of data streams, and then performs the second FEC encoding on each data stream obtained through the convolutional interleaving. It should be understood that, to improve performance, one data stream participating in the second FEC encoding is to be from a plurality of codewords obtained through the first FEC encoding. However, this needs to be implemented by using convolutional interleaving with a long latency, but application effects are not ideal in scenarios requiring a low latency.

SUMMARY

Embodiments of this application provide a data processing method and a data processing apparatus. Better performance of a concatenated FEC solution can be obtained in a scenario with a low latency.

According to a first aspect, this application provides a data processing method. The method includes the following blocks. First, convolutional interleaving is separately performed on n lane data streams to obtain n first data streams, where n is an integer greater than 1, and first FEC encoding is performed on all the n lane data streams. Every a codewords obtained through the first FEC encoding are distributed in b lane data streams, where $a \leq b \leq n$, n can be exactly divided by b, and a is an integer greater than or equal to 1. z consecutive symbols in each of the first data streams are from z different codewords, and z is an integer greater than 1. Then, every K first data streams of the n first data streams are multiplexed to obtain one second data stream, so as to obtain a total of m second data streams. The n first data streams include G first data stream subsets, symbols in different first data stream subsets are from different codewords, m=n/K, K is an integer greater than 1, and G is an integer greater than 1. y consecutive symbols in each second data stream are from y different codewords, where y>z. If $K \leq G$, the K first data streams are respectively from K first data stream subsets. If K>G, the K first data streams include K/G first data streams that are in each first data stream subset.

In this embodiment, all the n lane data streams are outer-code encoded codeword streams. Convolutional interleaving is separately performed on the n data streams, data stream multiplexing is performed on n data streams obtained through the convolutional interleaving, to obtain m second data streams, and then inner-code encoding is performed. According to the data interleaving and multiplexing processing solution provided in this application, the following case can be implemented with a short latency: A plurality of symbols consecutively output from m multiplexed data streams are from a plurality of different outer-code codewords, so that a concatenated FEC solution helps reduce the data interleaving latency while ensuring good performance. In other words, in this application, the solution of the combination of convolutional interleaving and data multiplexing can reduce the overall latency of the concatenated FEC solution, and is more applicable to scenarios requiring a low latency.

In some embodiments, performing convolutional interleaving on one lane data stream to obtain one first data stream includes: delaying one lane data stream based on p delay lines to obtain one first data stream, where p is an integer greater than 1, and a quantity of storage units included in each delay line is different. A delay line with a smallest quantity of storage units includes 0 storage units, a difference between quantities of storage units of every two adjacent delay lines is Q, each storage unit is configured to store d symbols, and z=p*d. Symbols in each lane data stream are sequentially input to the p delay lines based on sequence numbers of the p delay lines, d symbols are input to each delay line for a single time and d symbols are output from the delay line for a single time, and p*d consecutive symbols in the first data stream include the d symbols output from the delay line. Q is an integer greater than or equal to 1, and d is an integer greater than or equal to 1. In this embodiment, a specific implementation of convolutional interleaving is provided, thereby improving practicability of this solution.

In some embodiments, a delay line with a largest sequence number in the p delay lines includes 0 storage units. $d(p*Q+1) \geq a*N/b$, $d \leq a$, and N is a length of the codeword, so that z consecutive symbols in each first data stream can be from z different codewords.

In some embodiments, a delay line with a smallest sequence number in the p delay lines includes 0 storage units. $d(p*Q-1) \geq a*N/b$, $d \leq a$, and N is a length of the codeword, so that z consecutive symbols in each first data stream can be from z different codewords.

In some embodiments, if $K \leq G$, $y=K*z$; or if $K>G$, $y=G*z$. Such a multiplexing manner is used to ensure that $y>z$ can be implemented in a plurality of different application scenarios, and better performance of the concatenated FEC solution can be implemented with a low latency.

In some embodiments, each second data stream includes a plurality of second data stream symbol subsets, each second data stream symbol subset includes K groups of symbols, and each group of symbols includes $\Delta$ symbols. Two adjacent groups of symbols in each second data stream symbol subset are from different first data stream subsets. If $K \leq G$, $\Delta$ is a divisor of z; or if $K>G$, $\Delta=z$.

In this embodiment, because two adjacent groups of symbols in each second data stream symbol subset are from different first data stream subsets, y consecutive symbols in the second data stream obtained through the multiplexing are from y different codewords, where $y>z$ ($y=K*z$ or $y=G*z$). It should be understood that, when only convolutional interleaving is performed, to implement a case in which the y consecutive symbols in the output data stream are from y different codewords, a long latency is required. In this solution, while duration of the convolutional interleaving is reduced, equivalent performance can still be achieved by combining the convolutional interleaving and the multiplexing. In addition, duration of the multiplexing is short, and equivalent performance can be achieved with a shorter latency by combining the convolutional interleaving and the multiplexing.

In some embodiments, a $j^{th}$ group of symbols in each of the second data stream symbol subsets is from a $j^{th}$ first data stream of the K first data streams participating in the multiplexing, and $0 \leq j \leq K-1$. In the foregoing manner, a rule for selecting the K first data streams participating in the multiplexing is provided, to ensure that two adjacent groups of symbols in each second data stream symbol subset are from different first data stream subsets.

In some embodiments, if $K>G$, two adjacent first data streams of the K first data streams participating in the multiplexing are from different first data stream subsets. In the foregoing manner, in the scenario in which $K>G$, the rule for selecting the K first data streams participating in the multiplexing is provided, to ensure that $y=G*z$.

In some embodiments, if $K>G$, every G consecutive first data streams participating in the multiplexing are from different first data stream subsets. In the foregoing manner, in the scenario in which $K>G$, the rule for selecting the K first data streams participating in the multiplexing is provided, to further ensure that $y=G*z$.

In some embodiments, $n=32$, and $K=2$, 4, or 8. In the foregoing manner, several specific types of multiplexers are provided, and an application scenario of this solution is extended.

In some embodiments, $n=32$, $p=2$, 3, 4, 6, or 8, and $d=1$ or 2. In the foregoing manner, several specific types of convolution interleavers are provided, and an application scenario of this solution is extended.

In some embodiments, $a=1$ or 2, and $b=4$, 8, or 16. In the foregoing manner, several distribution manners of the lane data streams are provided, and an application scenario of this solution is extended.

In some embodiments, before the separately performing convolutional interleaving on n lane data streams to obtain n first data streams, the method further includes: performing lane reordering on the n lane data streams, so that the n lane data streams are arranged in a preset sequence.

In some embodiments, before the separately performing convolutional interleaving on n lane data streams to obtain n first data streams, the method further includes: performing lane deskewing on the n lane data streams. In this embodiment, a specific implementation of lane data alignment is provided, thereby enhancing implementability of this solution.

In some embodiments, before the separately performing convolutional interleaving on n lane data streams to obtain n first data streams, the method further includes: aligning the n lane data streams, so that symbols in the n lane data streams are aligned. In this embodiment, another specific implementation of lane data alignment is provided, thereby enhancing flexibility of this solution.

In some embodiments, after the total of m second data streams are obtained, the method further includes: separately performing second FEC encoding on the m second data streams. A length of an information bit of the second FEC encoding is less than or equal to y symbols.

According to a second aspect, this application provides a data processing apparatus. The data processing apparatus includes a convolution interleaver and a multiplexer. The convolution interleaver is configured to separately perform convolutional interleaving on n lane data streams to obtain n first data streams, where n is an integer greater than 1, and first FEC encoding is performed on all the n lane data streams. Every a codewords obtained through the first FEC encoding are distributed in b lane data streams, where $a \leq b \leq n$, n can be exactly divided by b, and a is an integer greater than or equal to 1. z consecutive symbols in each of the first data streams are from z different codewords, and z is an integer greater than 1. The multiplexer is configured to: multiplex every K first data streams of the n first data streams to obtain one second data stream, so as to obtain a total of m second data streams. The n first data streams include G first data stream subsets, symbols in different first data stream subsets are from different codewords, $m=n/K$, K is an integer greater than 1, and G is an integer greater than 1. y consecutive symbols in each second data stream are from y different codewords, where $y>z$. If $K \leq G$, the K first data streams are respectively from K first data stream subsets. If $K>G$, the K first data streams include K/G first data streams that are in each first data stream subset.

In some embodiments, the convolution interleaver is specifically configured to: delay one lane data stream based on p delay lines to obtain one first data stream, where p is an integer greater than 1, and a quantity of storage units included in each delay line is different. A delay line with a smallest quantity of storage units includes 0 storage units, a difference between quantities of storage units of every two adjacent delay lines is Q, each storage unit is configured to store d symbols, and $z=p*d$. Symbols in each lane data stream are sequentially input to the p delay lines based on sequence numbers of the p delay lines, d symbols are input to each delay line for a single time and d symbols are output from the delay line for a single time, $p*d$ consecutive symbols in the first data stream include the d symbols output from the delay line, Q is an integer greater than or equal to 1, and d is an integer greater than or equal to 1.

In some embodiments, a delay line with a largest sequence number in the p delay lines includes 0 storage units, $d(p*Q+1) \geq a*N/b$, N is a length of the codeword, and $d \leq a$.

In some embodiments, a delay line with a smallest sequence number in the p delay lines includes 0 storage units, $d(p*Q-1) \geq a*N/b$, N is a length of the codeword, and $d \leq a$.

In some embodiments, if K≤G, y=K*z; or if K>G, y=G*z.

In some embodiments, each second data stream includes a plurality of second data stream symbol subsets, each second data stream symbol subset includes K groups of symbols, and each group of symbols includes Δ symbols. Two adjacent groups of symbols in each second data stream symbol subset are from different first data stream subsets. If K≤G, Δ is a divisor of z; or if K>G, Δ=z.

In some embodiments, a $j^{th}$ group of symbols in each of the second data stream symbol subsets is from a $j^{th}$ first data stream of the K first data streams participating in the multiplexing, and 0≤j≤K−1.

In some embodiments, if K>G, two adjacent first data streams of the K first data streams participating in the multiplexing are from different first data stream subsets.

In some embodiments, if K>G, every G consecutive first data streams participating in the multiplexing are from different first data stream subsets.

In some embodiments, n=32, and K=2, 4, or 8.

In some embodiments, n=32, p=2, 3, 4, 6, or 8, and d=1 or 2.

In some embodiments, a=1 or 2, and b=4, 8, or 16.

In some embodiments, the data processing apparatus further includes a lane reordering unit. Before the convolutional interleaving are separately performed on the n lane data streams to obtain the n first data streams, the lane reordering unit is configured to: perform lane reordering on the n lane data streams, so that the n lane data streams are arranged in a preset sequence.

In some embodiments, the data processing apparatus further includes a lane data alignment unit. Before the convolutional interleaving are separately performed on the n lane data streams to obtain the n first data streams, the lane data alignment unit is configured to: perform lane deskewing on the n lane data streams.

In some embodiments, the data processing apparatus further includes a lane data alignment unit. Before the convolutional interleaving are separately performed on the n lane data streams to obtain the n first data streams, the lane data alignment unit is configured to: align the n lane data streams, so that symbols in the n lane data streams are aligned.

In some embodiments, the data processing apparatus further includes an encoder. After the total of m second data streams are obtained, the encoder is configured to: separately perform second FEC encoding on the m second data streams, where a length of an information bit of the second FEC encoding is less than or equal to y symbols.

According to a third aspect, this application provides a data processing method. The method includes the following blocks: performing interleaving on n lane data streams to obtain m target data streams, where n is a multiple of 4. First forward error correction FEC encoding is performed on all the n lane data streams, every a codewords obtained through the first FEC encoding are distributed in b lane data streams, a≤b≤n, and n can be exactly divided by b. F consecutive symbols in each target data stream are from F different codewords, and F>a. F consecutive symbols in each of the target data streams are from at least K1 different lane data streams, F consecutive symbols in each of the target data streams are from at most K2 symbols in n aligned symbols of the n lane data streams, K1 and K2 are divisors of n, and K2 is a divisor of K1. At most K3 symbols in the F consecutive symbols in each target data stream are from a same lane data stream, K3=⌈F/K1⌉, ⌈F/K1⌉ represents an integer obtained by rounding up a quotient of F/K1, any two of the K3 symbols are separated by at least K4 symbols on a same lane data stream, K4≥a*N*K2/n, and N is a length of the codeword.

In some embodiments, K1=n/4, and K2=n/16.

In some embodiments, the performing interleaving on n lane data streams to obtain m target data streams includes: separately performing convolutional interleaving on the n lane data streams to obtain n first data streams, where z consecutive symbols in each of the first data streams are from at least e different codewords, z is an integer greater than 1, a≤e≤F, and e*k2≥F, and at most k1/k2 symbols in the z consecutive symbols in each of the first data streams are from a same codeword; and performing block interleaving on every K1 first data streams of the n first data streams to obtain S target data streams, so as to obtain a total of the m target data streams, where S is an integer greater than or equal to 1, m=S*n/K1, S≥k1/k2, the n first data streams include K1 first data stream groups, symbols of every two first data streams in a same first data stream group are from same codewords, and the K1 first data streams are respectively from the K1 first data stream groups.

In some embodiments, performing convolutional interleaving on one lane data stream to obtain one first data stream includes: delaying one lane data stream based on p delay lines to obtain one first data stream, where p is an integer greater than 1, p*a≥F/k2, a quantity of storage units included in each delay line is different, a delay line with a smallest quantity of storage units includes 0 storage units, a difference between quantities of storage units of every two adjacent delay lines is Q, each storage unit is configured to store d symbols, and z=p*d. Symbols in each lane data stream are sequentially input to the p delay lines based on sequence numbers of the p delay lines, d symbols are input to each delay line for a single time and d symbols are output from the delay line for a single time, p*d consecutive symbols in the first data stream include the d symbols output from the delay line, Q is an integer greater than or equal to 1, d is an integer greater than or equal to 1, and d≤a.

In some embodiments, a delay line with a largest sequence number in the p delay lines includes 0 storage units, and d(p*Q+1)≥K4.

In some embodiments, a delay line with a smallest sequence number in the p delay lines includes 0 storage units, and d(p*Q−1)≥K4.

In some embodiments, K first data streams participating in the block interleaving include a first symbol matrix, the first symbol matrix includes K rows and B columns of symbols, B=R*p*d, R is an integer greater than or equal to 1, the S target data streams obtained through the block interleaving includes a second symbol matrix, the second symbol matrix includes S rows and F columns of symbols, and K*B=S*F. Symbols in the first symbol matrix are from at least F different codewords, and at most R*K1/K2 symbols in the first symbol matrix are from a same codeword.

In some embodiments, F symbols in each row of the second symbol matrix are from at least ⌈F/K2⌉ columns in the first symbol matrix, at most K2 symbols are selected in each of the ⌈F/K2⌉ columns, and ⌈F/K2⌉ represents an integer obtained by rounding up a quotient of F/K2. The F symbols in each row of the second symbol matrix include at least ⌊F/K1⌋ symbols in each row of the first symbol matrix, ⌊F/K1⌋ represents an integer obtained by rounding down a quotient of F/K1, the F symbols in each row of the second symbol matrix include at most ⌈F/K1⌉ symbols in each row of the first symbol matrix, and ⌈F/K1⌉ represents an integer obtained by rounding up a quotient of F/K.

In some embodiments, symbols, from odd-numbered columns of the first symbol matrix, in each row of the second symbol matrix are located in different rows of the first symbol matrix. Symbols, from even-numbered columns of the first symbol matrix, in each row of the second symbol matrix are located in different rows of the first symbol matrix.

In some embodiments, symbols that are output from delay lines with a same delay value and that are in each row of the second symbol matrix are from different rows of the first symbol matrix.

In some embodiments, at most K3 symbols in each row of the second symbol matrix are from a same row of the first symbol matrix, and any two of the K3 symbols are respectively output from two delay lines whose delay difference is greater than or equal to 2*Q*d.

In some embodiments, the performing interleaving on n lane data streams to obtain m target data streams includes: performing first block interleaving on the n lane data streams to obtain T first data streams, where C consecutive symbols in each of the first data streams are from at least E different codewords, T=n/K1, C is a multiple of a, and E≥K2*a; performing convolutional interleaving on the T first data streams to obtain T second data streams, where H consecutive symbols in each of the second data streams are from at least F different codewords, F≥E, and at most K1/K2 symbols in the H consecutive symbols in each of the second data streams are from a same codeword; and performing second block interleaving on each of the T second data streams to obtain S target data streams, so as to obtain a total of the m target data streams, where m=T*S, and S≥k1/K2.

In some embodiments, the n lane data streams participating in the first block interleaving include a third symbol matrix, the third symbol matrix includes n rows and A columns of symbols, A is a multiple of a, the T first data streams obtained through the first block interleaving include a fourth symbol matrix, the fourth symbol matrix includes T rows and C columns of symbols, T is a divisor of n, and n*A=T*C. Every T consecutive symbols in one column of the third symbol matrix are a symbol submatrix, and T symbols in each column of the fourth symbol matrix are in one-to-one correspondence with each symbol submatrix in the third symbol matrix.

In some embodiments, symbol submatrices in the third symbol matrix are arranged in a first sequence, a $1^{st}$ row to an $n^{th}$ row of each column in the third symbol matrix include a $1^{st}$ symbol submatrix to an $(n/T)^{th}$ symbol submatrix that are arranged in the first sequence, an $(n/T)^{th}$ symbol submatrix in a former column and a $1^{st}$ symbol submatrix in a latter column of two adjacent columns of the third symbol matrix are two consecutive symbol submatrices arranged in the first sequence, T symbols in a $1^{st}$ column of the fourth symbol matrix are from a $1^{st}$ symbol submatrix that is arranged in the first sequence and that is in the third symbol matrix, and the rest can be deduced by analogy until T symbols in a $C^{th}$ column in the fourth symbol matrix are from a last symbol submatrix that is arranged in the first sequence and that is in the third symbol matrix; or symbol submatrices in the third symbol matrix are arranged in a second sequence, a $1^{st}$ column to an $A^{th}$ row of every T rows in the third symbol matrix include a $1^{st}$ symbol submatrix to an $A^{th}$ symbol submatrix that are arranged in the second sequence, an $A^{th}$ symbol submatrix in former T rows and a $1^{st}$ symbol submatrix in latter T rows of two consecutive T rows of the third symbol matrix are two consecutive symbol submatrices arranged in the second sequence, T symbols in a $1^{st}$ column of the fourth symbol matrix are from a $1^{st}$ symbol submatrix that is arranged in the second sequence and that is in the third symbol matrix, and the rest can be deduced by analogy until T symbols in a $C^{th}$ column in the fourth symbol matrix are from a last symbol submatrix that is arranged in the second sequence and that is in the third symbol matrix.

In some embodiments, the performing convolutional interleaving on one first data stream to obtain one second data stream includes: delaying one first data stream based on p delay lines to obtain one second data stream, where p is an integer greater than 1, p*E≥F, a quantity of storage units included in each delay line is different, a delay line with a smallest quantity of storage units includes 0 storage units, a difference between quantities of storage units of every two adjacent delay lines is Q, each storage unit is configured to store C symbols, p*C=H, symbols in each first data stream are sequentially input to the p delay lines based on sequence numbers of the p delay lines, C symbols are input to each delay line for a single time and C symbols are output from the delay line for a single time, p*C consecutive symbols in the second data stream include the C symbols output from the delay line, and Q is an integer greater than or equal to 1.

In some embodiments, a delay line with a largest sequence number in the p delay lines includes 0 storage units, and C(p*Q+1)≥K1*K4.

In some embodiments, a delay line with a smallest sequence number in the p delay lines includes 0 storage units, and C(p*Q−1)≥K1*K4.

In some embodiments, each second data stream includes R symbol sets, each symbol set includes p symbol subsets, each symbol subset includes C symbols, the p symbol subsets are respectively output from the p delay lines, symbols in each symbol set are from at least F different codewords, each target data stream includes F symbols, R*p*C=S*F, and R is an integer greater than or equal to. The F symbols in the target data stream are from at least $\lceil F/K2*a \rceil$ different symbol subsets, each of the $\lceil F/(K2*a) \rceil$ different symbol subsets has at most K2*a symbols, and $\lceil F/(K2*a) \rceil$ represents an integer obtained by rounding up a quotient of F/(K2*a).

In some embodiments, the F symbols in the target data stream include a first group of symbols from a first symbol subset and a second group of symbols from a second symbol subset, the first symbol subset and the second symbol subset belong to a same symbol set, the first symbol subset and the second symbol subset are respectively output from two adjacent delay lines, symbols in the first symbol subset and symbols in the second symbol subset are separately sequentially arranged, and a ranking of the first group of symbols in the first symbol subset is different from a ranking of the second group of symbols in the second symbol subset; or the F symbols in the target data stream include a third group of symbols from a third symbol subset and a fourth group of symbols from a fourth symbol subset, the third symbol subset and the fourth symbol subset belong to different symbol sets, the third symbol subset and the fourth symbol subset are output from a same delay line, symbols in the third symbol subset and symbols in the fourth symbol subset are separately sequentially arranged, and a ranking of the third group of symbols in the third symbol subset is different from a ranking of the fourth group of symbols in the fourth symbol subset.

In some embodiments, at most $\lceil F/R \rceil$ symbols in the F symbols in each target data stream are from a same symbol set, and $\lceil F/R \rceil$ represents an integer obtained by rounding up a quotient of F/R.

In some embodiments, after the total of the m target data streams are obtained, the method further includes: separately performing second FEC encoding on the m target data streams, where a length of an information bit of the second FEC encoding is equal to F symbols.

According to a fourth aspect, this application provides a data processing apparatus, and the data processing apparatus includes an interleaving module. The interleaving module is configured to perform interleaving on n lane data streams to obtain m target data streams, where n is a multiple of 4, first forward error correction FEC encoding is performed on all the n lane data streams, every a codewords obtained through the first FEC encoding are distributed in b lane data streams, a≤b≤n, and n can be exactly divided by b. F consecutive symbols in each target data stream are from F different codewords, and F>a. F consecutive symbols in each of the target data streams are from at least K1 different lane data streams, F consecutive symbols in each of the target data streams are from at most K2 symbols in n aligned symbols of the n lane data streams, K1 and K2 are divisors of n, and K2 is a divisor of K1. At most K3 symbols in the F consecutive symbols in each target data stream are from a same lane data stream, K3=⌈F/K1⌉, ⌈F/K1⌉ represents an integer obtained by rounding up a quotient of F/K1, any two of the K3 symbols are separated by at least K4 symbols on a same lane data stream, K4≥a*N*K2/n, and N is a length of the codeword.

In some embodiments, K1=n/4, and K2=n/16.

In some embodiments, the interleaving module includes a convolution interleaver and a block interleaver. The convolution interleaver is configured to separately perform convolutional interleaving on the n lane data streams to obtain n first data streams, where z consecutive symbols in each of the first data streams are from at least e different codewords, z is an integer greater than 1, a≤e≤F, e*k2≥F, and at most k1/k2 symbols in the z consecutive symbols in each of the first data streams are from a same codeword. The block interleaver is configured to perform block interleaving on every K1 first data streams of the n first data streams to obtain S target data streams, so as to obtain a total of the m target data streams, where S is an integer greater than or equal to 1, m=S*n/K1, S≥k1/k2, the n first data streams include K1 first data stream groups, symbols of every two first data streams in a same first data stream group are from same codewords, and the K1 first data streams are respectively from the K1 first data stream groups.

In some embodiments, the convolution interleaver is specifically configured to: delay one lane data stream based on p delay lines to obtain one first data stream, where p is an integer greater than 1, p*a≥F/k2, a quantity of storage units included in each delay line is different, a delay line with a smallest quantity of storage units includes 0 storage units, a difference between quantities of storage units of every two adjacent delay lines is Q, each storage unit is configured to store d symbols, and z=p*d. Symbols in each lane data stream are sequentially input to the p delay lines based on sequence numbers of the p delay lines, d symbols are input to each delay line for a single time and d symbols are output from the delay line for a single time, p*d consecutive symbols in the first data stream include the d symbols output from the delay line, Q is an integer greater than or equal to 1, d is an integer greater than or equal to 1, and d≤a.

In some embodiments, a delay line with a largest sequence number in the p delay lines includes 0 storage units, and d(p*Q+1)≥K4.

In some embodiments, a delay line with a smallest sequence number in the p delay lines includes 0 storage units, and d(p*Q−1)≥K4.

In some embodiments, K first data streams participating in the block interleaving include a first symbol matrix, the first symbol matrix includes K rows and B columns of symbols, B=R*p*d, R is an integer greater than or equal to 1, the S target data streams obtained through the block interleaving includes a second symbol matrix, the second symbol matrix includes S rows and F columns of symbols, and K*B=S*F. Symbols in the first symbol matrix are from at least F different codewords, and at most R*K1/K2 symbols in the first symbol matrix are from a same codeword.

In some embodiments, F symbols in each row of the second symbol matrix are from at least ⌈F/K2⌉ columns in the first symbol matrix, at most K2 symbols are selected in each of the ⌈F/K2⌉ columns, and ⌈F/K2⌉ represents an integer obtained by rounding up a quotient of F/K2. The F symbols in each row of the second symbol matrix include at least ⌈F/K1⌉ symbols in each row of the first symbol matrix, ⌈F/K1⌉ represents an integer obtained by rounding down a quotient of F/K1, the F symbols in each row of the second symbol matrix include at most ⌈F/K1⌉ symbols in each row of the first symbol matrix, and ⌈F/K1⌉ represents an integer obtained by rounding up a quotient of F/K.

In some embodiments, symbols, from odd-numbered columns of the first symbol matrix, in each row of the second symbol matrix are located in different rows of the first symbol matrix, and symbols, from even-numbered columns of the first symbol matrix, in each row of the second symbol matrix are located in different rows of the first symbol matrix.

In some embodiments, symbols that are output from delay lines with a same delay value and that are in each row of the second symbol matrix are from different rows of the first symbol matrix.

In some embodiments, at most K3 symbols in each row of the second symbol matrix are from a same row of the first symbol matrix, and any two of the K3 symbols are respectively output from two delay lines whose delay difference is greater than or equal to 2*Q*d.

In some embodiments, the convolutional interleaving module includes a first block interleaver, a convolution interleaver, and a second block interleaver. The first block interleaver is configured to perform first block interleaving on the n lane data streams to obtain T first data streams, where C consecutive symbols in each of the first data streams are from at least E different codewords, T=n/K1, C is a multiple of a, and E≥K2*a. The convolution interleaver is configured to perform convolutional interleaving on the T first data streams to obtain T second data streams, where H consecutive symbols in each of the second data streams are from at least F different codewords, F≥E, and at most K1/K2 symbols in the H consecutive symbols in each of the second data streams are from a same codeword. The second block interleaver is configured to perform second block interleaving on each of the T second data streams to obtain S target data streams, so as to obtain a total of the m target data streams, where m=T*S, and S≥k1/K2.

In some embodiments, the n lane data streams participating in the first block interleaving include a third symbol matrix, the third symbol matrix includes n rows and A columns of symbols, A is a multiple of a, the T first data streams obtained through the first block interleaving include a fourth symbol matrix, the fourth symbol matrix includes T rows and C columns of symbols, T is a divisor of n, and n*A=T*C. Every T consecutive symbols in one column of the third symbol matrix are a symbol submatrix, and T symbols in each column of the fourth symbol matrix are in one-to-one correspondence with each symbol submatrix in the third symbol matrix.

In some embodiments, symbol submatrices in the third symbol matrix are arranged in a first sequence, a $1^{st}$ row to an $n^{th}$ row of each column in the third symbol matrix include a $1^{st}$ symbol submatrix to an $(n/T)^{th}$ symbol submatrix that are arranged in the first sequence, an $(n/T)^{th}$ symbol submatrix in a former column and a $1^{st}$ symbol submatrix in a latter column of two adjacent columns of the third symbol matrix are two consecutive symbol submatrices arranged in the first sequence, T symbols in a $1^{st}$ column of the fourth symbol matrix are from a $1^{st}$ symbol submatrix that is arranged in the first sequence and that is in the third symbol matrix, and the rest can be deduced by analogy until T symbols in a $C^{th}$ column in the fourth symbol matrix are from a last symbol submatrix that is arranged in the first sequence and that is in the third symbol matrix; or symbol submatrices in the third symbol matrix are arranged in a second sequence, a $1^{st}$ column to an $A^{th}$ row of every T rows in the third symbol matrix include a $1^{st}$ symbol submatrix to an $A^{th}$ symbol submatrix that are arranged in the second sequence, an $A^{th}$ symbol submatrix in former T rows and a $1^{st}$ symbol submatrix in latter T rows of two consecutive T rows of the third symbol matrix are two consecutive symbol submatrices arranged in the second sequence, T symbols in a $1^{st}$ column of the fourth symbol matrix are from a $1^{st}$ symbol submatrix that is arranged in the second sequence and that is in the third symbol matrix, and the rest can be deduced by analogy until T symbols in a $C^{th}$ column in the fourth symbol matrix are from a last symbol submatrix that is arranged in the second sequence and that is in the third symbol matrix.

In some embodiments, the convolution interleaver is specifically configured to: delay one first data stream based on p delay lines to obtain one second data stream, where p is an integer greater than 1, $p*E \geq F$, a quantity of storage units included in each delay line is different, a delay line with a smallest quantity of storage units includes 0 storage units, a difference between quantities of storage units of every two adjacent delay lines is Q, each storage unit is configured to store C symbols, and $p*C = H$. Symbols in each first data stream are sequentially input to the p delay lines based on sequence numbers of the p delay lines, C symbols are input to each delay line for a single time and C symbols are output from the delay line for a single time, $p*C$ consecutive symbols in the second data stream include the C symbols output from the delay line, and Q is an integer greater than or equal to 1.

In some embodiments, a delay line with a largest sequence number in the p delay lines includes 0 storage units, and $C(p*Q+1) \geq K1*K4$.

In some embodiments, a delay line with a smallest sequence number in the p delay lines includes 0 storage units, and $C(p*Q-1) \geq K1*K4$.

In some embodiments, each second data stream includes R symbol sets, each symbol set includes p symbol subsets, each symbol subset includes C symbols, the p symbol subsets are respectively output from the p delay lines, symbols in each symbol set are from at least F different codewords, each target data stream includes F symbols, $R*p*C = S*F$, and R is an integer greater than or equal to. The F symbols in the target data stream are from at least $\lceil F/(K2*a) \rceil$ different symbol subsets, each of the $\lceil F/(K2*a) \rceil$ different symbol subsets has at most $K2*a$ symbols, and $\lceil F/(K2*a) \rceil$ represents an integer obtained by rounding up a quotient of $F/(K2*a)$.

In some embodiments, the F symbols in the target data stream include a first group of symbols from a first symbol subset and a second group of symbols from a second symbol subset, the first symbol subset and the second symbol subset belong to a same symbol set, the first symbol subset and the second symbol subset are respectively output from two adjacent delay lines, symbols in the first symbol subset and symbols in the second symbol subset are separately sequentially arranged, and a ranking of the first group of symbols in the first symbol subset is different from a ranking of the second group of symbols in the second symbol subset; or the F symbols in the target data stream include a third group of symbols from a third symbol subset and a fourth group of symbols from a fourth symbol subset, the third symbol subset and the fourth symbol subset belong to different symbol sets, the third symbol subset and the fourth symbol subset are output from a same delay line, symbols in the third symbol subset and symbols in the fourth symbol subset are separately sequentially arranged, and a ranking of the third group of symbols in the third symbol subset is different from a ranking of the fourth group of symbols in the fourth symbol subset.

In some embodiments, at most $\lceil F/R \rceil$ symbols in the F symbols in each target data stream are from a same symbol set, and $\lceil F/R \rceil$ represents an integer obtained by rounding up a quotient of $F/R$.

In some embodiments, the data processing apparatus further includes an encoder. After the total of the m target data streams are obtained, the encoder is configured to: separately perform second FEC encoding on the m target data streams, where a length of an information bit of the second FEC encoding is equal to F symbols.

According to a fifth aspect, this application provides a data processing method. The method includes the following blocks. First, block interleaving is performed on every t lane data streams of n lane data streams to obtain s first data streams, so as to obtain a total of m first data streams, where $n = q*t$, $m = q*s$, n is an integer greater than 1, n can be exactly divided by q, q is an integer greater than or equal to 1, t is an integer greater than or equal to 1, and s is an integer greater than or equal to 1. First forward error correction FEC encoding is performed on all the n lane data streams, every a codewords obtained through the first FEC encoding are distributed in b lane data streams, $a \leq b \leq n$, n can be exactly divided by b, and a is an integer greater than or equal to 1. Every a consecutive symbols in each lane data stream are from a different codewords, every L1 consecutive symbols in each lane data stream are from at least a different codewords, $L1 = N*a/b$, and N represents a length of the codeword. The t lane data streams include a total of $t*a$ symbols (a consecutive symbols in each lane data stream), the $t*a$ symbols include a total of D bits (4 bits in each symbol, and $D = \Delta*t*a$), the D bits are consecutive in any one of the s first data streams, $\Delta = M/s$, and M represents a quantity of bits included in one symbol. Then, convolutional interleaving is separately performed on the m first data streams to obtain m second data streams.

In some embodiments, every d consecutive symbols in each first data stream are from v different codewords, every L2 consecutive symbols in each first data stream are from at least v different codewords, v can be exactly divided by a, $L2 = t/s*L1$, and $d = D/M$.

In some embodiments, $n = 32$, 16 lane data streams in odd-numbered lanes of the n lane data streams are from same codewords, 16 lane data streams in even-numbered lanes of the n lane data streams are from same codewords, and the data stream in the odd-numbered lane of the n lane data streams and the data stream in the even-numbered lane of the n lane data streams are from different codewords.

In some embodiments, t=2, s=1, and the performing block interleaving on every t lane data streams of n lane data streams to obtain s first data streams includes: performing block interleaving on a $(2*i)^{th}$ lane data stream and a $(2*i+1)^{th}$ lane data stream to obtain one first data stream, where 0≤i<16. Two consecutive symbols in the $(2*i)^{th}$ lane data stream and two consecutive symbols in the $(2*i+1)^{th}$ lane data stream are consecutive in the first data stream obtained through the block interleaving, and every four consecutive symbols in the first data stream obtained through the block interleaving are from four different codewords.

In some embodiments, a $j^{th}$ bit in 40 consecutive bits in the first data stream obtained through the block interleaving is from a $$\left(\left\lfloor\left\lfloor\frac{j}{\beta}\right\rfloor/2\right\rfloor*\beta+j\%\beta\right)^{th}$$

bit in 20 consecutive bits in a $$\left(2*i+\left\lfloor\frac{j}{\beta}\right\rfloor\%2\right)^{th}$$

lane data stream, $\lfloor x\rfloor$ represents rounding down, 0≤j<40, and β is 1, 2, 4, 5, 10, or 20.

In some embodiments, t=2, s=1, and the performing block interleaving on every t lane data streams of n lane data streams to obtain s first data streams includes: performing block interleaving on a $(2*i)^{th}$ lane data stream and a $(2*i+1)^{th}$ lane data stream to obtain one first data stream, where 0≤i<16. A $j^{th}$ group of consecutive β bits in the $(2*i)^{th}$ lane data stream and a $j^{th}$ group of consecutive β bits in the $(2*i+1)^{th}$ lane data stream are consecutive in the first data stream obtained through the block interleaving, j≥0, β is 1, 2, 4, 5, 10, or 20, and every four consecutive symbols in the first data stream obtained through the block interleaving are from four different codewords.

In some embodiments, t=2, s=2, and the performing block interleaving on every t lane data streams of n lane data streams to obtain s first data streams includes: performing block interleaving on a $(2*i)^{th}$ lane data stream and a $(2*i+1)^{th}$ lane data stream to obtain a $(2*i)^{th}$ first data stream and a $(2*i+1)^{th}$ first data stream, where 0≤i<16. A total of 20 bits (five bits in each of four symbols: two consecutive symbols in the $(2*i)^{th}$ lane data stream and two consecutive symbols in the $(2*i+1)^{th}$ lane data stream) are consecutive in the $(2*i)^{th}$ first data stream, every 20 consecutive bits in the $(2*i)^{th}$ first data stream are from four different codewords, a total of 20 bits (the other five bits in each of the four symbols: two consecutive symbols in the $(2*i)^{th}$ lane data stream and two consecutive symbols in the $(2*i+1)^{th}$ lane data stream) are consecutive in the $(2*i+1)^{th}$ first data stream, and every 20 consecutive bits in the $(2*i+1)^{th}$ first data stream are from four different codewords.

In some embodiments, an $f^{th}$ bit in 20 consecutive bits in a $(2*i+g)^{th}$ first data stream is from a $$\left(5*g+\left\lfloor\frac{f\%10}{5}\right\rfloor*10+f\%5\right)^{th}$$

bit in 20 consecutive bits in a $$\left(2*i+\left\lfloor\frac{f}{10}\right\rfloor\right)^{th}$$

lane data stream, 0≤f<20, and 0≤g<2.

In some embodiments, an $f^{th}$ bit in 20 consecutive bits in a $(2*i+g)^{th}$ first data stream is from a $$\left(5*g+\left\lfloor\frac{f}{10}\right\rfloor*10+f\%5\right)^{th}$$

bit in 20 consecutive bits in a $$\left(2*i+\left\lfloor\frac{f}{5}\right\rfloor\%2\right)^{th}$$

lane data stream, from a 0≤f<20, and 0≤g<2.

In some embodiments, t=4, s=1, and the performing block interleaving on every t lane data streams of n lane data streams to obtain s first data streams includes: performing block interleaving on a total of four lane data streams: a $(4*i)^{th}$ lane data stream, a $(4*i+1)^{th}$ lane data stream, a $(4*i+2)^{th}$ lane data stream, and a $(4*i+3)^{th}$ lane data stream, to obtain one first data stream, where 0≤i≤7, a total of eight symbols (two consecutive symbols included in each of the four lane data streams) are consecutive in the first data stream obtained through the block interleaving, every eight consecutive symbols in the first data stream obtained through the block interleaving are from at least four different codewords, every 272 consecutive symbols are from at least four different codewords, a $0^{th}$ symbol, a $1^{st}$ symbol, a $2^{nd}$ symbol, and a $3^{rd}$ symbol in every eight consecutive symbols in the first data stream obtained through the block interleaving are from different codewords, and a $4^{th}$ symbol, a $5^{th}$ symbol, a $6^{th}$ symbol, and a $7^{th}$ symbol in every eight consecutive symbols in the first data stream obtained through the block interleaving are from different codewords.

In some embodiments, t=4, s=1, and the performing block interleaving on every t lane data streams of n lane data streams to obtain s first data streams includes: performing block interleaving on a total of four lane data streams: a $(4*i)^{th}$ lane data stream, a $(4*i+1)^{th}$ lane data stream, a $(4*i+2)^{th}$ lane data stream, and a $(4*i+3)^{th}$ lane data stream, to obtain one first data stream, where 0≤i≤7, a total of eight symbols (a $j^{th}$ group of two consecutive symbols included in each of the four lane data streams) are consecutive in the first data stream obtained through the block interleaving, the $j^{th}$ group of two consecutive symbols included in each of the four lane data streams are consecutive in the first data stream obtained through the block interleaving, j≥0, every eight consecutive symbols in the first data stream obtained through the block interleaving are from at least four different codewords, every 272 consecutive symbols are from at least four different codewords, a $0^{th}$ symbol, a $1^{st}$ symbol, a $2^{nd}$ symbol, and a $3^{rd}$ symbol in every eight consecutive symbols in the first data stream obtained through the block interleaving are from different codewords, and a $4^{th}$ symbol, a $5^{th}$ symbol, a $6^{th}$ symbol, and a $7^{th}$ symbol in every eight consecutive symbols in the first data stream obtained through the block interleaving are from different codewords.

In some embodiments, t=4, s=1, and the performing block interleaving on every t lane data streams of n lane data streams to obtain s first data streams includes: performing block interleaving on a total of four lane data streams: a $(4*i)^{th}$ lane data stream, a $(4*i+1)^{th}$ lane data stream, a $(4*i+2)^{th}$ lane data stream, and a $(4*i+3)^{th}$ lane data stream, to obtain one first data stream, where $0 \leq i \leq 7$, a total of four symbols (a $j^{th}$ symbol included in each of the four lane data streams) are consecutive in the first data stream obtained through the block interleaving, $j \geq 0$, and every four consecutive symbols in the first data stream obtained through the block interleaving are from four different codewords.

In some embodiments, t=8, s=1, and the performing block interleaving on every t lane data streams of n lane data streams to obtain s first data streams includes: performing block interleaving on a total of eight lane data streams: an $(8*i)^{th}$ lane data stream, an $(8*i+1)^{th}$ lane data stream, an $(8*i+2)^{th}$ lane data stream, an $(8*i+3)^{th}$ lane data stream, an $(8*i+4)^{th}$ lane data stream, an $(8*i+5)^{th}$ lane data stream, an $(8*i+6)^{th}$ lane data stream, and an $(8*i+7)^{th}$ lane data stream, to obtain one first data stream, where $0 \leq i \leq 3$, a total of 16 symbols (two consecutive symbols included in each of the eight lane data streams) are consecutive in the first data stream obtained through the block interleaving, every 16 consecutive symbols in the first data stream obtained through the block interleaving are from at least four different codewords, every 544 consecutive symbols are from at least four different codewords, a $0^{th}$ symbol, a $1^{st}$ symbol, a $2^{nd}$ symbol, and a $3^{rd}$ symbol in every 16 consecutive symbols in the first data stream obtained through the block interleaving are from different codewords, a $4^{th}$ symbol, a $5^{th}$ symbol, a $6^{th}$ symbol, and a $7^{th}$ symbol in every 16 consecutive symbols in the first data stream obtained through the block interleaving are from different codewords, an $8^{th}$ symbol, a $9^{th}$ symbol, a $10^{th}$ symbol, and an $11^{th}$ symbol in every 16 consecutive symbols in the first data stream obtained through the block interleaving are from different codewords, and a $12^{th}$ symbol, a $13^{th}$ symbol, a $14^{th}$ symbol, and a $15^{th}$ symbol in every 16 consecutive symbols in the first data stream obtained through the block interleaving are from different codewords.

In some embodiments, t=8, s=1, and the performing block interleaving on every t lane data streams of n lane data streams to obtain s first data streams includes:

performing block interleaving on a total of eight lane data streams: an $(8*i)^{th}$ lane data stream, an $(8*i+1)^{th}$ lane data stream, an $(8*i+2)^{th}$ lane data stream, an $(8*i+3)^{th}$ lane data stream, an $(8*i+4)^{th}$ lane data stream, an $(8*i+5)^{th}$ lane data stream, an $(8*i+6)^{th}$ lane data stream, and an $(8*i+7)^{th}$ lane data stream, to obtain one first data stream, where $0 \leq i \leq 3$, a total of 16 symbols (a $j^{th}$ group of two consecutive symbols included in each of the eight lane data streams) are consecutive in the first data stream obtained through the block interleaving, a $j^{th}$ group of two consecutive symbols included in each of the eight lane data streams are consecutive in the first data stream obtained through the block interleaving, $j \geq 0$, every 16 consecutive symbols in the first data stream obtained through the block interleaving are from at least four different codewords, every 544 consecutive symbols are from at least four different codewords, a $0^{th}$ symbol, a $1^{st}$ symbol, a $2^{nd}$ symbol, and a $3^{rd}$ symbol in every 16 consecutive symbols in the first data stream obtained through the block interleaving are from different codewords, a $4^{th}$ symbol, a $5^{th}$ symbol, a $6^{th}$ symbol, and a $7^{th}$ symbol in every 16 consecutive symbols in the first data stream obtained through the block interleaving are from different codewords, an $8^{th}$ symbol, a $9^{th}$ symbol, a $10^{th}$ symbol, and an $11^{th}$ symbol in every 16 consecutive symbols in the first data stream obtained through the block interleaving are from different codewords, and a $12^{th}$ symbol, a $13^{th}$ symbol, a $14^{th}$ symbol, and a $15^{th}$ symbol in every 16 consecutive symbols in the first data stream obtained through the block interleaving are from different codewords.

In some embodiments, t=8, s=1, and the performing block interleaving on every t lane data streams of n lane data streams to obtain s first data streams includes: performing block interleaving on a total of eight lane data streams: an $(8*i)^{th}$ lane data stream, an $(8*i+1)^{th}$ lane data stream, an $(8*i+2)^{th}$ lane data stream, an $(8*i+3)^{th}$ lane data stream, an $(8*i+4)^{th}$ lane data stream, an $(8*i+5)^{th}$ lane data stream, an $(8*i+6)^{th}$ lane data stream, and an $(8*i+7)^{th}$ lane data stream, to obtain one first data stream, where $0 \leq i \leq 3$, a total of eight symbols (a $j^{th}$ symbol included in each of the eight lane data streams) are consecutive in the first data stream obtained through the block interleaving, $j \geq 0$, every eight consecutive symbols in the first data stream obtained through the block interleaving are from four different codewords, a $0^{th}$ symbol, a $1^{st}$ symbol, a $2^{nd}$ symbol, and a $3^{rd}$ symbol in every eight consecutive symbols in the first data stream obtained through the block interleaving are from different codewords, and a $4^{th}$ symbol, a $5^{th}$ symbol, a $6^{th}$ symbol, and a $7^{th}$ symbol in every eight consecutive symbols in the first data stream obtained through the block interleaving are from different codewords.

In some embodiments, n=32, 16 consecutive lane data streams sorted in the front of the n lane data streams are from same codewords, 16 consecutive lane data streams sorted in the back of the n lane data streams are from same codewords, and the 16 consecutive lane data streams sorted in the front of the n lane data streams and the 16 consecutive lane data streams sorted in the back of the n lane data streams are from different codewords.

In some embodiments, t=2, s=1, and the performing block interleaving on every t lane data streams of n lane data streams to obtain s first data streams includes: performing block interleaving on an $i^{th}$ lane data stream and an $(i+16)^{th}$ lane data stream to obtain one first data stream, where $0 \leq i < 16$. Two consecutive symbols in the $i^{th}$ lane data stream and two consecutive symbols in the $(i+16)^{th}$ lane data stream are consecutive in the first data stream obtained through the block interleaving, and every four consecutive symbols in the first data stream obtained through the block interleaving are from four different codewords.

In some embodiments, a $j^{th}$ bit in 40 consecutive bits in the first data stream obtained through the block interleaving is from a $$\left( \left\lfloor \left\lfloor \frac{j}{\beta} \right\rfloor / 2 \right\rfloor * \beta + j \% \beta \right)^{th}$$

bit in 20 consecutive bits in a $$\left( 2 * i + \left\lfloor \frac{j}{\beta} \right\rfloor \% 2 \right)^{th}$$

lane data stream, $\lfloor x \rfloor$ represents rounding down, $0 \leq j < 40$, and $\beta$ is 1, 2, 4, 5, 10, or 20.

In some embodiments, t=2, s=1, and the performing block interleaving on every t lane data streams of n lane data streams to obtain s first data streams includes: performing block interleaving on an $i^{th}$ lane data stream and an $(i+16)^{th}$ lane data stream to obtain one first data stream, where $0 \leq i < 16$. A $j^{th}$ group of consecutive $\beta$ bits in the $i^{th}$ lane data stream and a $j^{th}$ group of consecutive $\beta$ bits in the $(i+16)^{th}$ lane data stream are consecutive in the first data stream obtained through the block interleaving, $j \geq 0$, $\beta$ is 1, 2, 4, 5, 10, or 20, and every four consecutive symbols in the first data stream obtained through the block interleaving are from four different codewords.

In some embodiments, t=2, s=2, and the performing block interleaving on every t lane data streams of n lane data streams to obtain s first data streams includes: performing block interleaving on an $i^{th}$ lane data stream and an $(i+16)^{th}$ lane data stream to obtain a $(2*i)^{th}$ first data stream and a $(2*i+1)^{th}$ first data stream, where $0 \leq i < 16$. A total of 20 bits (five bits in each of four symbols: two consecutive symbols in the $i^{th}$ lane data stream and two consecutive symbols in the $(i+16)^{th}$ lane data stream) are consecutive in the $(2*i)^{th}$ first data stream, every 20 consecutive bits in the $(2*i)^{th}$ first data stream are from four different codewords, a total of 20 bits (the other five bits in each of the four symbols: two consecutive symbols in the $i^{th}$ lane data stream and two consecutive symbols in the $(i+16)^{th}$ lane data stream) are consecutive in the $(2*i+1)^{th}$ first data stream, and every 20 consecutive bits in the $(2*i+1)^{th}$ first data stream are from four different codewords.

In some embodiments, an $f^{th}$ bit in 20 consecutive bits in a $(2*i+g)^{th}$ first data stream is from a $$\left( 5 * g + \left\lfloor \frac{f \% 10}{5} \right\rfloor * 10 + f \% 5 \right)^{th}$$

bit in 20 consecutive bits in a $$\left( i + 16 * \left\lfloor \frac{f}{10} \right\rfloor \right)^{th}$$

lane data stream, $0 \leq f < 20$, and $0 \leq g < 2$.

In some embodiments, an $f^{th}$ bit in 20 consecutive bits in a $(2*i+g)^{th}$ first data stream is from a $$\left( 5 * g + \left\lfloor \frac{f}{10} \right\rfloor * 10 + f \% 5 \right)^{th}$$

bit in 20 consecutive bits in a $$\left( i + 16 * \left\lfloor \frac{f}{10} \right\rfloor \right)^{th}$$

lane data stream, $0 \leq f < 20$, and $0 \leq g < 2$.

In some embodiments, t=4, s=1, and the performing block interleaving on every t lane data streams of n lane data streams to obtain s first data streams includes: performing block interleaving on a total of four lane data streams: a $(2*i)^{th}$ lane data stream, a $(2*i+1)^{th}$ lane data stream, a $(2*i+16)^{th}$ lane data stream, and a $(2*i+17)^{th}$ lane data stream, to obtain one first data stream, where $0 \leq i \leq 7$, a total of eight symbols (two consecutive symbols included in each of the four lane data streams) are consecutive in the first data stream obtained through the block interleaving, every eight consecutive symbols in the first data stream obtained through the block interleaving are from at least four different codewords, every 272 consecutive symbols are from at least four different codewords, a $0^{th}$ symbol, a $1^{st}$ symbol, a $2^{nd}$ symbol, and a $3^{rd}$ symbol in every eight consecutive symbols in the first data stream obtained through the block interleaving are from different codewords, and a $4^{th}$ symbol, a $5^{th}$ symbol, a $6^{th}$ symbol, and a $7^{th}$ symbol in every eight consecutive symbols in the first data stream obtained through the block interleaving are from different codewords.

In some embodiments, t=4, s=1, and the performing block interleaving on every t lane data streams of n lane data streams to obtain s first data streams includes: performing block interleaving on a total of four lane data streams: a $(2*i)^{th}$ lane data stream, a $(2*i+1)^{th}$ lane data stream, a $(2*i+16)^{th}$ lane data stream, and a $(2*i+17)^{th}$ lane data stream, to obtain one first data stream, where $0 \leq i \leq 7$, a total of eight symbols (a $j^{th}$ group of two consecutive symbols included in each of the four lane data streams) are consecutive in the first data stream obtained through the block interleaving, the $j^{th}$ group of two consecutive symbols included in each of the four lane data streams are consecutive in the first data stream obtained through the block interleaving, $j \geq 0$, every eight consecutive symbols in the first data stream obtained through the block interleaving are from at least four different codewords, every 272 consecutive symbols are from at least four different codewords, a $0^{th}$ symbol, a $1^{st}$ symbol, a $2^{nd}$ symbol, and a $3^{rd}$ symbol in every eight consecutive symbols in the first data stream obtained through the block interleaving are from different codewords, and a $4^{th}$ symbol, a $5^{th}$ symbol, a $6^{th}$ symbol, and a $7^{th}$ symbol in every eight consecutive symbols in the first data stream obtained through the block interleaving are from different codewords.

In some embodiments, t=4, s=1, and the performing block interleaving on every t lane data streams of n lane data streams to obtain s first data streams includes: performing block interleaving on a total of four lane data streams: a $(2*i)^{th}$ lane data stream, a $(2*i+1)^{th}$ lane data stream, a $(2*i+16)^{th}$ lane data stream, and a $(2*i+17)^{th}$ lane data stream, to obtain one first data stream, where $0 \leq i \leq 7$, a total of four symbols (a $j^{th}$ symbol included in each of the four lane data streams) are consecutive in the first data stream obtained through the block interleaving, $j \geq 0$, and every four consecutive symbols in the first data stream obtained through the block interleaving are from four different codewords.

In some embodiments, t=8, s=1, and the performing block interleaving on every t lane data streams of n lane data streams to obtain s first data streams includes: performing block interleaving on a total of eight lane data streams: a $(4*i)^{th}$ lane data stream, a $(4*i+1)^{th}$ lane data stream, a $(4*i+2)^{th}$ lane data stream, a $(4*i+3)^{th}$ lane data stream, a $(4*i+16)^{th}$ lane data stream, a $(4*i+17)^{th}$ lane data stream, a $(4*i+18)^{th}$ lane data stream, and a $(4*i+19)^{th}$ lane data stream, to obtain one first data stream, where $0 \leq i \leq 3$, a total of 16 symbols (two consecutive symbols included in each of the eight lane data streams) are consecutive in the first data stream obtained through the block interleaving, every 16 consecutive symbols in the first data stream obtained through the block interleaving are from at least four different codewords, every 544 consecutive symbols are from at least four different codewords, a $0^{th}$ symbol, a $1^{st}$ symbol, a $2^{nd}$ symbol, and a $3^{rd}$ symbol in every 16 consecutive symbols in the first data stream obtained through the block interleaving are from different codewords, a $4^{th}$ symbol, a $5^{th}$ symbol, a $6^{th}$ symbol, and a $7^{th}$ symbol in every 16 consecutive symbols in the first data stream obtained through the block interleaving are from different codewords, an $8^{th}$ symbol, a $9^{th}$ symbol, a $10^{th}$ symbol, and an $11^{th}$ symbol in every 16 consecutive symbols in the first data stream obtained through the block interleaving are from different codewords, and a $12^{th}$ symbol, a $13^{th}$ symbol, a $14^{th}$ symbol, and a $15^{th}$ symbol in every 16 consecutive symbols in the first data stream obtained through the block interleaving are from different codewords.

In some embodiments, t=8, s=1, and the performing block interleaving on every t lane data streams of n lane data streams to obtain s first data streams includes: performing block interleaving on a total of eight lane data streams: a $(4*i)^{th}$ lane data stream, a $(4*i+1)^{th}$ lane data stream, a $(4*i+2)^{th}$ lane data stream, a $(4*i+3)^{th}$ lane data stream, a $(4*i+16)^{th}$ lane data stream, a $(4*i+17)^{th}$ lane data stream, a $(4*i+18)^{th}$ lane data stream, and a $(4*i+19)^{th}$ lane data stream, to obtain one first data stream, where $0 \leq i \leq 3$, a total of 16 symbols (a $j^{th}$ group of two consecutive symbols included in each of the eight lane data streams) are consecutive in the first data stream obtained through the block interleaving, a $j^{th}$ group of two consecutive symbols included in each of the eight lane data streams are consecutive in the first data stream obtained through the block interleaving, $j \geq 0$, every 16 consecutive symbols in the first data stream obtained through the block interleaving are from at least four different codewords, every 544 consecutive symbols are from at least four different codewords, a $0^{th}$ symbol, a $1^{st}$ symbol, a $2^{nd}$ symbol, and a $3^{rd}$ symbol in every 16 consecutive symbols in the first data stream obtained through the block interleaving are from different codewords, a $4^{th}$ symbol, a $5^{th}$ symbol, a $6^{th}$ symbol, and a $7^{th}$ symbol in every 16 consecutive symbols in the first data stream obtained through the block interleaving are from different codewords, an $8^{th}$ symbol, a $9^{th}$ symbol, a $10^{th}$ symbol, and an $11^{th}$ symbol in every 16 consecutive symbols in the first data stream obtained through the block interleaving are from different codewords, and a $12^{th}$ symbol, a $13^{th}$ symbol, a $14^{th}$ symbol, and a $15^{th}$ symbol in every 16 consecutive symbols in the first data stream obtained through the block interleaving are from different codewords.

In some embodiments, t=8, s=1, and the performing block interleaving on every t lane data streams of n lane data streams to obtain s first data streams includes: performing block interleaving on a total of eight lane data streams: a $(4*i)^{th}$ lane data stream, a $(4*i+1)^{th}$ lane data stream, a $(4*i+2)^{th}$ lane data stream, a $(4*i+3)^{th}$ lane data stream, a $(4*i+16)^{th}$ lane data stream, a $(4*i+17)^{th}$ lane data stream, a $(4*i+18)^{th}$ lane data stream, and a $(4*i+19)^{th}$ lane data stream, to obtain one first data stream, where $0 \leq i \leq 3$, a total of eight symbols (a $j^{th}$ symbol included in each of the eight lane data streams) are consecutive in the first data stream obtained through the block interleaving, $j \geq 0$, every eight consecutive symbols in the first data stream obtained through the block interleaving are from at least four different codewords, a $0^{th}$ symbol, a $1^{st}$ symbol, a $2^{nd}$ symbol, and a $3^{rd}$ symbol in every eight consecutive symbols in the first data stream obtained through the block interleaving are from different codewords, and a $4^{th}$ symbol, a $5^{th}$ symbol, a $6^{th}$ symbol, and a $7^{th}$ symbol in every eight consecutive symbols in the first data stream obtained through the block interleaving are from different codewords.

In some embodiments, the performing convolutional interleaving on one first data stream to obtain one second data stream includes: delaying one first data stream based on p delay lines to obtain one second data stream, where p is an integer greater than 1, a quantity of storage units included in each delay line is different, a delay line with a smallest quantity of storage units includes 0 storage units, a difference between quantities of storage units of every two adjacent delay lines is Q, each storage unit is configured to store d symbols, symbols in each lane data stream are sequentially input to the p delay lines based on sequence numbers of the p delay lines, d symbols are input to each delay line for a single time and d symbols are output from the delay line for a single time, p*d consecutive symbols in the second data stream include the d symbols output from the delay line, and Q is an integer greater than or equal to 1.

In some embodiments, a delay line with a largest sequence number in the p delay lines includes 0 storage units, $d(p*Q+1) \geq L2$, and $L2=t/s*L1$; or a delay line with a smallest sequence number in the p delay lines includes 0 storage units, $d(p*Q-1) \geq L2$, and $L2=t/s*L1$.

In some embodiments, after the separately performing convolutional interleaving on the m first data streams to obtain m second data streams, the method further includes: separately performing second FEC encoding on the m second data streams to obtain m encoded data streams. Information data whose length is K symbols in each of the encoded data streams is from at most K different codewords, and $K \geq p*d$.

In some embodiments, the performing convolutional interleaving on one first data stream to obtain one second data stream includes: delaying one first data stream based on p delay lines to obtain one second data stream, where p is an integer greater than 1, a quantity of storage units included in each delay line is different, a delay line with a smallest quantity of storage units includes 0 storage units, a difference between quantities of storage units of every two adjacent delay lines is Q, each storage unit is configured to store four symbols, symbols in each lane data stream are sequentially input to the p delay lines based on sequence numbers of the p delay lines, four symbols are input to each delay line for a single time and four symbols are output from the delay line for a single time, p*4 consecutive symbols in the second data stream include the four symbols output from the delay line, and Q satisfies $4(p*Q-1) \geq 272$, $4(p*Q+1) \geq 272$, $4(p*Q-1) \geq 544$, or $4(p*Q+1) \geq 544$.

In some embodiments, after the separately performing convolutional interleaving on the m first data streams to obtain m second data streams, the method further includes: separately performing second FEC encoding on the m second data streams to obtain m encoded data streams, where information data whose length is K symbols in each of the encoded data streams is from at most K different codewords, and $K \geq p*4$.

In some embodiments, the performing convolutional interleaving on one first data stream to obtain one second data stream includes: delaying one first data stream based on p delay lines to obtain one second data stream, where p is an integer greater than 1, a quantity of storage units included in each delay line is different, a delay line with a smallest quantity of storage units includes 0 storage units, and a difference between quantities of storage units of every two adjacent delay lines is Q; and each storage unit is configured to store 34 bits, bits in each lane data stream are sequentially input to the p delay lines based on sequence numbers of the p delay lines, 34 bits are input to each delay line for a single time and 34 bits are output from each delay line for a single time, and p*34 consecutive bits in one second data stream include the 34 bits output from the delay line; or each storage unit is configured to store 68 bits, bits in each lane data stream are sequentially input to the p delay lines based on sequence numbers of the p delay lines, 68 bits are input to each delay line for a single time and 68 bits are output from each delay line for a single time, and p*68 consecutive bits in one second data stream include the 68 bits output from the delay line.

In some embodiments, p=2 and each storage unit is configured to store 68 bits, or p=4 and each storage unit is configured to store 34 bits.

According to a sixth aspect, this application provides a data processing apparatus. The data processing apparatus includes a block interleaver and a convolution interleaver. The block interleaver is configured to perform block interleaving on every t lane data streams of n lane data streams to obtain s first data streams, so as to obtain a total of m first data streams. n=q*t, m=q*s, n is an integer greater than 1, n can be exactly divided by q, q is an integer greater than or equal to 1, t is an integer greater than or equal to 1, and s is an integer greater than or equal to 1. First forward error correction FEC encoding is performed on all the n lane data streams, every a codewords obtained through the first FEC encoding are distributed in b lane data streams, a≤b≤n, n can be exactly divided by b, and a is an integer greater than or equal to 1. Every a consecutive symbols in each lane data stream are from a different codewords, every L1 consecutive symbols in each lane data stream are from at least a different codewords, L1=N*a/b, and N represents a length of the codeword. The t lane data streams include a total of t*a symbols (a consecutive symbols in each lane data stream), the t*a symbols include a total of D bits (4 bits in each symbol, and D=Δ*t*a), the D bits are consecutive in any one of the s first data streams, Δ=M/s, and M represents a quantity of bits included in one symbol. The convolution interleaver is configured to separately perform convolutional interleaving on the m first data streams to obtain m second data streams.

In some embodiments, every d consecutive symbols in each first data stream are from v different codewords, every L2 consecutive symbols in each first data stream are from at least v different codewords, v can be exactly divided by a, L2=t/s*L1, and d=D/M.

In some embodiments, n=32, 16 lane data streams in odd-numbered lanes of the n lane data streams are from same codewords, 16 lane data streams in even-numbered lanes of the n lane data streams are from same codewords, and the data stream in the odd-numbered lane of the n lane data streams and the data stream in the even-numbered lane of the n lane data streams are from different codewords.

In some embodiments, t=2, s=1, and the block interleaver is specifically configured to: perform block interleaving on a $(2*i)^{th}$ lane data stream and a $(2*i+1)^{th}$ lane data stream to obtain one first data stream, where 0≤i≤16. Two consecutive symbols in the $(2*i)^{th}$ lane data stream and two consecutive symbols in the $(2*i+1)^{th}$ lane data stream are consecutive in the first data stream obtained through the block interleaving, and every four consecutive symbols in the first data stream obtained through the block interleaving are from four different codewords.

In some embodiments, a $j^{th}$ bit in 40 consecutive bits in the first data stream obtained $$\left(\left\lfloor\left\lfloor\frac{j}{\beta}\right\rfloor/2\right\rfloor*\beta+j\%\beta\right)^{th}$$

through the block interleaving is from a $$\left(2*i+\left\lfloor\frac{j}{\beta}\right\rfloor\%2\right)^{th}$$

lane data stream, $\lfloor x\rfloor$ represents rounding down, 0≤j<40, and β is 1, 2, 4, 5, 10, or 20.

In some embodiments, t=2, s=1, and the block interleaver is specifically configured to: perform block interleaving on a $(2*i)^{th}$ lane data stream and a $(2*i+1)^{th}$ lane data stream to obtain one first data stream, where 0≤i<16. A $j^{th}$ group of consecutive β bits in the $(2*i)^{th}$ lane data stream and a $j^{th}$ group of consecutive β bits in the $(2*i+1)^{th}$ lane data stream are consecutive in the first data stream obtained through the block interleaving, j≥0, β is 1, 2, 4, 5, 10, or 20, and every four consecutive symbols in the first data stream obtained through the block interleaving are from four different codewords.

In some embodiments, t=2, s=2, and the block interleaver is specifically configured to: perform block interleaving on a $(2*i)^{th}$ lane data stream and a $(2*i+1)^{th}$ lane data stream to obtain a $(2*i)^{th}$ first data stream and a $(2*i+1)^{th}$ first data stream, where 0≤i<16. A total of 20 bits (five bits in each of four symbols: two consecutive symbols in the $(2*i)^{th}$ lane data stream and two consecutive symbols in the $(2*i+1)^{th}$ lane data stream) are consecutive in the $(2*i)^{th}$ first data stream, every 20 consecutive bits in the $(2*i)^{th}$ first data stream are from four different codewords, a total of 20 bits (the other five bits in each of the four symbols: two consecutive symbols in the $(2*i)^{th}$ lane data stream and two consecutive symbols in the $(2*i+1)^{th}$ lane data stream) are consecutive in the $(2*i+1)^{th}$ first data stream, and every 20 consecutive bits in the $(2*i+1)^{th}$ first data stream are from four different codewords.

In some embodiments, an $f^{th}$ bit in 20 consecutive bits in a $(2*i+g)^{th}$ first data stream is from a $$\left(5*g+\left\lfloor\frac{f\%10}{5}\right\rfloor*10+f\%5\right)^{th}$$

bit in 20 consecutive bits in a $$\left(2*i+\left\lfloor\frac{f}{10}\right\rfloor\right)^{th}$$

lane data stream, 0≤f<20, and 0≤g<2.

In some embodiments, an $f^{th}$ bit in 20 consecutive bits in a $(2*i+g)^{th}$ first data stream is from a $$\left(5*g+\left\lfloor\frac{f}{10}\right\rfloor*10+f\%5\right)^{th}$$

bit in 20 consecutive bits in a $$\left(2*i+\left\lfloor\frac{f}{5}\right\rfloor\%2\right)^{th}$$

lane data stream, 0≤f<20, and 0≤g<2.

In some embodiments, t=4, s=1, and the block interleaver is specifically configured to: perform block interleaving on a total of four lane data streams: a $(4*i)^{th}$ lane data stream, a $(4*i+1)^{th}$ lane data stream, a $(4*i+2)^{th}$ lane data stream, and a $(4*i+3)^{th}$ lane data stream, to obtain one first data stream, where 0≤i≤7, a total of eight symbols (two consecutive symbols included in each of the four lane data streams) are consecutive in the first data stream obtained through the block interleaving, every eight consecutive symbols in the first data stream obtained through the block interleaving are from at least four different codewords, every 272 consecutive symbols are from at least four different codewords, a $0^{th}$ symbol, a $1^{st}$ symbol, a $2^{nd}$ symbol, and a $3^{rd}$ symbol in every eight consecutive symbols in the first data stream obtained through the block interleaving are from different codewords, and a $4^{th}$ symbol, a $5^{th}$ symbol, a $6^{th}$ symbol, and a $7^{th}$ symbol in every eight consecutive symbols in the first data stream obtained through the block interleaving are from different codewords.

In some embodiments, t=4, s=1, and the block interleaver is specifically configured to: perform block interleaving on a total of four lane data streams: a $(4*i)^{th}$ lane data stream, a $(4*i+1)^{th}$ lane data stream, a $(4*i+2)^{th}$ lane data stream, and a $(4*i+3)^{th}$ lane data stream, to obtain one first data stream, where $0 \le i \le 7$, a total of eight symbols (a $j^{th}$ group of two consecutive symbols included in each of the four lane data streams) are consecutive in the first data stream obtained through the block interleaving, the $j^{th}$ group of two consecutive symbols included in each of the four lane data streams are consecutive in the first data stream obtained through the block interleaving, $j \ge 0$, every eight consecutive symbols in the first data stream obtained through the block interleaving are from at least four different codewords, every 272 consecutive symbols are from at least four different codewords, a $0^{th}$ symbol, a $1^{st}$ symbol, a $2^{nd}$ symbol, and a $3^{rd}$ symbol in every eight consecutive symbols in the first data stream obtained through the block interleaving are from different codewords, and a $4^{th}$ symbol, a $5^{th}$ symbol, a $6^{th}$ symbol, and a $7^{th}$ symbol in every eight consecutive symbols in the first data stream obtained through the block interleaving are from different codewords.

In some embodiments, t=4, s=1, and the block interleaver is specifically configured to: perform block interleaving on a total of four lane data streams: a $(4*i)^{th}$ lane data stream, a $(4*i+1)^{th}$ lane data stream, a $(4*i+2)^{th}$ lane data stream, and a $(4*i+3)^{th}$ lane data stream, to obtain one first data stream, where $0 \le i \le 7$, a total of four symbols (a $j^{th}$ symbol included in each of the four lane data streams) are consecutive in the first data stream obtained through the block interleaving, $j \ge 0$, and every four consecutive symbols in the first data stream obtained through the block interleaving are from four different codewords.

In some embodiments, t=8, s=1, and the block interleaver is specifically configured to: perform block interleaving on a total of eight lane data streams: an $(8*i)^{th}$ lane data stream, an $(8*i+1)^{th}$ lane data stream, an $(8*i+2)^{th}$ lane data stream, an $(8*i+3)^{th}$ lane data stream, an $(8*i+4)^{th}$ lane data stream, an $(8*i+5)^{th}$ lane data stream, an $(8*i+6)^{th}$ lane data stream, and an $(8*i+7)^{th}$ lane data stream, to obtain one first data stream, where $0 \le i \le 3$, a total of 16 symbols (two consecutive symbols included in each of the eight lane data streams) are consecutive in the first data stream obtained through the block interleaving, every 16 consecutive symbols in the first data stream obtained through the block interleaving are from at least four different codewords, every 544 consecutive symbols are from at least four different codewords, a $0^{th}$ symbol, a $1^{st}$ symbol, a $2^{nd}$ symbol, and a $3^{rd}$ symbol in every 16 consecutive symbols in the first data stream obtained through the block interleaving are from different codewords, a $4^{th}$ symbol, a $5^{th}$ symbol, a $6^{th}$ symbol, and a $7^{th}$ symbol in every 16 consecutive symbols in the first data stream obtained through the block interleaving are from different codewords, an $8^{th}$ symbol, a $9^{th}$ symbol, a $10^{th}$ symbol, and an $11^{th}$ symbol in every 16 consecutive symbols in the first data stream obtained through the block interleaving are from different codewords, and a $12^{th}$ symbol, a $13^{th}$ symbol, a $14^{th}$ symbol, and a $15^{th}$ symbol in every 16 consecutive symbols in the first data stream obtained through the block interleaving are from different codewords.

In some embodiments, t=8, s=1, and the block interleaver is specifically configured to: perform block interleaving on a total of eight lane data streams: an $(8*i)^{th}$ lane data stream, an $(8*i+1)^{th}$ lane data stream, an $(8*i+2)^{th}$ lane data stream, an $(8*i+3)^{th}$ lane data stream, an $(8*i+4)^{th}$ lane data stream, an $(8*i+5)^{th}$ lane data stream, an $(8*i+6)^{th}$ lane data stream, and an $(8*i+7)^{th}$ lane data stream, to obtain one first data stream, where $0 \le i \le 3$, a total of 16 symbols (a $j^{th}$ group of two consecutive symbols included in each of the eight lane data streams) are consecutive in the first data stream obtained through the block interleaving, a $j^{th}$ group of two consecutive symbols included in each of the eight lane data streams are consecutive in the first data stream obtained through the block interleaving, $j \ge 0$, every 16 consecutive symbols in the first data stream obtained through the block interleaving are from at least four different codewords, every 544 consecutive symbols are from at least four different codewords, a $0^{th}$ symbol, a $1^{st}$ symbol, a $2^{nd}$ symbol, and a $3^{rd}$ symbol in every 16 consecutive symbols in the first data stream obtained through the block interleaving are from different codewords, a $4^{th}$ symbol, a $5^{th}$ symbol, a $6^{th}$ symbol, and a $7^{th}$ symbol in every 16 consecutive symbols in the first data stream obtained through the block interleaving are from different codewords, an $8^{th}$ symbol, a $9^{th}$ symbol, a $10^{th}$ symbol, and an $11^{th}$ symbol in every 16 consecutive symbols in the first data stream obtained through the block interleaving are from different codewords, and a $12^{th}$ symbol, a $13^{th}$ symbol, a $14^{th}$ symbol, and a $15^{th}$ symbol in every 16 consecutive symbols in the first data stream obtained through the block interleaving are from different codewords.

In some embodiments, t=8, s=1, and the block interleaver is specifically configured to: perform block interleaving on a total of eight lane data streams: an $(8*i)^{th}$ lane data stream, an $(8*i+1)^{th}$ lane data stream, an $(8*i+2)^{th}$ lane data stream, an $(8*i+3)^{th}$ lane data stream, an $(8*i+4)^{th}$ lane data stream, an $(8*i+5)^{th}$ lane data stream, an $(8*i+6)^{th}$ lane data stream, and an $(8*i+7)^{th}$ lane data stream, to obtain one first data stream, where $0 \le i \le 3$, a total of eight symbols (a $j^{th}$ symbol included in each of the eight lane data streams) are consecutive in the first data stream obtained through the block interleaving, $j \ge 0$, every eight consecutive symbols in the first data stream obtained through the block interleaving are from four different codewords, a $0^{th}$ symbol, a $1^{st}$ symbol, a $2^{nd}$ symbol, and a $3^{rd}$ symbol in every eight consecutive symbols in the first data stream obtained through the block interleaving are from different codewords, and a $4^{th}$ symbol, a $5^{th}$ symbol, a $6^{th}$ symbol, and a $7^{th}$ symbol in every eight consecutive symbols in the first data stream obtained through the block interleaving are from different codewords.

In some embodiments, n=32, 16 consecutive lane data streams sorted in the front of the n lane data streams are from same codewords, 16 consecutive lane data streams sorted in the back of the n lane data streams are from same codewords, and the 16 consecutive lane data streams sorted in the front of the n lane data streams and the 16 consecutive lane data streams sorted in the back of the n lane data streams are from different codewords.

In some embodiments, t=2, s=1, and the block interleaver is specifically configured to: perform block interleaving on an $i^{th}$ lane data stream and an $(i+16)^{th}$ lane data stream to obtain one first data stream, where $0 \le i < 16$. Two consecutive symbols in the $i^{th}$ lane data stream and two consecutive symbols in the $(i+16)^{th}$ lane data stream are consecutive in the first data stream obtained through the block interleaving, and every four consecutive symbols in the first data stream obtained through the block interleaving are from four different codewords.

In some embodiments, a $j^{th}$ bit in 40 consecutive bits in the first data stream obtained through the block interleaving is from a $$\left(\left\lfloor\left\lfloor\frac{j}{\beta}\right\rfloor/2\right\rfloor * \beta + j\,\%\,\beta\right)^{th}$$

bit in 20 consecutive bits in a $$\left(2*i+\left\lfloor\frac{j}{\beta}\right\rfloor\%\,2\right)^{th}$$

lane data stream, $\lfloor x \rfloor$ represents rounding down, $0 \le j < 40$, and $\beta$ is 1, 2, 4, 5, 10, or 20.

In some embodiments, t=2, s=1, and the block interleaver is specifically configured to: perform block interleaving on an $i^{th}$ lane data stream and an $(i+16)^{th}$ lane data stream to obtain one first data stream, where $0 \le i < 16$. A $j^{th}$ group of consecutive $\beta$ bits in the $i^{th}$ lane data stream and a $j^{th}$ group of consecutive $\beta$ bits in the $(i+16)^{th}$ lane data stream are consecutive in the first data stream obtained through the block interleaving, $j \ge 0$, $\beta$ is 1, 2, 4, 5, 10, or 20, and every four consecutive symbols in the first data stream obtained through the block interleaving are from four different codewords.

In some embodiments, t=2, s=2, and the block interleaver is specifically configured to: perform block interleaving on an $i^{th}$ lane data stream and an $(i+16)^{th}$ lane data stream to obtain a $(2*i)^{th}$ first data stream and a $(2*i+1)^{th}$ first data stream, where $0 \le i < 16$. A total of 20 bits (five bits in each of four symbols: two consecutive symbols in the $i^{th}$ lane data stream and two consecutive symbols in the $(i+16)^{th}$ lane data stream) are consecutive in the $(2*i)^{th}$ first data stream, every 20 consecutive bits in the $(2*i)^{th}$ first data stream are from four different codewords, a total of 20 bits (the other five bits in each of the four symbols: two consecutive symbols in the $i^{th}$ lane data stream and two consecutive symbols in the $(i+16)^{th}$ lane data stream) are consecutive in the $(2*i+1)^{th}$ first data stream, and every 20 consecutive bits in the $(2*i+1)^{th}$ first data stream are from four different codewords.

In some embodiments, an $f^{th}$ bit in 20 consecutive bits in a $(2*i+g)^{th}$ first data stream is from a $$\left(5*g+\left\lfloor\frac{f\,\%\,10}{5}\right\rfloor*10+f\,\%\,5\right)^{th}$$

bit in 20 consecutive bits in a $$\left(i+16*\left\lfloor\frac{f}{10}\right\rfloor\right)^{th}$$

lane data stream, $0 \le f < 20$, and $0 \le g < 2$.

In some embodiments, an $f^{th}$ bit in 20 consecutive bits in a $(2*i+g)^{th}$ first data stream is from a $$\left(5*g+\left\lfloor\frac{f}{10}\right\rfloor*10+f\,\%\,5\right)^{th}$$

bit in 20 consecutive bits in a $$\left(i+16*\left\lfloor\frac{f}{10}\right\rfloor\right)^{th}$$

lane data stream, $0 \le f < 20$, and $0 \le g < 2$.

In some embodiments, t=4, s=1, and the block interleaver is specifically configured to: perform block interleaving on a total of four lane data streams: a $(2*i)^{th}$ lane data stream, a $(2*i+1)^{th}$ lane data stream, a $(2*i+16)^{th}$ lane data stream, and a $(2*i+17)^{th}$ lane data stream, to obtain one first data stream, where $0 \le i \le 7$, a total of eight symbols (two consecutive symbols included in each of the four lane data streams) are consecutive in the first data stream obtained through the block interleaving, every eight consecutive symbols in the first data stream obtained through the block interleaving are from at least four different codewords, every 272 consecutive symbols are from at least four different codewords, a $0^{th}$ symbol, a $1^{st}$ symbol, a $2^{nd}$ symbol, and a $3^{rd}$ symbol in every eight consecutive symbols in the first data stream obtained through the block interleaving are from different codewords, and a $4^{th}$ symbol, a $5^{th}$ symbol, a $6^{th}$ symbol, and a $7^{th}$ symbol in every eight consecutive symbols in the first data stream obtained through the block interleaving are from different codewords.

In some embodiments, t=4, s=1, and the block interleaver is specifically configured to: perform block interleaving on a total of four lane data streams: a $(2*i)^{th}$ lane data stream, a $(2*i+1)^{th}$ lane data stream, a $(2*i+16)^{th}$ lane data stream, and a $(2*i+17)^{th}$ lane data stream, to obtain one first data stream, where $0 \le i \le 7$, a total of eight symbols (a $j^{th}$ group of two consecutive symbols included in each of the four lane data streams) are consecutive in the first data stream obtained through the block interleaving, the $j^{th}$ group of two consecutive symbols included in each of the four lane data streams are consecutive in the first data stream obtained through the block interleaving, $j \ge 0$, every eight consecutive symbols in the first data stream obtained through the block interleaving are from at least four different codewords, every 272 consecutive symbols are from at least four different codewords, a $0^{th}$ symbol, a $1^{st}$ symbol, a $2^{nd}$ symbol, and a $3^{rd}$ symbol in every eight consecutive symbols in the first data stream obtained through the block interleaving are from different codewords, and a $4^{th}$ symbol, a $5^{th}$ symbol, a $6^{th}$ symbol, and a $7^{th}$ symbol in every eight consecutive symbols in the first data stream obtained through the block interleaving are from different codewords.

In some embodiments, t=4, s=1, and the block interleaver is specifically configured to: perform block interleaving on a total of four lane data streams: a $(2*i)^{th}$ lane data stream, a $(2*i+1)^{th}$ lane data stream, a $(2*i+16)^{th}$ lane data stream, and a $(2*i+17)^{th}$ lane data stream, to obtain one first data stream, where $0 \le i \le 7$, a total of four symbols (a $j^{th}$ symbol included in each of the four lane data streams) are consecutive in the first data stream obtained through the block interleaving, $j \ge 0$, and every four consecutive symbols in the first data stream obtained through the block interleaving are from four different codewords.

In some embodiments, t=8, s=1, and the block interleaver is specifically configured to: perform block interleaving on a total of eight lane data streams: a $(4*i)^{th}$ lane data stream, a $(4*i+1)^{th}$ lane data stream, a $(4*i+2)^{th}$ lane data stream, a $(4*i+3)^{th}$ lane data stream, a $(4*i+16)^{th}$ lane data stream, a $(4*i+17)^{th}$ lane data stream, a $(4*i+18)^{th}$ lane data stream, and a $(4*i+19)^{th}$ lane data stream, to obtain one first data stream, where $0 \le i \le 3$, a total of 16 symbols (two consecutive symbols included in each of the eight lane data streams) are consecutive in the first data stream obtained through the block interleaving, every 16 consecutive symbols in the first data stream obtained through the block interleaving are from at least four different codewords, every 544 consecutive symbols are from at least four different codewords, a $0^{th}$ symbol, a $1^{st}$ symbol, a $2^{nd}$ symbol, and a $3^{rd}$ symbol in every 16 consecutive symbols in the first data stream obtained through the block interleaving are from different codewords, a $4^{th}$ symbol, a $5^{th}$ symbol, a $6^{th}$ symbol, and a $7^{th}$ symbol in every 16 consecutive symbols in the first data stream obtained through the block interleaving are from different codewords, an $8^{th}$ symbol, a $9^{th}$ symbol, a $10^{th}$ symbol, and an $11^{th}$ symbol in every 16 consecutive symbols in the first data stream obtained through the block interleaving are from different codewords, and a $12^{th}$ symbol, a $13^{th}$ symbol, a $14^{th}$ symbol, and a $15^{th}$ symbol in every 16 consecutive symbols in the first data stream obtained through the block interleaving are from different codewords.

In some embodiments, $t=8$, $s=1$, and the block interleaver is specifically configured to: perform block interleaving on a total of eight lane data streams: a $(4*i)^{th}$ lane data stream, a $(4*i+1)^{th}$ lane data stream, a $(4*i+2)^{th}$ lane data stream, a $(4*i+3)^{th}$ lane data stream, a $(4*i+16)^{th}$ lane data stream, a $(4*i+17)^{th}$ lane data stream, a $(4*i+18)^{th}$ lane data stream, and a $(4*i+19)^{th}$ lane data stream, to obtain one first data stream, where $0 \le i \le 3$, a total of 16 symbols (a $j^{th}$ group of two consecutive symbols included in each of the eight lane data streams) are consecutive in the first data stream obtained through the block interleaving, a $j^{th}$ group of two consecutive symbols included in each of the eight lane data streams are consecutive in the first data stream obtained through the block interleaving, $j \ge 0$, every 16 consecutive symbols in the first data stream obtained through the block interleaving are from at least four different codewords, every 544 consecutive symbols are from at least four different codewords, a $0^{th}$ symbol, a $1^{st}$ symbol, a $2^{nd}$ symbol, and a $3^{rd}$ symbol in every 16 consecutive symbols in the first data stream obtained through the block interleaving are from different codewords, a $4^{th}$ symbol, a $5^{th}$ symbol, a $6^{th}$ symbol, and a $7^{th}$ symbol in every 16 consecutive symbols in the first data stream obtained through the block interleaving are from different codewords, an $8^{th}$ symbol, a $9^{th}$ symbol, a $10^{th}$ symbol, and an $11^{th}$ symbol in every 16 consecutive symbols in the first data stream obtained through the block interleaving are from different codewords, and a $12^{th}$ symbol, a $13^{th}$ symbol, a $14^{th}$ symbol, and a $15^{th}$ symbol in every 16 consecutive symbols in the first data stream obtained through the block interleaving are from different codewords.

In some embodiments, $t=8$, $s=1$, and the block interleaver is specifically configured to: perform block interleaving on a total of eight lane data streams: a $(4*i)^{th}$ lane data stream, a $(4*i+1)^{th}$ lane data stream, a $(4*i+2)^{th}$ lane data stream, a $(4*i+3)^{th}$ lane data stream, a $(4*i+16)^{th}$ lane data stream, a $(4*i+17)^{th}$ lane data stream, a $(4*i+18)^{th}$ lane data stream, and a $(4*i+19)^{th}$ lane data stream, to obtain one first data stream, where $0 \le i \le 3$, a total of eight symbols (a $j^{th}$ symbol included in each of the eight lane data streams) are consecutive in the first data stream obtained through the block interleaving, $j \ge 0$, every eight consecutive symbols in the first data stream obtained through the block interleaving are from at least four different codewords, a $0^{th}$ symbol, a $1^{st}$ symbol, a $2^{nd}$ symbol, and a $3^{rd}$ symbol in every eight consecutive symbols in the first data stream obtained through the block interleaving are from different codewords, and a $4^{th}$ symbol, a $5^{th}$ symbol, a $6^{th}$ symbol, and a $7^{th}$ symbol in every eight consecutive symbols in the first data stream obtained through the block interleaving are from different codewords.

In some embodiments, the convolution interleaver is specifically configured to: delay one first data stream based on p delay lines to obtain one second data stream, where p is an integer greater than 1, a quantity of storage units included in each delay line is different, a delay line with a smallest quantity of storage units includes 0 storage units, a difference between quantities of storage units of every two adjacent delay lines is Q, each storage unit is configured to store d symbols, symbols in each lane data stream are sequentially input to the p delay lines based on sequence numbers of the p delay lines, d symbols are input to each delay line for a single time and d symbols are output from the delay line for a single time, $p*d$ consecutive symbols in the second data stream include the d symbols output from the delay line, and Q is an integer greater than or equal to 1.

In some embodiments, a delay line with a largest sequence number in the p delay lines includes 0 storage units, $d(p*Q+1) \ge L2$, and $L2=t/s*L1$; or a delay line with a smallest sequence number in the p delay lines includes 0 storage units, $d(p*Q-1) \ge L2$, and $L2=t/s*L1$.

In some embodiments, the data processing apparatus further includes an encoder. After the m second data streams are obtained, the encoder is configured to: separately perform second FEC encoding on the m second data streams to obtain m encoded data streams. Information data whose length is K symbols in each of the encoded data streams is from at most K different codewords, and $K \ge p*d$.

In some embodiments, the convolution interleaver is specifically configured to: delay one first data stream based on p delay lines to obtain one second data stream, where p is an integer greater than 1, a quantity of storage units included in each delay line is different, a delay line with a smallest quantity of storage units includes 0 storage units, a difference between quantities of storage units of every two adjacent delay lines is Q, each storage unit is configured to store four symbols, symbols in each lane data stream are sequentially input to the p delay lines based on sequence numbers of the p delay lines, four symbols are input to each delay line for a single time and four symbols are output from the delay line for a single time, $p*4$ consecutive symbols in the second data stream include the four symbols output from the delay line, and Q satisfies $4(p*Q-1) \ge 272$, $4(p*Q+1) \ge 272$, $4(p*Q-1) \ge 544$, or $4(p*Q+1) \ge 544$.

In some embodiments, the data processing apparatus further includes an encoder. After the m second data streams are obtained, the encoder is configured to: separately perform second FEC encoding on the m second data streams to obtain m encoded data streams, where information data whose length is K symbols in each of the encoded data streams is from at most K different codewords, and $K \ge p*4$.

In some embodiments, the convolution interleaver is specifically configured to: delay one first data stream based on p delay lines to obtain one second data stream, where p is an integer greater than 1, a quantity of storage units included in each delay line is different, a delay line with a smallest quantity of storage units includes 0 storage units, and a difference between quantities of storage units of every two adjacent delay lines is Q. Each storage unit is configured to store 34 bits, bits in each lane data stream are sequentially input to the p delay lines based on sequence numbers of the p delay lines, 34 bits are input to each delay line for a single time and 34 bits are output from each delay line for a single time, and p*34 consecutive bits in one second data stream include the 34 bits output from the delay line; or each storage unit is configured to store 68 bits, bits in each lane data stream are sequentially input to the p delay lines based on sequence numbers of the p delay lines, 68 bits are input to each delay line for a single time and 68 bits are output from each delay line for a single time, and p*68 consecutive bits in one second data stream include the 68 bits output from the delay line.

In some embodiments, p=2 and each storage unit is configured to store 68 bits, or p=4 and each storage unit is configured to store 34 bits.

According to a seventh aspect, this application provides a data processing method. The method includes the following blocks. First, n lane data streams are separately delayed based on p delay lines to obtain n first data streams. First forward error correction FEC encoding is performed on all the n lane data streams, p is an integer greater than 1, a quantity of storage units included in each delay line is different, a delay line with a smallest quantity of storage units includes 0 storage units, a difference between quantities of storage units of every two adjacent delay lines is Q, each storage unit is configured to store U bits, bits in each lane data stream are sequentially input to the p delay lines based on sequence numbers of the p delay lines, U bits are input to each delay line for a single time and U bits are output from the delay line for a single time, p*U consecutive bits in one second data stream include the U bits output from the delay line, Q is an integer greater than or equal to 1, and U is an integer greater than or equal to 1. Then, second FEC encoding is separately performed on the n first data streams to obtain n second data streams. Information data of each codeword in the second data streams obtained through the second FEC encoding is p*U bits output from the p delay lines for a single time.

In some embodiments, p*U=120, 136, or 160.

According to an eighth aspect, this application provides a data processing apparatus, and the data processing apparatus includes a convolution interleaver and an encoder. The convolution interleaver is configured to separately delay n lane data streams based on p delay lines to obtain n first data streams. First forward error correction FEC encoding is performed on all the n lane data streams, p is an integer greater than 1, a quantity of storage units included in each delay line is different, a delay line with a smallest quantity of storage units includes 0 storage units, a difference between quantities of storage units of every two adjacent delay lines is Q, each storage unit is configured to store U bits, bits in each lane data stream are sequentially input to the p delay lines based on sequence numbers of the p delay lines, U bits are input to each delay line for a single time and U bits are output from the delay line for a single time, p*U consecutive bits in one second data stream include the U bits output from the delay line, Q is an integer greater than or equal to 1, and U is an integer greater than or equal to 1. Then, the encoder is configured to separately perform second FEC encoding on the n first data streams to obtain n second data streams. Information data of each codeword in the second data streams obtained through the second FEC encoding is p*U bits output from the p delay lines for a single time.

In some embodiments, p*U=120, 136, or 160.

According to a ninth aspect, this application provides a computer-readable storage medium. The computer-readable storage medium stores a computer program. When the computer program is executed by hardware, some or all blocks of any method in the first aspect, the third aspect, the fifth aspect, or the seventh aspect can be implemented.

In embodiments of this application, all the n lane data streams are the outer-code encoded codeword streams. The convolutional interleaving is separately performed on the n data streams, the data stream multiplexing is performed on the n data streams obtained through the convolutional interleaving, to obtain the m second data streams, and then the inner-code encoding is performed. According to the data interleaving and multiplexing processing solution provided in this application, the following case can be implemented with a short latency: The plurality of symbols consecutively output from the m multiplexed data streams are from a plurality of different outer-code codewords, so that the concatenated FEC solution helps reduce the data interleaving latency while ensuring the good performance. In other words, in this application, the solution of the combination of the convolutional interleaving and the data multiplexing can reduce the overall latency of the concatenated FEC solution, and is more applicable to the application scenario requiring the low latency.

BRIEF DESCRIPTION OF DRAWINGS

FIG. 10 is a schematic flowchart of a data processing method according to an embodiment of this application;

FIG. 11 is a schematic diagram of a structure in which convolutional interleaving is separately performed on n lane data streams according to an embodiment of this application;

FIG. 12(*b*) is a schematic diagram of a second structure of a convolution interleaver according to an embodiment of this application;

FIG. 16(*b*) is a schematic diagram of a fourth structure of a convolution interleaver according to an embodiment of this application;

FIG. 17(*b*) is a schematic diagram of a third structure of a multiplexer according to an embodiment of this application;

FIG. 17(*c*) is a schematic diagram of a fourth structure of a multiplexer according to an embodiment of this application;

FIG. 18(*b*) is a schematic diagram of a sixth structure of a convolution interleaver according to an embodiment of this application;

FIG. 19(*a*) is a schematic diagram of a seventh structure of a convolution interleaver according to an embodiment of this application;

FIG. 19(*b*) is a schematic diagram of an eighth structure of a convolution interleaver according to an embodiment of this application;

FIG. 27(*a*) is a schematic diagram of a fourteenth structure of a convolution interleaver according to an embodiment of this application;

FIG. 27(*b*) is a schematic diagram of a fifteenth structure of a convolution interleaver according to an embodiment of this application;

FIG. 28(*b*) is a schematic diagram of a seventeenth structure of a convolution interleaver according to an embodiment of this application;

FIG. 29(*b*) is a schematic diagram of a nineteenth structure of a convolution interleaver according to an embodiment of this application;

FIG. 30(*b*) is a schematic diagram of a twenty-first structure of a convolution interleaver according to an embodiment of this application;

FIG. 31(*b*) is a schematic diagram of a twenty-third structure of a convolution interleaver according to an embodiment of this application;

FIG. 32(*b*) is a schematic diagram of a structure of a block interleaver according to an embodiment of this application;

FIG. 42 is another schematic flowchart of interleaving according to an embodiment of this application;

FIG. 43 is a schematic diagram of an embodiment of performing first block interleaving according to an embodiment of this application;

FIG. 44(*b*) is a schematic diagram of a specific implementation of performing second block interleaving according to an embodiment of this application;

FIG. 45(*b*) is a schematic diagram of an embodiment of convolutional interleaving;

FIG. 45(*c*) is a schematic diagram of another embodiment of convolutional interleaving;

FIG. 45(*d*) is a schematic diagram of an embodiment of second block interleaving;

FIG. 46(*b*) is a schematic diagram of another embodiment of convolutional interleaving;

FIG. 46(*c*) is a schematic diagram of another embodiment of second block interleaving;

FIG. 50(*b*) is a schematic diagram of another structure of a data processing apparatus according to an embodiment of this application;

FIG. 61 is a schematic diagram of still another application scenario of block interleaving according to an embodiment of this application;

FIG. 62 is a schematic diagram of still another application scenario of block interleaving according to an embodiment of this application;

FIG. 65 is a schematic diagram of still another application scenario of block interleaving according to an embodiment of this application;

FIG. 66 is a schematic diagram of still another application scenario of block interleaving according to an embodiment of this application;

FIG. 73 is a schematic diagram of a structure in which convolutional interleaving is separately performed on m first data streams according to an embodiment of this application;

FIG. 74 is a schematic diagram of an embodiment of a convolution interleaver according to an embodiment of this application;

DESCRIPTION OF EMBODIMENTS

Embodiments of this application provide a data processing method and a data processing apparatus, so that better performance of a concatenated FEC solution can be achieved in a scenario with a low latency. It should be noted that, the terms "first", "second", and the like in the specification, claims, and accompanying drawings of this application are intended to distinguish between similar objects but do not necessarily indicate a specific order or sequence. It should be understood that the foregoing terms are interchangeable in proper circumstances so that embodiments described in this application can be implemented in other orders than the order described in this application. Moreover, the terms "include", "have", or any other variant thereof are intended to cover non-exclusive inclusion. For example, processes, methods, systems, products, or devices that include a series of blocks or units are not limited to the blocks or the units that are clearly listed, and may include other blocks and units that are not clearly listed or that are inherent to the processes, methods, products, or devices.

Figure 1:
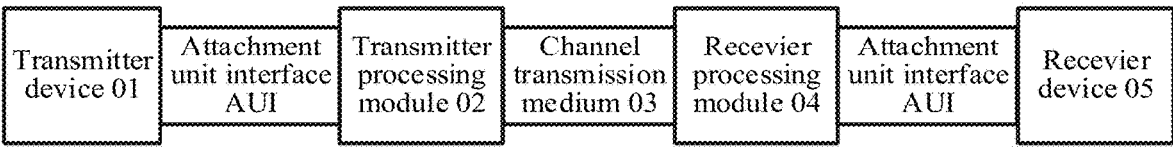
FIG. 1 is a schematic diagram of a communication system according to an embodiment of this application.

FIG. 1 is a schematic diagram of a communication system according to an embodiment of this application. As shown in FIG. 1, the communication system includes a transmitter device 01, a transmitter processing module 02, a channel transmission medium 03, a receiver processing module 04, and a receiver device 05. For example, the communication system is a data center network. The transmitter device 01 and the receiver device 05 may be devices such as a switch or a router, the transmitter device 01 is also referred to as a host chip located at a transmitter, the receiver device 05 is also referred to as a host chip located at a receiver, and the channel transmission medium 03 may be an optical fiber. The host chip is also referred to as a host device. The transmitter device 01 may be connected to the transmitter processing module 02 through an attachment unit interface (AUI), and the receiver device 05 may be connected to the receiver processing module 04 through an AUI. The transmitter processing module 02 and the receiver processing module 04 may each be an optical module, an electrical module, a connector, or another module that processes data in a data transmission process. For example, the processing module may be an 800LR module (which is a coherent optical module). In addition, the transmitter device 01, the transmitter processing module 02, the channel transmission medium 03, the receiver processing module 04, and the receiver device 05 in the communication system may all support bidirectional transmission or unidirectional transmission. This is not specifically limited herein.

Figure 2:
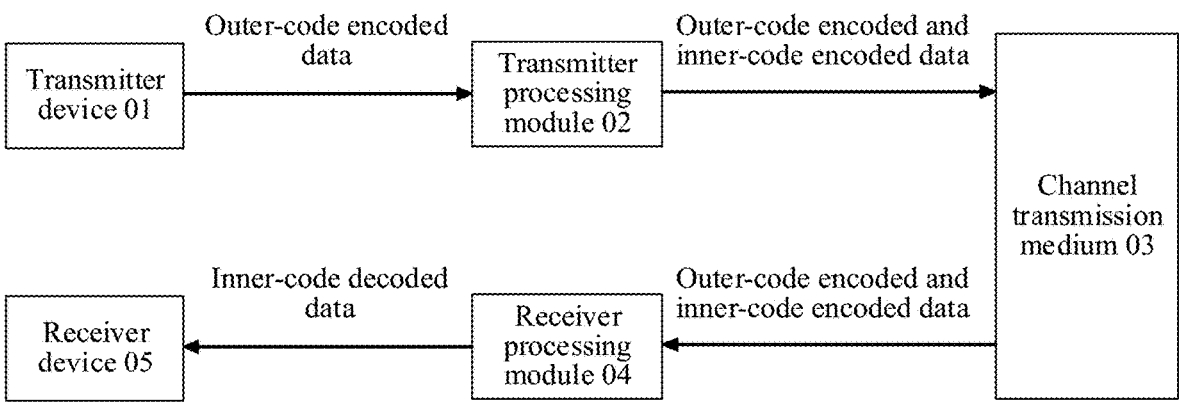
FIG. 2 is a schematic diagram of a data transmission process in the communication system shown in FIG. 1.

FIG. 2 is a schematic diagram of a data transmission process in the communication system shown in FIG. 1. As shown in FIG. 2, in a process of transmitting data from the transmitter device 01 to the receiver device 05, the transmitter device 01 is configured to perform outer-code encoding on the data, and then transmit outer-code encoded data to the transmitter processing module 02. The transmitter processing module 02 is configured to perform inner-code encoding on the outer-code encoded data, to obtain outer-code encoded and inner-code encoded data, and transmit the outer-code encoded and inner-code encoded data to the channel transmission medium 03. The channel transmission medium 03 is configured to transmit the outer-code encoded and inner-code encoded data to the receiver processing module 04. The receiver processing module 04 is configured to: perform inner-code decoding on the outer-code encoded and inner-code encoded data, and transmit inner-code decoded data to the receiver device 05. The receiver device 05 is configured to perform outer-code decoding on the inner-code decoded data.

It should be understood that the "inner" in inner code and the "outer" in outer code are distinguished based merely on a distance between an execution body that performs an operation on data and the channel transmission medium 03. An execution body that performs an operation on inner code is close to the channel transmission medium, and an execution body that performs an operation on outer code is far away from the channel transmission medium. In embodiments of this application, data is transmitted from the transmitter device 01 to the channel transmission medium 03 via the transmitter processing module 02, and then is transmitted from the channel transmission medium 03 to the receiver device 05 via the receiver processing module 04. A distance that the data encoded by the transmitter device 01 travels to the channel transmission medium 03 is longer than that of the data encoded by the transmitter processing module 02, and a distance that the data decoded by the receiver device 05 travels to the channel transmission medium 03 is longer than that of data decoded by the receiver processing module 04. Therefore, the data encoded by the transmitter device 01 is referred to as outer-code encoded data, the data encoded by the transmitter processing module 02 is referred to as inner-code encoded data, the data decoded by the receiver device 05 is referred to as outer-code decoded data, and data decoded by the receiver processing module 04 is referred to as inner-code decoded data. In an embodiment, both the inner-code encoding and the outer-code encoding use an FEC encoding manner, so as to form a concatenated FEC transmission solution. For example, the transmitter device 01 may perform the outer-code encoding by using RS code, and the transmitter processing module 02 may perform the inner-code encoding by using Hamming code. For another example, the transmitter device 01 may perform the outer-code encoding by using RS code, and the transmitter processing module 02 may perform the inner-code encoding by using Bose-Chaudhuri-Hocquenghem (BCH) code.

It should be noted that the foregoing content is example description of an application scenario of a data interleaving method provided in embodiments of this application, and does not constitute any limitation on application scenarios of the data interleaving method. A person of ordinary skill in the art may learn that, as a service requirement changes, application scenario of the data interleaving method may be adjusted depending on an application requirement. Application scenarios are not listed one by one in embodiments of this application.

For the foregoing concatenated FEC transmission solution, a data processing solution including "convolutional interleaving" and "multiplexing" is designed in this application, to implement good performance and a low latency of the overall concatenated FEC solution. Therefore, the concatenated FEC transmission solution can be applied to a plurality of transmission scenarios, and is particularly applicable to a transmission scenario that requires a low transmission latency, for example, a low-latency data center interconnection scenario. Data processing is implemented through the foregoing transmitter processing module 02.

Figure 3A:
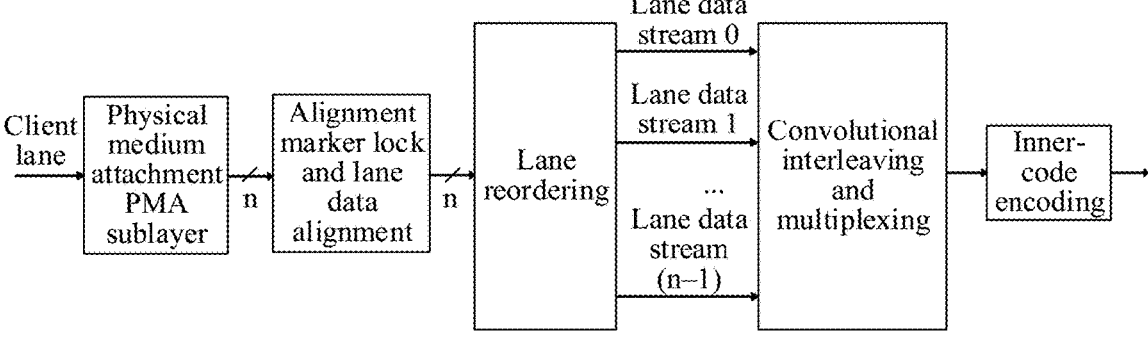
FIG. 3(a) is a schematic diagram of a first type of data processing by a transmitter processing module according to an embodiment of this application.

FIG. 3(a) is a schematic diagram of a first type of data processing by a transmitter processing module according to an embodiment of this application. As shown in FIG. 3(a), after processing data from a plurality of synchronous client lanes, a physical media attachment (PMA) sublayer of the transmitter processing module may obtain n outer-code encoded physical coding sublayer (PCS) or FEC lane data streams, and perform alignment marker lock (alignment lock) and lane data alignment to obtain n aligned lane data streams. Then, lane reordering (lane reorder) is performed on n lanes of data based on alignment markers, so that the n lanes of data can be arranged in a specified sequence. The n lane data streams obtained through lane reordering are sent to a designed processor including convolutional interleaving and multiplexing (muxing), for data sequence disordering, and then are sent to an inner-code encoder for inner-code encoding. After data processing is performed on inner-code encoded data streams, data processed data streams are sent to a channel transmission medium for transmission. The data processing may include modulation and mapping, channel interleaving, polarization distribution, DSP framing (framing), and the like. Herein, n is a positive integer greater than 1.

Figure 3B:
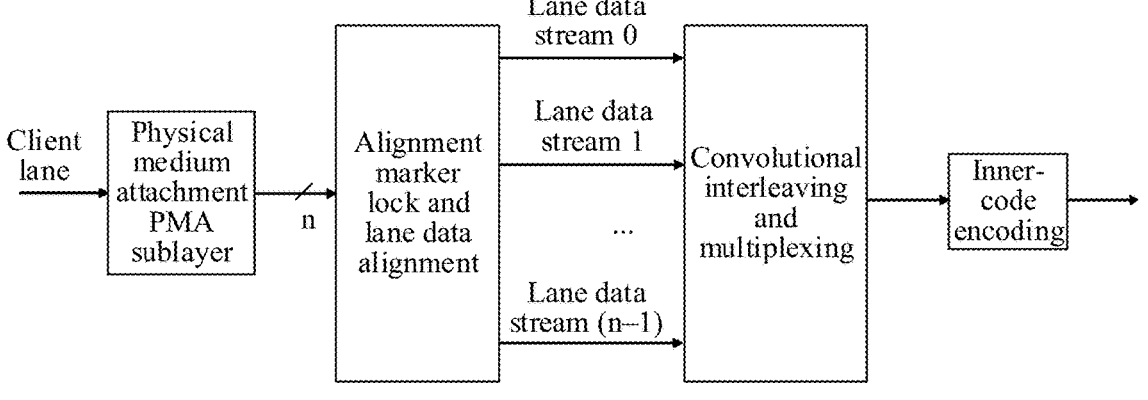
FIG. 3(b) is a schematic diagram of a second type of data processing by a transmitter processing module according to an embodiment of this application.

FIG. 3(b) is a schematic diagram of a second type of data processing by a transmitter processing module according to an embodiment of this application. As shown in FIG. 3(b), in some actual application scenarios, n aligned lane data streams obtained through lane data alignment has already been arranged in a specified sequence. In this case, lane reordering does not need to be performed, and the n aligned lane data streams are directly sent to a designed processor including convolutional interleaving and multiplexing, for interleaving and data sequence disordering, and then are sent to an inner-code encoder for inner-code encoding.

It should be understood that, in some embodiments, different from the data processing procedures described in FIG. 3(a) and FIG. 3(b), n aligned lane data streams obtained through lane data alignment may alternatively not be convolutionally interleaved, but are directly multiplexed, and are sent to an inner-code encoder for inner-code encoding.

Figure 3C:
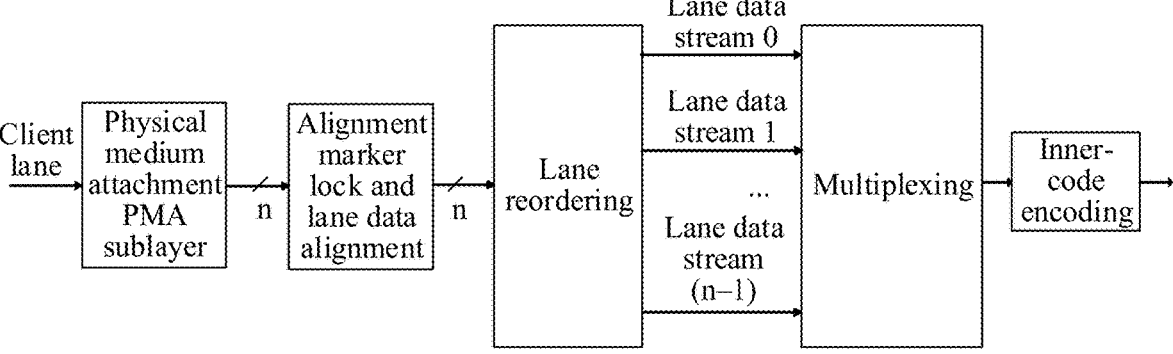
FIG. 3(c) is a schematic diagram of a third type of data processing by a transmitter processing module according to an embodiment of this application.

FIG. 3(c) is a schematic diagram of a third type of data processing by a transmitter processing module according to an embodiment of this application. As shown in FIG. 3(c), different from the data processing procedure shown in FIG. 3(a), n lane data streams obtained through lane reordering are not convolutionally interleaved, but are directly multiplexed, and are sent to an inner-code encoder for inner-code encoding.

Figure 3D:
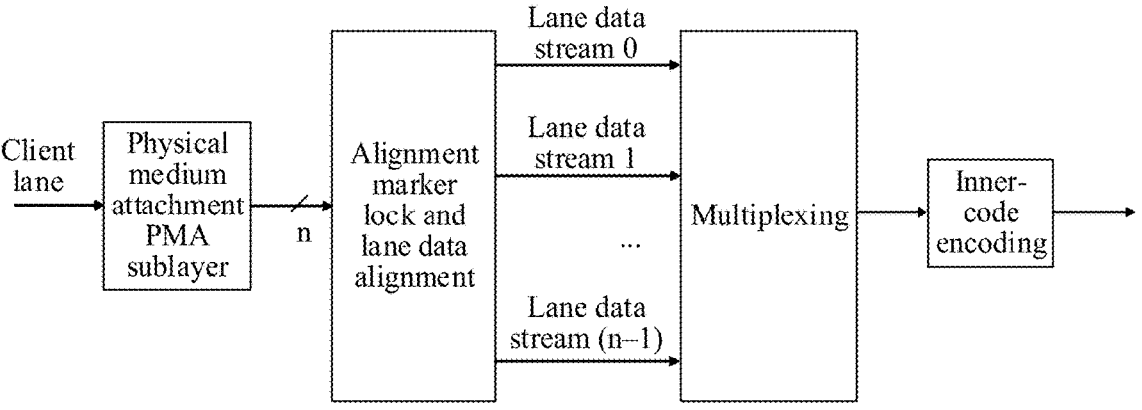
FIG. 3(d) is a schematic diagram of a fourth type of data processing by a transmitter processing module according to an embodiment of this application.

FIG. 3(d) is a schematic diagram of a fourth type of data processing by a transmitter processing module according to an embodiment of this application. As shown in FIG. 3(d), different from the data processing procedure shown in FIG.

3(b), n lane data streams obtained through lane data alignment are not convolutionally interleaved, but are directly multiplexed, and are sent to an inner-code encoder for inner-code encoding.

Figure 3E:
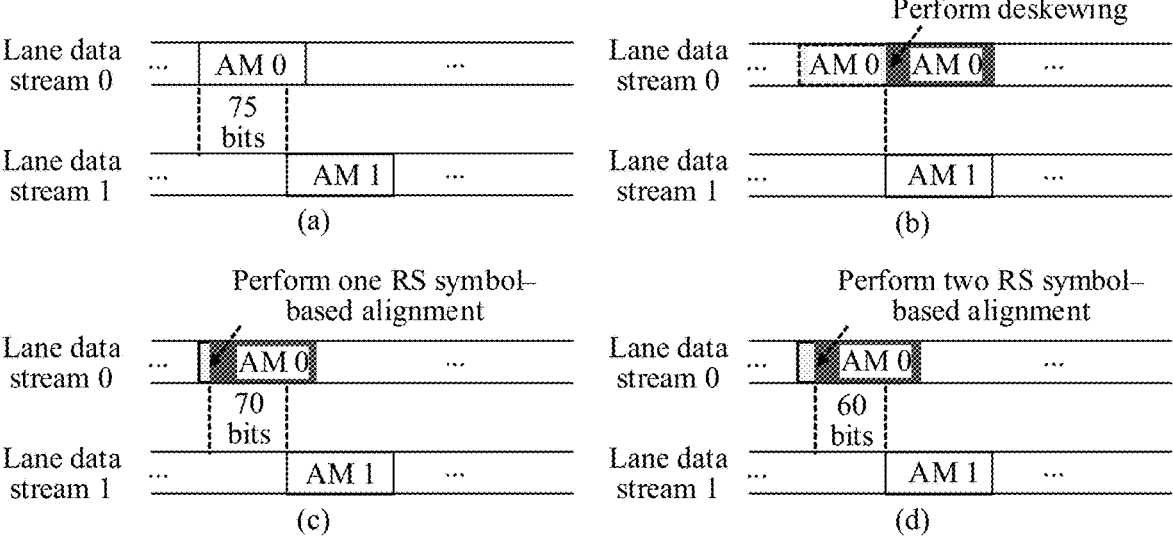
FIG. 3(e) is a schematic diagram of lane data alignment according to an embodiment of this application.

FIG. 3(e) is a schematic diagram of lane data alignment according to an embodiment of this application. It should be understood that the foregoing "lane data alignment" may be lane deskewing (lane de-skew) defined in an existing standard, so that data of n lane data streams output through the lane data alignment is completely aligned. Alternatively, the foregoing "lane data alignment" may be merely lane symbol alignment, so that data of n lane data streams output through the lane data alignment is aligned based on an outer-code symbol. Specifically, the data may be aligned based on one outer-code symbol or a plurality of outer-code symbols. In FIG. 3(e), two lane data streams are used as an example to describe a specific operation of the "lane data alignment". It is assumed that outer code is RS code, and a length of one RS code symbol is 10 bits. Scenario (a) in FIG. 3(e) indicates that there is a deviation of 75 bits between the two lane data streams, and AM 0 and AM 1 are respectively alignment markers of lane data stream 0 and lane data stream 1. In Scenario (b) in FIG. 3(e), lane deskewing (lane de-skew) defined in an existing standard is used, so that there is no deviation between output lane data stream 0 and output lane data stream 1. In Scenario (c) in FIG. 3(e), one RS symbol-based alignment is performed, so that one RS symbol of output lane data stream 0 and one RS symbol of output lane data stream 1 are aligned. In this case, a deviation of 70 bits still exists between the two lanes. In Scenario (d) in FIG. 3(e), two RS symbol-based alignment is performed, so that two RS symbols of output lane data stream 0 and two RS symbols of output lane data stream 1 are aligned. In this case, a deviation of 60 bits still exists between the two lanes.

Figure 3F:
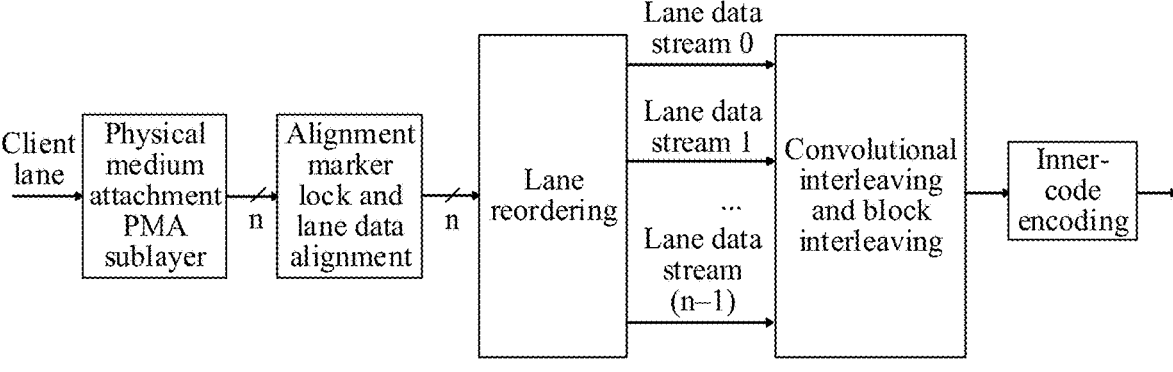
FIG. 3(f) is a schematic diagram of a fifth type of data processing by a transmitter processing module according to an embodiment of this application.

FIG. 3(f) is a schematic diagram of a fifth type of data processing by a transmitter processing module according to an embodiment of this application. As shown in FIG. 3(f), after processing data from a plurality of synchronous client lanes, a physical media attachment (PMA) sublayer of the transmitter processing module may obtain n outer-code encoded physical coding sublayer (PCS) or FEC lane data streams, and perform alignment marker lock (alignment lock) and lane data alignment to obtain n aligned lane data streams. Then, lane reordering (lane reorder) is performed on n lanes of data based on alignment markers, so that the n lanes of data can be arranged in a specified sequence. The n lane data streams obtained through lane reordering are sent to a designed processor including convolutional interleaving and block interleaving, for interleaving and data sequence disordering, and then are sent to an inner-code encoder for inner-code encoding. After data processing is performed on inner-code encoded data streams, data processed data streams are sent to a channel transmission medium for transmission. The data processing may include modulation and mapping, channel interleaving, polarization distribution, DSP framing (framing), and the like. Herein, n is a positive integer greater than 1.

Figure 3G:
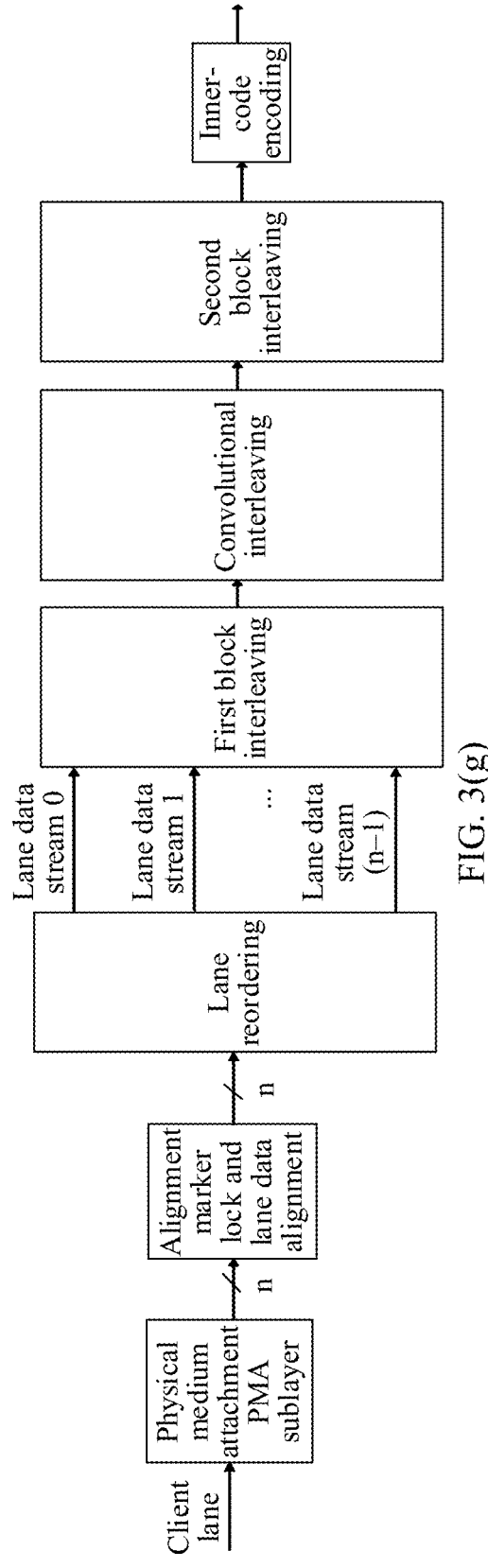
FIG. 3(g) is a schematic diagram of a sixth type of data processing by a transmitter processing module according to an embodiment of this application.

FIG. 3(g) is a schematic diagram of a sixth type of data processing by a transmitter processing module according to an embodiment of this application. As shown in FIG. 3(g), after processing data from a plurality of synchronous client lanes, a physical media attachment (PMA) sublayer of the transmitter processing module may obtain n outer-code encoded physical coding sublayer (PCS) or FEC lane data streams, where the PCS lane data stream and the FEC lane data stream are collectively referred to as a lane data stream, and perform alignment marker lock and lane data alignment to obtain n aligned lane data streams. Then, lane reordering is performed on n lanes of data based on alignment markers, so that the n lanes of data can be arranged in a specified sequence. The n lane data streams obtained through lane reordering are sent to a designed processor including first block interleaving, convolutional interleaving, and second block interleaving, for interleaving and data sequence disordering, and then are sent to an inner-code encoder for inner-code encoding. After data processing is performed on inner-code encoded data streams, data processed data streams are sent to a channel transmission medium for transmission. The data processing may include modulation and mapping, channel interleaving, polarization distribution, DSP framing (Framing), and the like. Herein, n is a positive integer greater than 1.

Figures 3H, 3I, 4A, 4B:
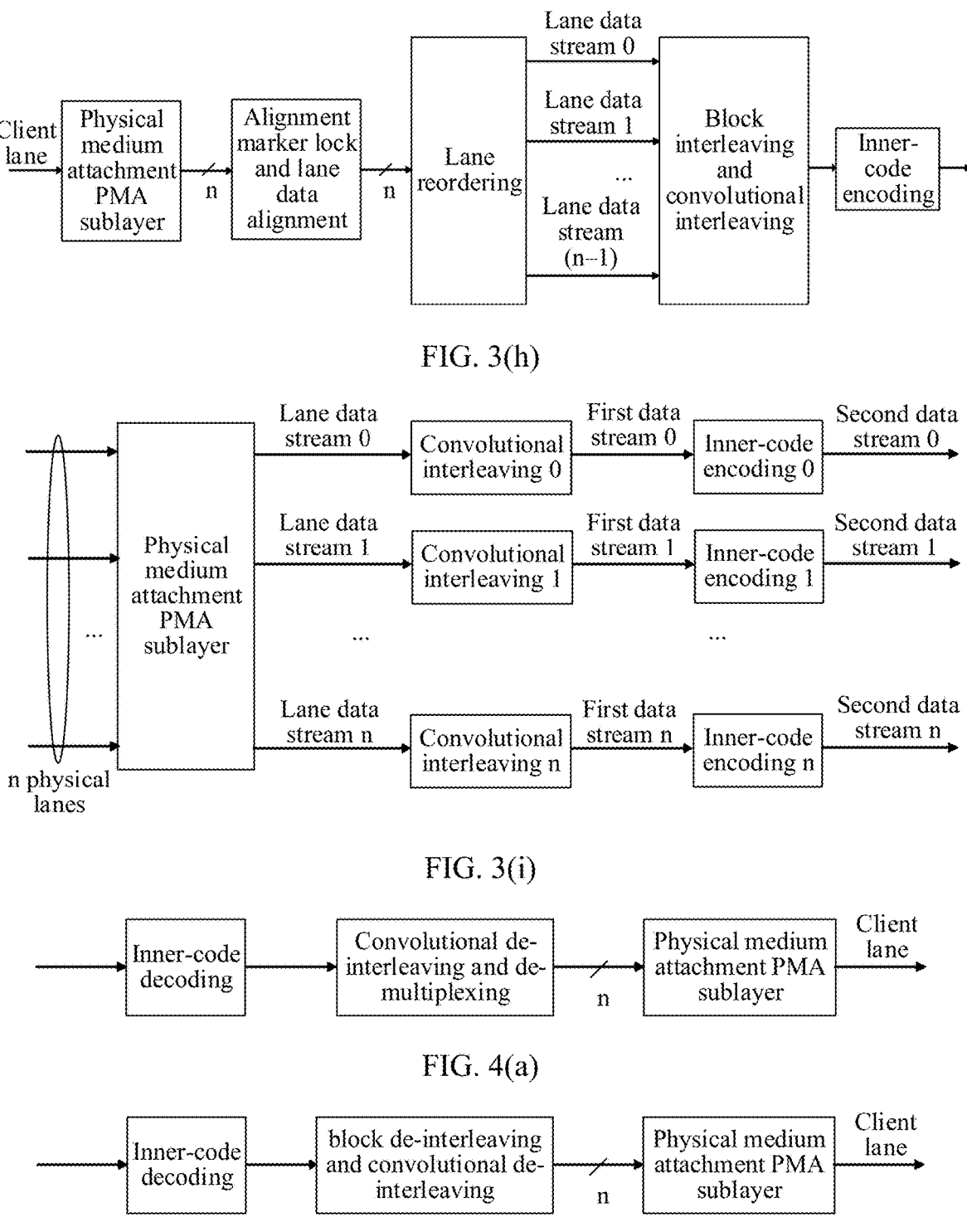
FIG. 3(h) is a schematic diagram of a seventh type of data processing by a transmitter processing module according to an embodiment of this application.
FIG. 3(i) is a schematic diagram of an eighth type of data processing by a transmitter processing module according to an embodiment of this application.
FIG. 4(a) is a schematic diagram of a first type of data processing by a receiver processing module according to an embodiment of this application.
FIG. 4(b) is a schematic diagram of a second type of data processing by a receiver processing module according to an embodiment of this application.

FIG. 3(h) is a schematic diagram of a seventh type of data processing by a transmitter processing module according to an embodiment of this application. As shown in FIG. 3(h), after processing data from a plurality of synchronous client lanes, a physical media attachment (PMA) sublayer of the transmitter processing module may obtain n outer-code encoded physical coding sublayer (PCS) or FEC lane data streams, and perform alignment marker lock and lane data alignment to obtain n aligned lane data streams. Then, lane reordering is performed on n lanes of data based on alignment markers, so that the n lanes of data can be arranged in a specified sequence. The n lane data streams obtained through lane reordering are sent to a designed processor including block interleaving and convolutional interleaving, for interleaving and data sequence disordering, and then are sent to an inner-code encoder for inner-code encoding. After data processing is performed on inner-code encoded data streams, data processed data streams are sent to a channel transmission medium for transmission. The data processing may include modulation and mapping (mapping), channel interleaving, polarization distribution, DSP framing, and the like. Herein, n is a positive integer greater than 1.

FIG. 3(i) is a schematic diagram of an eighth type of data processing by a transmitter processing module according to an embodiment of this application. As shown in FIG. 3(i), after processing data from n synchronous client lanes such as an AUI-n interface, a physical media attachment (PMA) sublayer of the transmitter processing module may obtain n outer-code encoded lane data streams. The PMA sublayer herein only needs to perform signal recovery operations such as clock data recovery (CDR) and PAM4 symbol demodulation on data from each client lane to obtain one lane data stream, and does not need to perform other complex operations such as AM locking, lane deskewing, and lane reordering. n lane data streams are sent to a designed processor including convolutional interleaving, for interleaving and data sequence disordering, and then are sent to an inner-code encoder for inner-code encoding. After data processing is performed on inner-code encoded data streams, data processed data streams are sent to a channel transmission medium for transmission. The data processing may include modulation and mapping, channel interleaving, polarization distribution, DSP framing, and the like. Herein, n is a positive integer greater than 1.

It should be understood that, in some actual application scenarios, RS outer-code encoding means that interleaving such as 2-way interleaving is performed after encoding is performed by using two encoders, so that RS symbols on a lane data stream with an even sequence number are transmitted in a manner of "A B A B A B . . . ", and RS symbols on the lane data stream with an odd sequence number are transmitted in a manner of "B A B A B A . . . ", where A and B are two RS symbols generated by different encoders. For two RS symbol-based alignment, an embodiment effect is that RS symbols on all lane data streams with even sequence numbers are generated by a same encoder at a same moment, and RS symbols on all lane data streams with odd sequence numbers are generated by another same encoder at the same moment; or another embodiment effect is that RS symbols on all lane data streams are generated by a same encoder at a same moment. A specific manner is not limited herein.

FIG. 4(a) is a schematic diagram of a first type of data processing by a receiver processing module according to an embodiment of this application. As shown in FIG. 4(a), the receiver processing module receives data streams from a channel transmission medium. When data processing such as modulation mapping, channel interleaving, polarization distribution, or DSP framing is performed on data streams from a transmitter processing module, the receiver processing module first performs corresponding data reverse processing and then sends the data streams to an inner-code decoder for decoding. After the inner-code decoding, the data streams are sent to a processor including convolutional de-interleaving and de-multiplexing, for processing, to obtain n lane data streams, and then the n lane data streams are sent to a PMA sublayer. The PMA sublayer processes the data streams and sends processed data streams to a receiver device for outer-code decoding. The convolutional de-interleaving and de-multiplexing (de-muxing) in the receiver processing module are reverse operations of convolutional interleaving and multiplexing in the transmitter processing module. The convolutional de-interleaving is the reverse operation of the convolutional interleaving in the transmitter processing module, and the de-multiplexing is the reverse operation of the multiplexing in the transmitter processing module. The following describes in detail the convolutional interleaving and the multiplexing in the transmitter processing module. The convolutional de-interleaving and the de-multiplexing in the receiver processing module are the reverse operations of the convolutional interleaving and the multiplexing in the transmitter processing modules shown in FIG. 3(a) and FIG. 3(b). This is well-known to a person of ordinary skill in the art and is not described herein.

FIG. 4(b) is a schematic diagram of a second type of data processing by a receiver processing module according to an embodiment of this application. As shown in FIG. 4(b), the receiver processing module receives data streams from a channel transmission medium. When data processing such as modulation mapping, channel interleaving, polarization distribution, or DSP framing is performed on data streams from a transmitter processing module, the receiver processing module first performs corresponding data reverse processing and then sends the data streams to an inner-code decoder for decoding. After the inner-code decoding, the data streams are sent to a processor including block de-interleaving and convolutional de-interleaving, for processing, to obtain n lane data streams, and then the n lane data streams are sent to a PMA sublayer. The PMA sublayer processes the data streams and sends processed data streams to a receiver device for outer-code decoding. Herein, the block de-interleaving and convolutional de-interleaving in the receiver processing module are reverse operations of the block interleaving and the convolutional interleaving in the transmitter processing module shown in FIG. 3(f). The convolutional de-interleaving is the reverse operation of the convolutional interleaving in the transmitter processing module, and the block de-interleaving is the reverse operation of the block interleaving in the transmitter processing module.

Figure 4C:
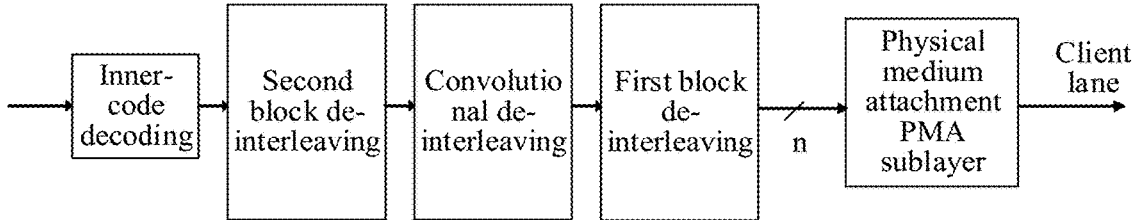
FIG. 4(c) is a schematic diagram of a third type of data processing by a receiver processing module according to an embodiment of this application.

FIG. 4(c) is a schematic diagram of a third type of data processing by a receiver processing module according to an embodiment of this application. As shown in FIG. 4(c), the receiver processing module receives data streams from a channel transmission medium. When data processing such as modulation mapping, channel interleaving, polarization distribution, or DSP framing is performed on data streams from a transmitter processing module, the receiver processing module first performs corresponding data reverse processing and then sends the data streams to an inner-code decoder for decoding. After the inner-code decoding, the data streams are sent to second block de-interleaving, convolutional de-interleaving, and first block de-interleaving, for processing, to obtain n lane data streams, and then the n lane data streams are sent to a PMA sublayer. The PMA sublayer processes the data streams and sends processed data streams to a receiver device for outer-code decoding. Herein, the first block de-interleaving, the convolutional de-interleaving, and the second block de-interleaving in the receiver processing module are respectively reverse operations of the first block interleaving, the convolutional interleaving, and the second block interleaving in the transmitter processing module shown in FIG. 3(g). The following describes in detail the first block interleaving, the convolutional interleaving, and the second block interleaving in the transmitter processing module. The first block de-interleaving, the convolutional de-interleaving, and the second block de-interleaving in the receiver processing module are respectively the reverse operations of the first block interleaving, the convolutional interleaving, and the second block interleaving in the transmitter processing module. This is well-known to a person of ordinary skill in the art and is not described herein.

The following first provides several specific scenarios to which embodiments of this application may be applied. It should be noted that, for ease of description, the following specific scenarios are described by using an example in which "lane data alignment" is lane deskewing.

Figure 5:
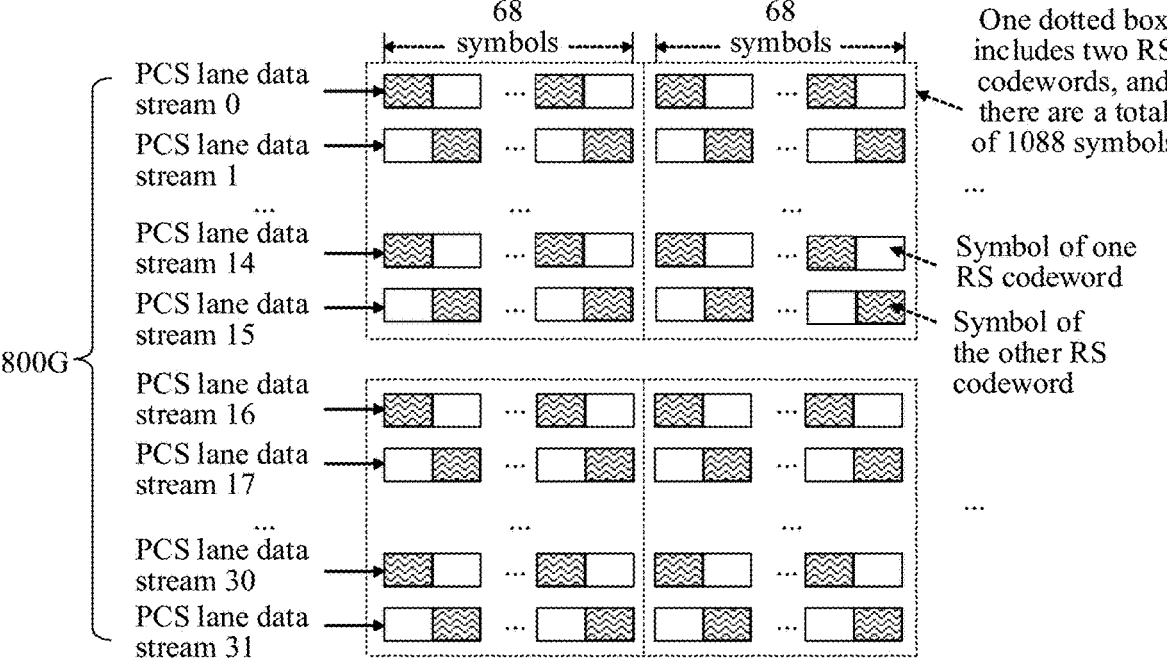
FIG. 5 is a schematic diagram of 32 PCS lane data streams corresponding to a 1×800G interface used by a transmitter device.

FIG. 5 is a schematic diagram of 32 PCS lane data streams corresponding to a 1×800G interface used by a transmitter device. As shown in FIG. 5, the transmitter device performs KP4 RS(544,514) code outer-code encoding on one channel of to-be-transmitted 800 GbE service data stream to obtain the 32 PCS lane data streams. Every 68 consecutive symbols in each of PCS lane data streams 0 to 15 form a total of 16*68=1088 symbols, where two RS codewords are included. Two adjacent symbols in each PCS lane data stream are from different RS codewords, and two symbols at same positions in two adjacent PCS lane data streams are from different RS codewords. Similarly, every 68 consecutive symbols in each of PCS lane data streams 16 to 31 form a total of 16*68=1088 symbols, where two RS codewords are included. Two adjacent symbols in each PCS lane data stream are from different RS codewords, and two symbols at same positions in two adjacent PCS lane data streams are from different RS codewords. After PMA processing, the 32 PCS lane data streams are sent to a transmitter processing module through an attachment unit interface 800GAUI-8.

Based on the foregoing schematic diagram of data processing of the transmitter processing module shown in FIG. 3(a), the transmitter processing module performs alignment marker lock (alignment lock) on the lane data streams based on known alignment markers of PCS lanes. The known alignment markers of the 32 lanes are different (refer to "Ethernet Technology Consortium 800G Specification"). The transmitter processing module then performs lane deskewing on the 32 lane data streams to obtain 32 aligned lane data streams. Then, lane reordering is performed on data of the n=32 lanes based on the alignment markers, so that the data of the n=32 lanes can be arranged in a specified sequence. One sequence is that the lane data streams are sorted from 0 to 31 from top to bottom, which is the same as that shown in FIG. 5.

Figure 6:
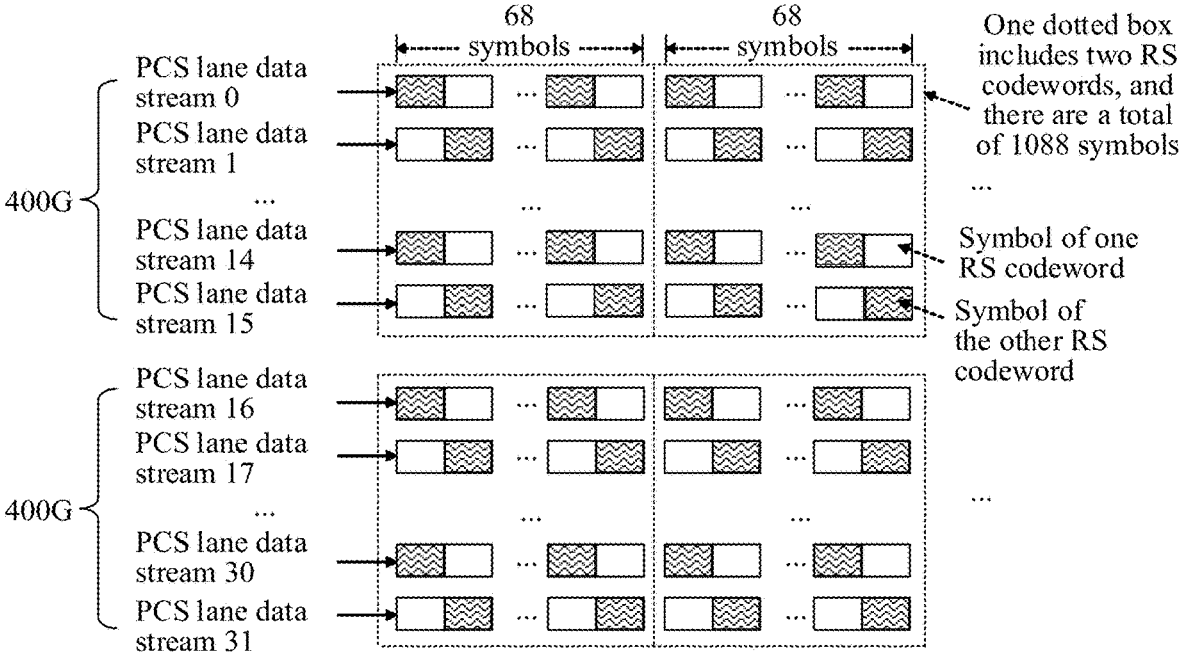
FIG. 6 is a schematic diagram of 32 PCS lane data streams corresponding to 2×400G interfaces used by a transmitter device.

FIG. 6 is a schematic diagram of 32 PCS lane data streams corresponding to 2×400G interfaces used by a transmitter device. As shown in FIG. 6, the transmitter device performs KP4 RS(544,514) code outer-code encoding on two channels of to-be-transmitted 400 GbE service data streams to obtain a total of 32 PCS lane data streams (two channels of PCS lane data streams), where each channel includes 16 PCS lane data streams. Every 68 consecutive symbols in each of PCS lane data streams 0 to 15 or PCS lane data streams 16 to 31 form a total of 16*68=1088 symbols, where two RS codewords are included. Two adjacent symbols in each PCS lane data stream are from different RS codewords, and two symbols at same positions in two adjacent PCS lane data streams are from different RS codewords. After PMA processing, the 32 PCS lane data streams are sent to a transmitter processing module through attachment unit interfaces 2×400GAUI-4.

Based on the foregoing schematic diagram of data processing of the transmitter processing module shown in FIG. 3(a), the transmitter processing module performs alignment marker lock (alignment lock) on 16 lane data streams based on known alignment markers of PCS lanes 0 to 15 or PCS lanes 16 to 31. PCS lanes 0 to 15 may be considered as PCS lanes 0 to 15 in a $0^{th}$ channel of 400G, and PCS lanes 16 to 31 may be considered as PCS lanes 0 to 15 in a $1^{st}$ channel of 400G. Known alignment markers of the 16 lanes in a $0^{th}$ channel of 400G are the same as known alignment markers of the 16 lanes in the $1^{st}$ channel of 400G. The transmitter processing module then performs lane deskewing (lane de-skew) on the 32 lane data streams to obtain 32 aligned lane data streams. Then, lane reordering (lane reorder) is performed on data of 16 lanes based on the alignment markers of the PCS lanes 0 to 15 or the PCS lanes 16 to 31, so that the data of the 16 lanes can be arranged in a specified sequence. Finally, data of 32 lanes can be arranged in a specified sequence. One sequence is that the lane data streams are sorted from 0 to 31 from top to bottom, which is the same as that shown in FIG. 6.

Figure 7:
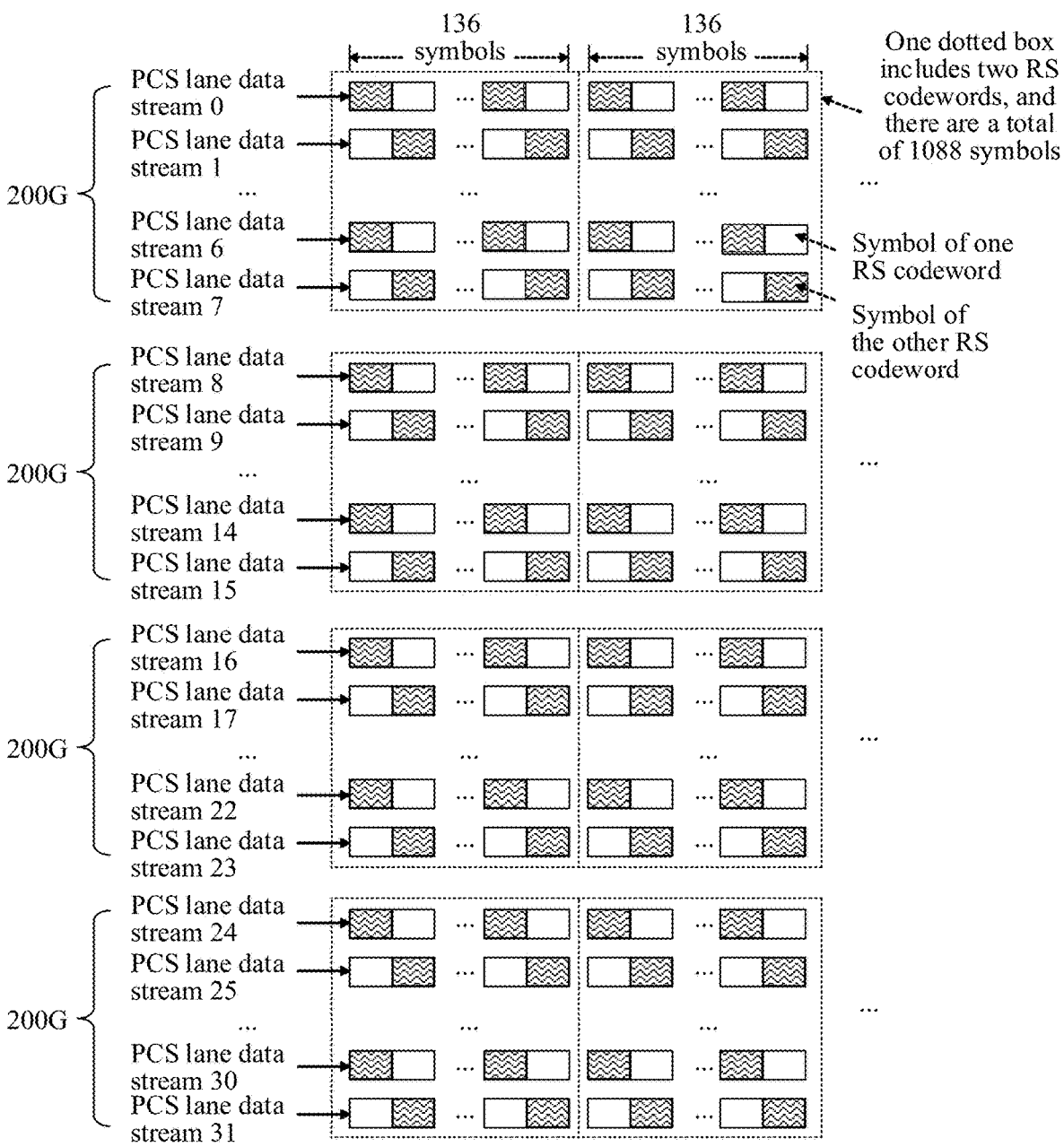
FIG. 7 is a schematic diagram of 32 PCS lane data streams corresponding to 4×200G interfaces used by a transmitter device.

FIG. 7 is a schematic diagram of 32 PCS lane data streams corresponding to 4×200G interfaces used by a transmitter device. As shown in FIG. 7, the transmitter device performs KP4 RS(544,514) code outer-code encoding on four channels of to-be-transmitted 200 GbE service data streams to obtain a total of 32 PCS lane data streams (four channels of PCS lane data streams), where each channel includes eight PCS lane data streams. Every 136 consecutive symbols in each of PCS lane data streams 0 to 7, PCS lane data streams 8 to 15, PCS lane data streams 16 to 23, or PCS lane data streams 24 to 31 form a total of 8*136=1088 symbols, where two RS codewords are included. Two adjacent symbols in each PCS lane data stream are from different RS codewords, and two symbols at same positions in two adjacent PCS lane data streams are from different RS codewords. After PMA processing, the 32 PCS lane data streams are sent to a transmitter processing module through attachment unit interfaces 4×200GAUI-2.

Based on the foregoing schematic diagram of data processing of the transmitter processing module shown in FIG.

3(a), the transmitter processing module performs alignment marker lock (alignment lock) on eight lane data streams based on known alignment markers of PCS lanes 0 to 7, PCS lanes 8 to 15, PCS lanes 16 to 23, or PCS lanes 24 to 31. PCS lanes 0 to 7, PCS lanes 8 to 15, PCS lanes 16 to 23, or PCS lanes 24 to 31 herein may be considered as PCS lanes 0 to 7 in a $0^{th}$ channel, a $1^{st}$ channel, a $2^{nd}$ channel, or a $3^{rd}$ channel of 200G respectively. The transmitter processing module then performs lane deskewing (lane de-skew) on the 32 lane data streams to obtain 32 aligned lane data streams. Then, lane reordering (lane reorder) is performed on data of eight lanes based on the alignment markers of PCS lanes 0 to 7, PCS lanes 8 to 15, PCS lanes 16 to 23, or PCS lanes 24 to 31, so that the data of the eight lanes can be arranged in a specified sequence. Finally, data of 32 lanes can be arranged in a specified sequence. One sequence is that the lane data streams are sorted from 0 to 31 from top to bottom, which is the same as that shown in FIG. 7.

Figure 8:
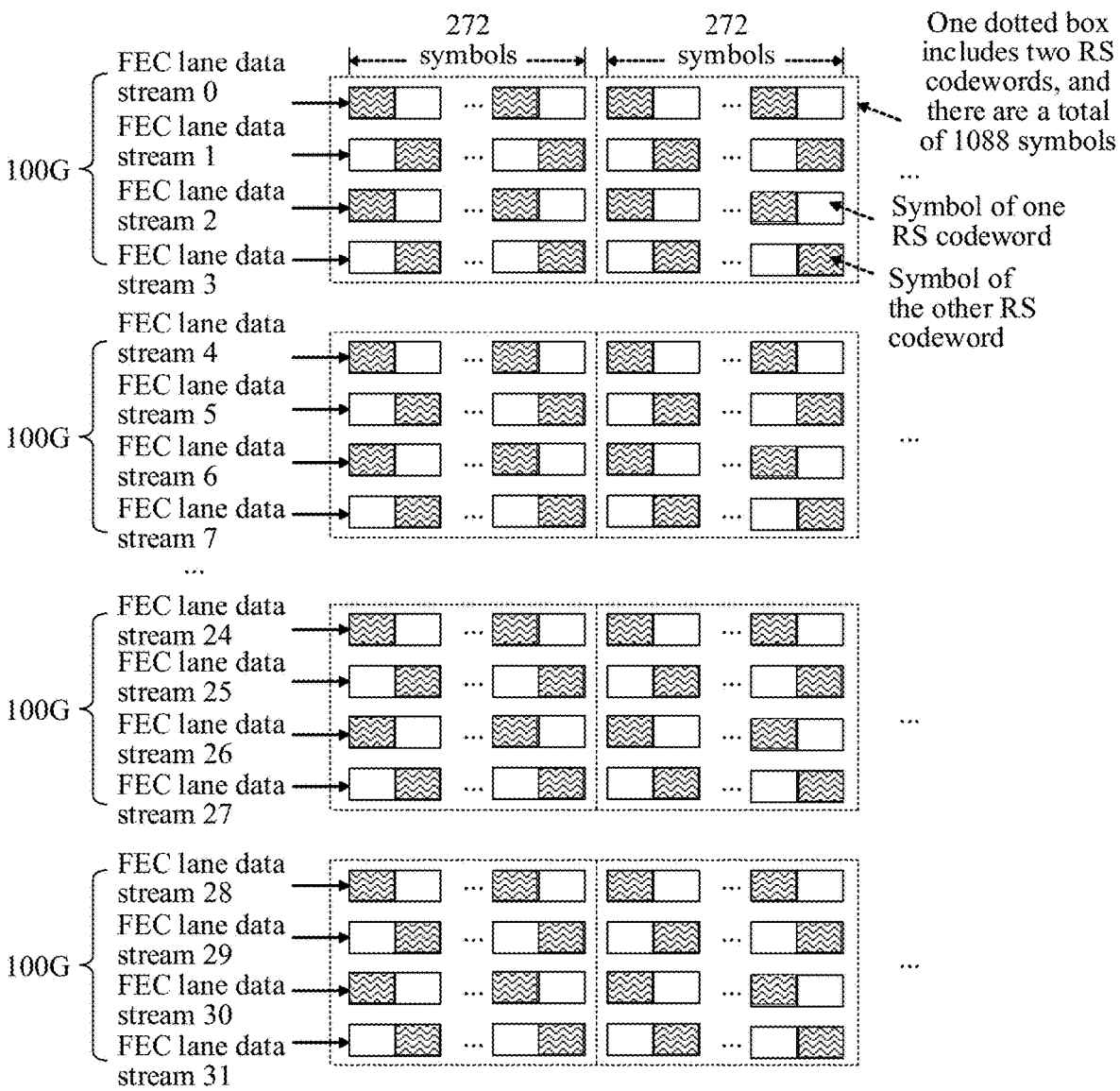
FIG. 8 is a schematic diagram of 32 FEC lane data streams corresponding to 8×100G interfaces used by a transmitter device.

FIG. 8 is a schematic diagram of 32 FEC lane data streams corresponding to 8×100G interfaces used by a transmitter device. As shown in FIG. 8, the transmitter device performs KP4 RS(544,514) code outer-code encoding on eight channels of to-be-transmitted 100 GbE service data streams to obtain a total of 32 FEC lane data streams (eight channels of FEC lane data streams), where each channel includes four FEC lane data streams. When a "100G RS-FEC-Int" mode of two KP4 RS(544,514) codeword-based interleaving, every 272 consecutive symbols in each of FEC lane data streams 0 to 3, FEC lane data streams 4 to 7, FEC lane data streams 8 to 11, FEC lane data streams 12 to 15, FEC lane data streams 16 to 19, FEC lane data streams 20 to 23, FEC lane data streams 24 to 27, or FEC lane data streams 28 to 31 form a total of 4*272=1088 symbols, where two RS codewords are included. Two adjacent symbols in each FEC lane data stream are from different RS codewords, and two symbols at same positions in two adjacent FEC lane data streams are from different RS codewords. After PMA processing, the 32 FEC lane data streams are sent to a transmitter processing module through attachment unit interfaces 8×100GAUI-1.

Figure 9:
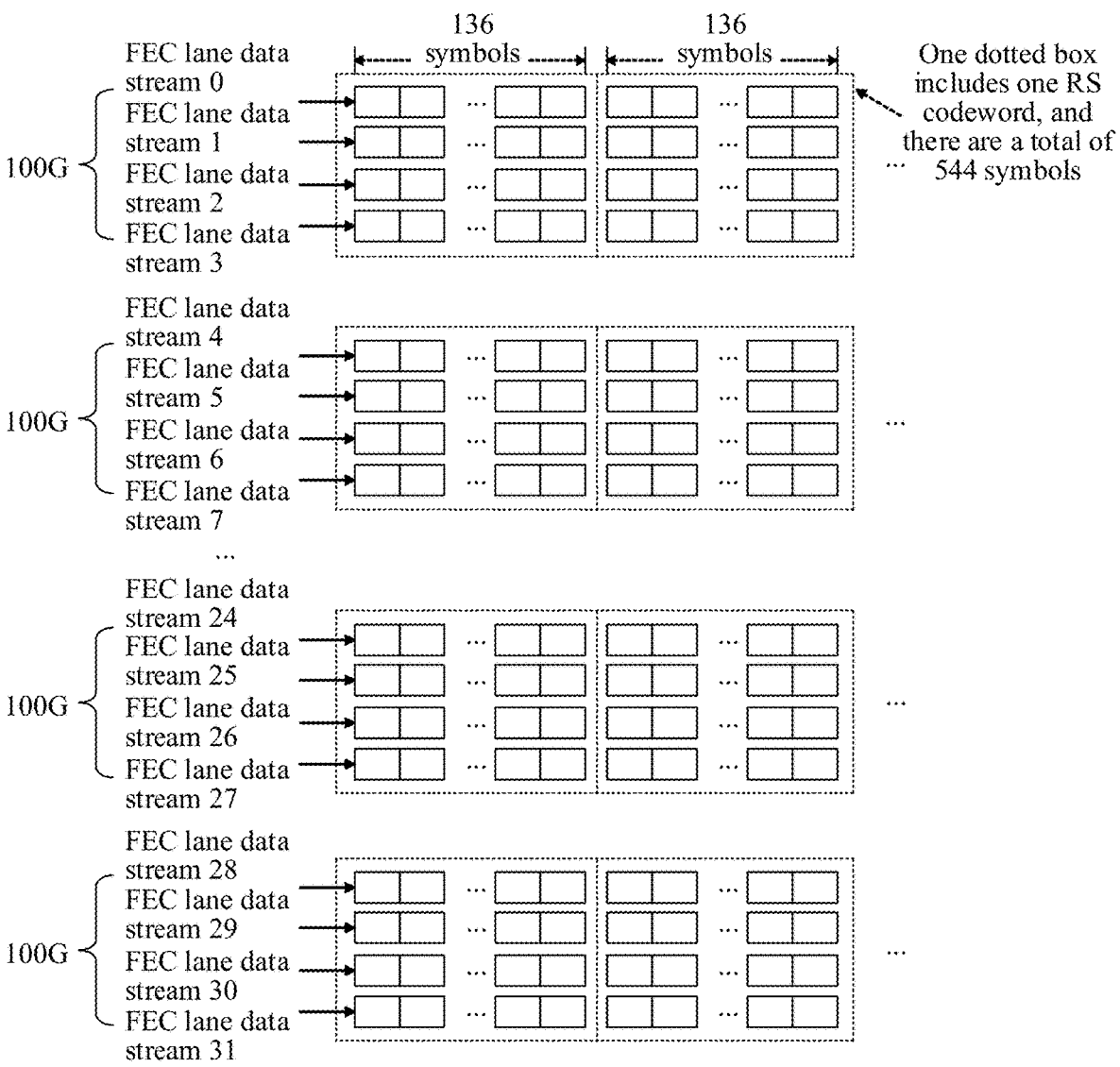
FIG. 9 is another schematic diagram of 32 FEC lane data streams corresponding to 8×100G interfaces used by a transmitter device.

FIG. 9 is another schematic diagram of 32 FEC lane data streams corresponding to 8×100G interfaces used by a transmitter device. As shown in FIG. 9, different from the scenario in FIG. 8, in this scenario, the transmitter device uses a "100G RS-FEC" mode, every 136 symbols in each of FEC lane data streams 0 to 3, FEC lane data streams 4 to 7, FEC lane data streams 8 to 11, FEC lane data streams 12 to 15, FEC lane data streams 16 to 19, FEC lane data streams 20 to 23, FEC lane data streams 24 to 27, or FEC lane data streams 28 to 31 form a total of 4*136=544 symbols, where one RS codeword is included. After PMA processing, the 32 FEC lane data streams are sent to a transmitter processing module through attachment unit interfaces 8×100GAUI-1.

Based on the foregoing schematic diagram of data processing of the transmitter processing module shown in FIG. 3(a), the transmitter processing module performs alignment marker lock (alignment lock) on four lane data streams based on known alignment markers of FEC lanes 0 to 3, FEC lanes 4 to 7, FEC lanes 8 to 11, FEC lanes 12 to 15, FEC lanes 16 to 19, FEC lanes 20 to 23, FEC lanes 24 to 27, or FEC lanes 28 to 31. FEC lanes 0 to 3, FEC lanes 4 to 7, FEC lanes 8 to 11, FEC lanes 12 to 15, FEC lanes 16 to 19, FEC lanes 20 to 23, FEC lanes 24 to 27, or FEC lanes 28 to 31 may be considered as FEC lanes 0 to 3 in a $0^{th}$ channel, a $1^{st}$ channel, a $2^{nd}$ channel, a $3^{rd}$ channel, a $4^{th}$ channel, a $5^{th}$ channel, a $6^{th}$ channel, or a $7^{th}$ channel of 100G respectively. The transmitter processing module then performs lane deskewing (lane de-skew) on the 32 lane data streams to obtain 32 aligned lane data streams. Then, lane reordering (lane reorder) is performed on data of four lanes based on the alignment markers of FEC lanes 0 to 3, FEC lanes 4 to 7, FEC lanes 8 to 11, FEC lanes 12 to 15, FEC lanes 16 to 19, FEC lanes 20 to 23, FEC lanes 24 to 27, or FEC lanes 28 to 31, so that the data of the four lanes can be arranged in a specified sequence. Finally, data of 32 lanes can be arranged in a specified sequence. One sequence is that the lane data streams are sorted from 0 to 31 from top to bottom, which is the same as that in FIG. 8 and FIG. 9.

FIG. 10 is a schematic flowchart of a data processing method according to an embodiment of this application.

Block 1001: Separately perform convolutional interleaving on n lane data streams to obtain n first data streams.

In this embodiment, the lane data stream may be a PCS lane data stream or an FEC lane data stream. This is not specifically limited herein. All the n lane data streams are data streams obtained through first FEC encoding, namely, the foregoing outer-code encoded data streams, where n is an integer greater than 1. For example, the outer-code encoding may be performed using RS code, and the n outer-code encoded data streams may include a plurality of RS codewords. In actual application, another encoding scheme may be used to perform the outer-code encoding. For ease of description, the following uses an RS codeword to represent a codeword generated through the outer-code encoding. It should be understood that every a codewords obtained through the outer-code encoding are distributed in b lane data streams, where a≤b≤n, n can be exactly divided by b, and a is an integer greater than or equal to 1. In different application scenarios shown in FIG. 5 to FIG. 9, values of a and b may also be different. The application scenario shown in FIG. 5 is used as an example, and n=32, a=2, and b=16, in other words, every two codewords are distributed in 16 lane data streams. Values of a and b in application scenarios in FIG. 6 to FIG. 9 may be deduced with reference to the accompanying drawings, and details are not described herein again. It should be noted that, in this application, a code length of outer code is measured in symbols, and the symbol may include one or more bits. For example, the outer code is KP4 RS(544,514) code that is used, the code length is N=544 symbols, and one symbol includes 10 bits.

In an example, when a=1, it indicates that interleaving is not performed on a codeword obtained through outer-code encoding by a transmitter device 01, and the codeword is directly distributed in the b lane data streams. As shown in FIG. 9, when a=1, interleaving is not performed on a codeword, with N=544 symbols, obtained through outer-code KP4 encoding by the transmitter device 01, and the codeword is directly distributed in b=4 lane data streams. The 544 symbols in one dashed box shown in FIG. 9 are from a same KP4 codeword, and N/b=544/4=136 consecutive symbols in one lane data stream in each dashed box are from the same KP4 codeword.

In another example, when a>1, it indicates that a codewords obtained through outer-code encoding by the transmitter device 01 are first interleaved, and then distributed in the b lane data streams. As shown in FIG. 8, a=2, two-way symbol interleaving is first performed on two codewords, with a total of a*N=2*544=1088 symbols, obtained through outer-code KP4 encoding by the transmitter device 01, and then two codewords are distributed in b=4 lane data streams. One dashed box shown in FIG. 8 includes 1088 symbols from the a=2 KP4 codewords, 2*N/b=2*544/4=272 consecutive symbols in one lane data stream in each dashed box are from the a=2 KP4 codewords, and two adjacent symbols are from different KP4 codewords. As shown in FIG. 5, a=2, two-way symbol interleaving is first performed on two codewords, with a total of a*N=2*544=1088 symbols, obtained through outer-code KP4 encoding by the transmitter device 01, and then two codewords are distributed in b=16 lane data streams. One dashed box shown in FIG. 5 includes 1088 symbols from the a=2 KP4 codewords, 2*N/b=2*544/16=68 consecutive symbols in one lane data stream in each dashed box are from the a=2 KP4 codewords, and two adjacent symbols are from different KP4 codewords.

It should be noted that, after the convolutional interleaving, z consecutive symbols in each of the first data streams are from z different codewords, and z is an integer greater than 1. The following describes a specific implementation of the convolutional interleaving.

FIG. 11 is a schematic diagram of a structure in which convolutional interleaving is separately performed on n lane data streams according to an embodiment of this application. As shown in FIG. 11, the convolutional interleaving may be separately performed on the n lane data streams via n convolution interleavers, and after the convolutional interleaving is performed on each lane data stream, a first data stream with a disordered data sequence may be obtained. It should be noted that, in this embodiment, each convolution interleaver performs the convolutional interleaving on an input lane data stream in a similar manner. Specifically, each convolution interleaver includes p delay lines, and each convolution interleaver delays the input lane data stream based on the p delay lines to obtain the first data stream. p is an integer greater than 1, a quantity of storage units included in each delay line is different, a delay line with a smallest quantity of storage units includes 0 storage units, and a difference between quantities of storage units of every two adjacent delay lines is Q. Each storage unit is configured to store d symbols, where z=p*d. Symbols in each lane data stream are sequentially input to the p delay lines based on sequence numbers of the p delay lines, d symbols are input to each delay line for a single time and d symbols are output from the delay line for a single time, and p*d consecutive symbols in the first data stream include the d symbols output from the delay line. Q is an integer greater than or equal to 1, and d is an integer greater than or equal to 1. For example, the p delay lines respectively include 0 storage units, Q storage units, 2Q storage units, . . . , (p–1)Q storage units, and each storage unit is configured to store d symbols. In this case, the p delay lines respectively correspond to p delay values, and the delay values include 0 symbols, Q×d symbols, 2Q×d symbols, . . . , (p–1)Q×d symbols. It should be noted that, in this application, a delay value is measured in symbols, and the symbol may include one or more bits. A larger quantity of symbols included in a delay value of a delay line indicates a longer delay (also referred to as latency) of the delay line for a data stream. It should be understood that when the delay line does not include a storage unit, a delay of the delay line is 0 symbols, in other words, transparent transmission with no delay is performed.

The following describes a specific structure of the convolution interleaver with reference to the accompanying drawings.

FIG. 12(*a*) is a schematic diagram of a first structure of a convolution interleaver according to an embodiment of this application. As shown in FIG. 12(*a*), quantities of storage units in p delay lines are in descending order based on sequence numbers of the p delay lines. To be specific, delay line 0 has (p–1)Q storage units, Q storage units are sequentially reduced for each delay line, and delay line (p–1) has 0 storage units. FIG. 12(*b*) is a schematic diagram of a second structure of a convolution interleaver according to an embodiment of this application. As shown in FIG. 12(*b*), quantities of storage units in p delay lines are in ascending order based on sequence numbers of the p delay lines. To be specific, delay line 0 has 0 storage units, Q storage units are sequentially increased for each delay line, and delay line (p–1) has (p–1)Q storage units.

It should be noted that, at a same moment, an input switch and an output switch of the convolution interleaver are located on a same delay line. After d symbols are input to a current delay line for a single time and d symbols are output from the current delay line for a single time, positions of the switches are updated to a next delay line, to ensure that symbols in each lane data stream are sequentially input to the p delay lines based on sequence numbers of the p delay lines, and p*d consecutive symbols in a first data stream include d symbols output from each delay line. A specific data read/write operation is as follows: d symbols are read out from a storage unit that is closest to an output port and that is on the current delay line. d symbols stored in each storage unit that is on the current delay line are transferred to a next storage unit. Then, d symbols are written into a storage unit that is closest to an input port and that is on the current delay line. Then, switching to a next delay line is performed and the foregoing operations are repeated, and the rest can be deduced by analogy. In an embodiment, if the convolution interleaver shown in FIG. 12(*a*) is used, a parameter of the convolution interleaver is to satisfy that d(p*Q+1)≥a*N/b, where N is a length of a codeword, so that p*d consecutive symbols in the first data stream output by the convolution interleaver are from p*d different outer-code codewords, where d≤a. In another embodiment, if the convolution interleaver shown in FIG. 12(*b*) is used, a parameter of the convolution interleaver is to satisfy that d(p*Q–1)≥a*N/b, where N is a length of a codeword, so that p*d consecutive symbols in the first data stream output by the convolution interleaver are from p*d different outer-code codewords, where d≤a.

It should be understood that when same parameters p, Q, and d are used, convolutional interleaving in FIG. 12(*a*) and convolutional interleaving in FIG. 12(*b*) are reverse operations of each other. In other words, when a transmitter processing module uses the convolutional interleaving structure shown in FIG. 12(*a*), convolutional de-interleaving corresponding to a receiver processing module uses the structure shown in FIG. 12(*b*). Similarly, when a transmitter processing module uses the convolutional interleaving structure shown in FIG. 12(*b*), convolutional de-interleaving corresponding to a receiver processing module uses the structure shown in FIG. 12(*a*).

It should be further understood that any one of n convolution interleavers may use the structure shown in FIG. 12(*a*) or FIG. 12(*b*). In actual application, the n convolution interleavers may all use the structure shown in FIG. 12(*a*); the n convolution interleavers may all use the structure shown in FIG. 12(*b*); or some convolution interleavers may use the structure shown in FIG. 12(*a*), and the remaining convolution interleavers use the structure shown in FIG. 12(*b*).

It should be noted that, in some specific application scenarios, n=32 is used as an example, a value of p may be 2, 3, 4, 6, or 8, and a value of d may be 1 or 2.

For ease of description, the following embodiments related to convolutional interleaving are described by using an example in which the n convolution interleavers all use the structure shown in FIG. 12(*a*). Certainly, the example may be simply extended to another structure listed above, specific implementation thereof may be known to a person of ordinary skill in the art, and details are not described herein.

In some embodiments, before the convolutional interleaving is separately performed on the n lane data streams to obtain the n first data streams, lane reordering may be further performed on the n lane data streams, so that the n data streams are arranged in a preset sequence. The 32 data streams are used as an example. The 32 data streams may be sorted from 0 to 31 from top to bottom. Certainly, the example may be simply extended to sorting in another sequence, specific implementation thereof may be known to a person of ordinary skill in the art, and details are not described herein.

In some embodiments, before the convolutional interleaving is separately performed on the n lane data streams to obtain the n first data streams, lane data alignment may be further performed on the n lane data streams. The lane data alignment may be lane deskewing (lane de-skew) defined in an existing standard, so that data of n lane data streams output through the lane data alignment is completely aligned. Alternatively, the foregoing "lane data alignment" may be merely lane symbol alignment, so that data of n lane data streams output through the lane data alignment is aligned based on an outer-code symbol. Specifically, the data may be aligned based on one outer-code symbol, or may be aligned based on a plurality of outer-code symbols. For detailed descriptions of the lane data alignment, refer to related descriptions of FIG. 3(*e*). Details are not described herein.

Block 1002: Multiplex every K first data streams of the n first data streams to obtain one second data stream, so as to obtain a total of m second data streams.

Figure 13:
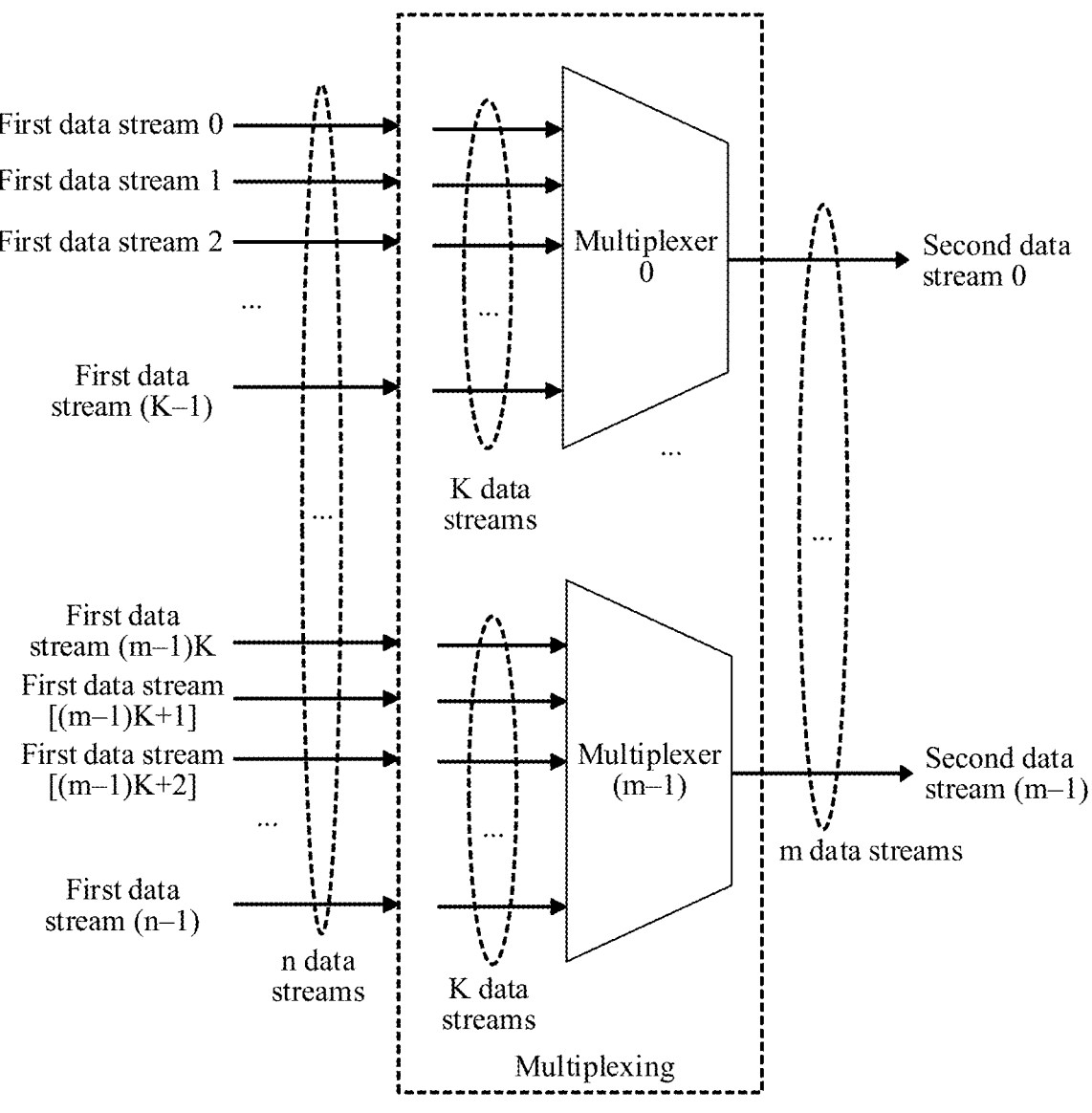
FIG. 13 is a schematic diagram of a structure in which multiplexing is performed on n first data streams according to an embodiment of this application.

FIG. 13 is a schematic diagram of a structure in which multiplexing is performed on n first data streams according to an embodiment of this application. As shown in FIG. 13, m multiplexers may be used to perform multiplexing. Specifically, every K first data streams in the n first data streams are input into one multiplexer, and the multiplexer outputs one second data stream. The m multiplexers output a total of m second data streams, where m=n/K, and K is an integer greater than 1. For ease of description, in this embodiment of this application, an example in which an integer n can be exactly divided by K is used for description. It should be noted that the n first data streams include G first data stream subsets, G is an integer greater than 1, and symbols in different first data stream subsets are from different codewords. In an embodiment, if K≤G, one first data stream is selected from each of any K first data stream subsets, in other words, the K first data streams input into one multiplexer are respectively from the K first data stream subsets. In another embodiment, if K>G, K/G first data streams are selected from each first data stream subset, in other words, the K first data streams input into one multiplexer include the K/G first data streams that are in each first data stream subset. For example, if n=32, G=2, K=4, and m=8, because K>G, two first data streams need to be selected from each of two first data stream subsets, to obtain four first data streams input into the multiplexer. For another example, if n=32, G=4, K=2, and m=8, because K<G, two first data stream subsets need to be selected from four first data stream subsets, and one first data stream needs to be selected from each of the two first data stream subsets, to obtain two first data streams input into the multiplexer.

It should be noted that, in some specific application scenarios, n=32 is used as an example, and a value of K may be 2, 4, or 8.

It should be understood that the first data stream subset is merely a concept introduced for ease of description. In actual application, the n first data streams are an entirety without division, and each first data stream subset may be considered as one or more data streams in the n first data streams.

It should be noted that, because z consecutive symbols in each first data stream participating in the multiplexing are from z different codewords, y consecutive symbols in each second data stream obtained through the multiplexing are from y different codewords, where y>z. In an embodiment, if K≤G, y=K*z. In another embodiment, if K>G, y=G*z.

The following describes a specific implementation of the multiplexing. For ease of description, in the following, the K first data streams input into the multiplexer are denoted as multiplexing input data stream 0, multiplexing input data stream 1, multiplexing input data stream 2, . . . , multiplexing input data stream (K−1).

Figure 14:
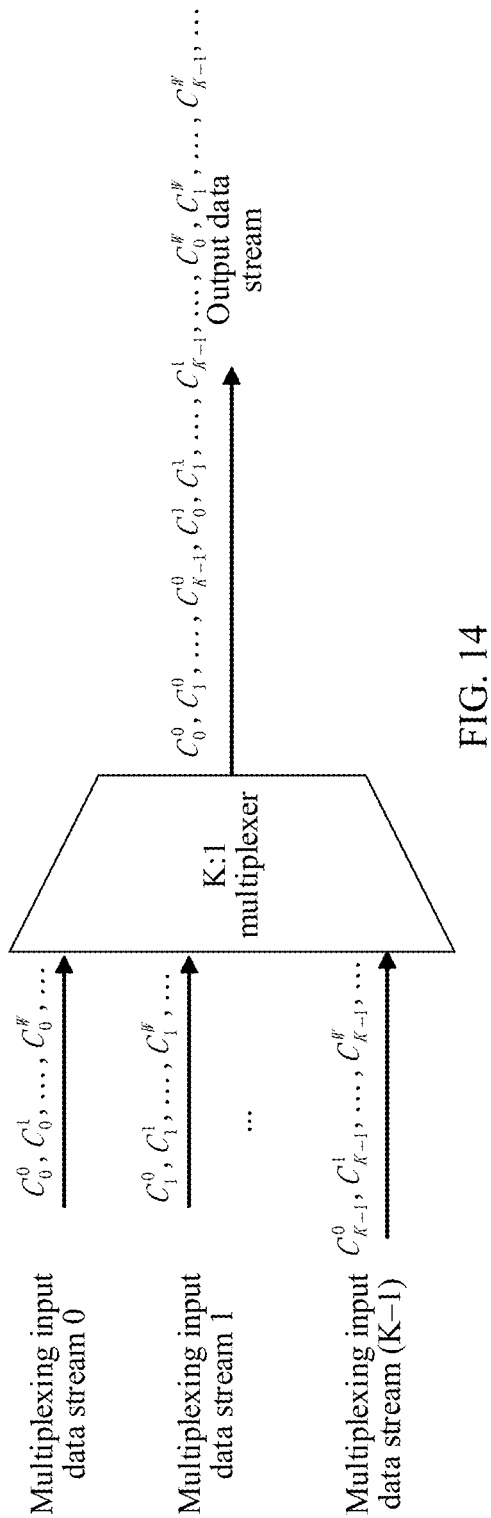
FIG. 14 is a schematic diagram of a first structure of a multiplexer according to an embodiment of this application.

FIG. 14 is a schematic diagram of a first structure of a multiplexer according to an embodiment of this application. As shown in FIG. 14, $$C_j^x$$

indicates consecutive Δ symbols in multiplexing input data stream j, and the Δ symbols are from Δ different outer-code codewords, where 0≤j≤K−1, and if K≤G, Δ is a divisor of z; or if $$K > G, \Delta = z.\ C_j^0, C_j^1, \ldots, C_j^w$$

indicate consecutive Δ·W RS symbols in multiplexing input data stream j. It should be noted that a second data stream output by the multiplexer includes a plurality of second data stream symbol subsets, each second data stream symbol subset includes K groups of symbols, and each group of symbols includes Δ symbols. In addition, two adjacent groups of symbols in each second data stream symbol subset are from different first data stream subsets. Specifically, a j*th* group of symbols in the second data stream symbol subset is from a j*th* of K multiplexing input data streams, where 0≤j≤K−1. It should be noted that, if K>G, two adjacent multiplexing input data streams in the K multiplexing input data streams are from different first data stream subsets. Further, it should be noted that if K>G, every G consecutive multiplexing input data streams are from different first data stream subsets.

It should be noted that, because two adjacent groups of symbols in each second data stream symbol subset are from different first data stream subsets, y consecutive symbols in the second data stream obtained through the multiplexing are from y different codewords, where y>z (y=K*z or y=G*z). It should be understood that, when only convolutional interleaving is performed, to implement a case in which the y consecutive symbols in the output data stream are from y different codewords, a long latency is required. In this solution, while duration of the convolutional interleaving is reduced, equivalent performance can still be achieved by combining the convolutional interleaving and the multiplexing. In addition, duration of the multiplexing is short, and equivalent performance can be achieved with a shorter latency by combining the convolutional interleaving and the multiplexing.

It should be understood that the second data stream symbol subset is merely a concept introduced for ease of description. In actual application, symbols in the second data stream are an entirety without division, and each second data stream symbol subset may be considered as a plurality of symbols in the second data stream.

FIG. 14 is used as an example.

$$C_0^0, C_1^0, \ldots, C_{K-1}^0$$

are denoted as a $0^{th}$ second data stream symbol subset, $$C_0^1, C_1^1, \ldots, C_{K-1}^1$$

are denoted as a $1^{st}$ second data stream symbol subset, . . . , $$C_0^w, C_1^w, \ldots, C_{K-1}^w$$

are denoted as a $W^{th}$ second data stream symbol subset. A $0^{th}$ second data stream symbol subset is used as an example, $$C_0^0$$

represents $\Delta$ symbols in a $0^{th}$ group, $$C_1^0$$

represents $\Delta$ symbols in a $1^{st}$ group, . . . , $$C_{K-1}^0$$

represents $\Delta$ symbols in a $(K-1)^{th}$ group. It can be learned that $$C_0^0$$

is from multiplexing input data stream 0, $$C_1^0$$

is from multiplexing input data stream 1, . . . , $$C_{K-1}^0$$

is from multiplexing input data stream (K−1). It should be understood that, assuming that $\Delta=z$, z consecutive symbols in $$C_0^0$$

are from z different codewords, z consecutive symbols in $$C_1^0$$

are from z different codewords, . . . . To implement a case in which y consecutive symbols in the second data stream obtained through the multiplexing are from y different codewords, where y>z, $$C_0^0$$

and $$C_1^0$$

are to be from different first data stream subsets, in other words, multiplexing input data stream 0 and multiplexing input data stream 1 are from different first data stream subsets. Similarly, $$C_1^0$$

and $$C_2^0$$

are to be from different first data stream subsets, in other words, multiplexing input data stream 1 and multiplexing input data stream 2 are from different first data stream subsets, and so on. In this way, every 2*z consecutive symbols in the second data stream obtained through the multiplexing are from 2*z different outer-code codewords. It should be noted that, if K>G, every G consecutive multiplexing input data streams are from different first data stream subsets. Specifically, multiplexing input data stream 0 to multiplexing input data stream (G−1) are from different first data stream subsets, multiplexing input data stream G and multiplexing input data stream (2*G−1) are from different first data stream subsets, and so on. In this way, every G*z consecutive symbols in the second data obtained through the multiplexing are from G*z different outer-code codewords.

In other words, in the foregoing manner, the multiplexer outputs data in the K input data streams to one second data stream in a polling manner per $\Delta$ symbols, in other words, sequentially outputs $\Delta$ symbols from each of multiplexing input data stream 0 to multiplexing input data stream (K−1) to generate the second data stream, and a data sequence corresponding to the second data stream is $$C_0^0, C_1^0, \ldots, C_{K-1}^0, C_0^1, C_1^1, \ldots, C_{K-1}^1, \ldots, C_0^w, C_1^w, \ldots, C_{K-1}^w,$$

. . . . When K≤G, K first data streams selected from first data stream subsets may correspond to multiplexing input data stream 0 to multiplexing input data stream (K−1) of the multiplexer in any sequence, Δ is a divisor of z, and any K*z consecutive symbols in the second data stream obtained through multiplexing and output are from different outer-code codewords. When K>G, the K first data streams selected from first data stream subsets need to correspond to multiplexing input data stream 0 to multiplexing input data stream (K−1) of the multiplexer according to a specific rule. The specific rule is that every G consecutive multiplexing input data streams of the multiplexer are from different first data stream subsets. In a specific manner, multiplexing input data stream i*G to multiplexing input data stream (i*G+G−1) are from first data stream subset 0 to first data stream subset (G−1) respectively, where 0≤i<K/G. In this way, every G*z consecutive symbols in the second data stream output by the multiplexer may be from different outer-code codewords.

Block 1003: Separately perform second FEC encoding on the m second data streams to obtain encoded data streams.

Figures 15, 16A:
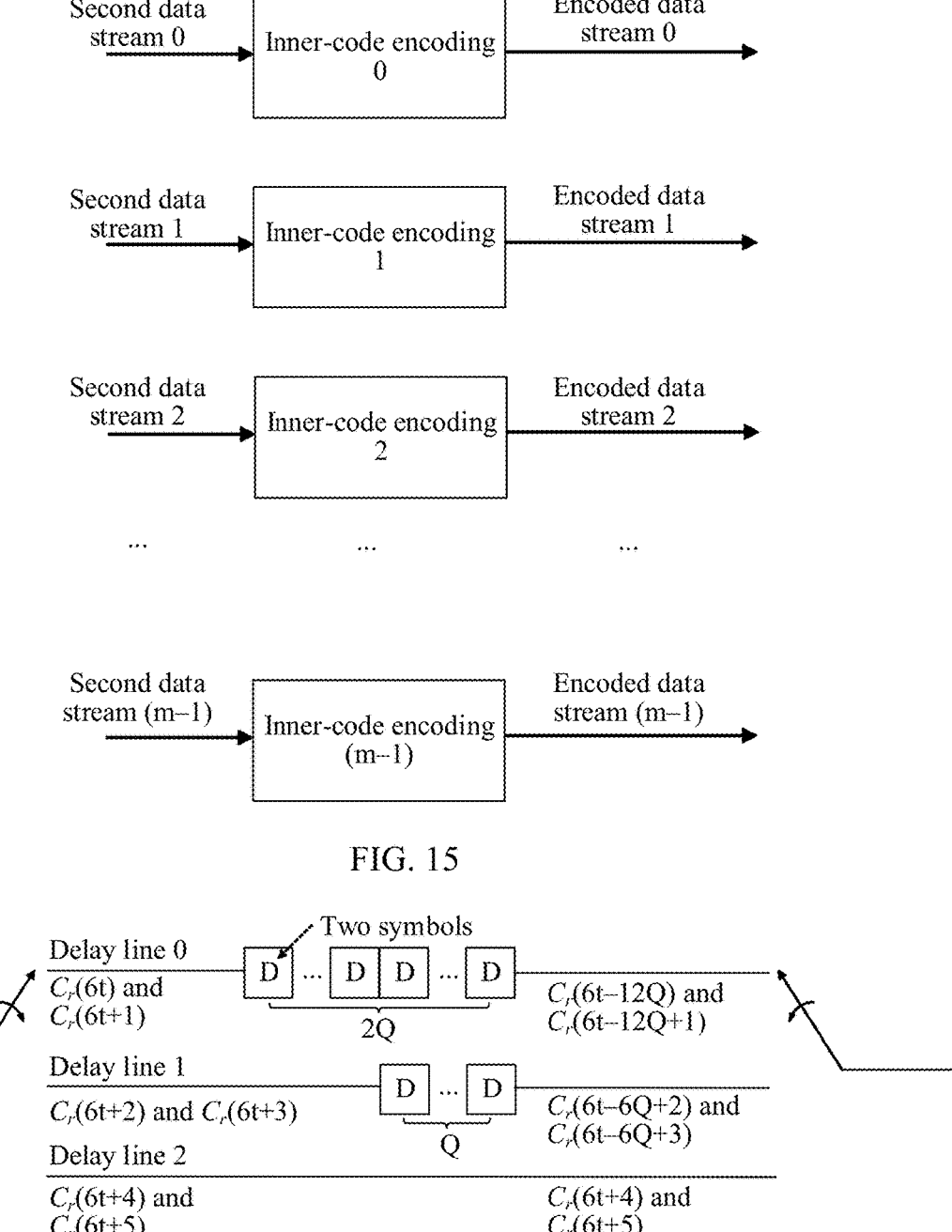
FIG. 15 is a schematic diagram of a structure in which FEC encoding is performed on m second data streams according to an embodiment of this application.

FIG. 15 is a schematic diagram of a structure in which FEC encoding is performed on m second data streams according to an embodiment of this application. As shown in FIG. 15, second FEC encoding, namely, inner-code encoding mentioned above, is separately performed on the m second data streams, and a length of an information bit of the inner-code encoding is less than or equal to y RS symbols. After data processing is performed on inner-code encoded data streams, data processed data streams are sent to a channel transmission medium for transmission. The data processing may include modulation and mapping, channel interleaving, polarization distribution, DSP framing, and the like. For example, the inner-code encoded data streams may be interleaved and then transmitted, so as to improve a capability of a system to resist a burst error.

In embodiments of this application, all n lane data streams are outer-code encoded codeword streams. Convolutional interleaving is separately performed on the n data streams, data stream multiplexing is performed on n data streams on which the convolutional interleaving is performed, to obtain m second data streams, and then the inner-code encoding is performed. According to the data interleaving and multiplexing processing solution provided in this application, the following case can be implemented with a short latency: A plurality of symbols consecutively output from m multiplex data streams are from a plurality of different outer-code codewords, so that a concatenated FEC solution helps reduce the data interleaving latency while ensuring good performance. In other words, in this application, a solution of a combination of convolutional interleaving and data multiplexing enables the overall latency of the concatenated FEC solution to be low, and is more applicable to an application scenario requiring a low latency.

The following further describes, with reference to some specific embodiments, a procedure of the data processing method described in FIG. 10.

Embodiment 1: An application scenario is a 1×800G interface, an information bit length of inner-code encoding is 120 bits, a 2:1, 4:1, or 8:1 multiplexer is used, and lane deskewing is used.

Based on the foregoing schematic diagram of data processing of the transmitter processing module shown in FIG.

3(*a*), the transmitter processing module performs alignment marker lock on lane data streams based on known alignment markers of PCS lanes. Known alignment markers of 32 lanes are different (refer to "Ethernet Technology Consortium 800G Specification"). The transmitter processing module then performs lane deskewing on 32 lane data streams to obtain 32 completely aligned lane data streams. Then, lane reordering is performed on data of the n=32 lanes based on the alignment markers, so that the data of the n=32 lanes can be arranged in a specified sequence. One sequence is that the lane data streams are sorted from 0 to 31 from top to bottom, which is the same as that in FIG. 5.

The n=32 lane data streams on which the lane reordering is performed are sent to a designed processor including convolutional interleaving and multiplexing, for convolutional interleaving and multiplexing, and then are sent to an inner-code encoder for inner-code encoding. After data processing is performed on inner-code encoded data streams, data processed data streams are sent to a channel transmission medium for transmission. The data processing may include modulation and mapping, channel interleaving, polarization distribution, DSP framing, and the like.

In this embodiment, the structure shown in FIG. 11 is used for the convolutional interleaving, and the convolutional interleaving is separately performed on n=32 PCS lane data streams to obtain n=32 first data streams. Convolution interleaver 0, convolution interleaver 1, convolution interleaver 2, . . . , convolution interleaver 31 use a same interleaving structure.

FIG. 16(*a*) is a schematic diagram of a third structure of a convolution interleaver according to an embodiment of this application. As shown in FIG. 16(*a*), p=3 delay lines are included. The p=3 delay lines respectively include 2Q storage units, Q storage units, and 0 storage units, and each storage unit is configured to store d=2 symbols. In other words, a delay value of delay line 0 is 4Q symbols, a delay value of delay line 1 is 2Q symbols, and a delay value of delay line 2 is 0 symbols, that is, no delay.

As shown in FIG. 16(*a*), $C_r(\cdot)$ represents one RS symbol in lane data stream r (where 0≤r≤n−1). For example, $C_r(6t)$ and $C_r(6t+1)$ represent two RS symbols that are currently input into delay line 0 and that are in lane data stream r, and $C_r(6t−12Q)$ and $C_r(6t−12Q+1)$ are two RS symbols output from delay line 0; $C_r(6t+2)$ and $C_r(6t+3)$ represent two RS symbols that are subsequently input into delay line 1 and that are in the lane data stream, and $C_r(6t−6Q+2)$ and $C_r(6t−6Q+3)$ are two RS symbols output from delay line 1; $C_r(6t+4)$ and $C_r(6t+5)$ represent two RS symbols that are subsequently input into delay line 2 and that are in the lane data stream, and $C_r(6t+4)$ and $C_r(6t+5)$ are two RS symbols output from delay line 2; $C_r(6t+6)$ and $C_r(6t+7)$ represent two RS symbols that are then subsequently input into delay line 0 and that are in the lane data stream, and $C_r(6t−12Q+6)$ and $C_r(6t−12Q+7)$ are two RS symbols output from delay line 0; and so on. With reference to FIG. 5, it can be seen that when 6Q+2≥68, that is, Q≥11, a total of six RS symbols $C_r(6t−12Q)$, $C_r(6t−12Q+1)$, $C_r(6t−6Q+2)$, $C_r(6t−6Q+3)$, $C_r(6t+4)$, and $C_r(6t+5)$ output through the convolutional interleaving are from six different RS codewords.

FIG. 16(*b*) is a schematic diagram of a fourth structure of a convolution interleaver according to an embodiment of this application. As shown in FIG. 16(*b*), in an embodiment, that Q=11 is selected, and a specific structure of the convolution interleaver is shown in FIG. 16(*b*). An interleaving latency corresponding to the convolution interleaver is approximately 22*2*3/2=66 RS symbols. The convolution interleaver shown in FIG. 16(*b*) separately performs convolutional interleaving on 32 PCS lane data streams to obtain 32 first data streams. Refer to the PCS lane data streams shown in FIG. 5. It is not difficult to understand that any RS symbol in first data streams 0 to 15 and any RS symbol in first data streams 16 to 31 are from different RS codewords. Therefore, the 32 first data streams include G−2 first data stream subsets, first data streams 0 to 15 are first data stream subset 0, and first data streams 16 to 31 are first data stream subset 1. With reference to FIG. 16(*a*), it is not difficult to understand that a total of 12 RS symbols (six output symbols $C_{r\_0}(6t-12Q)$, $C_{r\_0}(6t-12Q+1)$, $C_{r\_0}(6t-6Q+2)$, $C_{r\_0}(6t-6Q+3)$, $C_{r\_0}(6t+4)$, and $C_{r\_0}(6t+5)$ that are of any data stream r_0 in first data stream subset 0 and six output symbols $C_{r\_1}(6t-12Q)$, $C_{r\_1}(6t-12Q+1)$, $C_{r\_1}(6t-6Q+2)$, $C_{r\_1}(6t-6Q+3)$, $C_{r\_1}(6t+4)$, and $C_{r\_1}(6t+5)$ that are of any data stream r_1 in first data stream subset 1) are from 12 different RS codewords.

In this embodiment, a possible implementation of the multiplexing shown in FIG. 13 is as follows: G=2, K=2, and m=16. 16 second data streams are generated, and 16 2:1 multiplexing processing modules are included. Any first data stream selected from first data stream subset 0 and any first data stream selected from first data stream subset 1 are used as inputs of a 2:1 multiplexer.

FIG. 17(*a*) is a schematic diagram of a second structure of a multiplexer according to an embodiment of this application. As shown in FIG. 17(*a*), two input data streams of a 2:1 multiplexer i (where 0≤i≤15) are first data stream i and first data stream (i+16). In the figure, $$C_j^x$$

indicates consecutive 4=6 RS symbols in multiplexing input data stream j of the 2:1 multiplexer, and the RS symbols are from 6 different outer-code RS codewords. The 2:1 multiplexer outputs data in the two input data streams to an output data stream in a polling manner per 6 RS symbols, that is, an output data sequence is $$C_0^0, C_1^0, C_0^1, C_1^1, \dots, C_0^w, C_1^w,$$

. . . . It should be noted that because K=G=2, when Δ=1, 2, or 3, 12 consecutive RS symbols in the data stream output by the multiplexer can be from 12 different RS codewords.

Another embodiment of the multiplexing shown in FIG. 13 in this embodiment is as follows: G=2, K=4, m=8, eight second data streams are generated, and eight 4:1 multiplexers are included. Any two first data streams selected from first data stream subset 0 and any two first data streams selected from first data stream subset 1 are used as inputs of the 4:1 multiplexer.

FIG. 17(*b*) is a schematic diagram of a third structure of a multiplexer according to an embodiment of this application. As shown in FIG. 17(*b*), multiplexing input data stream 0, multiplexing input data stream 1, multiplexing input data stream 2, and multiplexing input data stream 3 of a 4:1 multiplexer i (where 0≤i≤7) respectively correspond to first data stream i, first data stream (i+16), first data stream (i+8), and first data stream (i+24), that is, any two consecutive multiplexing input data streams of the multiplexer are from different first data stream subsets. In the figure, $$C_j^x$$

indicates 4=6 consecutive RS symbols in multiplexing input data stream j (where 0≤j≤3) of the 4:1 multiplexer, and the symbols are from 6 different outer-code RS codewords. The 4:1 multiplexer outputs data in the four input data streams to an output data stream in a polling manner per 6 RS symbols, that is, an output data sequence is $$C_0^0, C_1^0, C_2^0, C_3^0, C_0^1, C_1^1, C_2^1, C_3^1, \dots, C_0^w, C_1^w, C_2^w, C_3^w,$$

. . . 12 consecutive RS symbols in the output data stream are from 12 different RS codewords.

Another embodiment of the multiplexing shown in FIG. 13 in this embodiment is as follows: G=2, K=8, m=4, four second data streams are generated, and four 8:1 multiplexers are included. Any four first data streams selected from first data stream subset 0 and any four first data streams selected from first data stream subset 1 are used as inputs of the 8:1 multiplexer.

FIG. 17(*c*) is a schematic diagram of a fourth structure of a multiplexer according to an embodiment of this application. As shown in FIG. 17(*c*), multiplexing input data streams 0 to 7 of an 8:1 multiplexer i (where 0≤i≤3) respectively correspond to first data stream i, first data stream (i+16), first data stream (i+8), first data stream (i+24), first data stream (i+4), first data stream (i+20), first data stream (i+12), and first data stream (i+28), that is, any two consecutive multiplexing input data streams of the multiplexer are from different first data stream subsets. It should be noted that, multiplexing input data streams 0 to 7 of the 8:1 multiplexer i (where 0≤i≤3) may alternatively respectively correspond to first data stream i, first data stream (i+16), first data stream (i+4), first data stream (i+20), first data stream (i+8), first data stream (i+24), first data stream (i+12), and first data stream (i+28), that is, any two consecutive multiplexing input data streams of the multiplexer are from different first data stream subsets. In the figure, $$C_j^x$$

indicates consecutive Δ=6 RS symbols in multiplexing input data stream j (where 0≤j≤7) of the 8:1 multiplexer, and the symbols are from 6 different outer-code RS codewords. The 8:1 multiplexer outputs data in the eight input data streams to an output data stream in a polling manner per 6 RS symbols, that is, an output data sequence is $$C_0^0, C_1^0, \dots, C_6^0, C_7^0, C_0^1, C_1^1, \dots, C_6^1, C_7^1, \dots, C_0^w, C_1^w, \dots, C_6^w, C_7^w,$$

. . . 12 consecutive RS symbols in the output data stream are from 12 different RS codewords.

The inner-code encoding is separately performed on the 16 second data streams, the eight second data streams, or the four second data streams, and the information bit length of the inner-code encoding is 120 bits. Specifically, an inner-code encoder separately adds redundancy to a total of 120 bits in 12 consecutive RS symbols in each second data stream, to obtain an inner-code codeword data stream. In an embodiment, the inner-code encoding is performed by using Hamming(128,120), and 8-bit redundancy is added to a total of 120 bits in 12 consecutive RS symbols in each second data stream, to obtain a 128-bit codeword. In another embodiment, the inner-code encoding is performed by using BCH(136,120), and 16-bit redundancy is added to a total of 120 bits in 12 consecutive RS symbols in each second data stream, to obtain a 136-bit codeword.

After data processing is performed on inner-code encoded data streams, data processed data streams to a channel transmission medium for transmission. The data processing may include modulation and mapping, channel interleaving, polarization distribution, DSP framing, and the like. For example, the inner-code encoded data streams may be interleaved, so as to improve a capability of a system to resist a burst error.

By using the data interleaving and encoding scheme in Embodiment 1, concatenated code of KP4 RS(544,514)+Hamming(128,120) in the scheme is under AWGN, a corresponding pre-FEC BER for implementing a post-FEC bit error rate BER of 1E-15 is approximately 4.5E-3, and performance approximates optimal performance of a concatenated FEC scheme.

Embodiment 2: An application scenario is a 1×800G interface, an information bit length of inner-code encoding is 120 bits, a 2:1, 4:1, or 8:1 multiplexer is used, and lane symbol alignment is used.

A main difference between Embodiment 2 and Embodiment 1 lies in that, in Embodiment 2, 32 aligned lane data streams are obtained through alignment based on two RS symbols.

Specifically, based on the foregoing schematic diagram of data processing of the transmitter processing module shown in FIG. 3(a), the transmitter processing module performs alignment marker lock on lane data streams based on known alignment markers of PCS lanes. Then, the transmitter processing module performs alignment on the 32 lane data streams based on two RS symbols to obtain the 32 aligned lane data streams. Then, lane reordering is performed on data of the 32 lanes based on the alignment markers, so that the data of the 32 lanes can be arranged in a specified sequence. One arrangement sequence is that the lane data streams are sorted from 0 to 31 from top to bottom, which is the same as that in FIG. 3(a). Another arrangement sequence is that in the 32 lanes output through "lane reordering" from top to bottom, the first 16 lane data streams include PCS lane data streams 0 to 15, and the second 16 lanes include PCS lane data streams 16 to 31. It should be understood that, in this case, a specific sequence of the first 16 lane data streams is not limited, and a specific sequence of the second 16 lane data streams is not limited either. That is, lane data stream i in FIG. 3(a) does not necessarily correspond to PCS lane data stream i.

The 32 lane data streams on which the lane reordering is performed are sent to a designed processor including convolutional interleaving and multiplexing, for interleaving and data sequence disordering, and then are sent to an inner-code encoder for inner-code encoding. After data processing is performed on inner-code encoded data streams, data processed data streams are sent to a channel transmission medium for transmission. It should be understood that, the convolutional interleaving and the multiplexing and the inner-code encoding scheme used in this embodiment all use the solutions in Embodiment 1.

By using the data interleaving and encoding scheme in Embodiment 2, concatenated code of KP4 RS(544,514)+Hamming(128,120) in the scheme is under AWGN, a corresponding pre-FEC BER for implementing a post-FEC bit error rate BER of 1E-15 is approximately 4.5E-3, performance is equivalent to that of the solution in Embodiment 1, and an overall latency is lower. However, compared with the solution in Embodiment 1, the solution in Embodiment 2 is poor in resisting a system burst error. This solution is applicable to some scenarios that require a lower latency.

Embodiment 3: An application scenario is a 1×800G interface, an information bit length of inner-code encoding is 160 bits, a 2:1, 4:1, or 8:1 multiplexer is used, and lane deskewing is used.

Based on Embodiment 1, in this embodiment, inner code with a code length of 160 bits is considered, and a newly designed convolution interleaver is correspondingly used.

In this embodiment, the structure shown in FIG. 11 is used for the convolutional interleaving, and the convolutional interleaving is separately performed on n=32 PCS lane data streams to obtain n=32 first data streams. Convolution interleaver 0, convolution interleaver 1, convolution interleaver 2, . . . , convolution interleaver 31 use a same interleaving structure.

Figure 18A:
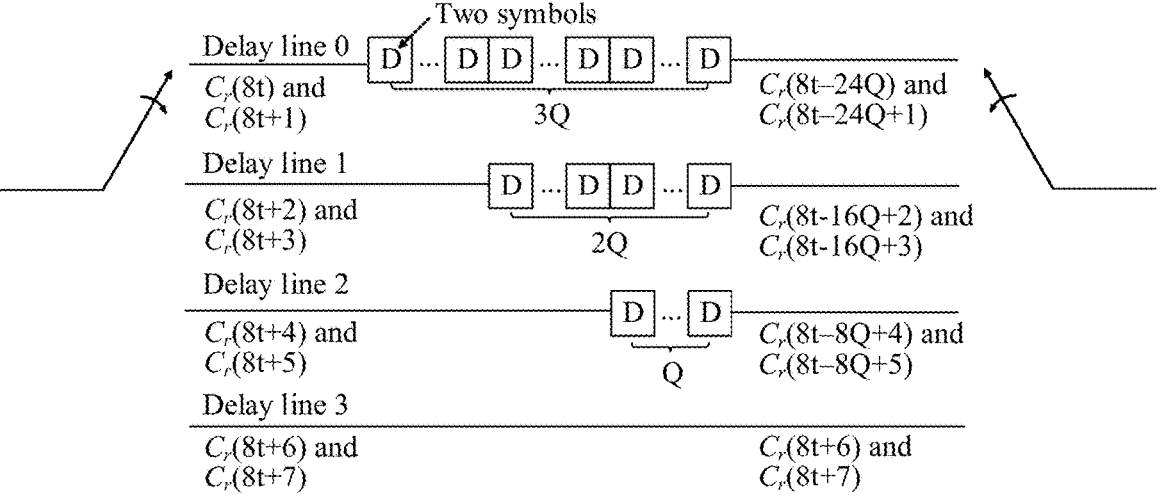
FIG. 18(*a*) is a schematic diagram of a fifth structure of a convolution interleaver according to an embodiment of this application.

FIG. 18(a) is a schematic diagram of a fifth structure of a convolution interleaver according to an embodiment of this application. As shown in FIG. 18(a), p=4 delay lines are included. The four delay lines respectively include 3Q storage units, 2Q storage units, Q storage units, and 0 storage units, and each storage unit is configured to store d=2 symbols. In other words, a delay value of delay line 0 is 6Q symbols, a delay value of delay line 1 is 4Q symbols, a delay value of delay line 2 is 2Q symbols, and a delay value of delay line 3 is 0 symbols, that is, no delay.

As shown in FIG. 18(a), $C_r(\cdot)$ represents one RS symbol in lane data stream r (where $0 \leq r \leq n-1$). For example, $C_r(8t)$ and $C_r(8t+1)$ represent two RS symbols that are currently input into delay line 0 and that are in the lane data stream r, and $C_r(8t-24Q)$ and $C_r(8t-24Q+1)$ are two RS symbols output from delay line 0; $C_r(8t+2)$ and $C_r(8t+3)$ represent two RS symbols that are subsequently input into delay line 1 and that are in the lane data stream, and $C_r(8t-16Q+2)$ and $C_r(8t-16Q+3)$ are two RS symbols output from delay line 1; $C_r(8t+4)$ and $C_r(8t+5)$ represent two RS symbols that are subsequently input into delay line 2 and that are in the lane data stream, and $C_r(8t-8Q+4)$ and $C_r(8t-8Q+5)$ are two RS symbols output from delay line 2; $C_r(8t+6)$ and $C_r(8t+7)$ represent two RS symbols that are then subsequently input into delay line 3 and that are in the lane data stream, and $C_r(8t+6)$ and $C_r(8t+7)$ are two RS symbols output from delay line 3; and so on. With reference to FIG. 5, it can be seen that when 8Q+2≥68, that is, Q≥9, a total of eight RS symbols, $C_r(8t-24Q)$, $C_r(8t-24Q+1)$, $C_r(8t-16Q+2)$, $C_r(8t-16Q+3)$, $C_r(8t-8Q+4)$, $C_r(8t-8Q+5)$, $C_r(8t+6)$, and $C_r(8t+7)$, output through the convolutional interleaving are from eight different RS codewords.

Figure 18B:
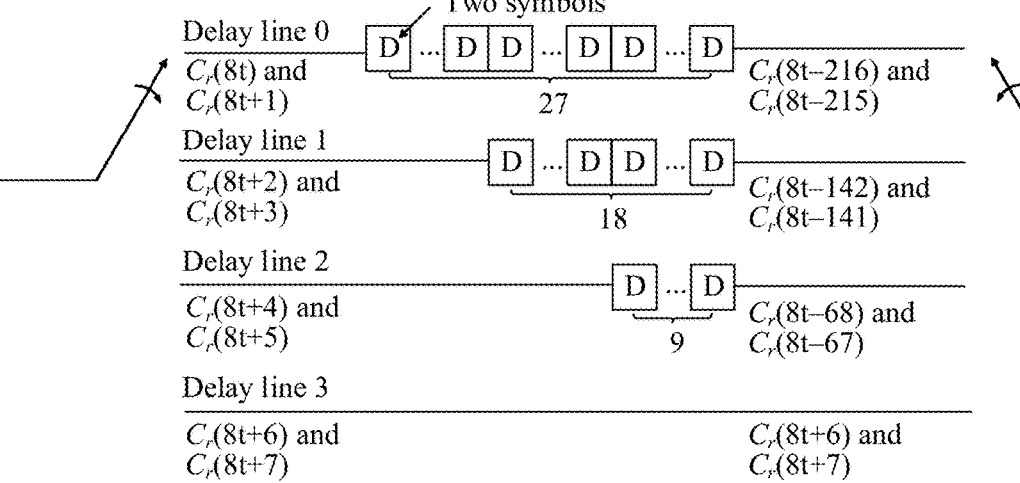

FIG. 18(b) is a schematic diagram of a sixth structure of a convolution interleaver according to an embodiment of this application. As shown in FIG. 18(b), in an embodiment, that Q=9 is selected, and a specific structure of the convolution interleaver is shown in FIG. 18(b). An interleaving latency corresponding to the convolution interleaver is approximately 27*2*4/2=108 RS symbols. The convolution interleaver shown in FIG. 18(b) separately performs convolutional interleaving on 32 PCS lane data streams to obtain 32 first data streams. Refer to the PCS lane data streams shown in FIG. 5. It is not difficult to understand that any RS symbol in first data streams 0 to 15 and any RS symbol in first data streams 16 to 31 are from different RS codewords. Therefore, the 32 first data streams include G=2 first data stream subsets, first data streams 0 to 15 are first data stream subset 0, and first data streams 16 to 31 are first data stream subset 1. With reference to FIG. 18($a$), it is not difficult to understand that, a total of 16 RS symbols (eight output symbols $C_{r\_0}(8t-24Q)$, $C_{r\_0}(8t-24Q+1)$, $C_{r\_0}(8t-16Q+2)$, $C_{r\_0}(8t-16Q+3)$, $C_{r\_0}(8t-8Q+4)$, $C_{r\_0}(8t-8Q+5)$, $C_{r\_0}(8t+6)$, and $C_{r\_0}(8t+7)$ that are of any data stream r_0 in first data stream subset 0 and eight output symbols $C_{r\_1}(8t-24Q)$, $C_{r\_1}(8t-24Q+1)$, $C_{r\_1}(8t-16Q+2)$, $C_{r\_1}(8t-16Q+3)$, $C_{r_1}(8t-8Q+4)$, $C_{r\_1}(8t-8Q+5)$, $C_{r\_1}(8t+6)$, and $C_{r\_1}(8t+7)$ that are of any data stream r_1 in first data stream subset 1) are from 16 different RS codewords.

In this embodiment, a possible implementation of the multiplexing shown in FIG. 13 is as follows: G=2, K=2, and m=16. 16 second data streams are generated, and 16 2:1 multiplexing processing modules are included. Any first data stream selected from first data stream subset 0 and any first data stream selected from first data stream subset 1 are used as inputs of a 2:1 multiplexer. A corresponding specific implementation of the 2:1 multiplexer is shown in FIG. 17($a$). Two input data streams of 2:1 multiplexer i (where 0≤i≤15) are first data stream i and first data stream (i+16). In the figure, $$C_j^x$$

indicates consecutive Δ=8 RS symbols in multiplexing input data stream j (where 0≤j≤1) of the 2:1 multiplexer, and the symbols are from 8 different outer-code RS codewords. The 2:1 multiplexer outputs data in the two input data streams to an output data stream in a polling manner per 8 RS symbols, that is, an output data sequence is $$C_0^0, C_1^0, C_0^1, C_1^1, \ldots, C_0^w, C_1^w,$$

. . . 16 consecutive RS symbols in the output data stream are from 16 different RS codewords. It should be noted that because K=G=2, when Δ=1, 2, or 4, 16 consecutive RS symbols in the data stream output by the multiplexer can be from 16 different RS codewords.

In this embodiment, another possible implementation of the multiplexing shown in FIG. 13 is as follows: G=2, K=4, and m=8. Eight second data streams are generated, and eight 4:1 multiplexers are included. Any two first data streams selected from first data stream subset 0 and any two first data streams selected from first data stream subset 1 are used as inputs of the 4:1 multiplexer. A corresponding specific implementation of the 4:1 multiplexer is shown in FIG. 17($b$). Multiplexing input data stream 0, multiplexing input data stream 1, multiplexing input data stream 2, and multiplexing input data stream 3 of the 4:1 multiplexer i (where 0≤i≤7) respectively correspond to first data stream i, first data stream (i+16), first data stream (i+8), and first data stream (i+24), that is, any two pieces of consecutive multiplexing input data of the multiplexer are from different first data symbol subsets. In the figure, $$C_j^x$$

indicates consecutive Δ=8 RS symbols in multiplexing input data stream j (where 0≤j≤3) of the 4:1 multiplexer, and the symbols are from 8 different outer-code RS codewords. The 4:1 multiplexer outputs data in the four input data streams to an output data stream in a polling manner per 8 RS symbols, that is, an output data sequence is $$C_0^0, C_1^0, C_2^0, C_3^0, C_0^1, C_1^1, C_2^1, C_3^1, \ldots, C_0^w, C_1^w, C_2^w, C_3^w,$$

. . . 16 consecutive RS symbols in the output data stream are from 16 different RS codewords.

Another embodiment of the multiplexing shown in FIG. 13 in this embodiment is as follows: G=2, K=8, m=4, four second data streams are generated, and four 8:1 multiplexers are included. Any four first data streams selected from first data stream subset 0 and any four first data streams selected from first data stream subset 1 are used as inputs of the 8:1 multiplexer. A corresponding specific implementation of the 8:1 multiplexer is shown in FIG. 17($c$). Multiplexing input data streams 0 to 7 of 8:1 multiplexer i (where 0≤i≤3) respectively correspond to first data stream i, first data stream (i+16), first data stream (i+4), first data stream (i+20), first data stream (i+8), first data stream (i+24), first data stream (i+12), and first data stream (i+28). In the figure, $$C_j^x$$

indicates consecutive Δ=8 RS symbols in multiplexing input data stream j (where 0≤j≤7) of the 8:1 multiplexer, and the symbols are from 8 different outer-code RS codewords. The 8:1 multiplexer outputs data in the eight input data streams to an output data stream in a polling manner per 8 RS symbols, that is, an output data sequence is $$C_0^0, C_1^0, C_2^0, C_3^0, C_4^0, C_5^0, C_6^0, C_7^0, C_0^1, C_1^1, C_2^1,$$
$$C_3^1, C_4^1, C_5^1, C_6^1, C_7^1, \ldots, C_0^w, C_1^w, C_2^w, C_3^w,$$

. . . 16 consecutive RS symbols in the output data stream are from 16 different RS codewords.

The inner-code encoding is separately performed on the 16 second data streams, the eight second data streams, or the four second data streams, and the information bit length of the inner-code encoding is 160 bits. Specifically, an inner-code encoder separately adds redundancy to a total of 160 bits in 16 consecutive RS symbols in the second data stream, to obtain an inner-code codeword data stream. In an embodiment, inner-code encoding is performed by using Hamming (170,160), and 10-bit redundancy is added to a total of 160 bits in 16 consecutive RS symbols in each second data stream, to obtain a 170-bit codeword. In another embodiment, inner-code encoding is performed by using BCH(176, 160), and 16-bit redundancy is added to a total of 160 bits in 16 consecutive RS symbols in each second data stream, to obtain a 176-bit codeword. After data processing is performed on inner-code encoded data streams, data processed data streams are sent to a channel transmission medium for transmission.

By using the data interleaving and encoding scheme in this embodiment, when Hamming(170,160) is used as inner code, concatenated code of KP4 RS(544,514)+Hamming (170,160) in the scheme is under AWGN, a corresponding pre-FEC BER for implementing a post-FEC bit error rate BER of 1E-15 is approximately 4.3E-3, and performance approximates to optimal performance of the concatenated FEC scheme. When the inner code uses BCH(176,160), concatenated code of KP4 RS(544,514)+BCH(176,160) in the scheme is under AWGN, a corresponding pre-FEC BER for implementing a post-FEC bit error rate BER of 1E-15 is approximately 8.3E-3, and performance approximates to optimal performance of the concatenated FEC scheme.

Embodiment 4: An application scenario is a 1×800G interface, an information bit length of inner-code encoding is 160 bits, a 2:1, 4:1, or 8:1 multiplexer is used, and lane symbol alignment is used.

A main difference between Embodiment 4 and Embodiment 3 lies in that, in Embodiment 4, 32 aligned lane data streams are obtained through alignment based on two RS symbols.

Specifically, based on the foregoing schematic diagram of data processing of the transmitter processing module shown in FIG. 3(a), the transmitter processing module performs alignment marker lock on lane data streams based on known alignment markers of PCS lanes. Then, the transmitter processing module performs alignment on the 32 lane data streams based on two RS symbols to obtain 32 aligned lane data streams. Then, lane reordering is performed on data of the 32 lanes based on the alignment markers, so that the data of the 32 lanes can be arranged in a specified sequence. One arrangement sequence is that the lane data streams are sorted from 0 to 31 from top to bottom, which is the same as that in FIG. 3(a). Another arrangement sequence is that in the 32 lanes output through "lane reordering" from top to bottom, the first 16 lane data streams include PCS lane data streams 0 to 15, and the second 16 lanes include PCS lane data streams 16 to 31. It should be understood that, in this case, a specific sequence of the first 16 lane data streams is not limited, and a specific sequence of the second 16 lane data streams is not limited either. That is, lane data stream i in FIG. 3(a) does not necessarily correspond to PCS lane data stream i.

The 32 lane data streams on which the lane reordering is performed are sent to a designed processor including convolutional interleaving and multiplexing, for interleaving and data sequence disordering, and then are sent to an inner-code encoder for inner-code encoding. After data processing is performed on inner-code encoded data streams, data processed data streams are sent to a channel transmission medium for transmission. It should be understood that, the convolutional interleaving and the multiplexing and the inner-code encoding scheme used in this embodiment all use the solutions in Embodiment 3.

By using the data interleaving and encoding scheme in Embodiment 4, concatenated code of KP4 RS(544,514)+Hamming(160,120) in the scheme is under AWGN, a corresponding pre-FEC BER for implementing a post-FEC bit error rate BER of 1E-15 is approximately 4.5E-3, performance is equivalent to that of the solution in Embodiment 3, and an overall latency is lower. However, compared with the solution in Embodiment 3, the solution in Embodiment 4 is poor in resisting a system burst error. This solution is applicable to some scenarios that require a lower latency.

By using the data interleaving and encoding scheme in Embodiment 4, when Hamming(170,160) is used as inner code, concatenated code of KP4 RS(544,514)+Hamming (170,160) in the scheme is under AWGN, a corresponding pre-FEC BER for implementing a post-FEC bit error rate BER of 1E-15 is approximately 4.3E-3, and performance approximates to optimal performance of the concatenated FEC scheme. When the inner code uses BCH(176,160), concatenated code of KP4 RS(544,514)+BCH(176,160) in the scheme is under AWGN, a corresponding pre-FEC BER for implementing a post-FEC bit error rate BER of 1E-15 is approximately 8.3E-3, and performance approximates to optimal performance of the concatenated FEC scheme. It should be understood that, when an inner-code scheme that is the same as the solution in Embodiment 3 is used, performance of the solution in Embodiment 4 is the same as that in Embodiment 3, but the solution in Embodiment 4 is poor in resisting a system burst error. This solution is applicable to some scenarios that require a lower latency.

Embodiment 5: An application scenario is 2×400G interfaces, an information bit length of inner-code encoding is 120 or 160 bits, a 2:1, 4:1, or 8:1 multiplexer is used, and lane deskewing is used.

Different from Embodiment 1 to Embodiment 4, in this embodiment, it is considered that host interfaces are 100 Gb/s per lane 2×400G interfaces. For details of the interface, refer to IEEE Std 802.3ckTM/D3.0.

Specifically, based on the foregoing schematic diagram of data processing of the transmitter processing module shown in FIG. 3(a), the transmitter processing module performs alignment marker lock on 16 lane data streams based on known alignment markers of PCS lanes 0 to 15 or PCS lanes 16 to 31. The transmitter processing module then performs lane deskewing on the 32 lane data streams to obtain 32 aligned lane data streams. Then, lane reordering is performed on data of 16 lanes based on the alignment markers of the PCS lanes 0 to 15 or the PCS lanes 16 to 31, so that the data of the 16 lanes can be arranged in a specified sequence. Finally, data of 32 lanes can be arranged in a specified sequence. One sequence is that the lane data streams are sorted from 0 to 31 from top to bottom, which is the same as that in FIG. 6.

The 32 lane data streams on which the lane reordering is performed are sent to a designed processor including convolutional interleaving and multiplexing, for interleaving and data sequence disordering, and then are sent to an inner-code encoder for inner-code encoding. After data processing is performed on inner-code encoded data streams, data processed data streams are sent to a channel transmission medium for transmission.

In an embodiment, when the processor including the convolutional interleaving and the multiplexing, and the inner-code encoding that are used in Embodiment 5 are the same as those in the solution in Embodiment 1, performance and a latency of the concatenated FEC solution are the same as those in Embodiment 1.

In another embodiment, when the processor including the convolutional interleaving and the multiplexing, and the inner-code encoding that are used in Embodiment 5 are the same as those in the solution in Embodiment 3, performance and a latency of the concatenated FEC solution are the same as those in Embodiment 3.

Embodiment 6: An application scenario is 2×400G interfaces, an information bit length of inner-code encoding is 120 or 160 bits, a 2:1, 4:1, or 8:1 multiplexer is used, lane symbol alignment is used, and lane reordering is not performed.

Based on the solution in Embodiment 5, Embodiment 6 provides an embodiment solution with a lower latency.

Specifically, based on the foregoing schematic diagram of data processing of the transmitter processing module shown in FIG. 3(b), the transmitter processing module performs alignment marker lock on 16 lane data streams based on known alignment markers of PCS lanes 0 to 15 or PCS lanes 16 to 31. Then, the transmitter processing module performs alignment on the 32 lane data streams based on two RS symbols to obtain 32 aligned lane data streams. The 32 aligned lane data streams are directly sent to a designed processor including convolutional interleaving and multiplexing, for interleaving and data sequence disordering, and then are sent to an inner-code encoder for inner-code encoding. After data processing is performed on inner-code encoded data streams, data processed data streams are sent to a channel transmission medium for transmission.

In an embodiment, when the processor including convolutional interleaving and multiplexing, and inner-code encoding that are used in Embodiment 6 are the same as those in the solution in Embodiment 2, performance and a latency of the concatenated FEC solution are the same as those in Embodiment 2.

In another embodiment, when the processor including convolutional interleaving and multiplexing, and inner-code encoding that are used in Embodiment 6 are the same as those in the solution in Embodiment 4, performance and a latency of the concatenated FEC solution are the same as those in Embodiment 4.

Embodiment 7: An application scenario is 4×200G interfaces, an information bit length of inner-code encoding is 120 or 160 bits, a 4:1 or 8:1 multiplexer is used, and lane deskewing is used.

In this embodiment, it is considered that host interfaces are 100 Gb/s per lane 4×200G interfaces. For details of the interface, refer to IEEE Std 802.3ckTM/D3.0.

Based on the foregoing schematic diagram of data processing of the transmitter processing module shown in FIG. 3(a), the transmitter processing module performs alignment marker lock on eight lane data streams based on known alignment markers of PCS lanes 0 to 7, PCS lanes 8 to 15, PCS lanes 16 to 23, or PCS lanes 24 to 31. PCS lanes 0 to 7, PCS lanes 8 to 15, PCS lanes 16 to 23, or PCS lanes 24 to 31 herein may be considered as PCS lanes 0 to 7 in a $0^{th}$ channel, a $1^{st}$ channel, a $2^{nd}$ channel, or a $3^{rd}$ channel of 200G respectively. The transmitter processing module then performs lane deskewing on the 32 lane data streams to obtain 32 aligned lane data streams. Then, lane reordering is performed on data of eight lanes based on the alignment markers of PCS lanes 0 to 7, PCS lanes 8 to 15, PCS lanes 16 to 23, or PCS lanes 24 to 31, so that the data of the eight lanes can be arranged in a specified sequence. Finally, data of 32 lanes can be arranged in a specified sequence. One sequence is that the lane data streams are sorted from 0 to 31 from top to bottom, which is the same as that in FIG. 7.

The 32 lane data streams on which the lane reordering is performed are sent to a designed processor including convolutional interleaving and multiplexing, for interleaving and data sequence disordering, and then are sent to an inner-code encoder for inner-code encoding. After data processing is performed on inner-code encoded data streams, data processed data streams are sent to a channel transmission medium for transmission.

In this embodiment, the structure shown in FIG. 11 is used for the convolutional interleaving, and the convolutional interleaving is separately performed on n=32 PCS lane data streams to obtain n=32 first data streams. Convolution interleaver 0, convolution interleaver 1, convolution interleaver 2, . . . , convolution interleaver 31 use a same interleaving structure.

Figures 19A, 19B, 20:
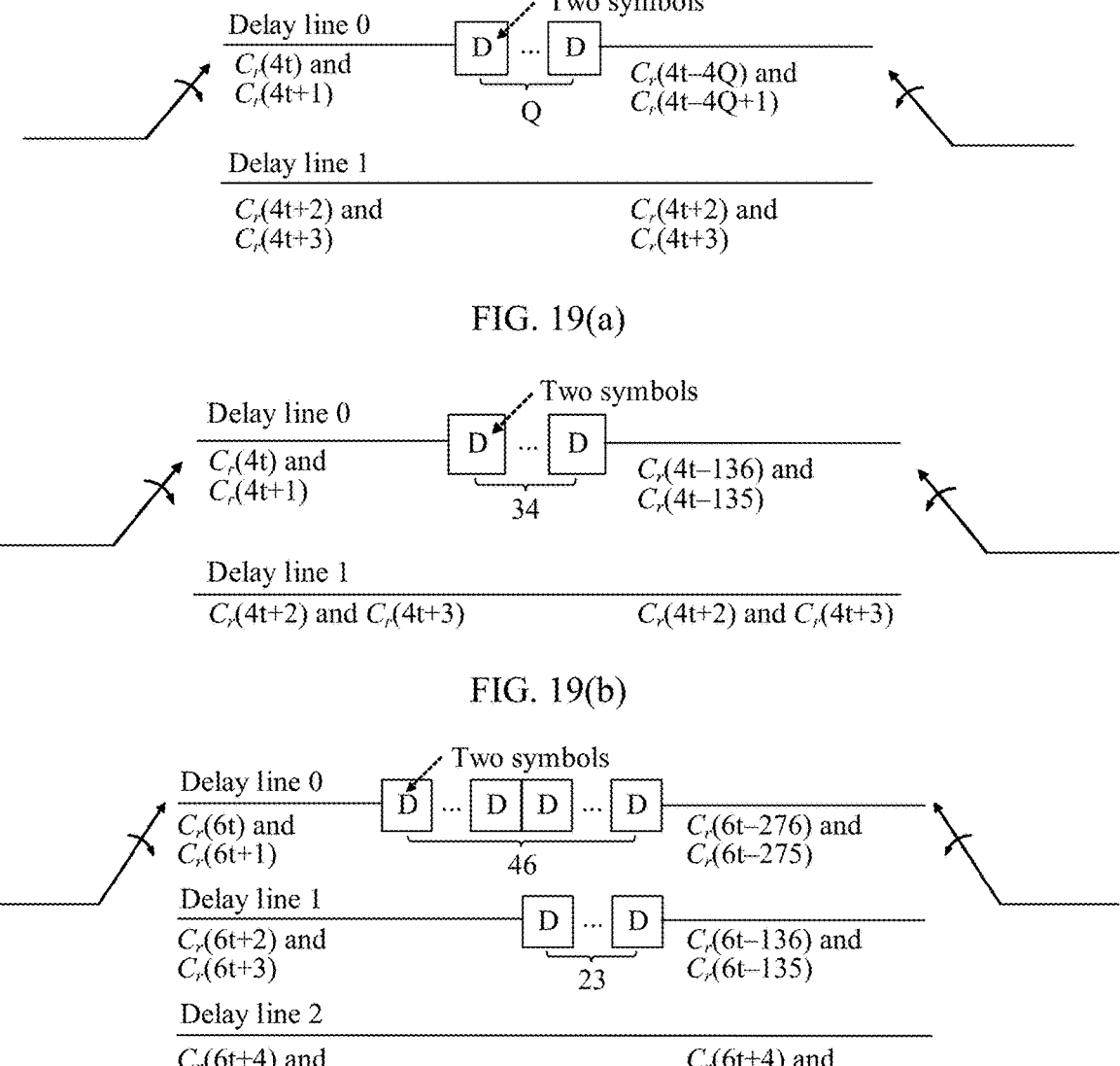
FIG. 20 is a schematic diagram of a ninth structure of a convolution interleaver according to an embodiment of this application.

FIG. 19(a) is a schematic diagram of a seventh structure of a convolution interleaver according to an embodiment of this application. As shown in FIG. 19(a), p=2 delay lines are included. The two delay lines respectively include Q storage units and 0 storage units, and each storage unit is configured to store d=2 symbols. In other words, a delay value of delay line 0 is 2Q symbols, and a delay value of delay line 1 is 0 symbols, that is, no delay.

As shown in FIG. 19(a), $C_r(\cdot)$ represents one RS symbol in lane data stream r ($0 \le r \le n-1$). For example, $C_r(4t)$ and $C_r(4t+1)$ represent two RS symbols that are currently input into delay line 0 and that are in the lane data stream, and $C_r(4t-4Q)$ and $C_r(4t-4Q+1)$ are two RS symbols output from delay line 0; $C_r(4t+2)$ and $C_r(4t+3)$ represent two RS symbols that are subsequently input into delay line 1 and that are in the lane data stream, and $C_r(4t+2)$ and $C_r(4t+3)$ are two RS symbols output from delay line 1; $C_r(4t+4)$ and $C_r(4t+5)$ represent two RS symbols that are subsequently input into delay line 0 and that are in the lane data stream, and $C_r(4t-4Q+4)$ and $C_r(4t-4Q+5)$ are two RS symbols output from delay line 0; and so on. With reference to FIG. 7, it can be seen that when $4Q+2 \ge 136$, that is, $Q \ge 34$, a total of four consecutive RS symbols, $C_r(4t-4Q)$, $C_r(4t-4Q+1)$, $C_r(4t+2)$, and $C_r(4t+3)$, output through the convolutional interleaving are from four different RS codewords.

FIG. 19(b) is a schematic diagram of an eighth structure of a convolution interleaver according to an embodiment of this application. As shown in FIG. 19(b), in an embodiment, that Q=34 is selected, and a specific structure of the convolution interleaver is shown in FIG. 19(b). A corresponding interleaving latency is approximately 34*2*2/2=68 RS symbols. The convolution interleaver shown in FIG. 19(b) separately performs convolutional interleaving on 32 PCS lane data streams to obtain 32 first data streams. Refer to the PCS lane data stream shown in FIG. 7. It is not difficult to understand that any RS symbol in first data streams 0 to 7, any RS symbol in first data streams 8 to 15, any RS symbol in first data streams 16 to 23, and any RS symbol in first data streams 24 to 31 are from different RS codewords. Therefore, the 32 first data streams include G=4 first data stream subsets, first data streams 0 to 7 are first data stream subset 0, first data streams 8 to 15 are first data stream subset 1, first data streams 16 to 23 are first data stream subset 2, and first data streams 24 to 31 are first data stream subset 3.

In this embodiment, a possible implementation of the multiplexing shown in FIG. 13 is as follows: G=4, K=4, and m=8. Eight 4:1 multiplexers are included. Each multiplexer multiplexes four first data streams to obtain one second data stream, and generates a total of eight second data streams. Any first data stream selected from first data stream subset 0, any first data stream selected from first data stream subset 1, any first data stream selected from first data stream subset 2, and any first data stream selected from first data stream subset 3 are used as inputs of the 4:1 multiplexer.

Figures 16B, 17A, 17B:
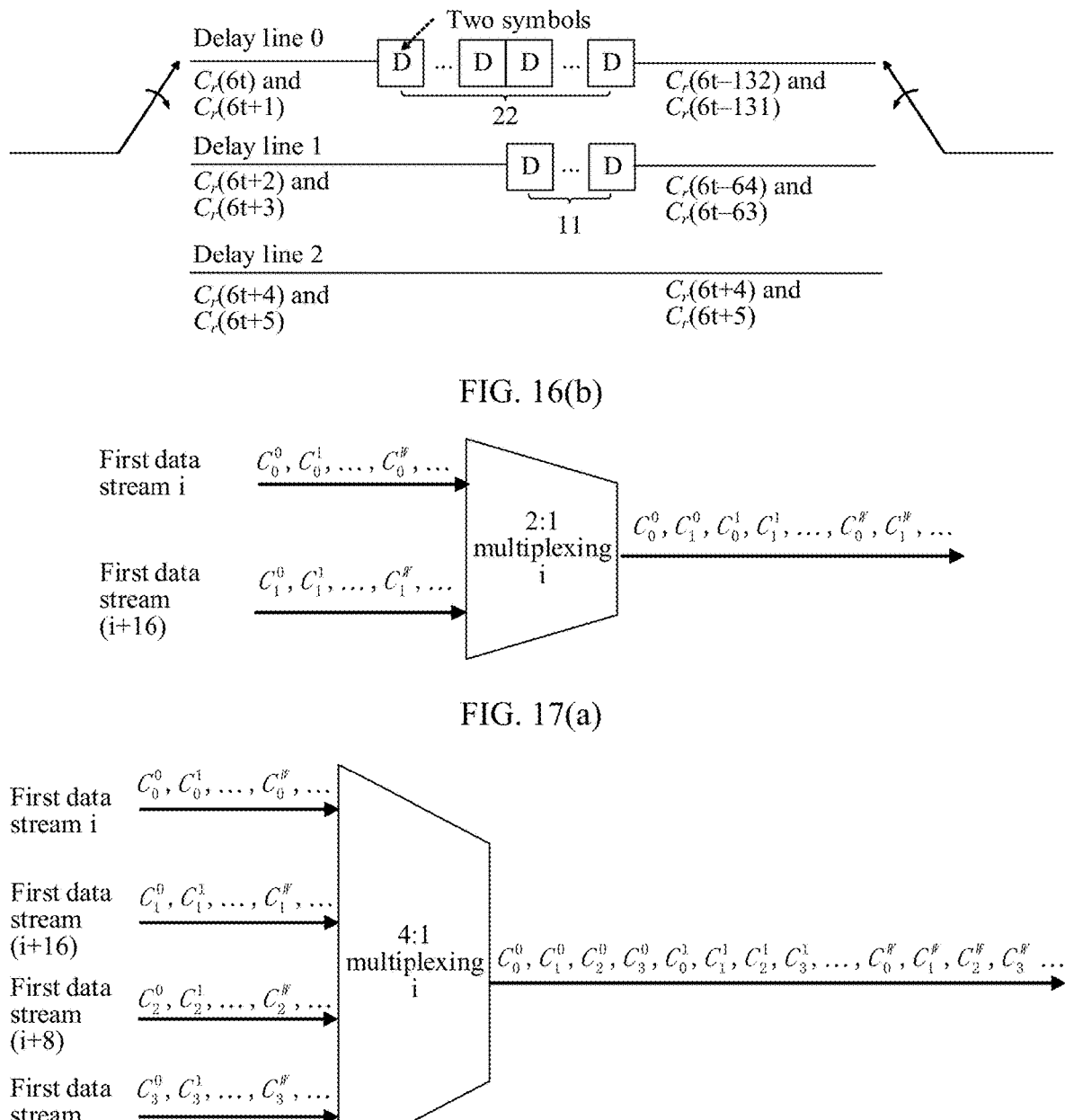
FIG. 16(*a*) is a schematic diagram of a third structure of a convolution interleaver according to an embodiment of this application.
FIG. 17(*a*) is a schematic diagram of a second structure of a multiplexer according to an embodiment of this application.

A corresponding specific implementation of the 4:1 multiplexer is shown in FIG. 17(b). Multiplexing input data stream 0, multiplexing input data stream 1, multiplexing input data stream 2, and multiplexing input data stream 3 of the 4:1 multiplexer i (where $0 \le i \le 7$) respectively correspond to first data stream i, first data stream (i+16), first data stream (i+8), and first data stream (i+24). It should be noted that, multiplexing input data stream 0, multiplexing input data stream 1, multiplexing input data stream 2, and multiplexing input data stream 3 of the 4:1 multiplexer i (where $0 \le i \le 7$) may alternatively respectively correspond to first data stream i, first data stream (i+8), first data stream (i+16), and first data stream (i+24). In this embodiment, $C_j^x$ shown in FIG. 17(*b*) indicates consecutive 4=4 RS symbols in multiplexing input data stream j (where 0≤j≤3) of the 4:1 multiplexer, and the symbols are from 4 different outer-code RS codewords. The 4:1 multiplexer outputs data in the four input data streams to an output data stream in a polling manner per 4 RS symbols, that is, an output data sequence is $$C_0^0, C_1^0, C_2^0, C_3^0, C_0^1, C_1^1, C_2^1, C_3^1, \dots, C_0^w, C_1^w, C_2^w, C_3^w,$$

. . . 16 consecutive RS symbols in the output data stream are from 16 different RS codewords. It should be noted that because K=G=4, one first data stream selected from each of first data stream subsets 0 to 3 may respectively correspond to multiplexing input data streams 0 to 3 of 4:1 multiplexer i (where 0≤i≤7) in any sequence. When Δ=1 or 2, the 16 consecutive RS symbols in the second data stream can still be from 16 different RS codewords.

In this embodiment, another possible implementation of the multiplexing shown in FIG. 13 is as follows: G=4, K=8, and m=4. Four 8:1 multiplexers are included. Each multiplexer multiplexes eight first data streams to obtain one second data stream, and generates a total of four second data streams. Any two first data streams selected from first data stream subset 0, any two first data streams selected from first data stream subset 1, any two first data streams selected from first data stream subset 2, and any two first data streams selected from first data stream subset 3 are used as inputs of the 8:1 multiplexer.

A corresponding specific implementation of the 8:1 multiplexer is shown in FIG. 17(*c*). Multiplexing input data streams 0 to 7 of the 8:1 multiplexer i (where 0≤i≤3) respectively correspond to first data stream i, first data stream (i+16), first data stream (i+8), first data stream (i+24), first data stream (i+4), first data stream (i+20), first data stream (i+12), and first data stream (i+28), that is, any Q=4 consecutive multiplexing input data streams of the multiplexer are from different first data stream subsets. It should be noted that, multiplexing input data streams 0 to 7 of the 8:1 multiplexer i (where 0≤i≤3) may alternatively respectively correspond to first data stream i, first data stream (i+8), first data stream (i+16), first data stream (i+24), first data stream (i+4), first data stream (i+12), first data stream (i+20), and first data stream (i+28). In the figure, $$C_j^x$$

indicates consecutive Δ=4 RS symbols in multiplexing input data stream j (where 0≤j≤7) of the 8:1 multiplexer, and the symbols are from 4 different outer-code RS codewords. The 8:1 multiplexer outputs data in the eight input data streams to an output data stream in a polling manner per 4 RS symbols, that is, an output data sequence is $$C_0^0, C_1^0, \dots, C_6^0, C_7^0, C_0^1, C_1^1, \dots, C_0^w, C_1^w, \dots, C_6^w, C_7^w,$$

. . . 16 consecutive RS symbols in the output data stream are from 16 different RS codewords.

The inner-code encoding is separately performed on the foregoing eight or four second data streams. The inner-code encoding scheme may be the encoding scheme provided in Embodiment 1, to obtain performance equivalent to that in Embodiment 1; or the encoding scheme provided in Embodiment 3 may be used to obtain performance equivalent to that in Embodiment 3, and details are not described herein.

Embodiment 8: An application scenario is 4×200G interfaces, an information bit length of inner-code encoding is 120 bits, a 2:1 multiplexer is used, and lane deskewing is used.

Based on Embodiment 7, in this embodiment, using of the 2:1 multiplexer is considered, and a newly designed convolution interleaver is correspondingly used.

Specifically, based on the foregoing schematic diagram of data processing of the transmitter processing module shown in FIG. 3(*a*), the transmitter processing module performs alignment marker lock on eight lane data streams based on known alignment markers of PCS lanes 0 to 7, PCS lanes 8 to 15, PCS lanes 16 to 23, or PCS lanes 24 to 31. PCS lanes 0 to 7, PCS lanes 8 to 15, PCS lanes 16 to 23, or PCS lanes 24 to 31 herein may be considered as PCS lanes 0 to 7 in a $0^{th}$ channel, a $1^{st}$ channel, a $2^{nd}$ channel, or a $3^{rd}$ channel of 200G respectively. The transmitter processing module then performs lane deskewing on the 32 lane data streams to obtain 32 aligned lane data streams. Then, lane reordering is performed on data of eight lanes based on the alignment markers of PCS lanes 0 to 7, PCS lanes 8 to 15, PCS lanes 16 to 23, or PCS lanes 24 to 31, so that the data of the eight lanes can be arranged in a specified sequence. Finally, data of 32 lanes can be arranged in a specified sequence. One sequence is that the lane data streams are sorted from 0 to 31 from top to bottom, which is the same as that in FIG. 7.

The 32 lane data streams on which the lane reordering is performed are sent to a designed processor including convolutional interleaving and multiplexing, for interleaving and data sequence disordering, and then are sent to an inner-code encoder for inner-code encoding. After data processing is performed on inner-code encoded data streams, data processed data streams are sent to a channel transmission medium for transmission.

In this embodiment, the structure shown in FIG. 11 is used for the convolutional interleaving, and the convolutional interleaving is separately performed on n=32 PCS lane data streams to obtain n=32 first data streams. Convolution interleaver 0, convolution interleaver 1, convolution interleaver 2, . . . , convolution interleaver 31 use a same interleaving structure. FIG. 16(*a*) shows a structure of a convolution interleaver that includes p=3 delay lines. The three delay lines respectively include 2Q storage units, Q storage units, and 0 storage units, and each storage unit is configured to store d=2 symbols. In other words, a delay value of delay line 0 is 4Q symbols, a delay value of delay line 1 is 2Q symbols, and a delay value of delay line 2 is 0 symbols, that is, no delay.

As shown in FIG. 16(*a*), $C_r(\cdot)$ represents one RS symbol in lane data stream r (where 0≤r≤n−1). For example, $C_r(6t)$ and $C_r(6t+1)$ represent two RS symbols that are currently input into delay line 0 and that are in the lane data stream, and $C_r(6t−12Q)$ and $C_r(6t−12Q+1)$ are two RS symbols output from delay line 0; $C_r(6t+2)$ and $C_r(6t+3)$ represent two RS symbols that are subsequently input into delay line 1 and that are in the lane data stream, and $C_r(6t−6Q+2)$ and $C_r(6t−6Q+3)$ are two RS symbols output from delay line 1; $C_r(6t+4)$ and $C_r(6t+5)$ represent two RS symbols that are subsequently input into delay line 2 and that are in the lane data stream, and $C_r(6t+4)$ and $C_r(6t+5)$ are two RS symbols output from delay line 2; $C_r(6t+6)$ and $C_r(6t+7)$ represent two RS symbols that are then subsequently input into delay line 0 and that are in the lane data stream, and $C_r(6t-12Q+6)$ and $C_r(6t-12Q+7)$ are two RS symbols output from delay line 0; and so on. With reference to FIG. 7, it can be seen that when $6Q+2\geq136$, in other words, $Q\geq23$, a total of six RS symbols $C_r(6t-12Q)$, $C_r(6t-12Q+1)$, $C_r(6t-6Q+2)$, $C_r(6t-6Q+3)$, $C_r(6t+4)$, and $C_r(6t+5)$ output through the convolutional interleaving are from six different RS codewords.

FIG. 20 is a schematic diagram of a ninth structure of a convolution interleaver according to an embodiment of this application. As shown in FIG. 20, in an embodiment, that $Q=23$ is selected, and a specific structure of the convolution interleaver is shown in FIG. 20. A corresponding interleaving latency is approximately $46*2*3/2=138$ RS symbols. The convolution interleaver shown in FIG. 20 separately performs convolutional interleaving on 32 PCS lane data streams to obtain 32 first data streams. Refer to the PCS lane data stream shown in FIG. 7. It is not difficult to understand that any RS symbol in first data streams 0 to 7, any RS symbol in first data streams 8 to 15, any RS symbol in first data streams 16 to 23, and any RS symbol in first data streams 24 to 31 are from different RS codewords. Therefore, the 32 first data streams include G=4 first data stream subsets, first data streams 0 to 7 are first data stream subset 0, first data streams 8 to 15 are first data stream subset 1, first data streams 16 to 23 are first data stream subset 2, and first data streams 24 to 31 are first data stream subset 3.

In this embodiment, a possible implementation of the multiplexing shown in FIG. 13 is as follows: G=4, K=2, and m=16. 16 2:1 multiplexers are included. Each multiplexer multiplexes two first data streams to obtain one second data stream, and generates a total of 16 second data streams. Two first data streams (any first data stream selected from each of any two of first data stream subset 0, first data stream subset 1, first data stream subset 2, and first data stream subset 3) are used as inputs of the 2:1 multiplexer. A corresponding specific implementation of the 2:1 multiplexer is shown in FIG. 17(*a*). Multiplexing input data stream 0 and multiplexing input data stream 1 of 2:1 multiplexer i (where $0\leq i\leq15$) respectively correspond to first data stream i and first data stream (i+16). In the figure, $$C_j^x$$

indicates consecutive $\Delta=6$ RS symbols in multiplexing input data stream j (where $0\leq j\leq1$) of the 2:1 multiplexer, and the symbols are from 6 different outer-code RS codewords. The 2:1 multiplexer outputs data in the two input data streams to an output data stream in a polling manner per 6 RS symbols, that is, an output data sequence is $$C_0^0, C_1^0, C_0^1, \ldots, C_1^1, \ldots, C_0^w, C_1^w,$$

. . . 12 consecutive RS symbols in the output data stream are from 12 different RS codewords. It should be noted that because K<G, when $\Delta=1$, 2, or 3, 12 consecutive RS symbols in the second data stream can still be from 12 different RS codes.

The inner-code encoding is separately performed on the foregoing 16 second data streams, and an inner-code encoding scheme of the 16 second data streams may use the encoding scheme provided in Embodiment 1, to obtain performance equivalent to that in Embodiment 1. Details are not described herein.

Embodiment 9: An application scenario is 4×200G interfaces, an information bit length of inner-code encoding is 160 bits, a 2:1 multiplexer is used, and lane deskewing is used.

Based on Embodiment 8, in this embodiment, inner code with a code length of 160 bits is considered, and a newly designed convolution interleaver is correspondingly used.

Specifically, in this embodiment, the convolution interleaver structure shown in FIG. 18(*a*) is used, and p=4 delay lines are included. The four delay lines respectively include 3Q storage units, 2Q storage units, Q storage units, and 0 storage units, and each storage unit is configured to store d=2 symbols. In other words, a delay value of delay line 0 is 6Q symbols, a delay value of delay line 1 is 4Q symbols, a delay value of delay line 2 is 2Q symbols, and a delay value of delay line 3 is 0 symbols, that is, no delay.

As shown in FIG. 18(*a*), $C_r(\cdot)$ represents one RS symbol in lane data stream r (where $0\leq r\leq n-1$). For example, $C_r(8t)$ and $C_r(8t+1)$ represent two RS symbols that are currently input into delay line 0 and that are in the lane data stream, and $C_r(8t-24Q)$ and $C_r(8t-24Q+1)$ are two RS symbols output from delay line 0; $C_r(8t+2)$ and $C_r(8t+3)$ represent two RS symbols that are subsequently input into delay line 1 and that are in the lane data stream, and $C_r(8t-16Q+2)$ and $C_r(8t-16Q+3)$ are two RS symbols output from delay line 1; $C_r(8t+4)$ and $C_r(8t+5)$ represent two RS symbols that are subsequently input into delay line 2 and that are in the lane data stream, and $C_r(8t-8Q+4)$ and $C_r(8t-8Q+5)$ are two RS symbols output from delay line 2; $C_r(8t+6)$ and $C_r(8t+7)$ represent two RS symbols that are then subsequently input into delay line 3 and that are in the lane data stream, and $C_r(8t+6)$ and $C_r(8t+7)$ are two RS symbols output from delay line 3; $C_r(8t+8)$ and $C_r(8t+9)$ represent two RS symbols that are then subsequently input into delay line 0 and that are in the lane data stream, and $C_r(8t-24Q+8)$ and $C_r(8t-24Q+9)$ are two RS symbols output from delay line 0; and so on. With reference to FIG. 7, it can be seen that when $8Q+2\geq136$, in other words, $Q\geq17$, a total of eight RS symbols $C_r(8t-24Q)$, $C_r(8t-24Q+1)$, $C_r(8t-16Q+2)$, $C_r(8t-16Q+3)$, $C_r(8t-8Q+4)$, $C_r(8t-8Q+5)$, $C_r(8t+6)$, and $C_r(8t+7)$ output through the convolutional interleaving are from eight different RS codewords.

Figure 21:
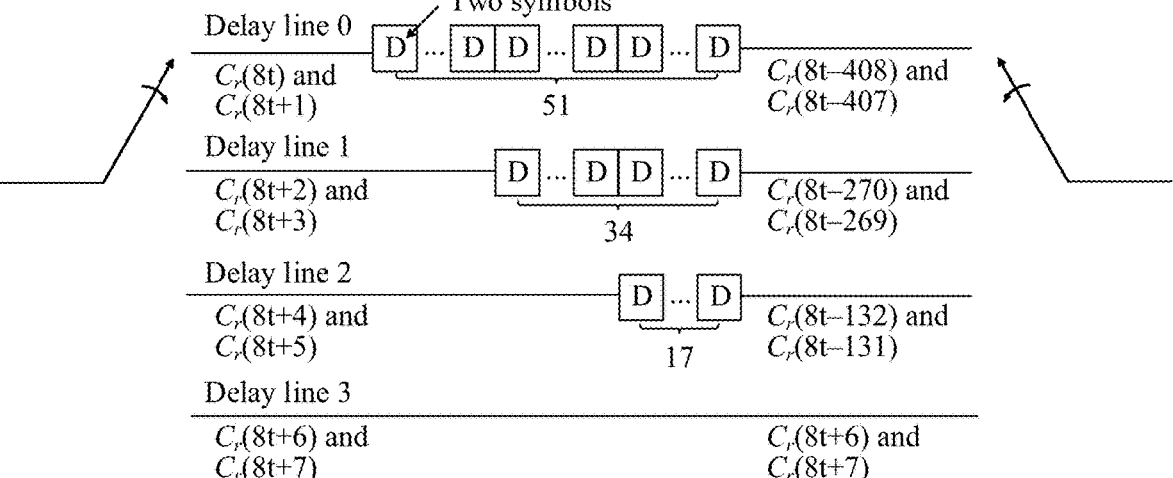
FIG. 21 is a schematic diagram of a tenth structure of a convolution interleaver according to an embodiment of this application.

FIG. 21 is a schematic diagram of a tenth structure of a convolution interleaver according to an embodiment of this application. As shown in FIG. 21, in an embodiment, that $Q=17$ is selected, and a specific structure of the convolution interleaver is shown in FIG. 21. A corresponding interleaving latency is approximately $51*2*4/2=204$ RS symbols.

The convolution interleaver shown in FIG. 21 separately performs convolutional interleaving on 32 PCS lane data streams to obtain 32 first data streams. Refer to the PCS lane data stream shown in FIG. 7. It is not difficult to understand that any RS symbol in first data streams 0 to 7, any RS symbol in first data streams 8 to 15, any RS symbol in first data streams 16 to 23, and any RS symbol in first data streams 24 to 31 are from different RS codewords. Therefore, the 32 first data streams include G=4 first data stream subsets, first data streams 0 to 7 are first data stream subset 0, first data streams 8 to 15 are first data stream subset 1, first data streams 16 to 23 are first data stream subset 2, and first data streams 24 to 31 are first data stream subset 3.

In this embodiment, a possible implementation of the multiplexing shown in FIG. 13 is as follows: G=4, K=2, and m=16. 16 2:1 multiplexers are included. Each multiplexer multiplexes two first data streams to obtain one second data stream, and generates a total of 16 second data streams. Two first data streams (any first data stream selected from each of any two of first data stream subset 0, first data stream subset 1, first data stream subset 2, and first data stream subset 3) are used as inputs of the 2:1 multiplexer. A corresponding specific implementation of the 2:1 multiplexer is shown in FIG. 17(a). Multiplexing input data stream 0 and multiplexing input data stream 1 of 2:1 multiplexer i (where $0 \leq i \leq 15$) respectively correspond to first data stream i and first data stream (i+16). In the figure, $$C_j^x$$

indicates consecutive $\Delta=8$ RS symbols in multiplexing input data stream j (where $0 \leq j \leq 1$) of the 2:1 multiplexer, and the symbols are from 8 different outer-code RS codewords. The 2:1 multiplexer outputs data in the two input data streams to an output data stream in a polling manner per 8 RS symbols, that is, an output data sequence is $$C_0^0, C_1^0, C_0^1, \ldots, C_1^1, \ldots, C_0^w, C_1^w,$$

. . . 16 consecutive RS symbols in the output data stream are from 16 different RS codewords. It should be noted that because K<G, when $\Delta=1$, 2, or 4, 16 consecutive RS symbols in the second data stream can still be from 16 different RS codes.

Inner-code encoding is separately performed on the foregoing 16 second data streams, and an inner-code encoding scheme of the 16 second data streams may use the encoding scheme provided in Embodiment 3, to obtain performance equivalent to that in Embodiment 3. Details are not described herein.

Embodiment 10: An application scenario is 4×200G interfaces, an information bit length of inner-code encoding is 160 bits, and lane symbol alignment is used.

Based on any one of Embodiments 7 to 9, this embodiment provides an embodiment solution with a lower latency.

Based on the foregoing schematic diagram of data processing of the transmitter processing module shown in FIG. 3(d), the transmitter processing module performs alignment marker lock on eight lane data streams based on known alignment markers of PCS lanes 0 to 7, PCS lanes 8 to 15, PCS lanes 16 to 23, or PCS lanes 24 to 31. PCS lanes 0 to 7, PCS lanes 8 to 15, PCS lanes 16 to 23, or PCS lanes 24 to 31 herein may be considered as PCS lanes 0 to 7 in a $0^{th}$ channel, a $1^{st}$ channel, a $2^{nd}$ channel, or a $3^{rd}$ channel of 200G respectively. Then, the transmitter processing module performs alignment on the 32 lane data streams based on two RS symbols to obtain 32 aligned lane data streams. The 32 aligned lane data streams are directly sent to a designed processor including multiplexing, for processing, and then are sent to an inner-code encoder for inner-code encoding. After data processing is performed on inner-code encoded data streams, data processed data streams are sent to a channel transmission medium for transmission.

In an embodiment, when both the multiplexing and the inner-code encoding scheme in this embodiment use the solution in Embodiment 7, concatenated code in the scheme is under AWGN, performance is equivalent to that in the solution in Embodiment 7, and an overall latency is lower. However, compared with the solution in Embodiment 7, the solution in Embodiment is poor in resisting a system burst error. This solution is applicable to some scenarios that require a lower latency.

In another embodiment, when both the multiplexing and the inner-code encoding scheme in this embodiment use the solution in Embodiment 8, concatenated code in the scheme is under AWGN, performance is equivalent to that in the solution in Embodiment 8, and an overall latency is lower. However, compared with the solution in Embodiment 8, the solution in this embodiment is poor in resisting a system burst error. This solution is applicable to some scenarios that require a lower latency.

In still another embodiment, when both the multiplexing and the inner-code encoding scheme in this embodiment use the solution in Embodiment 9, concatenated code in the scheme is under AWGN, performance is equivalent to that in the solution in Embodiment 9, and an overall latency is lower. However, compared with the solution in Embodiment 9, the solution in this embodiment is poor in resisting a system burst error. This solution is applicable to some scenarios that require a lower latency.

Embodiment 11: An application scenario is 8×100G interfaces, an information bit length of inner-code encoding is 120 bits or 160 bits, an 8:1 multiplexer is used, and lane deskewing is used.

In this embodiment, it is considered that host interfaces are 100 Gb/s per lane 8×100G interfaces and a "100G RS-FEC-Int" mode is used. For details of the interface, refer to IEEE Std 802.3ckTM/D3.0.

Based on the foregoing schematic diagram of data processing of the transmitter processing module shown in FIG. 3(c), the transmitter processing module performs alignment marker lock on four lane data streams based on known alignment markers of FEC lanes 0 to 3, FEC lanes 4 to 7, FEC lanes 8 to 11, FEC lanes 12 to 15, FEC lanes 16 to 19, FEC lanes 20 to 23, FEC lanes 24 to 27, or FEC lanes 28 to 31. FEC lanes 0 to 3, FEC lanes 4 to 7, FEC lanes 8 to 11, FEC lanes 12 to 15, FEC lanes 16 to 19, FEC lanes 20 to 23, FEC lanes 24 to 27, or FEC lanes 28 to 31 may be considered as FEC lanes 0 to 3 in a $0^{th}$ channel, a $1^{st}$ channel, a $2^{nd}$ channel, a 3rd channel, a $4^{th}$ channel, a $5^{th}$ channel, a $6^{th}$ channel, or a $7^{th}$ channel of 100G respectively. The transmitter processing module then performs lane deskewing on the 32 lane data streams to obtain 32 aligned lane data streams. Then, lane reordering is performed on data of four lanes based on the alignment markers of FEC lanes 0 to 3, FEC lanes 4 to 7, FEC lanes 8 to 11, FEC lanes 12 to 15, FEC lanes 16 to 19, FEC lanes 20 to 23, FEC lanes 24 to 27, or FEC lanes 28 to 31, so that the data of the four lanes can be arranged in a specified sequence. Finally, data of 32 lanes can be arranged in a specified sequence. One sequence is that the lane data streams are sorted from 0 to 31 from top to bottom, which is the same as that in FIG. 11. 32 lane data streams on which lane reordering is performed are not convolutionally interleaved, but are directly multiplexed to obtain a total of 16 second data streams, and the second data streams are sent to an inner-code encoder for inner-code encoding. After data processing is performed on inner-code encoded data streams, data processed data streams are sent to a channel transmission medium for transmission.

Refer to the PCS lane data streams shown in FIG. 8. It is not difficult to understand that any RS symbol in lane data streams 0 to 3, any RS symbol in lane data streams 4 to 7, any RS symbol in lane data streams 8 to 11, any RS symbol in lane data streams 12 to 15, any RS symbol in lane data streams 16 to 19, any RS symbol in lane data streams 20 to 23, any RS symbol in lane data streams 24 to 27, and any RS symbol in lane data streams 28 to 31 are all from different RS codewords. Because convolutional interleaving is not performed on the lane data streams, lane data streams 0 to 31 are equivalent to first data streams 0 to 31. Therefore, the 32 first data streams include G=8 first data stream subsets, first data streams 0 to 3 are first data stream subset 0, first data streams 4 to 7 are first data stream subset 1, first data streams 8 to 11 are first data stream subset 2, first data streams 12 to 15 are first data stream subset 3, first data streams 16 to 19 are first data stream subset 4, first data streams 20 to 23 are first data stream subset 5, first data streams 24 to 27 are first data stream subset 6, and first data streams 28 to 31 are first data stream subset 7.

Figure 17C:
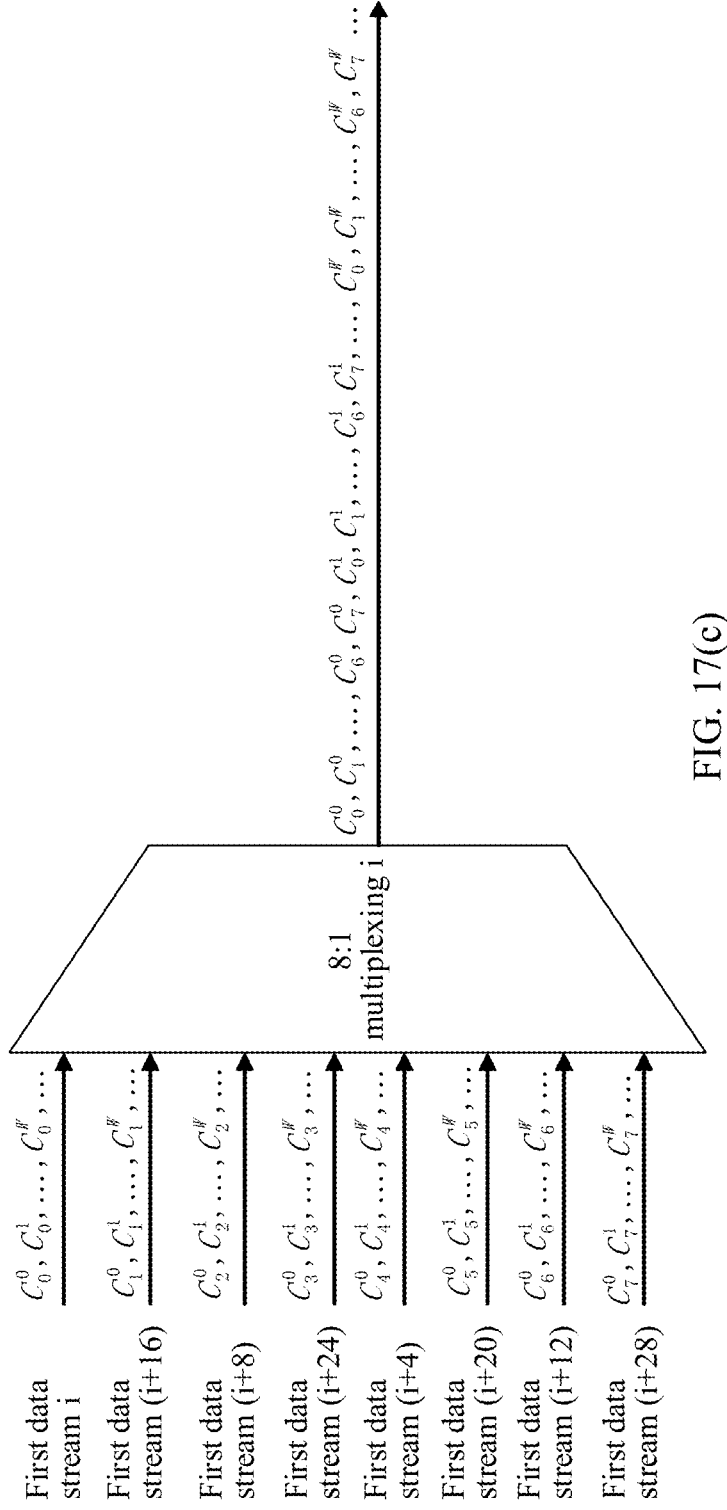

An embodiment of the multiplexing shown in FIG. 13 used in this embodiment is as follows: G=8, K=8, m=4, and multiplexing is performed on the 32 lane data streams to obtain four second data streams. A total of eight lane data streams (one data stream in first data stream subset 0, one data stream in first data stream subset 1, one data stream in first data stream subset 2, one data stream in first data stream subset 3, one data stream in first data stream subset 4, one data stream in first data stream subset 5, one data stream in first data stream subset 6, and one data stream in first data stream subset 7) are used as eight input data streams of 8:1 multiplexer i (where 0≤i≤3). A specific implementation is shown in FIG. 17(c). Multiplexer i (where 0≤i≤3) uses first data stream i, first data stream (i+16), first data stream (i+8), first data stream (i+24), first data stream (i+4), first data stream (i+20), first data stream (i+12), and first data stream (i+28) to respectively correspond to multiplexing input data streams 0 to 7 of the 8:1 multiplexer. In the figure, $$C_j^x$$

indicates consecutive 4=2 RS symbols in multiplexing input data stream j (where 0≤j≤7) of the 8:1 multiplexer, and the symbols are from 2 different outer-code RS codewords. The 8:1 multiplexer outputs data in the eight input data streams to an output data stream in a polling manner per 2 RS symbols, that is, an output data sequence is $$C_0^0, C_1^0, \ldots, C_6^0, C_7^0, C_0^1, C_1^1, \ldots, C_0^w, C_1^w, \ldots, C_6^w, C_7^w,$$

. . . 16 consecutive RS symbols in the output data stream are from 16 different RS codewords. It should be noted that because K≤G, when Δ=1, 16 consecutive RS symbols in the second data stream can still be from 16 different RS codes.

Figure 22:
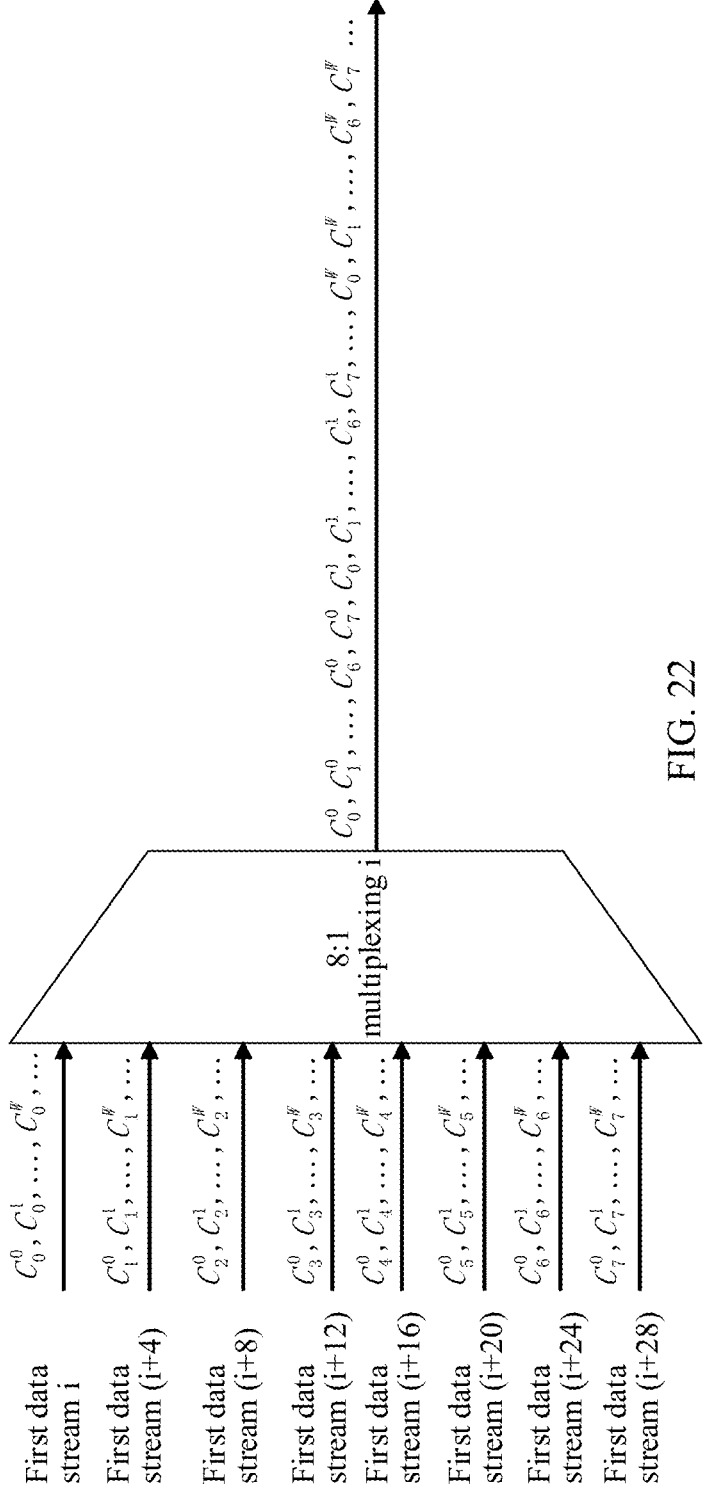
FIG. 22 is a schematic diagram of a fifth structure of a multiplexer according to an embodiment of this application.

FIG. 22 is a schematic diagram of a fifth structure of a multiplexer according to an embodiment of this application. As shown in FIG. 22, multiplexer i (where 0≤i≤3) uses first data stream i, first data stream (i+4), first data stream (i+8), first data stream (i+12), first data stream (i+16), first data stream (i+20), first data stream (i+24), and first data stream (i+28) to respectively correspond to multiplexing input data streams 0 to 7 of an 8:1 multiplexer. In the figure, $$C_j^x$$

indicates consecutive Δ=2 RS symbols in multiplexing input data stream j (where 0≤j≤7) of the 8:1 multiplexer, and the symbols are from 2 different outer-code RS codewords. The 8:1 multiplexer outputs data in the eight input data streams to an output data stream in a polling manner per 2 RS symbols, that is, an output data sequence is $$C_0^0, C_1^0, \ldots, C_6^0, C_7^0, C_0^1, C_1^1, \ldots, C_6^1, C_7^1, \ldots, C_0^w, C_1^w, \ldots, C_6^w, C_7^w,$$

. . . 16 consecutive RS symbols in the output data stream are from 16 different RS codewords. It should be noted that because K≤G, when Δ=1, 16 consecutive RS symbols in the second data stream can still be from 16 different RS codes.

Inner-code encoding is separately performed on the foregoing four second data streams. The inner-code encoding scheme may be the encoding scheme provided in Embodiment 1, to obtain performance equivalent to that in Embodiment 1; or the encoding scheme provided in Embodiment 3 may be used to obtain performance equivalent to that in Embodiment 3, and details are not described herein.

Embodiment 12: An application scenario is 8×100G interfaces, an information bit length of inner-code encoding is 120 bits or 160 bits, a 4:1 multiplexer is used, and lane deskewing is used.

Based on the solution in Embodiment 11, this embodiment provides an embodiment solution of a second-low latency when a 4:1 multiplexer is used for multiplexing.

Based on the foregoing schematic diagram of data processing of the transmitter processing module shown in FIG. 3(a), the transmitter processing module performs alignment marker lock on four lane data streams based on known alignment markers of FEC lanes 0 to 3, FEC lanes 4 to 7, FEC lanes 8 to 11, FEC lanes 12 to 15, FEC lanes 16 to 19, FEC lanes 20 to 23, FEC lanes 24 to 27, or FEC lanes 28 to 31. FEC lanes 0 to 3, FEC lanes 4 to 7, FEC lanes 8 to 11, FEC lanes 12 to 15, FEC lanes 16 to 19, FEC lanes 20 to 23, FEC lanes 24 to 27, or FEC lanes 28 to 31 may be considered as FEC lanes 0 to 3 in a $0^{th}$ channel, a $1^{st}$ channel, a $2^{nd}$ channel, a 3rd channel, a $4^{th}$ channel, a $5^{th}$ channel, a $6^{th}$ channel, or a $7^{th}$ channel of 100G respectively. The transmitter processing module then performs lane deskewing on the 32 lane data streams to obtain 32 aligned lane data streams. Then, lane reordering is performed on data of four lanes based on the alignment markers of FEC lanes 0 to 3, FEC lanes 4 to 7, FEC lanes 8 to 11, FEC lanes 12 to 15, FEC lanes 16 to 19, FEC lanes 20 to 23, FEC lanes 24 to 27, or FEC lanes 28 to 31, so that the data of the four lanes can be arranged in a specified sequence. Finally, data of 32 lanes can be arranged in a specified sequence. One sequence is that the lane data streams are sorted from 0 to 31 from top to bottom, which is the same as that in FIG. 11.

The 32 lane data streams on which the lane reordering is performed are sent to a designed processor including convolutional interleaving and multiplexing, for interleaving and data sequence disordering, and then are sent to an inner-code encoder for inner-code encoding. After data processing is performed on inner-code encoded data streams, data processed data streams are sent to a channel transmission medium for transmission.

In this embodiment, the structure shown in FIG. 11 is used for the convolutional interleaving, and the convolutional interleaving is separately performed on n=32 PCS lane data streams to obtain n=32 first data streams. Convolution interleaver 0, convolution interleaver 1, convolution interleaver 2, . . . , convolution interleaver 31 use a same interleaving structure. FIG. 19(a) shows a structure of a convolution interleaver that includes p=2 delay lines. The two delay lines respectively include Q storage units and 0 storage units, and each storage unit is configured to store d=2 symbols. In other words, a delay value of delay line 0 is 2Q symbols, and a delay value of delay line 1 is 0 symbols, that is, no delay.

As shown in FIG. 19(*a*), $C_r(\cdot)$ represents one RS symbol in lane data stream r (where $0 \leq r \leq n-1$). For example, $C_r(4t)$ and $C_r(4t+1)$ represent two RS symbols that are currently input into delay line 0 and that are in the lane data stream, and $C_r(4t-4Q)$ and $C_r(4t-4Q+1)$ are two RS symbols output from delay line 0; $C_r(4t+2)$ and $C_r(4t+3)$ represent two RS symbols that are subsequently input into delay line 1 and that are in the lane data stream, and $C_r(4t+2)$ and $C_r(4t+3)$ are two RS symbols output from delay line 1; $C_r(4t+4)$ and $C_r(4t+5)$ represent two RS symbols that are subsequently input into delay line 0 and that are in the lane data stream, and $C_r(4t-4Q+4)$ and $C_r(4t-4Q+5)$ are two RS symbols output from delay line 0; and so on. With reference to FIG. 8, it can be seen that when $4Q+2 \geq 272$, that is, $Q \geq 68$, four consecutive RS symbols, $C_r(4t-4Q)$, $C_r(4t-4Q+1)$, $C_r(4t+2)$, and $C_r(4t+3)$, output through the convolutional interleaving are from four different RS codewords.

Figure 23:
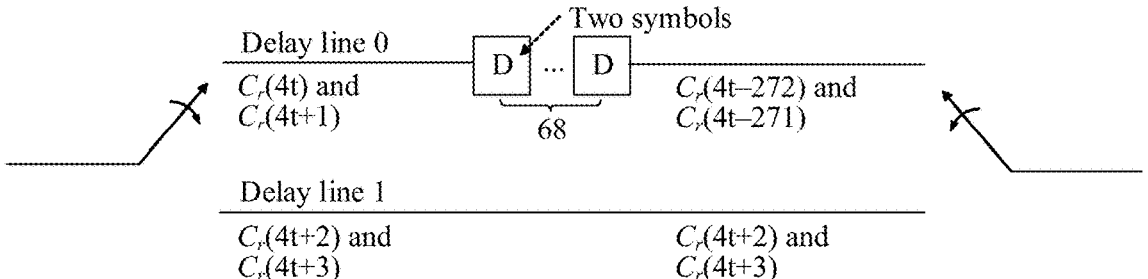
FIG. 23 is a schematic diagram of an eleventh structure of a convolution interleaver according to an embodiment of this application.

FIG. 23 is a schematic diagram of an eleventh structure of a convolution interleaver according to an embodiment of this application. As shown in FIG. 23, in an embodiment, that Q=68 is selected, and a specific structure of the convolution interleaver is shown in FIG. 23. A corresponding interleaving latency is approximately 68*2*2/2=136 RS symbols.

The convolution interleaver shown in FIG. 23 separately performs convolutional interleaving on 32 PCS lane data streams to obtain 32 first data streams. Refer to the PCS lane data streams shown in FIG. 8. It is not difficult to understand that any RS symbol in lane data streams 0 to 3, any RS symbol in lane data streams 4 to 7, any RS symbol in lane data streams 8 to 11, any RS symbol in lane data streams 12 to 15, any RS symbol in lane data streams 16 to 19, any RS symbol in lane data streams 20 to 23, any RS symbol in lane data streams 24 to 27, and any RS symbol in lane data streams 28 to 31 are from different RS codewords. Therefore, the 32 first data streams include G=8 first data stream subsets, first data streams 0 to 3 are first data stream subset 0, first data streams 4 to 7 are first data stream subset 1, first data streams 8 to 11 are first data stream subset 2, first data streams 12 to 15 are first data stream subset 3, first data streams 16 to 19 are first data stream subset 4, first data streams 20 to 23 are first data stream subset 5, first data streams 24 to 27 are first data stream subset 6, and first data streams 28 to 31 are first data stream subset 7.

In this embodiment, a possible implementation of the multiplexing shown in FIG. 13 is as follows: G=8, K=4, and m=8. Eight 4:1 multiplexers are included. Each multiplexer multiplexes four first data streams to obtain one second data stream, and generates a total of eight second data streams. Four first data streams (any first data stream selected from each of any four of first data stream subsets 0 to 7) are used as inputs of the 4:1 multiplexer. A specific implementation is shown in FIG. 17(*b*). Multiplexing input data streams 0 to 3 of 4:1 multiplexer i (where $0 \leq i \leq 7$) respectively correspond to first data stream i, first data stream (i+16), first data stream (i+8), and first data stream (i+24). In the figure, $$C_j^x$$

indicates consecutive $\Delta=4$ RS symbols in multiplexing input data stream j (where $0 \leq j \leq 3$) of the 4:1 multiplexer, and the symbols are from 4 different outer-code RS codewords. The 4:1 multiplexer outputs data in the four input data streams to an output data stream in a polling manner per 4 RS symbols, that is, an output data sequence is $$C_0^0, C_1^0, C_2^0, C_3^0, C_0^1, C_1^1, C_2^1, C_3^1, \ldots, C_0^w, C_1^w, C_2^w, C_3^w,$$

. . . 16 consecutive RS symbols in the output data stream are from 16 different RS codewords. It should be noted that because $K \leq G$, when $\Delta=1$ or 2, 16 consecutive RS symbols in the second data stream can still be from 16 different RS codes.

Figure 24:
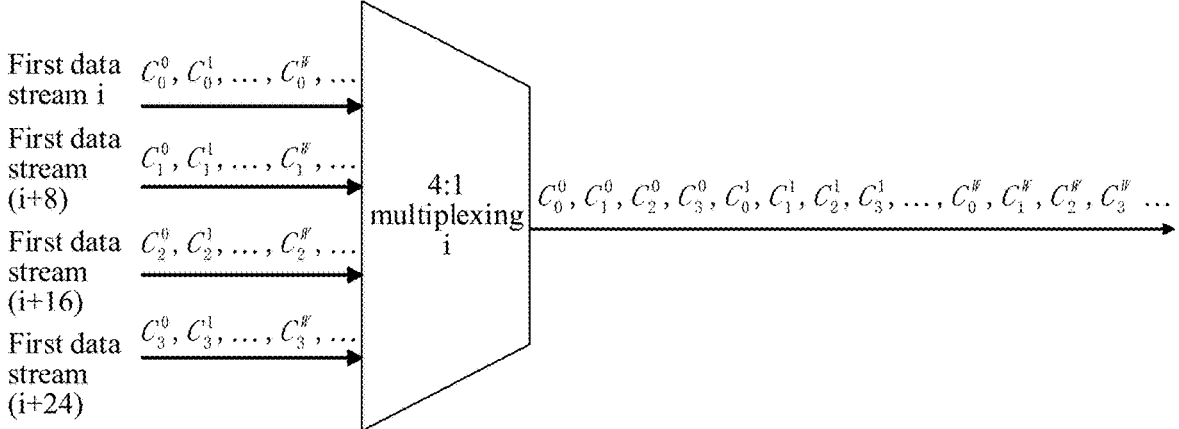
FIG. 24 is a schematic diagram of a sixth structure of a multiplexer according to an embodiment of this application.

FIG. 24 is a schematic diagram of a sixth structure of a multiplexer according to an embodiment of this application. As shown in FIG. 24, multiplexer i (where $0 \leq i \leq 3$) uses first data stream i, first data stream (i+8), first data stream (i+16), and first data stream (i+24) to respectively correspond to multiplexing input data streams 0 to 3 of a 4:1 multiplexer. In the figure, CX indicates consecutive $\Delta=4$ RS symbols in multiplexing input data stream j (where $0 \leq j \leq 3$) of the 4:1 multiplexer, and the symbols are from 4 different outer-code RS codewords. The 4:1 multiplexer outputs data in the 4 input data streams to an output data stream in a polling manner per 4 RS symbols, that is, an output data sequence is $$C_0^0, C_1^0, C_2^0, C_3^0, C_0^1, C_1^1, C_2^1, C_3^1, \ldots, C_0^w, C_1^w, C_2^w, C_3^w,$$

. . . 16 consecutive RS symbols in the output data stream are from 16 different RS codewords. It should be noted that because $K \leq G$, when $\Delta=1$ or 2, 16 consecutive RS symbols in the second data stream can still be from 16 different RS codes.

Inner-code encoding is separately performed on the foregoing eight second data streams. The inner-code encoding scheme may be the encoding scheme provided in Embodiment 1, to obtain performance equivalent to that in Embodiment 1; or the encoding scheme provided in Embodiment 3 may be used to obtain performance equivalent to that in Embodiment 3, and details are not described herein.

Embodiment 13: An application scenario is 8×100G interfaces, an information bit length of inner-code encoding is 120 bits, a 2:1 multiplexer is used, and lane deskewing is used.

Based on Embodiment 12, in this embodiment, it is considered that the 2:1 multiplexer and inner code with a 120-bit information length are used for multiplexing, and a newly designed convolution interleaver and multiplexing are correspondingly used.

In this embodiment, the structure shown in FIG. 11 is used for the convolutional interleaving, and the convolutional interleaving is separately performed on n=32 PCS lane data streams to obtain n=32 first data streams. Convolution interleaver 0, convolution interleaver 1, convolution interleaver 2, . . . , convolution interleaver 31 use a same interleaving structure. FIG. 16(*a*) shows a structure of a convolution interleaver that includes p=3 delay lines. The three delay lines respectively include 2Q storage units, Q storage units, and 0 storage units, and each storage unit is configured to store d=2 symbols. In other words, a delay value of delay line 0 is 4Q symbols, a delay value of delay line 1 is 2Q symbols, and a delay value of delay line 2 is 0 symbols, that is, no delay.

As shown in FIG. 16(*a*), $C_r(\cdot)$ represents one RS symbol in lane data stream r (where $0 \le r \le n-1$). For example, $C_r(6t)$ and $C_r(6t+1)$ represent two RS symbols that are currently input into delay line 0 and that are in the lane data stream, and $C_r(6t-12Q)$ and $C_r(6t-12Q+1)$ are two RS symbols output from delay line 0; $C_r(6t+2)$ and $C_r(6t+3)$ represent two RS symbols that are subsequently input into delay line 1 and that are in the lane data stream, and $C_r(6t-6Q+2)$ and $C_r(6t-6Q+3)$ are two RS symbols output from delay line 1; $C_r(6t+4)$ and $C_r(6t+5)$ represent two RS symbols that are subsequently input into delay line 2 and that are in the lane data stream, and $C_r(6t+4)$ and $C_r(6t+5)$ are two RS symbols output from delay line 2; $C_r(6t+6)$ and $C_r(6t+7)$ represent two RS symbols that are then subsequently input into delay line 0 and that are in the lane data stream, and $C_r(6t-12Q+6)$ and $C_r(6t-12Q+7)$ are two RS symbols output from delay line 0; and so on. With reference to FIG. 8, it can be seen that when $6Q+2 \ge 272$, in other words, $Q \ge 45$, a total of six RS symbols $C_r(6t-12Q)$, $C_r(6t-12Q+1)$, $C_r(6t-6Q+2)$, $C_r(6t-6Q+3)$, $C_r(6t+4)$, and $C_r(6t+5)$ output through the convolutional interleaving are from six different RS codewords.

Figure 25:
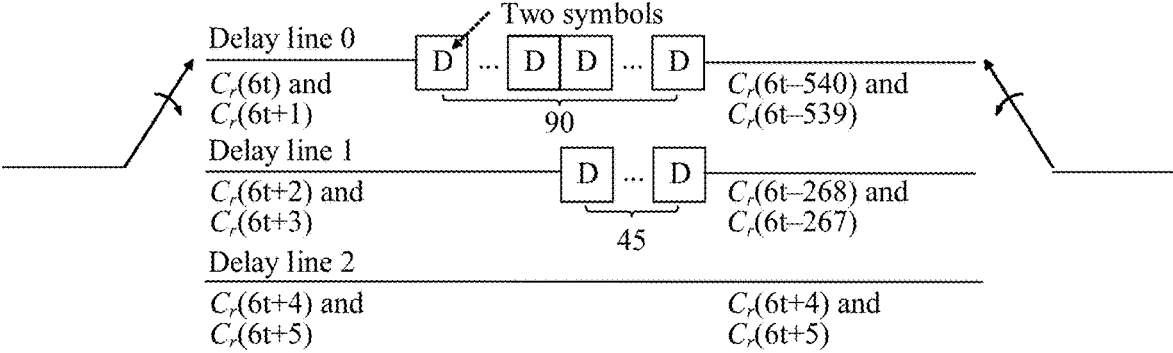
FIG. 25 is a schematic diagram of a twelfth structure of a convolution interleaver according to an embodiment of this application.

FIG. 25 is a schematic diagram of a twelfth structure of a convolution interleaver according to an embodiment of this application. As shown in FIG. 25, in an embodiment, that Q=45 is selected, and a specific structure of the convolution interleaver is shown in FIG. 25. A corresponding interleaving latency is approximately 90*2*3/2=270 RS symbols.

The convolution interleaver shown in FIG. 25 separately performs convolutional interleaving on 32 PCS lane data streams to obtain 32 first data streams. Refer to the PCS lane data streams shown in FIG. 8. It is not difficult to understand that any RS symbol in first data streams 0 to 3, any RS symbol in first data streams 4 to 7, any RS symbol in first data streams 8 to 11, any RS symbol in first data streams 12 to 15, any RS symbol in first data streams 16 to 19, any RS symbol in first data streams 20 to 23, any RS symbol in first data streams 24 to 27, and any RS symbol in first data streams 28 to 31 are from different RS codewords. Therefore, the 32 first data streams include G=8 first data stream subsets, first data streams 0 to 3 are first data stream subset 0, first data streams 4 to 7 are first data stream subset 1, first data streams 8 to 11 are first data stream subset 2, first data streams 12 to 15 are first data stream subset 3, first data streams 16 to 19 are first data stream subset 4, first data streams 20 to 23 are first data stream subset 5, first data streams 24 to 27 are first data stream subset 6, and first data streams 28 to 31 are first data stream subset 7.

In this embodiment, a possible implementation of the multiplexing shown in FIG. 13 is as follows: G=8, K=2, and m=16. 16 2:1 multiplexers are included. Each multiplexer multiplexes two first data streams to obtain one second data stream, and generates a total of 16 second data streams. Two first data streams (any first data stream selected from each of any two of first data stream subsets 0 to 7) are used as inputs of the 2:1 multiplexer. A corresponding specific implementation of the 2:1 multiplexer is shown in FIG. 17(*a*). Multiplexing input data stream 0 and multiplexing input data stream 1 of 2:1 multiplexer i (where $0 \le i \le 15$) respectively correspond to first data stream i and first data stream (i+16). In the figure, $$C_j^x$$

indicates consecutive $\Delta=6$ RS symbols in multiplexing input data stream j (where $0 \le j \le 1$) of the 2:1 multiplexer, and the symbols are from 6 different outer-code RS codewords. The 2:1 multiplexer outputs data in the two input data streams to an output data stream in a polling manner per 6 RS symbols, that is, an output data sequence is $$C_0^0, C_1^0, C_0^1, \dots, C_1^1, C_0^w, C_1^w,$$

. . . 12 consecutive RS symbols in the output data stream are from 12 different RS codewords. It should be noted that because $K \le G$, when $\Delta=1$, 2, or 3, 12 consecutive RS symbols in the second data stream can still be from 12 different RS codes.

A solution of encoding the 16 second data streams output through the multiplexing may use the solution in Embodiment 1, to obtain performance equivalent to that in Embodiment 1, and details are not described herein again.

Embodiment 14: An application scenario is 8×100G interfaces, an information bit length of inner-code encoding is 160 bits, a 2:1 multiplexer is used, and lane deskewing is used.

Based on Embodiment 12, in this embodiment, it is considered that the 2:1 multiplexer and inner code with a 160-bit information length are used for multiplexing, and a newly designed convolution interleaver and multiplexing are correspondingly used.

In this embodiment, the structure shown in FIG. 11 is used for the convolutional interleaving, and the convolutional interleaving is separately performed on n=32 PCS lane data streams to obtain n=32 first data streams. Convolution interleaver 0, convolution interleaver 1, convolution interleaver 2, . . . , convolution interleaver 31 use a same interleaving structure. FIG. 18(*a*) shows a structure of a convolution interleaver that includes p=4 delay lines. The four delay lines respectively include 3Q storage units, 2Q storage units, Q storage units, and 0 storage units, and each storage unit is configured to store d=2 symbols. In other words, a delay value of delay line 0 is 6Q symbols, a delay value of delay line 1 is 4Q symbols, a delay value of delay line 2 is 2Q symbols, and a delay value of delay line 3 is 0 symbols, that is, no delay.

As shown in FIG. 18(*a*), $C_r(\cdot)$ represents one RS symbol in lane data stream r (where $0 \le r \le n-1$). For example, $C_r(8t)$ and $C_r(8t+1)$ represent two RS symbols that are currently input into delay line 0 and that are in the lane data stream, and $C_r(8t-24Q)$ and $C_r(8t-24Q+1)$ are two RS symbols output from delay line 0; $C_r(8t+2)$ and $C_r(8t+3)$ represent two RS symbols that are subsequently input into delay line 1 and that are in the lane data stream, and $C_r(8t-16Q+2)$ and $C_r(8t-16Q+3)$ are two RS symbols output from delay line 1; $C_r(8t+4)$ and $C_r(8t+5)$ represent two RS symbols that are subsequently input into delay line 2 and that are in the lane data stream, and $C_r(8t-8Q+4)$ and $C_r(8t-8Q+5)$ are two RS symbols output from delay line 2; $C_r(8t+6)$ and $C_r(8t+7)$ represent two RS symbols that are then subsequently input into delay line 3 and that are in the lane data stream, and $C_r(8t+6)$ and $C_r(8t+7)$ are two RS symbols output from delay line 3; $C_r(8t+8)$ and $C_r(8t+9)$ represent two RS symbols that are then subsequently input into delay line 0 and that are in the lane data stream, and $C_r(8t-24Q+8)$ and $C_r(8t-24Q+9)$ are two RS symbols output from delay line 0; and so on. With reference to FIG. 8, it can be seen that when $8Q+2 \ge 272$, in other words, $Q \ge 34$, a total of eight RS symbols $C_r(8t-24Q)$, $C_r(8t-24Q+1)$, $C_r(8t-16Q+2)$, $C_r(8t-$ 16Q+3), $C_r(8t-8Q+4)$, $C_r(8t-8Q+5)$, $C_r(8t+6)$, and $C_r(8t+7)$ output through the convolutional interleaving are from eight different RS codewords.

Figures 26, 27A, 27B:
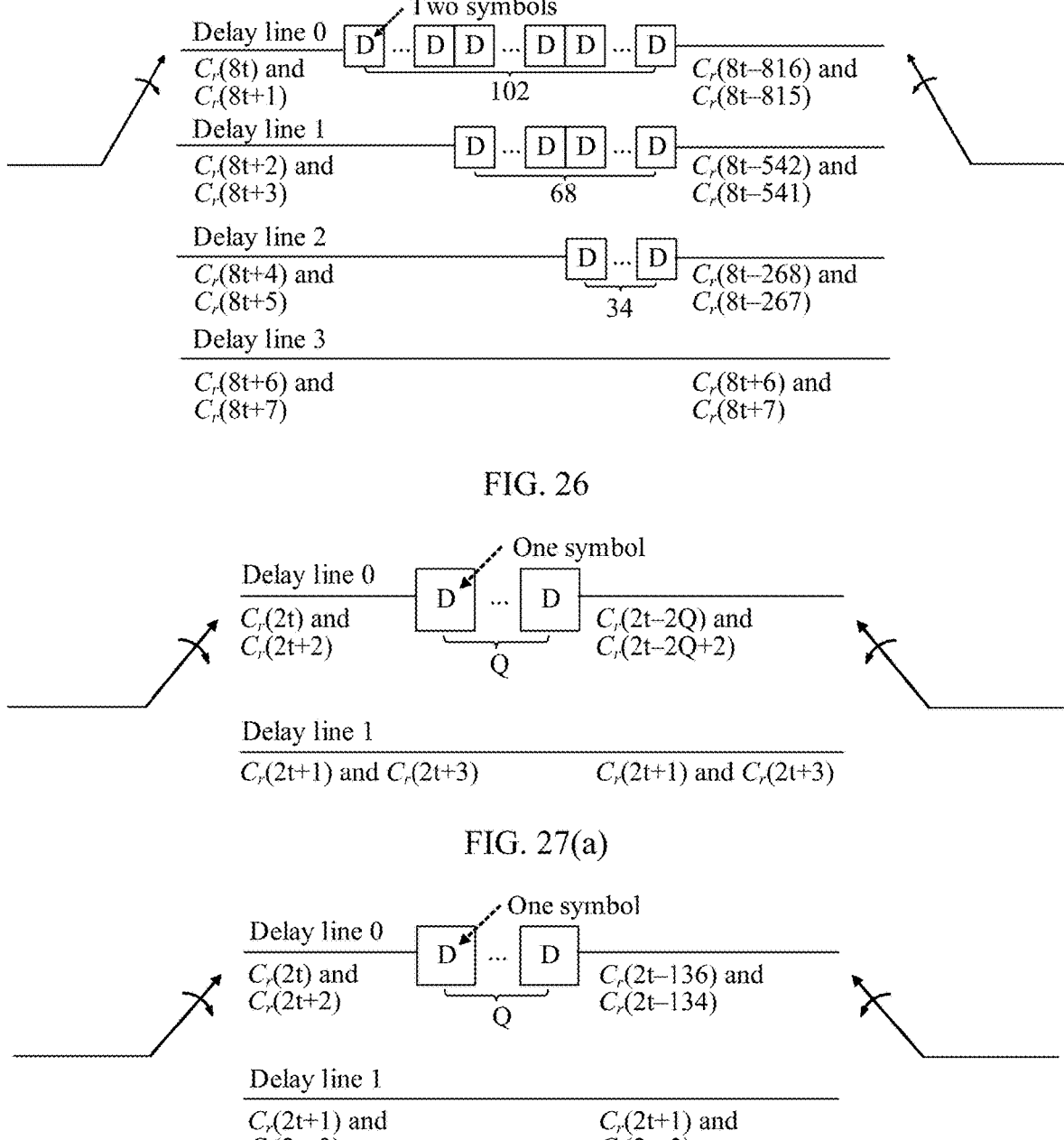
FIG. 26 is a schematic diagram of a thirteenth structure of a convolution interleaver according to an embodiment of this application.

FIG. 26 is a schematic diagram of a thirteenth structure of a convolution interleaver according to an embodiment of this application. As shown in FIG. 26, in an embodiment, that Q=34 is selected, and a specific structure of the convolution interleaver is shown in FIG. 26. A corresponding interleaving latency is approximately 102*2*4/2=408 RS symbols.

The convolution interleaver shown in FIG. 26 separately performs convolutional interleaving on 32 PCS lane data streams to obtain 32 first data streams. Refer to the PCS lane data streams shown in FIG. 8. It is not difficult to understand that any RS symbol in first data streams 0 to 3, any RS symbol in first data streams 4 to 7, any RS symbol in first data streams 8 to 11, any RS symbol in first data streams 12 to 15, any RS symbol in first data streams 16 to 19, any RS symbol in first data streams 20 to 23, any RS symbol in first data streams 24 to 27, and any RS symbol in first data streams 28 to 31 are from different RS codewords. Therefore, the 32 first data streams include G=8 first data stream subsets, first data streams 0 to 3 are first data stream subset 0, first data streams 4 to 7 are first data stream subset 1, first data streams 8 to 11 are first data stream subset 2, first data streams 12 to 15 are first data stream subset 3, first data streams 16 to 19 are first data stream subset 4, first data streams 20 to 23 are first data stream subset 5, first data streams 24 to 27 are first data stream subset 6, and first data streams 28 to 31 are first data stream subset 7.

In this embodiment, a possible implementation of the multiplexing shown in FIG. 13 is as follows: G=8, K=2, and m=16. 16 2:1 multiplexers are included. Each multiplexer multiplexes two first data streams to obtain one second data stream, and generates a total of 16 second data streams. Two first data streams (any first data stream selected from each of any two of first data stream subsets 0 to 7) are used as inputs of the 2:1 multiplexer. A corresponding specific implementation of the 2:1 multiplexer is shown in FIG. 17(*a*). Multiplexing input data stream 0 and multiplexing input data stream 1 of 2:1 multiplexer i (where 0≤i≤15) respectively correspond to first data stream i and first data stream (i+16). In the figure, $$C_j^x$$

indicates consecutive Δ=8 RS symbols in multiplexing input data stream j (where 0≤j≤1) of the 2:1 multiplexer, and the symbols are from 8 different outer-code RS codewords. The 2:1 multiplexer outputs data in the two input data streams to an output data stream in a polling manner per 8 RS symbols, that is, an output data sequence is $$C_0^0, C_1^0, C_0^1, \ldots, C_1^1, C_0^w, C_1^w,$$

. . . 16 consecutive RS symbols in the output data stream are from 16 different RS codewords. It should be noted that because K≤G, when Δ=1, 2, or 4, 16 consecutive RS symbols in the second data stream can still be from 16 different RS codes.

A scheme of perform inner-code encoding on the 16 second data streams output through the multiplexing may use the inner-code encoding scheme in Embodiment 3, to obtain performance equivalent to that in Embodiment 3, and details are not described herein again.

Embodiment 15: An application scenario is 8×100G interfaces, and lane symbol alignment is used.

Based on any one of Embodiments 11 to 14, this embodiment provides an embodiment solution with a lower latency.

Based on the foregoing schematic diagram of data processing of the transmitter processing module shown in FIG. 3(*b*), the transmitter processing module performs alignment marker lock on four lane data streams based on known alignment markers of FEC lanes 0 to 3, FEC lanes 4 to 7, FEC lanes 8 to 11, FEC lanes 12 to 15, FEC lanes 16 to 19, FEC lanes 20 to 23, FEC lanes 24 to 27, or FEC lanes 28 to 31. Then, the transmitter processing module performs alignment on the 32 lane data streams based on two RS symbols to obtain 32 aligned lane data streams. Convolutional interleaving is separately performed on the 32 lane data streams to obtain 32 first data streams, multiplexing is performed on the first data streams to obtain 4, 8, or 16 second data streams, and the second data streams are sent to an inner-code encoder for inner-code encoding. After data processing is performed on inner-code encoded data streams, data processed data streams are sent to a channel transmission medium for transmission.

In this embodiment, when a processor including the convolutional interleaving and the multiplexing and the inner-code encoding are the same as those in the solution in Embodiment 11, concatenated code in the scheme is under AWGN, performance is equivalent to that in the solution in Embodiment 11, but the solution in this embodiment is poor in resisting a system burst error. This solution is applicable to some scenarios that require a lower latency.

In this embodiment, when a processor including convolutional interleaving and multiplexing and the inner-code encoding are the same as those in the solution in Embodiment 12, concatenated code in the scheme is under AWGN, performance is equivalent to that in the solution in Embodiment 12, but the solution in this embodiment is poor in resisting a system burst error. This solution is applicable to some scenarios that require a lower latency.

In this embodiment, when a processor including convolutional interleaving and multiplexing and the inner-code encoding are the same as those in the solution in Embodiment 13, concatenated code in the scheme is under AWGN, performance is equivalent to that in the solution in Embodiment 13, but the solution in this embodiment is poor in resisting a system burst error. This solution is applicable to some scenarios that require a lower latency.

In this embodiment, when a processor including convolutional interleaving and multiplexing and the inner-code encoding are the same as those in the solution in Embodiment 14, concatenated code in the scheme is under AWGN, performance is equivalent to that in the solution in Embodiment 14, but the solution in this embodiment is poor in resisting a system burst error. This solution is applicable to some scenarios that require a lower latency.

Embodiment 16: An application scenario is 8×100G interfaces, an information bit length of inner-code encoding is 120 bits or 160 bits, an 8:1 multiplexer is used, and lane deskewing is used.

In this embodiment, it is considered that host interfaces are 100 Gb/s per lane 8×100G interfaces and a "100G RS-FEC" mode is used. For details of the interface, refer to IEEE Std 802.3ckTM/D3.0.

Based on the foregoing schematic diagram of data processing of the transmitter processing module shown in FIG. 3(*a*), the transmitter processing module performs alignment marker lock on four lane data streams based on known alignment markers of FEC lanes 0 to 3, FEC lanes 4 to 7, FEC lanes 8 to 11, FEC lanes 12 to 15, FEC lanes 16 to 19, FEC lanes 20 to 23, FEC lanes 24 to 27, or FEC lanes 28 to 31. FEC lanes 0 to 3, FEC lanes 4 to 7, FEC lanes 8 to 11, FEC lanes 12 to 15, FEC lanes 16 to 19, FEC lanes 20 to 23, FEC lanes 24 to 27, or FEC lanes 28 to 31 may be considered as FEC lanes 0 to 3 in a $0^{th}$ channel, a $1^{st}$ channel, a $2^{nd}$ channel, a 3rd channel, a $4^{th}$ channel, a $5^{th}$ channel, a $6^{th}$ channel, or a $7^{th}$ channel of 100G respectively. The transmitter processing module then performs lane deskewing on the 32 lane data streams to obtain 32 aligned lane data streams. Then, lane reordering is performed on data of four lanes based on the alignment markers of FEC lanes 0 to 3, FEC lanes 4 to 7, FEC lanes 8 to 11, FEC lanes 12 to 15, FEC lanes 16 to 19, FEC lanes 20 to 23, FEC lanes 24 to 27, or FEC lanes 28 to 31, so that the data of the four lanes can be arranged in a specified sequence. Finally, data of 32 lanes can be arranged in a specified sequence. One sequence is that the lane data streams are sorted from 0 to 31 from top to bottom, which is the same as that in FIG. 9.

The 32 lane data streams on which the lane reordering is performed are sent to a designed processor including convolutional interleaving and multiplexing, for interleaving and data sequence disordering, and then are sent to an inner-code encoder for inner-code encoding. After data processing is performed on inner-code encoded data streams, data processed data streams are sent to a channel transmission medium for transmission.

In this embodiment, the structure shown in FIG. 11 is used for the convolutional interleaving, and the convolutional interleaving is separately performed on n=32 FEC lane data streams to obtain n=32 first data streams. Convolution interleaver 0, convolution interleaver 1, convolution interleaver 2, . . . , convolution interleaver 31 use a same interleaving structure.

FIG. 27($a$) is a schematic diagram of a fourteenth structure of a convolution interleaver according to an embodiment of this application. As shown in FIG. 27($a$), p=2 delay lines are included. The two delay lines respectively include Q storage units and 0 storage units, and each storage unit is configured to store d=1 symbol. In other words, a delay value of delay line 0 is Q symbols, and a delay value of delay line 1 is 0 symbols, that is, no delay.

As shown in FIG. 27($a$), $C_r(\cdot)$ represents one RS symbol in lane data stream r (where 0≤r≤n−1). For example, $C_r(2t)$ represents one RS symbol that is currently input into delay line 0 and that is in the lane data stream, and $C_r(2t−2Q)$ is one RS symbol output from delay line 0; $C_r(2t+1)$ represents one RS symbol that is subsequently input into delay line 1 and that is in the lane data stream, and $C_r(2t+1)$ is one RS symbol output from delay line 1; $C_r(2t+2)$ represents one RS symbol that is then subsequently input into delay line 0 and that is in the lane data stream, and $C_r(2t−2Q+2)$ is one RS symbol output from delay line 0; and so on. With reference to FIG. 9, it can be seen that when 2Q+1≥136, that is, Q≥68, two consecutive RS symbols, $C_r(2t−2Q)$ and $C_r(2t+1)$, output through the convolutional interleaving are from two different RS codewords.

FIG. 27($b$) is a schematic diagram of a fifteenth structure of a convolution interleaver according to an embodiment of this application. As shown in FIG. 27($b$), in an embodiment, that Q=68 is selected, and a specific structure of the convolution interleaver is shown in FIG. 27($b$). A corresponding interleaving latency is approximately 68*2/2=68 RS symbols.

The convolution interleaver shown in FIG. 27($b$) separately performs convolutional interleaving on 32 FEC lane data streams to obtain 32 first data streams. Refer to the FEC lane data streams shown in FIG. 9. It is not difficult to understand that any RS symbol in first data streams 0 to 3, any RS symbol in first data streams 4 to 7, any RS symbol in first data streams 8 to 11, any RS symbol in first data streams 12 to 15, any RS symbol in first data streams 16 to 19, any RS symbol in first data streams 20 to 23, any RS symbol in first data streams 24 to 27, and any RS symbol in first data streams 28 to 31 are from different RS codewords. Therefore, the 32 first data streams include G=8 first data stream subsets, first data streams 0 to 3 are first data stream subset 0, first data streams 4 to 7 are first data stream subset 1, first data streams 8 to 11 are first data stream subset 2, first data streams 12 to 15 are first data stream subset 3, first data streams 16 to 19 are first data stream subset 4, first data streams 20 to 23 are first data stream subset 5, first data streams 24 to 27 are first data stream subset 6, and first data streams 28 to 31 are first data stream subset 7.

In this embodiment, the 8:1 multiplexing processing structure in Embodiment 11 is used, so that four second data streams may be obtained, and 16 consecutive RS symbols in each second data stream are all from 16 different RS codewords.

Inner-code encoding is separately performed on the foregoing four second data streams. The inner-code encoding scheme may be the encoding scheme provided in Embodiment 1, to obtain performance equivalent to that in Embodiment 1; or the encoding scheme provided in Embodiment 3 may be used to obtain performance equivalent to that in Embodiment 3, and details are not described herein.

Embodiment 17: An application scenario is 8×100G interfaces, an information bit length of inner-code encoding is 120 bits, a 4:1 multiplexer is used, and lane deskewing is used.

Based on the solution in Embodiment 16, in this embodiment, when a length of inner-code information is 120 bits, and the 4:1 multiplexer is used for multiplexing, a newly designed convolution interleaver and the multiplexing are correspondingly used.

In this embodiment, the structure shown in FIG. 11 is used for the convolutional interleaving, and the convolutional interleaving is separately performed on n=32 PCS lane data streams to obtain n=32 first data streams. Convolution interleaver 0, convolution interleaver 1, convolution interleaver 2, . . . , convolution interleaver 31 use a same interleaving structure.

Figure 28A:
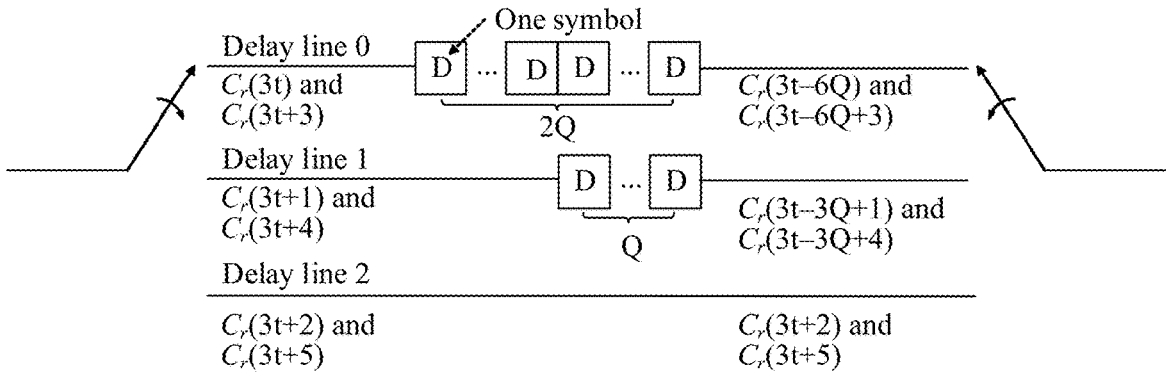
FIG. 28(*a*) is a schematic diagram of a sixteenth structure of a convolution interleaver according to an embodiment of this application.
Figure 28B:
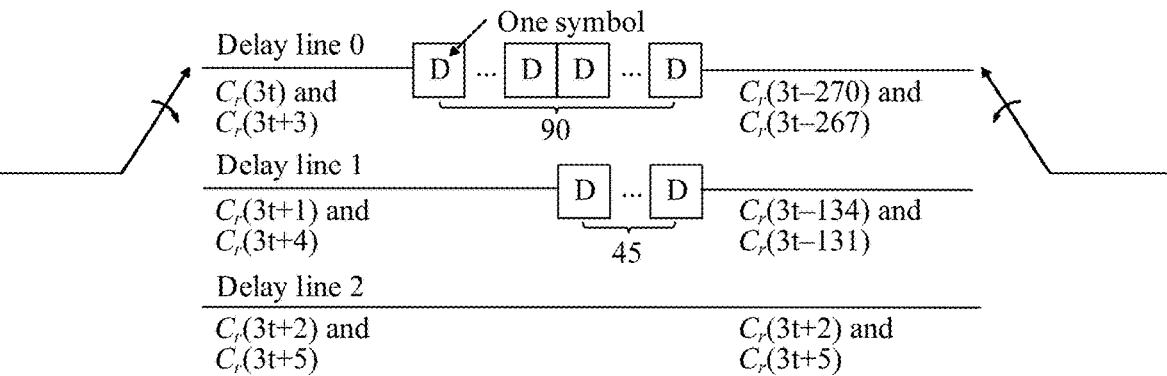

FIG. 28($a$) is a schematic diagram of a sixteenth structure of a convolution interleaver according to an embodiment of this application. As shown in FIG. 28($a$), p=3 delay lines (delay lines) are included. The p=3 delay lines respectively include 2Q storage units, Q storage units, and 0 storage units, and each storage unit is configured to store d=1 symbol. In other words, a delay value of delay line 0 is 2Q symbols, a delay value of delay line 1 is Q symbols, and a delay value of delay line 1 is 0 symbols, that is, no delay.

As shown in FIG. 28($a$), $C_r(\cdot)$ represents one RS symbol in lane data stream r (where 0≤r≤n−1). For example, $C_r(3t)$ represents one RS symbol that is currently input into delay line 0 and that is in the lane data stream, and $C_r(3t−6Q)$ is one RS symbol output from delay line 0; $C_r(3t+1)$ represents one RS symbol that is subsequently input into delay line 1 and that is in the lane data stream, and $C_r(3t−3Q+1)$ is one RS symbol output from delay line 1; $C_r(3t+2)$ represents one RS symbol that is then subsequently input into delay line 2 and that is in the lane data stream, and $C_r(3t+2)$ is one RS symbol output from delay line 2; $C_r(3t+3)$ represents one RS symbol that is then subsequently input into delay line 0 and that is in the lane data stream, and $C_r(3t-6Q+3)$ is one RS symbol output from delay line 0; and so on. With reference to FIG. 9, it can be seen that when $3Q+1\geq136$, that is, $Q\geq45$, a total of three RS symbols, $C_r(3t-6Q)$, $C_r(3t-3Q+2)$, and $C_r(3t+2)$, output through the convolutional interleaving are from three different RS codewords.

FIG. 28(*b*) is a schematic diagram of a seventeenth structure of a convolution interleaver according to an embodiment of this application. As shown in FIG. 28(*b*), in an embodiment, that Q=45 is selected, and a specific structure of the convolution interleaver is shown in FIG. 28(*b*). A corresponding interleaving latency is approximately 90*3/2=135 RS symbols.

The convolution interleaver shown in FIG. 28(*b*) separately performs convolutional interleaving on 32 FEC lane data streams to obtain 32 first data streams. Refer to the FEC lane data streams shown in FIG. 9. It is not difficult to understand that any RS symbol in first data streams 0 to 3, any RS symbol in first data streams 4 to 7, any RS symbol in first data streams 8 to 11, any RS symbol in first data streams 12 to 15, any RS symbol in first data streams 16 to 19, any RS symbol in first data streams 20 to 23, any RS symbol in first data streams 24 to 27, and any RS symbol in first data streams 28 to 31 are from different RS codewords. Therefore, the 32 first data streams include G=8 first data stream subsets, first data streams 0 to 3 are first data stream subset 0, first data streams 4 to 7 are first data stream subset 1, first data streams 8 to 11 are first data stream subset 2, first data streams 12 to 15 are first data stream subset 3, first data streams 16 to 19 are first data stream subset 4, first data streams 20 to 23 are first data stream subset 5, first data streams 24 to 27 are first data stream subset 6, and first data streams 28 to 31 are first data stream subset 7.

In this embodiment, the multiplexing processing structure in Embodiment 12 is used, when Δ=1 or 3, eight second data streams may be obtained, and 12 consecutive RS symbols in each second data stream are all from 12 different RS codewords.

A solution of encoding the eight second data streams output through the multiplexing may use the solution in Embodiment 1, to obtain performance equivalent to that in Embodiment 1, and details are not described herein again.

Embodiment 18: An application scenario is 8×100G interfaces, an information bit length of inner-code encoding is 160 bits, a 4:1 multiplexer is used, and lane deskewing is used.

Based on the solution in Embodiment 16, in this embodiment, an implementation solution, with a second-low latency, in which a length of inner-code information is 160 bits, and the 4:1 multiplexer is used for multiplexing is provided, and a newly designed interleaver and the multiplexing are correspondingly used.

In this embodiment, the structure shown in FIG. 11 is used for the convolutional interleaving, and the convolutional interleaving is separately performed on n=32 PCS lane data streams to obtain n=32 first data streams. Convolution interleaver 0, convolution interleaver 1, convolution interleaver 2, . . . , convolution interleaver 31 use a same interleaving structure.

Figure 29A:
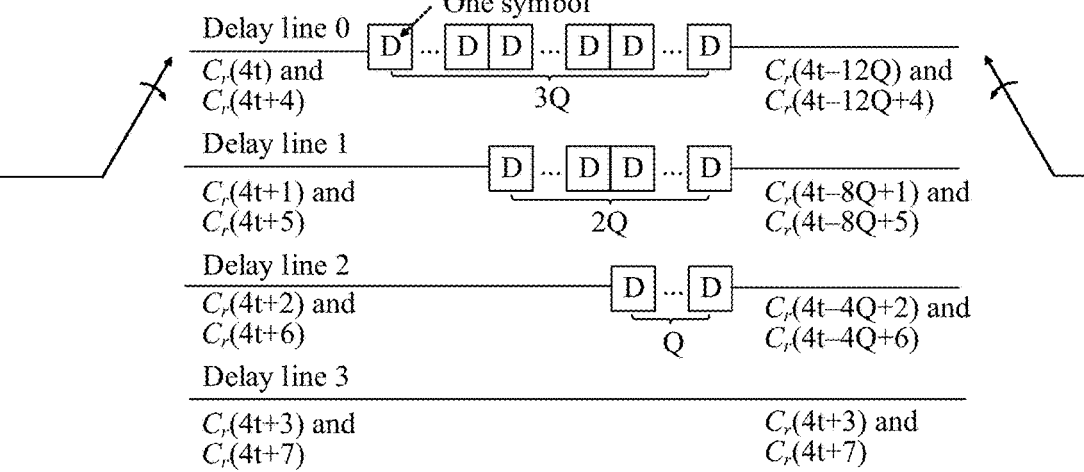
FIG. 29(*a*) is a schematic diagram of an eighteenth structure of a convolution interleaver according to an embodiment of this application.
Figure 29B:
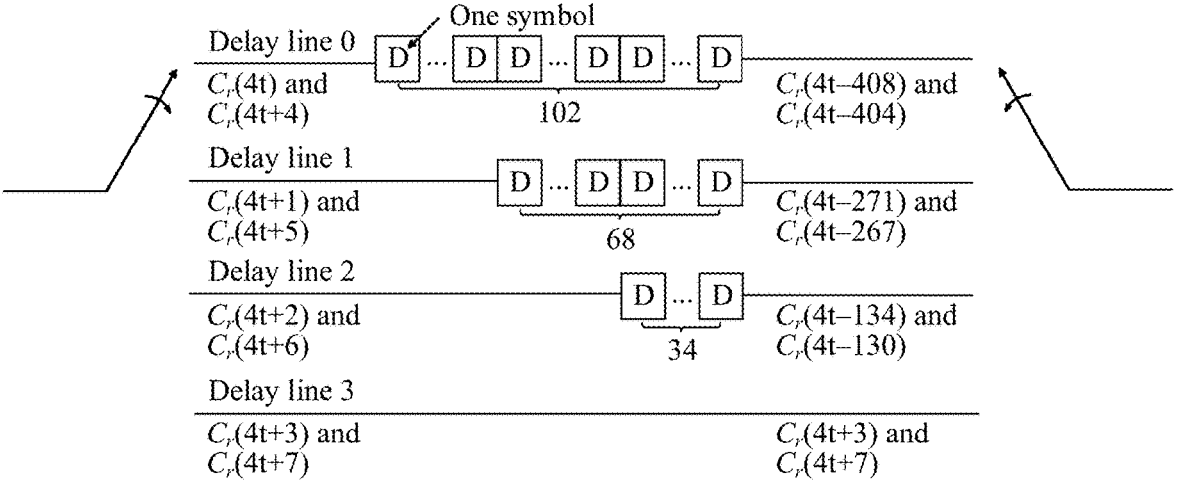

FIG. 29(*a*) is a schematic diagram of an eighteenth structure of a convolution interleaver according to an embodiment of this application. As shown in FIG. 29(*a*), p=4 delay lines (delay lines) are included. The p=4 delay lines respectively include 3Q storage units, 2Q storage units, Q storage units, and 0 storage units, and each storage unit is configured to store d=1 symbol. In other words, a delay value of delay line 0 is 3Q symbols, a delay value of delay line 1 is 2Q symbols, a delay value of delay line 2 is Q symbols, and a delay value of delay line 3 is 0 symbols, that is, no delay.

As shown in FIG. 29(*a*), $C_r(\cdot)$ represents one RS symbol in lane data stream r (where $0\leq r\leq n-1$). For example, $C_r(4t)$ represents one RS symbol that is currently input into delay line 0 and that is in the lane data stream, and $C_r(4t-12Q)$ is one RS symbol output from delay line 0; $C_r(4t+1)$ represents one RS symbol that is subsequently input into delay line 1 and that is in the lane data stream, and $C_r(4t-8Q+1)$ is one RS symbol output from delay line 1; $C_r(4t+2)$ represents one RS symbol that is then subsequently input into delay line 2 and that is in the lane data stream, and $C_r(4t-4Q+2)$ is one RS symbol output from delay line 2; $C_r(4t+3)$ represents one RS symbol that is then subsequently input into delay line 3 and that is in the lane data stream, and $C_r(4t+3)$ is one RS symbol output from delay line 3; $C_r(4t+4)$ represents one RS symbol that is then subsequently input into delay line 0 and that is in the lane data stream, and $C_r(4t-12Q+4)$ is one RS symbol output from delay line 0; and so on. With reference to FIG. 9, it can be seen that when $4Q+1\geq136$, that is, $Q\geq34$, a total of four RS symbols, $C_r(4t-12Q)$, $C_r(4t-8Q+1)$, $C_r(4t-4Q+2)$, and $C_r(4t+3)$, consecutively output through the convolutional interleaving are from four different RS codewords.

FIG. 29(*b*) is a schematic diagram of a nineteenth structure of a convolution interleaver according to an embodiment of this application. As shown in FIG. 29(*b*), in an embodiment, that Q=34 is selected, and a specific structure of the convolution interleaver is shown in FIG. 29(*b*). A corresponding interleaving latency is approximately 102*4/2=204 RS symbols.

The convolution interleaver shown in FIG. 29(*b*) separately performs convolutional interleaving on 32 FEC lane data streams to obtain 32 first data streams. Refer to the FEC lane data streams shown in FIG. 9. It is not difficult to understand that any RS symbol in first data streams 0 to 3, any RS symbol in first data streams 4 to 7, any RS symbol in first data streams 8 to 11, any RS symbol in first data streams 12 to 15, any RS symbol in first data streams 16 to 19, any RS symbol in first data streams 20 to 23, any RS symbol in first data streams 24 to 27, and any RS symbol in first data streams 28 to 31 are from different RS codewords. Therefore, the 32 first data streams include G=8 first data stream subsets, first data streams 0 to 3 are first data stream subset 0, first data streams 4 to 7 are first data stream subset 1, first data streams 8 to 11 are first data stream subset 2, first data streams 12 to 15 are first data stream subset 3, first data streams 16 to 19 are first data stream subset 4, first data streams 20 to 23 are first data stream subset 5, first data streams 24 to 27 are first data stream subset 6, and first data streams 28 to 31 are first data stream subset 7.

In this embodiment, the multiplexing processing structure in Embodiment 13 is used, when Δ=1, 2, or 4, eight second data streams may be obtained, and 16 consecutive RS symbols in each second data stream are all from 16 different RS codewords.

Inner-code encoding is separately performed on the foregoing eight second data streams, and an inner-code encoding scheme of the eight second data streams may use the inner-code encoding scheme provided in Embodiment 3, to obtain performance equivalent to that in Embodiment 3. Details are not described herein.

Embodiment 19: An application scenario is 8×100G interfaces, an information bit length of inner-code encoding is 120 bits, a 2:1 multiplexer is used, and lane deskewing is used.

Based on the solution in Embodiment 16, in this embodiment, when a length of inner-code information is 120 bits, and the 4:1 multiplexer is used for multiplexing, a newly designed convolution interleaver and the multiplexing are correspondingly used.

In this embodiment, the structure shown in FIG. 11 is used for the convolutional interleaving, and the convolutional interleaving is separately performed on n=32 PCS lane data streams to obtain n=32 first data streams. Convolution interleaver 0, convolution interleaver 1, convolution interleaver 2, . . . , convolution interleaver 31 use a same interleaving structure.

Figure 30A:
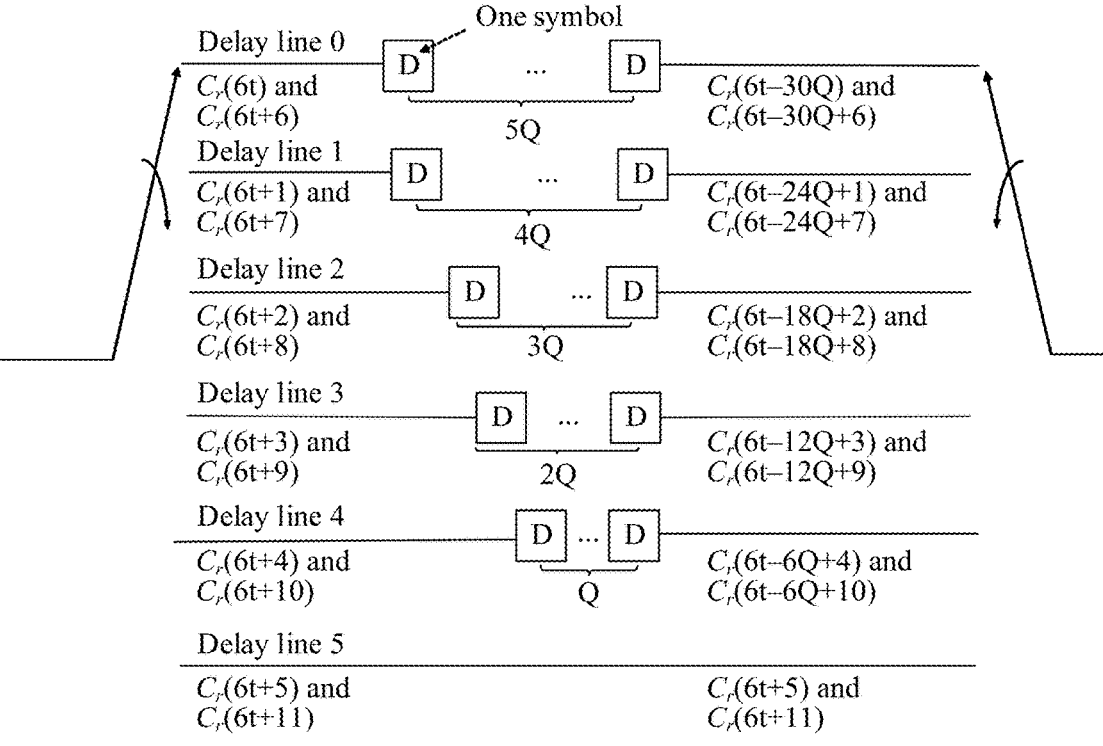
FIG. 30(*a*) is a schematic diagram of a twentieth structure of a convolution interleaver according to an embodiment of this application.
Figure 30B:
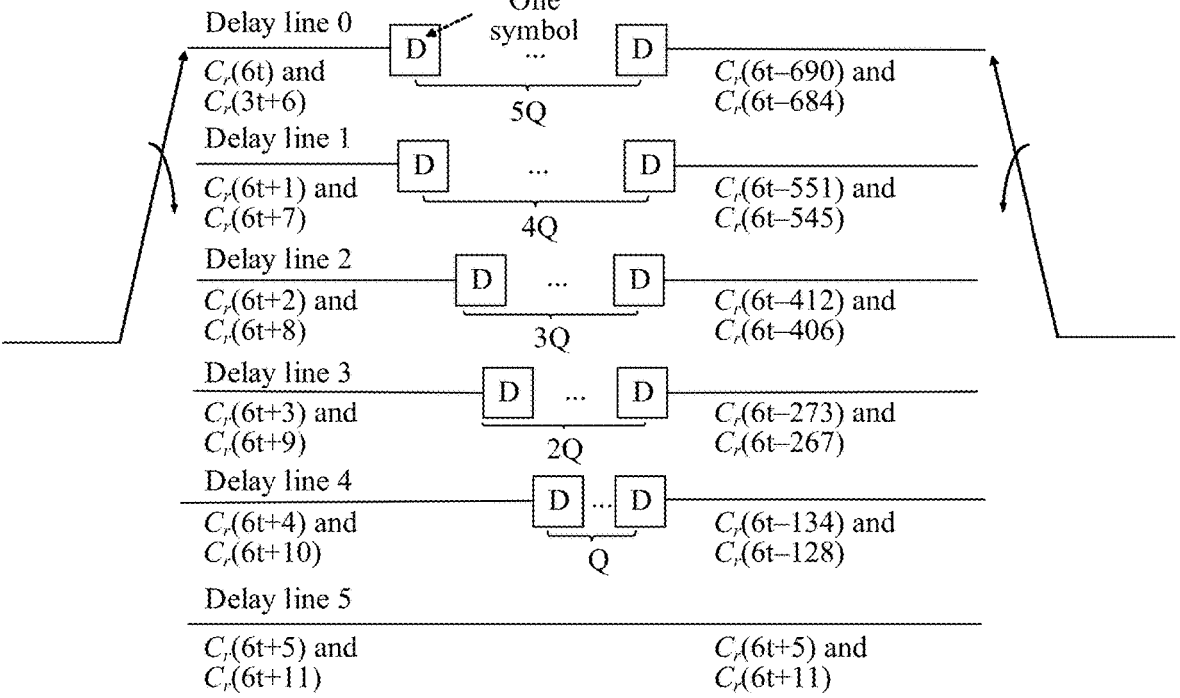

FIG. 30(*a*) is a schematic diagram of a twentieth structure of a convolution interleaver according to an embodiment of this application. As shown in FIG. 30(*a*), p=6 delay lines (delay lines) are included. The p=6 delay lines respectively include 5Q storage units, 4Q storage units, 3Q storage units, 2Q storage units, Q storage units, and 0 storage units, and each storage unit is configured to store d=1 symbol. That is, a delay value of delay line 0 is 5Q symbols, a delay value of delay line 1 is 4Q symbols, a delay value of delay line 2 is 3Q symbols, a delay value of delay line 3 is 2Q symbols, a delay value of delay line 4 is Q symbols, and a delay value of delay line 5 is 0 symbols, that is, no delay.

As shown in FIG. 30(*a*), $C_r(\cdot)$ represents one RS symbol in lane data stream r (where $0 \le r \le n-1$). For example, $C_r(6t)$ represents one RS symbol that is currently input into delay line 0 and that is in the lane data stream, and $C_r(6t-30Q)$ is one RS symbol output from delay line 0; $C_r(6t+1)$ represents one RS symbol that is subsequently input into delay line 1 and that is in the lane data stream, and $C_r(6t-24Q+1)$ is one RS symbol output from delay line 1; $C_r(6t+2)$ represents one RS symbol that is then subsequently input into delay line 2 and that is in the lane data stream, and $C_r(6t-18Q+2)$ is one RS symbol output from delay line 2; $C_r(6t+3)$ represents one RS symbol that is then subsequently input into delay line 3 and that is in the lane data stream, and $C_r(6t-12Q+3)$ is one RS symbol output from delay line 3; $C_r(6t+4)$ represents one RS symbol that is then subsequently input into delay line 4 and that is in the lane data stream, and $C_r(6t-6Q+4)$ is one RS symbol output from delay line 4; $C_r(6t+5)$ represents one RS symbol that is then subsequently input into delay line 5 and that is in the lane data stream, and $C_r(6t+5)$ is one RS symbol output from delay line 5; $C_r(6t+6)$ represents one RS symbol that is then subsequently input into delay line 0 and that is in the lane data stream, and $C_r(6t-30Q+6)$ is one RS symbol output from delay line 0; and so on. With reference to FIG. 9, it can be seen that when $6Q+1 \ge 136$, that is, $Q \ge 23$, a total of six RS symbols, $C_r(6t-30Q)$, $C_r(6t-24Q+1)$, $C_r(6t-18Q+2)$, $C_r(6t-12Q+3)$, $C_r(6t-6Q+4)$, and $C_r(6t+5)$, consecutively output through the convolutional interleaving are from six different RS codewords.

FIG. 30(*b*) is a schematic diagram of a twenty-first structure of a convolution interleaver according to an embodiment of this application. As shown in FIG. 30(*b*), in an embodiment, that Q=23 is selected, and a specific structure of the convolution interleaver is shown in FIG. 30(*b*). A corresponding interleaving latency is approximately 23*5*6/2=345 RS symbols.

The convolution interleaver shown in FIG. 30(*b*) separately performs convolutional interleaving on 32 FEC lane data streams to obtain 32 first data streams. Refer to the FEC lane data streams shown in FIG. 9. It is not difficult to understand that any RS symbol in first data streams 0 to 3, any RS symbol in first data streams 4 to 7, any RS symbol in first data streams 8 to 11, any RS symbol in first data streams 12 to 15, any RS symbol in first data streams 16 to 19, any RS symbol in first data streams 20 to 23, any RS symbol in first data streams 24 to 27, and any RS symbol in first data streams 28 to 31 are from different RS codewords. Therefore, the 32 first data streams include G=8 first data stream subsets, first data streams 0 to 3 are first data stream subset 0, first data streams 4 to 7 are first data stream subset 1, first data streams 8 to 11 are first data stream subset 2, first data streams 12 to 15 are first data stream subset 3, first data streams 16 to 19 are first data stream subset 4, first data streams 20 to 23 are first data stream subset 5, first data streams 24 to 27 are first data stream subset 6, and first data streams 28 to 31 are first data stream subset 7.

In this embodiment, the multiplexing processing structure in Embodiment 13 is used, when Δ=1, 2, 3, or 6, 16 second data streams may be obtained, and 12 consecutive RS symbols in each second data stream are all from 12 different RS codewords.

Inner-code encoding is separately performed on the foregoing 16 second data streams, and an encoding scheme of the 16 second data streams may use the inner-code encoding scheme provided in Embodiment 1, to obtain performance equivalent to that in Embodiment 1. Details are not described herein.

Embodiment 20: An application scenario is 8×100G interfaces, an information bit length of inner-code encoding is 160 bits, a 2:1 multiplexer is used, and lane deskewing is used.

Based on the solution in Embodiment 16, in this embodiment, when a length of inner-code information is 160 bits, and a 2:1 multiplexer is used for multiplexing, a newly designed convolution interleaver and the multiplexing are correspondingly used.

In this embodiment, the structure shown in FIG. 11 is used for the convolutional interleaving, and the convolutional interleaving is separately performed on n=32 PCS lane data streams to obtain n=32 first data streams. Convolution interleaver 0, convolution interleaver 1, convolution interleaver 2, . . . , convolution interleaver 31 use a same interleaving structure.

Figure 31A:
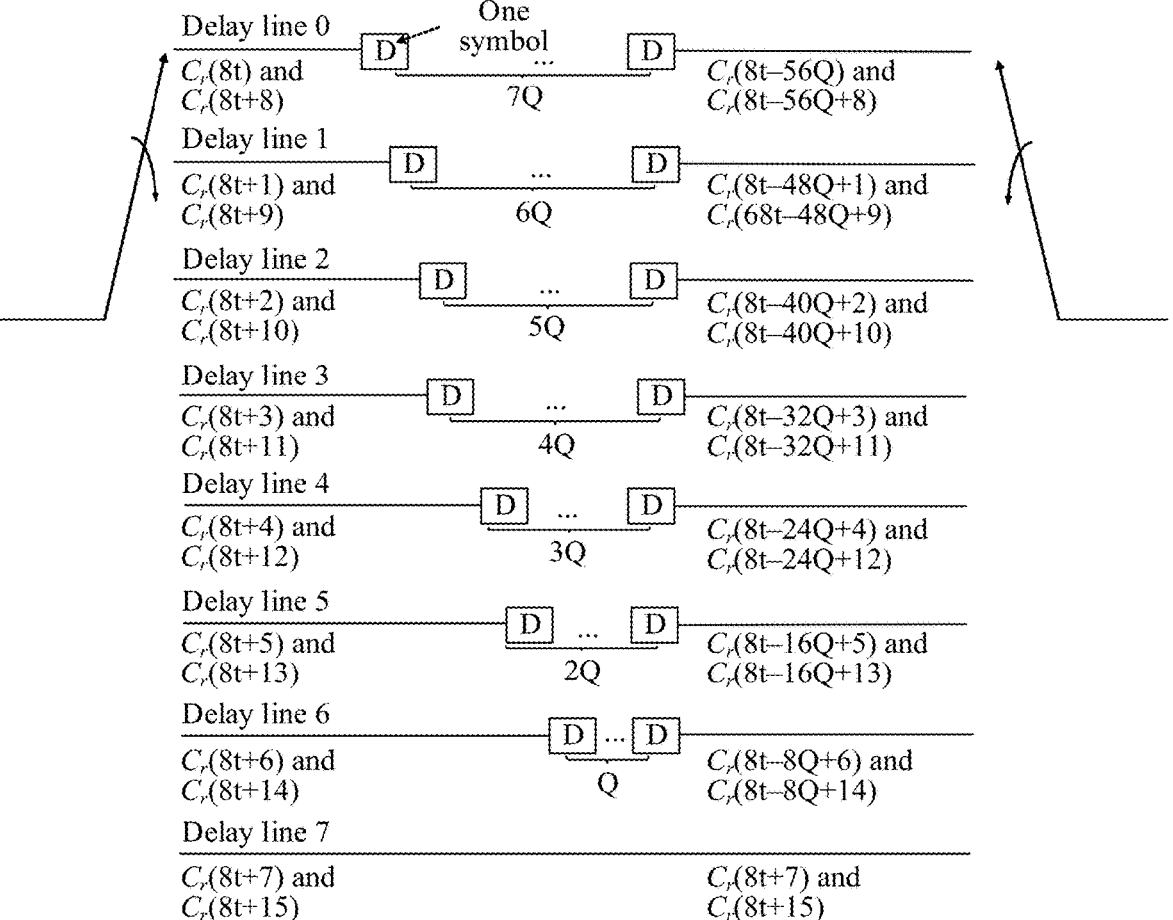
FIG. 31(*a*) is a schematic diagram of a twenty-second structure of a convolution interleaver according to an embodiment of this application.
Figure 31B:
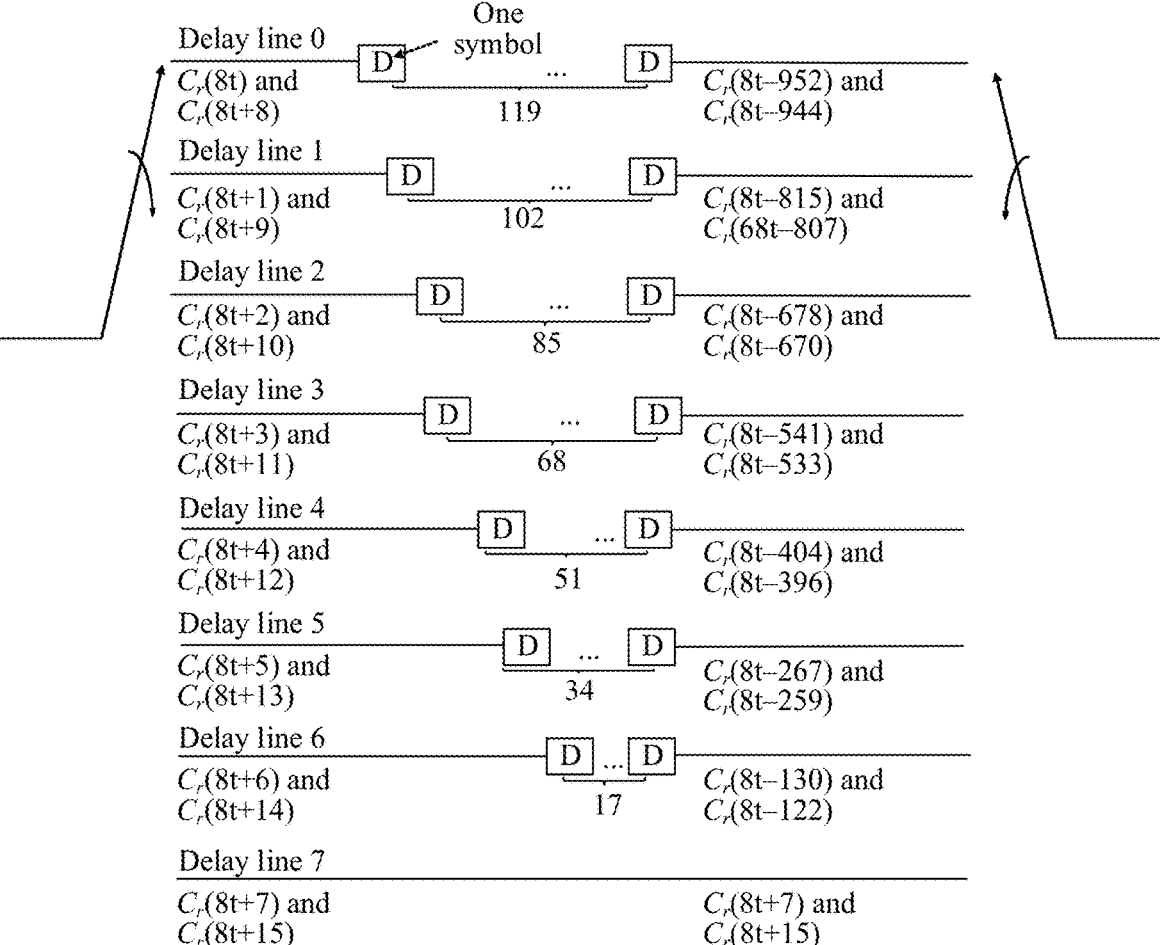

FIG. 31(*a*) is a schematic diagram of a twenty-second structure of a convolution interleaver according to an embodiment of this application. As shown in FIG. 31(*a*), p=8 delay lines are included. The p=8 delay lines respectively include 7Q storage units, 6Q storage units, 5Q storage units, 4Q storage units, 3Q storage units, 2Q storage units, Q storage units, and 0 storage units, and each storage unit is configured to store d=1 symbol. That is, a delay value of delay line 0 is 7Q symbols, a delay value of delay line 1 is 6Q symbols, a delay value of delay line 2 is 5Q symbols, a delay value of delay line 3 is 4Q symbols, a delay value of delay line 4 is 3Q symbols, a delay value of delay line 5 is 2Q symbols, a delay value of delay line 6 is Q symbols, and a delay value of delay line 7 is 0 symbols, that is, no delay.

As shown in FIG. 31(*a*), $C_r(\cdot)$ represents one RS symbol in lane data stream r (where $0 \le r \le n-1$). For example, $C_r(8t)$ represents one RS symbol that is currently input into delay line 0 and that is in the lane data stream, and $C_r(8t-56Q)$ is one RS symbol output from delay line 0; $C_r(8t+1)$ represents one RS symbol that is subsequently input into delay line 1 and that is in the lane data stream, and $C_r(8t-48Q+1)$ is one RS symbol output from delay line 1; $C_r(8t+2)$ represents one RS symbol that is then subsequently input into delay line 2 and that is in the lane data stream, and $C_r(8t-40Q+2)$ is one RS symbol output from delay line 2; $C_r(8t+3)$ represents one RS symbol that is then subsequently input into delay line 3 and that is in the lane data stream, and $C_r(8t-32Q+3)$ is one RS symbol output from delay line 3; $C_r(8t+4)$ represents one RS symbol that is then subsequently input into delay line 4 and that is in the lane data stream, and $C_r(8t-24Q+4)$ is one RS symbol output from delay line 4; $C_r(8t+5)$ represents one RS symbol that is then subsequently input into delay line 5 and that is in the lane data stream, and $C_r(8t-16Q+5)$ is one RS symbol output from delay line 5; $C_r(8t+6)$ represents one RS symbol that is then subsequently input into delay line 6 and that is in the lane data stream, and $C_r(8t-8Q+6)$ is one RS symbol output from delay line 6; $C_r(8t+7)$ represents one RS symbol that is then subsequently input into delay line 7 and that is in the lane data stream, and $C_r(8t+7)$ is one RS symbol output from delay line 7; $C_r(8t+8)$ represents one RS symbol that is then subsequently input into delay line 0 and that is in the lane data stream, and $C_r(8t-56Q+8)$ is one RS symbol output from delay line 0; and so on. With reference to FIG. 9, it can be seen that when $8Q+1 \geq 136$, that is, $Q \geq 17$, a total of eight RS symbols $C_r(8t-56Q)$, $C_r(8t-48Q+1)$, $C_r(8t-40Q+2)$ $C_r(8t-32Q+3)$, $C_r(8t-24Q+4)$, $C_r(8t-16Q+5)$, $C_r(8t-8Q+6)$, and $C_r(8t+7)$ consecutively output through the convolutional interleaving are from eight different RS codewords.

FIG. 31(*b*) is a schematic diagram of a twenty-third structure of a convolution interleaver according to an embodiment of this application. As shown in FIG. 31(*b*), in an embodiment, that Q=17 is selected, and a specific structure of the convolution interleaver is shown in FIG. 31(*b*). A corresponding interleaving latency is approximately $17*7*8/2=476$ RS symbols.

The convolution interleaver shown in FIG. 31(*b*) separately performs convolutional interleaving on 32 FEC lane data streams to obtain 32 first data streams. Refer to the FEC lane data streams shown in FIG. 9. It is not difficult to understand that any RS symbol in first data streams 0 to 3, any RS symbol in first data streams 4 to 7, any RS symbol in first data streams 8 to 11, any RS symbol in first data streams 12 to 15, any RS symbol in first data streams 16 to 19, any RS symbol in first data streams 20 to 23, any RS symbol in first data streams 24 to 27, and any RS symbol in first data streams 28 to 31 are from different RS codewords. Therefore, the 32 first data streams include G=8 first data stream subsets, first data streams 0 to 3 are first data stream subset 0, first data streams 4 to 7 are first data stream subset 1, first data streams 8 to 11 are first data stream subset 2, first data streams 12 to 15 are first data stream subset 3, first data streams 16 to 19 are first data stream subset 4, first data streams 20 to 23 are first data stream subset 5, first data streams 24 to 27 are first data stream subset 6, and first data streams 28 to 31 are first data stream subset 7.

In this embodiment, the multiplexing processing structure in Embodiment 13 is used, when $\Delta=1$, 2, 4, or 8, 16 second data streams may be obtained, and 16 consecutive RS symbols in each second data stream are all from 16 different RS codewords.

Inner-code encoding is separately performed on the foregoing 16 second data streams, and an inner-code encoding scheme of the 16 second data streams may use the inner-code encoding scheme provided in Embodiment 3, to obtain performance equivalent to that in Embodiment 3. Details are not described herein.

Embodiment 21: An application scenario is 8×100G interfaces, an information bit length of inner-code encoding is 120 bits or 160 bits, and lane symbol alignment is used.

Based on the solution in any one of Embodiments 16 to 20, this embodiment provides an embodiment solution with a lower latency.

Based on the foregoing schematic diagram of data processing of the transmitter processing module shown in FIG. 3(*d*), the transmitter processing module performs alignment marker lock on four lane data streams based on known alignment markers of FEC lanes 0 to 3, FEC lanes 4 to 7, FEC lanes 8 to 11, FEC lanes 12 to 15, FEC lanes 16 to 19, FEC lanes 20 to 23, FEC lanes 24 to 27, or FEC lanes 28 to 31. Then, the transmitter processing module performs one symbol-based alignment on the 32 lane data streams to obtain 32 aligned lane data streams. Convolutional interleaving is separately performed on the 32 lane data streams to obtain 32 first data streams, multiplexing is performed on the first data streams to obtain 4, 8, or 16 second data streams, and the second data streams are sent to an inner-code encoder for inner-code encoding. After data processing is performed on inner-code encoded data streams, data processed data streams are sent to a channel transmission medium for transmission.

It should be understood that, the multiplexing and the inner-code encoding scheme used in this embodiment both use the solution provided in any one of Embodiments 16 to 20.

In this embodiment, when a processor including multiplexing and the inner-code encoding are the same as those in the solution in Embodiment 16, concatenated code in the scheme is under AWGN, performance is equivalent to that in the solution in Embodiment 16, but the solution in this embodiment is poor in resisting a system burst error. This solution is applicable to some scenarios that require a lower latency.

In this embodiment, when a processor including multiplexing and the inner-code encoding are the same as those in the solution in Embodiment 17, concatenated code in the scheme is under AWGN, performance is equivalent to that in the solution in Embodiment 17, but the solution in this embodiment is poor in resisting a system burst error. This solution is applicable to some scenarios that require a lower latency.

In this embodiment, when a processor including multiplexing and the inner-code encoding are the same as those in the solution in Embodiment 18, concatenated code in the scheme is under AWGN, performance is equivalent to that in the solution in Embodiment 18, but the solution in this embodiment is poor in resisting a system burst error. This solution is applicable to some scenarios that require a lower latency.

In this embodiment, when a processor including multiplexing and the inner-code encoding are the same as those in the solution in Embodiment 19, concatenated code in the scheme is under AWGN, performance is equivalent to that in the solution in Embodiment 19, but the solution in this embodiment is poor in resisting a system burst error. This solution is applicable to some scenarios that require a lower latency.

In this embodiment, when a processor including multiplexing and the inner-code encoding are the same as those in the solution in Embodiment 20, concatenated code in the scheme is under AWGN, performance is equivalent to that in the solution in Embodiment 20, but the solution in this embodiment is poor in resisting a system burst error. This solution is applicable to some scenarios that require a lower latency.

It should be noted that, in some embodiments, the multiplexing described in the foregoing embodiments may also be replaced with block interleaving for implementation. The following provides descriptions with reference to a specific embodiment.

Figure 32A:
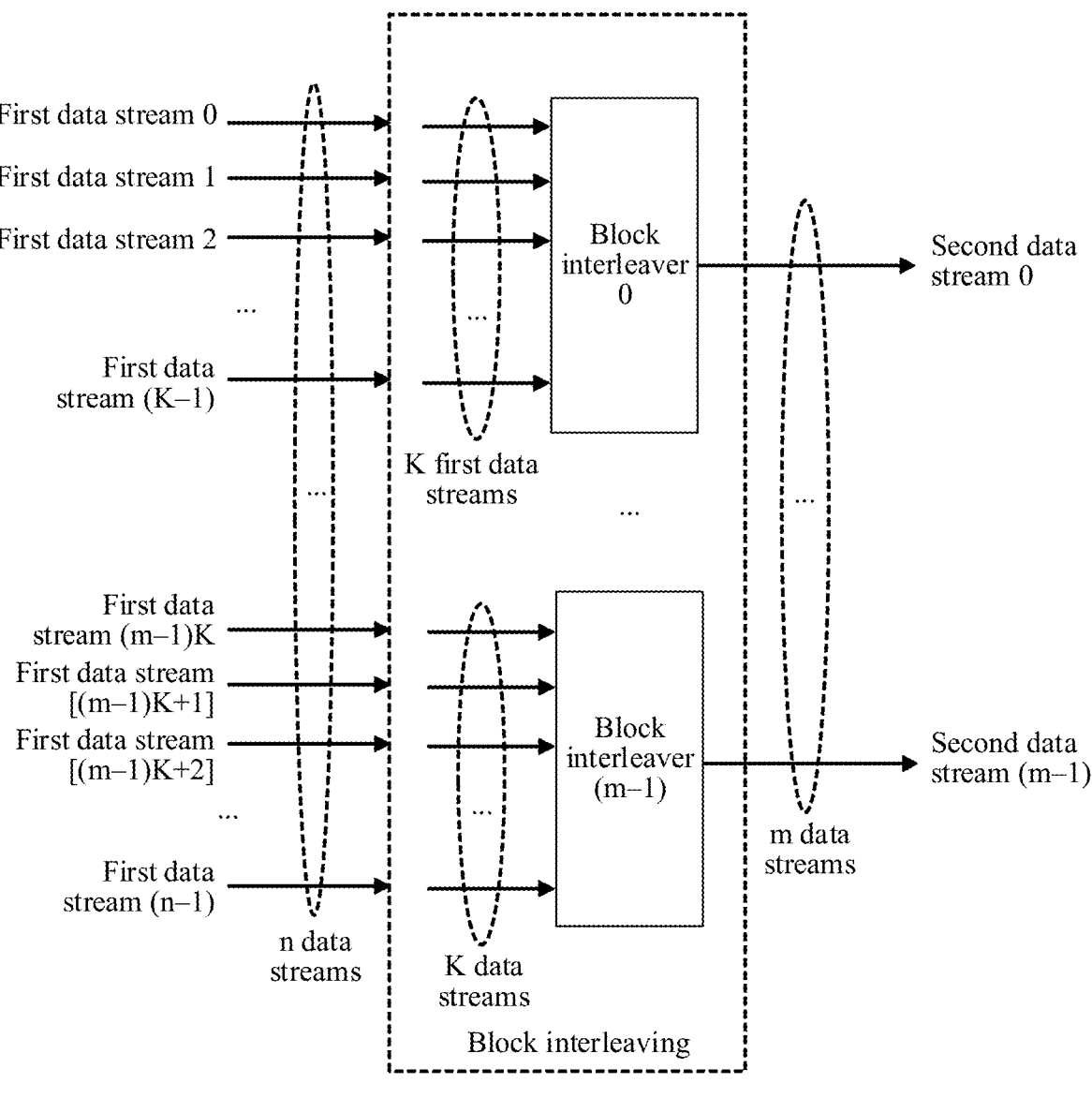
FIG. 32(*a*) is a schematic diagram of a structure in which block interleaving is performed on n first data streams according to an embodiment of this application.
Figure 32B:
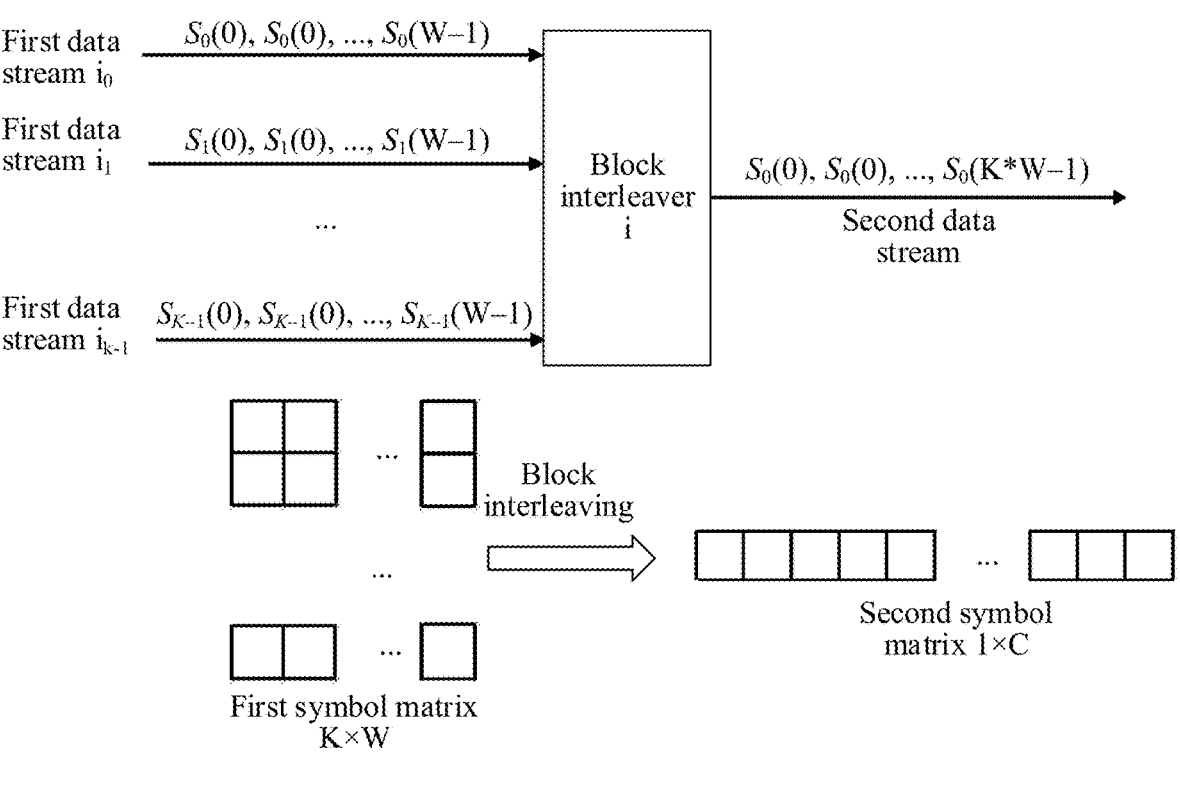

FIG. 32(*a*) is a schematic diagram of a structure in which block interleaving is performed on n first data streams according to an embodiment of this application. As shown in FIG. 32(*a*), the block interleaving may be performed via m parallel block interleaving modules. Specifically, each block interleaver generates one second data stream after performing block interleaving on K input first data streams, to obtain a total of m second data streams. A manner of selecting the K first data streams input into each block interleaver is consistent with a manner of selecting K input multiplexing data streams input into the multiplexer in the foregoing embodiments, and details are not described herein again.

FIG. 32(*b*) is a schematic diagram of a structure of a block interleaver according to an embodiment of this application. As shown in FIG. 32(*b*), consecutive $\Delta$ RS symbols in first data stream $i_k$ are one symbol subset, and are represented by $S_k(\cdot)$, where $0 \leq k \leq K-1$. Therefore, $S_k(0)$, $S_k(1)$, . . . , $S_k(W)$ represent consecutive W symbol subsets output from first data stream $i_k$. Consecutive $\Delta$ RS symbols in a second data stream are one symbol subset, and are represented by $S(\cdot)$. W symbol subsets are obtained from each of K input first data streams, to form a first symbol matrix with K rows and W columns. Each element in the first symbol matrix is a symbol subset, and $S_k(w)$ corresponds to an element in a $k^{th}$ row and a $w^{th}$ column in the first symbol matrix, where $0 \leq k \leq K-1$ and $0 \leq w \leq W-1$. A second symbol matrix with one row and C columns is obtained through block interleaving is performed on the first symbol matrix with K rows and W columns, where $C = K*W$. Each element in the second symbol matrix is also a symbol subset, and $S(c)$ represents an element in a $c^{th}$ column in the second symbol matrix, where $0 \leq c \leq C$. Mapping between block interleaving $S(c)$ and $S_k(w)$ may be expressed as: $c = K*w+k$. $S(0)$, $S(0)$, . . . , $S(K*W-1)$ in the second symbol matrix obtained through the block interleaving sequentially correspond to information bits of Q pieces of inner code, and the Q pieces of inner code are obtained through inner-code encoding. If a length of the inner code is D symbols, $K*W*\Delta = Q*D$.

It should be noted that the symbol subset is merely a concept introduced for ease of description. In actual application, the first data stream and the second data stream are both a whole and are not divided. Each symbol subset may be considered as one or more symbols in the first data stream or the second data stream. In addition, in actual application, the first symbol matrix and the second symbol matrix may alternatively not be presented in a form of matrices. For example, the first symbol matrix is presented as a first symbol set, and the first symbol set includes K*W symbol subsets that respectively correspond to K rows and W columns of elements in the first symbol matrix. The second symbol matrix is presented as a second symbol set, and the second symbol set includes C symbol subsets that respectively correspond to elements in one row and C columns in the second symbol matrix.

In an example, based on the convolution interleaver provided in Embodiment 1, a specific implementation corresponding to the block interleaving is as follows: G=2, K=2, and m=16. Input first data stream i, and input first data stream $i_1$ of block interleaver i respectively correspond to first data stream i and first data stream (i+16). The structure of the block interleaver shown in FIG. 32(*b*) is used as an example, and parameters of the block interleaver may be $\Delta=6$, W=1, and Q=1, or may be $\Delta=3$, W=2, and Q=1. The second symbol matrix is mapped to one piece of information data of inner code with a 120-bit information bit length, and the inner-code encoding scheme in Embodiment 1 may be used, to implement equivalent performance.

In another example, based on the convolution interleaver provided in Embodiment 1, another specific implementation corresponding to the block interleaving is as follows: G=2, K=4, and m=16. Input first data stream i, to input first data stream $i_3$ of block interleaver i respectively correspond to first data stream i, first data stream (i+16), first data stream (i+8), and first data stream (i+24). The structure of the block interleaver shown in FIG. 32(*b*) is used as an example, and parameters of the block interleaver may be $\Delta=6$, W=1, and Q=2. The second symbol matrix is mapped to two pieces of information data of inner code with a 120-bit information length bit, and the inner-code encoding scheme in Embodiment 1 may be used, to implement equivalent performance.

In still another example, based on the convolution interleaver provided in Embodiment 1, still another specific implementation corresponding to the block interleaving is as follows: G=2, K=8, and m=16. Input first data stream $i_0$ to input first data stream $i_7$ of block interleaver i respectively correspond to first data stream i, first data stream (i+16), first data stream (i+8), first data stream (i+24), first data stream (i+4), first data stream (i+20), first data stream (i+12), and first data stream (i+28). The structure of the block interleaver shown in FIG. 32(*b*) is used as an example, and parameters of the block interleaver may be $\Delta=6$, W=1, and Q=4. The second symbol matrix is mapped to four pieces of information data of inner code with a 120-bit information bit length, and the inner-code encoding scheme in Embodiment 1 may be used, to implement equivalent performance.

It should be understood that an embodiment of corresponding block interleaving may alternatively be deduced based on convolutional interleaving and an inner-code encoding scheme in another embodiment, and is not listed one by one herein.

The foregoing describes the data processing method provided in embodiments of this application. The following describes a data processing apparatus provided in an embodiment of this application.

Figure 33:
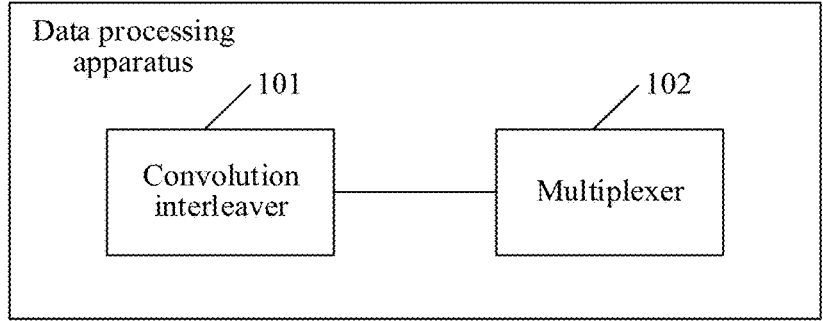
FIG. 33 is a schematic diagram of a structure of a data processing apparatus according to an embodiment of this application.

FIG. 33 is a schematic diagram of a structure of a data processing apparatus according to an embodiment of this application. As shown in FIG. 33, the data processing apparatus includes a convolution interleaver 101 and a multiplexer 102. The convolution interleaver 101 is configured to perform an operation that is in the foregoing data processing method and that is of separately performing convolutional interleaving on n lane data streams to obtain n first data streams. The multiplexer 102 is configured to perform an operation that is in the foregoing data processing method and that is of multiplexing every K first data streams in the n first data streams to obtain one second data stream, to obtain a total of m second data streams. For details, refer to related descriptions of the convolutional interleaving operation and the multiplexing operation in the foregoing data processing method. Details are not described herein again.

It should be understood that the apparatus provided in this application may alternatively be implemented in another manner. For example, the unit division in the foregoing apparatus is merely logical function division and may be other division in actual implementation. For example, a plurality of units or components may be combined or integrated into another system. In addition, functional units in embodiments of this application may be integrated into one processing unit, or may be independent physical units, or two or more functional units are integrated into one processing unit. The integrated unit may be implemented in a form of hardware, or may be implemented in a form of a software functional unit.

It should be noted that, in addition to the data processing method described in the foregoing embodiments, this application further provides another data processing method. The following describes the method in detail.

In this embodiment, n lane data streams are first interleaved to obtain m target data streams. Then, second FEC encoding is separately performed on the m target data streams to obtain encoded data streams. A manner of separately performing the second FEC encoding on the m target data streams is similar to the manner described in block 1003 in the embodiment shown in FIG. 10, and details are not described herein again.

In this embodiment, the lane data stream may be a PCS lane data stream or an FEC lane data stream. This is not specifically limited herein. All the n lane data streams are data streams obtained through first FEC encoding, namely, the foregoing outer-code encoded data streams, where n is an integer greater than 1 and is a multiple of 4. For example, RS code may be used in the outer-code encoding, and the n outer-code encoded data streams may include a plurality of RS codewords. In actual application, another encoding scheme may be used to perform the outer-code encoding. For ease of description, the following uses an RS codeword to represent a codeword generated through the outer-code encoding. It should be understood that every a codewords obtained through the outer-code encoding are distributed in b lane data streams, where a≤b≤n, n can be exactly divided by b, and a is an integer greater than or equal to 1. In different application scenarios shown in FIG. 5 to FIG. 9, values of a and b may also be different. The application scenario shown in FIG. 5 is used as an example, and n=32, a=2, and b=16, in other words, every two codewords are distributed in 16 lane data streams. Values of a and b in application scenarios in FIG. 6 to FIG. 9 may be deduced with reference to the accompanying drawings, and details are not described herein again. Therefore, a maximum value of b is 16 and a minimum value of b is 4. It should be noted that, in this application, a code length of outer code is measured in symbols, and the symbol may include one or more bits. For example, the outer code is KP4 RS(544,514) code that is used, the code length is N=544 symbols, and one symbol includes 10 bits.

It should be understood that, F consecutive symbols in each target data stream are from F different codewords, and F>a. F consecutive symbols in each of the target data streams are from at least K1 different lane data streams, F consecutive symbols in each of the target data streams are from at most K2 symbols in n aligned symbols of the n lane data streams, K1 and K2 are divisors of n, and K2 is a divisor of K1. The n aligned symbols of the n lane data streams refer to n symbols at same positions of all the lane data streams. Different application scenarios shown in FIG. 5 to FIG. 9 are used as an example, n symbols in each column of the n lane data streams are aligned, in other words, the n aligned symbols of the n lane data streams may be n symbols in one column of the n lane data streams. It should be further understood that, at most K3 symbols in the F consecutive symbols in each target data stream are from a same lane data stream, K3=⌈F/K1⌉, ⌈F/K1⌉ represents an integer obtained by rounding up a quotient of F/K1, any two of the K3 symbols are separated by at least K4 symbols on a same lane data stream, K4≥a*N*K2/n, and N is a length of the codeword. In this embodiment, a maximum value of b is 16, and a minimum value of b is 4. Therefore, in some embodiments, K1=n/4, and K2=n/16.

In some embodiments, before the n lane data streams are interleaved to obtain the m target data streams, lane reordering may be further performed on the n lane data streams, so that the n data streams are arranged in a preset sequence. The 32 data streams are used as an example. The 32 data streams may be sorted from 0 to 31 from top to bottom. Certainly, the example may be simply extended to sorting in another sequence, specific implementation thereof may be known to a person of ordinary skill in the art, and details are not described herein.

In some embodiments, before the n lane data streams are interleaved to obtain the m target data streams, lane data alignment may be further performed on the n lane data streams. The lane data alignment may be lane deskewing defined in an existing standard, so that data of n lane data streams output through the lane data alignment is completely aligned. Alternatively, the foregoing "lane data alignment" may be merely lane symbol alignment, so that data of n lane data streams output through the lane data alignment is aligned based on an outer-code symbol. Specifically, the data may be aligned based on one outer-code symbol, or may be aligned based on a plurality of outer-code symbols. For detailed descriptions of the lane data alignment, refer to related descriptions of FIG. 3(*e*). Details are not described herein.

It should be noted that the interleaving in this embodiment may have a plurality of specific implementations that are separately described below.

Figure 34:
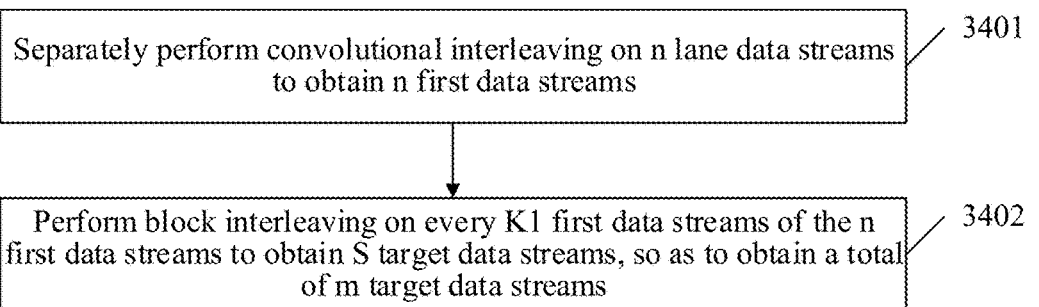
FIG. 34 is a schematic flowchart of interleaving according to an embodiment of this application.

FIG. 34 is a schematic flowchart of interleaving according to an embodiment of this application.

Block 3401: Separately perform convolutional interleaving on n lane data streams to obtain n first data streams.

In this embodiment, z consecutive symbols in each first data stream obtained through the convolutional interleaving are from at least e different codewords, z is an integer greater than 1, a≤e≤F, and e*k2≥F. At most k1/k2 symbols in the z consecutive symbols in each first data stream are from a same codeword.

It should be noted that an embodiment of the convolutional interleaving in this embodiment is similar to the convolutional interleaving manner described in the embodiment shown in FIG. 10, and details are not described herein again. In an embodiment, if the convolution interleaver shown in FIG. 12(*a*) is used, a parameter of the convolution interleaver is to satisfy that d(p*Q+1)≥K4, so that z=p*d consecutive symbols in the first data stream output by the convolution interleaver are from at least e different outer-code codewords, where N is a codeword length of outer-code encoding. In another embodiment, if the convolution interleaver shown in FIG. 12(*b*) is used, a parameter of the convolution interleaver is to satisfy that d(p*Q−1)≥K4, so that z=p*d consecutive symbols in the first data stream output by the convolution interleaver are from at least e different outer-code codewords, where N is a codeword length of outer-code encoding.

Block 3402: Perform block interleaving on every K1 first data streams of the n first data streams to obtain S target data streams, so as to obtain a total of m target data streams.

Figure 35:
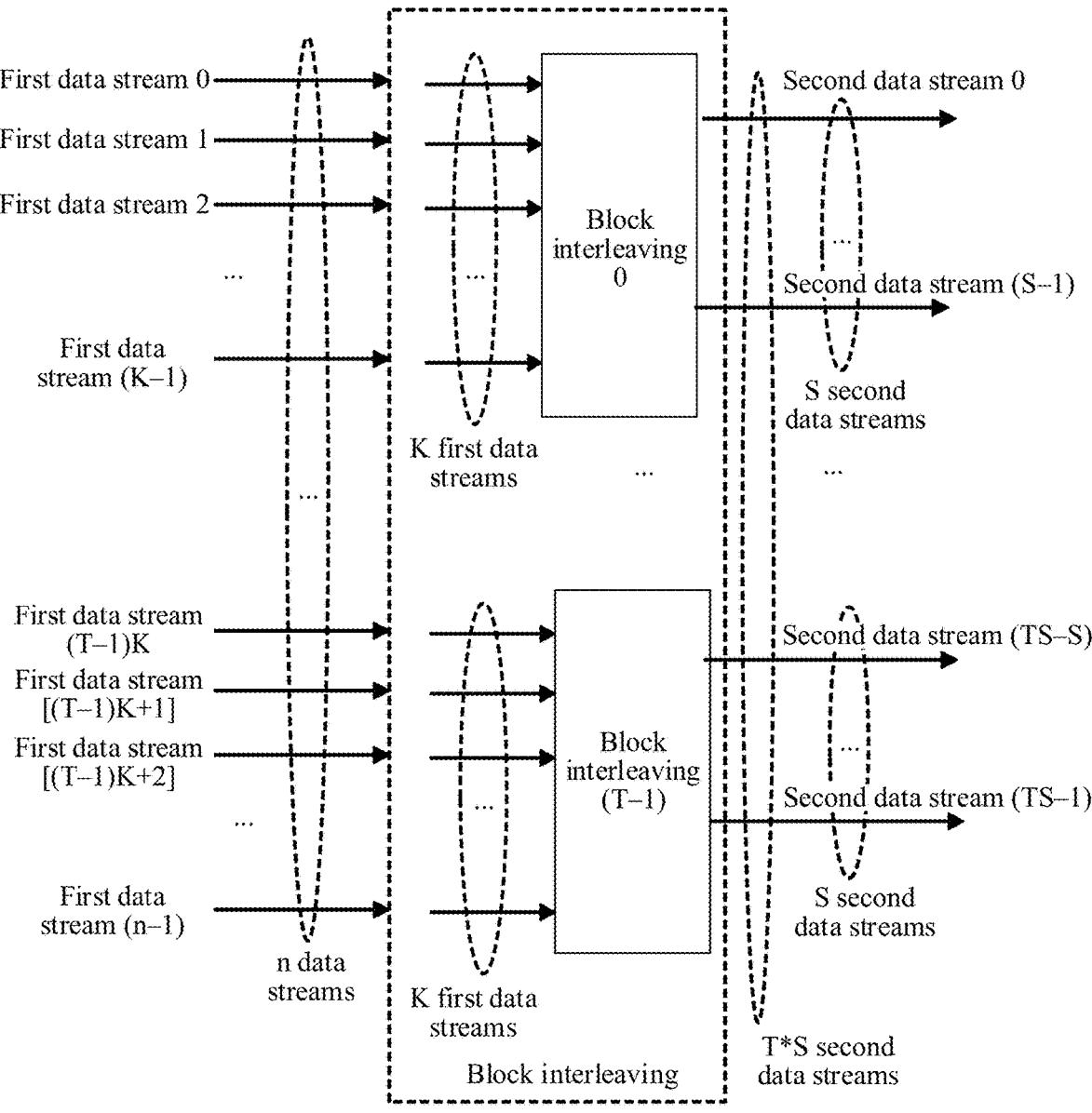
FIG. 35 is a schematic diagram of a structure in which block interleaving is performed on n first data streams according to an embodiment of this application.

FIG. 35 is a schematic diagram of a structure in which block interleaving is performed on n first data streams according to an embodiment of this application. As shown in FIG. 35, T block interleavers may be used to perform the block interleaving. Specifically, every K1 first data streams in the n first data streams are input into one block interleaver, and the block interleaver outputs S target data streams. The T block interleavers output a total of m target data streams, where m=S*T, T=n/K1, and S≥k1/k2. It should be noted that the n first data streams include K1 first data stream groups, one first data stream is selected from each first data stream group to form the K1 first data streams participating in the block interleaving, and symbols of any two first data streams in a same first data stream group are from a same codeword.

It should be understood that the first data stream group is merely a concept introduced for ease of description. In actual application, the n first data streams are an entirety without division, and each first data stream group may be considered as one or more data streams in the n first data streams.

The following describes a specific implementation of the block interleaving.

Figure 36:
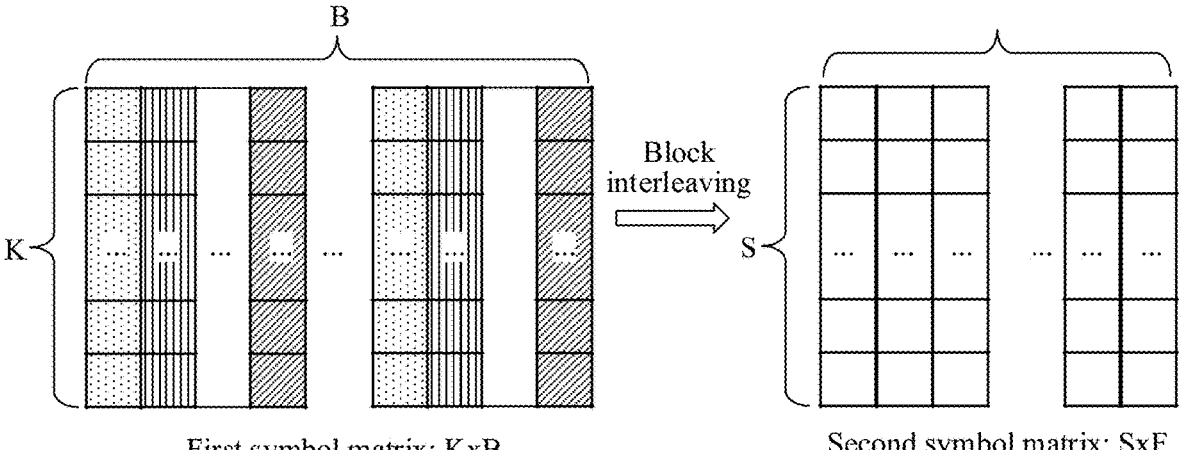
FIG. 36 is a schematic diagram of an embodiment of performing block interleaving according to an embodiment of this application.

FIG. 36 is a schematic diagram of an embodiment of performing block interleaving according to an embodiment of this application. As shown in FIG. 36, an embodiment of one block interleaver is used as an example for description. Each of K first data streams participating in the block interleaving includes B symbols. In other words, the K first data streams include a first symbol matrix, and the first symbol matrix includes K rows and B columns of symbols. B=R*p*d, R is an integer greater than or equal to 1, and B symbols in each row of the first symbol matrix are B consecutive symbols output from p delay lines, of a convolution interleaver, on which polling is performed for R times. Each of S target data streams obtained through the block interleaving includes F symbols, in other words, the S target data streams include a second symbol matrix, and the second symbol matrix includes S rows and F columns of symbols. K*B=S*F, and F is a length of inner-code information data. It should be understood that symbols in the first symbol matrix are from at least F different codewords, at most R*K1/K2 symbols in the first symbol matrix are from a same codeword, and F symbols from different codewords are selected from the first symbol matrix and mapped to one row of the second symbol matrix. That is, F consecutive symbols in each target data stream are from F different codewords.

In an embodiment, F symbols in each row of the second symbol matrix are from at least ⌈F/K2⌉ columns in the first symbol matrix, at most K2 symbols are selected in each of the ⌈F/K2⌉ columns, and ⌈F/K2⌉ represents an integer obtained by rounding up a quotient of F/K2. The F symbols in each row of the second symbol matrix include at least ⌊F/K1⌋ symbols in each row of the first symbol matrix, ⌊F/K1⌋ represents an integer obtained by rounding down a quotient of F/K1, the F symbols in each row of the second symbol matrix include at most ⌈F/K1⌉ symbols in each row of the first symbol matrix, and ⌈F/K1⌉ represents an integer obtained by rounding up a quotient of F/K1.

In another embodiment, symbols, from odd-numbered columns of the first symbol matrix, in each row of the second symbol matrix are located in different rows of the first symbol matrix, and symbols, from even-numbered columns of the first symbol matrix, in each row of the second symbol matrix are located in different rows of the first symbol matrix.

In still another embodiment, symbols that are output from delay lines with a same delay value and that are in each row of the second symbol matrix are from different rows of the first symbol matrix. At most K3 symbols in each row of the second symbol matrix are from a same row of the first symbol matrix, and any two of the K3 symbols are respectively output from two delay lines whose delay difference is greater than or equal to 2*Q*d.

It should be noted that, in actual application, the first symbol matrix and the second symbol matrix may alternatively not be presented in a form of matrices. For example, the first symbol matrix is presented as a first symbol set, and the first symbol set includes K*B symbol subsets that respectively correspond to K rows and B columns of symbols in the first symbol matrix. The second symbol matrix is presented as a second symbol set, and the second symbol set includes S*F symbol subsets that respectively correspond to symbols in S rows and F columns in the second symbol matrix.

In the present invention, for a concatenated FEC transmission solution, a data interleaving and encoding method including convolutional interleaving, block interleaving, and encoding is designed, so that a same interleaving solution can be used for all access services, and the overall concatenated FEC solution has good performance and a low latency. Therefore, the concatenated FEC transmission solution can be applied to a plurality of transmission scenarios, and is particularly applicable to a transmission scenario that requires a low transmission latency, for example, a low-latency data center interconnection scenario.

The following further describes, with reference to some specific embodiments, a procedure of the interleaving processing method described in FIG. 34. It should be understood that an inner-code parallelism degree in each of the following embodiments is a quantity of target data streams. For example, inner-code parallelism degree 16 indicates that a quantity of target data streams is 16. It should be further understood that a target symbol subset in the following embodiments represents F consecutive symbols in the target data stream.

Embodiment 1: Uniform interleaving is used for all services, an information bit length of inner-code encoding is 120 bits, and an inner-code parallelism degree is 16.

This embodiment provides a specific data interleaving and encoding scheme that is service-insensitive and that is in an OIF LR scenario. A transmitter processing module performs alignment marker lock on lane data streams based on known alignment markers of PCS lanes or FEC lanes of each service based on a type of the access service. Known alignment markers of 32 lanes are different and are related to the access service. The transmitter processing module then performs deskewing on a plurality of PCS lanes or FEC lanes in each service. After the deskewing, the plurality of PCS/FEC lanes in a same service are all AM aligned, and lane data streams between services only need to meet RS symbol alignment, that is, a difference between AMs is an integer number of RS symbols.

Figure 37:
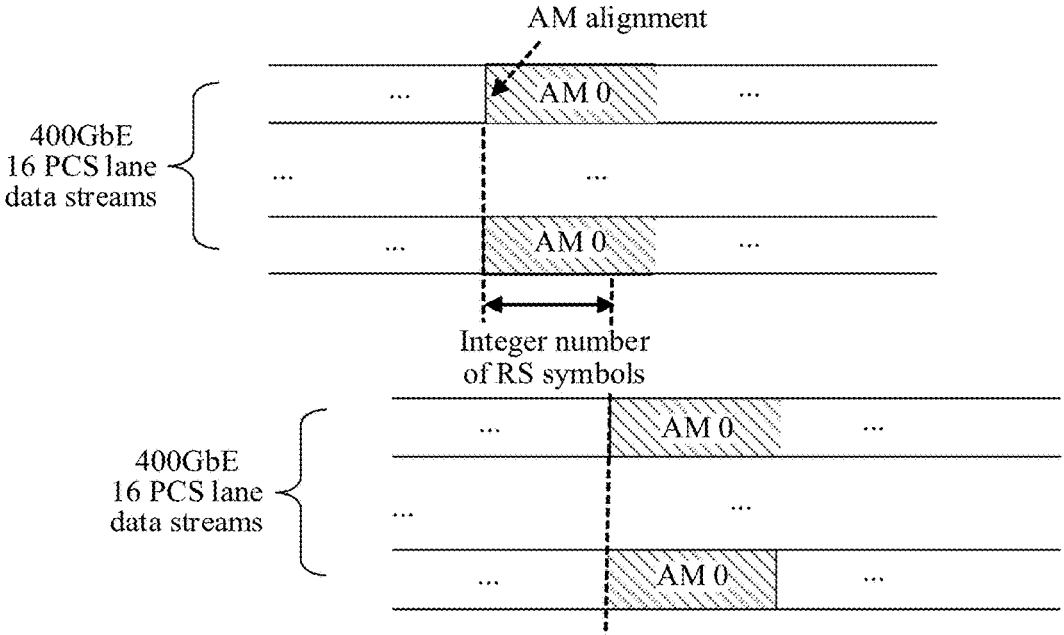
FIG. 37 is a schematic diagram of a lane-aligned data stream format in a case of 2×400 GbE host interfaces.

FIG. 37 is a schematic diagram of a lane-aligned data stream format in a case of 2×400 GbE host interfaces. For example, when an access service is a 2*400 GbE service, 32 de-skewed lane data streams are shown in FIG. 37. AM alignment is performed between 16 PCS lanes in each 400 GbE service, and a difference between AMs of two services is an integer number of RS symbols. Then, lane reordering is performed on data of the n=32 lanes based on the alignment markers, so that the data of the n=32 lanes can be arranged in a specified sequence. For example, when the access service is a 1*800 GbE service, 32 lane data streams are shown in FIG. 5. When the access service is a 2*400 GbE service, 32 lane data streams are shown in FIG. 6. When the access service is a 4*200 GbE service, 32 lane data streams are shown in FIG. 7. When the access service is an 8*100 GbE service and is in a "100G RS-FEC-Int" mode, 32 lane data streams are shown in FIG. 8. When the access service is an 8*100 GbE service and is in a "100G RS-FEC" mode, 32 lane data streams are shown in FIG. 9.

n=32 lane data streams on which the lane reordering is performed are sent to a convolutional interleaving module and a block interleaving module for corresponding processing, and then are sent to an inner-code encoder for inner-code encoding. After data processing is performed on inner-code encoded data streams, data processed data streams are sent to a channel transmission medium for transmission. The data processing may include modulation and mapping, channel interleaving, polarization distribution (Polarization distribution), DSP framing, and the like.

In this embodiment, convolutional interleaving is separately performed on the n=32 PCS lane data streams to obtain n=32 first data streams. Convolutional interleaving 0, convolutional interleaving 1, convolutional interleaving 2, . . . , convolutional interleaving 31 use a same interleaving structure. FIG. 16(*a*) shows a structure of a convolution interleaver that includes p=3 delay lines. The p=3 delay lines respectively include 2Q storage units, Q storage units, and 0 storage units, and each storage unit is configured to store d=2 symbols. In other words, a delay value of delay line 0 is 4Q symbols, a delay value of delay line 1 is 2Q symbols, and a delay value of delay line 2 is 0 symbols, that is, no delay.

As shown in FIG. 16(*a*), $C_r($ ) represents one RS symbol in lane data stream r (where $0 \le r \le n-1$). For example, $C_r(6t)$ and $C_r(6t+1)$ represent two RS symbols that are currently input into delay line 0 and that are in the lane data stream, and $C_r(6t-12Q)$ and $C_r(6t-12Q+1)$ are two RS symbols output from delay line 0; $C_r(6t+2)$ and $C_r(6t+3)$ represent two RS symbols that are subsequently input into delay line 1 and that are in the lane data stream, and $C_r(6t-6Q+2)$ and $C_r(6t-6Q+3)$ are two RS symbols output from delay line 1; $C_r(6t+4)$ and $C_r(6t+5)$ represent two RS symbols that are subsequently input into delay line 2 and that are in the lane data stream, and $C_r(6t+4)$ and $C_r(6t+5)$ are two RS symbols output from delay line 2; $C_r(6t+6)$ and $C_r(6t+7)$ represent two RS symbols that are then subsequently input into delay line 0 and that are in the lane data stream, and $C_r(6t-12Q+6)$ and $C_r(6t-12Q+7)$ are two RS symbols output from delay line 0; and so on. When the access service is a 1*800 GbE service or a 2*400 GbE service, that $$d(pQ + 1) \ge a * \frac{N}{b}$$

is satisfied, in other words, $6Q+2 \ge 2*544/16$, that is $Q \ge 11$, a total of six RS symbols, $C_r(6t-12Q)$, $C_r(6t-12Q+1)$, $C_r(6t-6Q+2)$, $C_r(6t-6Q+3)$, $C_r(6t+4)$, and $C_r(6t+5)$, output through the convolutional interleaving are from six different RS codewords. Then, data of two first data stream subsets is aggregated by using block interleaving, so that 12 consecutive RS symbols in the target data stream can be from 12 different RS codewords. Similarly, for another access service, when $Q \ge 11$, with reference to subsequent block interleaving, 12 consecutive RS symbols of the target data stream can be from 12 different RS codewords.

In an embodiment, that Q=11 is selected, and a specific structure of the convolution interleaver is shown in FIG. 16(*b*). An interleaving latency corresponding to the convolution interleaver is approximately 22*2*3/2=66 RS symbols.

The convolution interleaver shown in FIG. 16(*b*) separately performs convolutional interleaving on 32 PCS lane data streams to obtain 32 first data streams. Refer to the PCS/FEC lane data streams shown in FIG. 5 to FIG. 9. It is not difficult to understand that the first data stream at most includes $G_{max}=8$ first data stream subsets, and at least includes $G_{min}=2$ first data stream subsets. To use a same interleaving solution for all services and reduce a convolutional interleaving delay, the first data streams are divided into $K1=G_{max}=8$ first data stream groups, any two data streams in each first data stream group are from a same RS codeword, and corresponding groups are specifically divided as follows: First data streams 0 to 3 are first data stream group 0, first data streams 4 to 7 are first data stream group 1, first data streams 8 to 11 are first data stream group 2, first data streams 12 to 15 are first data stream group 3, first data streams 16 to 19 are first data stream group 4, first data streams 20 to 23 are first data stream group 5, first data streams 24 to 27 are first data stream group 6, and the first data streams 28 to 31 are first data stream group 7. Therefore, in this embodiment, the block interleaving shown in FIG. 35 is used, and corresponding parameters are K=K1=8 and T=32/K1=4, and eight first data streams (any first data stream selected from each first data stream group) are used as eight input data streams of block interleaving i (where $0 \le i < 4$).

Figure 38:
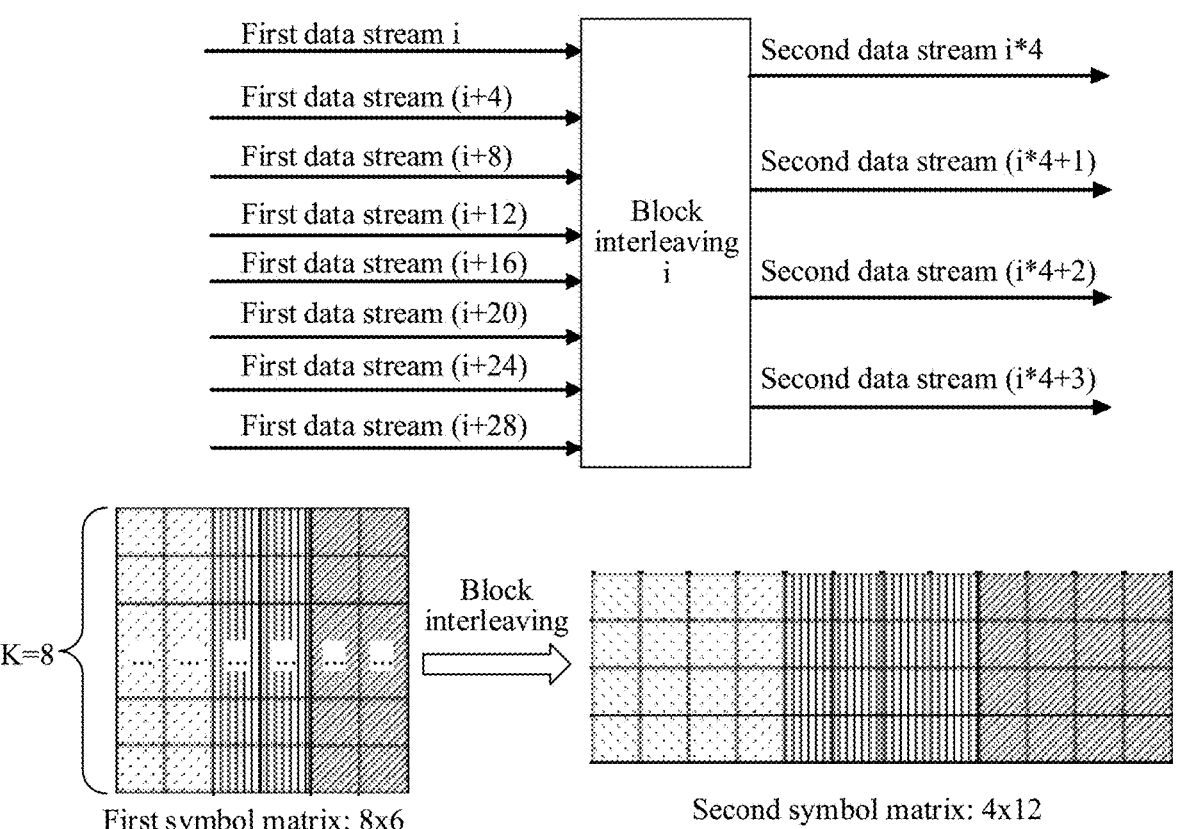
FIG. 38 is a schematic diagram of an embodiment of block interleaving.

FIG. 38 is a schematic diagram of an embodiment of block interleaving. As shown in FIG. 38, eight input data streams of block interleaving i (where $0 \le i < 4$) are respectively first data stream i, first data stream (i+4), first data stream (i+8), first data stream (i+12), first data stream (i+16), first data stream (i+20), first data stream (i+24), and first data stream (i+28). Consecutive B=6 RS symbols are obtained from each input data stream, to form a first symbol matrix with eight rows and six columns, where six RS symbols in each row are respectively six RS symbols output from delay line 0, delay line 1, and delay line 2, of the convolution interleaver shown in FIG. 16(*b*), on which polling is performed for R=1 time. Refer to FIG. 5 to FIG. 9. It is not difficult to learn that the first symbol matrix is from at least 12 different RS codewords, and at most four RS symbols belong to a same RS codeword. Further, in the first symbol matrix, a $0^{th}$ row to a $3^{rd}$ row are from at least six different RS codewords, a $4^{th}$ row to a $7^{th}$ row are from at least six different RS codewords, and the two are not from same RS codewords. Further, RS codeword distribution in all odd-numbered columns or all even-numbered columns in the first symbol matrix may be consistent. Further, in the first symbol matrix, distribution of RS codewords in a $0^{th}$ column to a $3^{rd}$ column may be consistent, and distribution of RS codewords in a $2^{nd}$ column to a $5^{th}$ column may be consistent. Therefore, two RS symbols may be selected from each column of the first symbol matrix, where one RS symbol is from any row from the $0^{th}$ row to the $3^{rd}$ row, and the other RS symbol is from any row from the $4^{th}$ row to the $7^{th}$ row. A total of 12 RS symbols are mapped to one row of the second symbol matrix, to obtain a second symbol matrix with four rows and 12 columns. The 12 RS symbols in a $t^{th}$ (where $0 \le t < 4$) row of the second symbol matrix are 12 consecutive RS symbols in target data stream (i*4+t) output through block interleaving i. Therefore, one row of the second symbol matrix is defined as a target symbol subset. For ease of description, $S(i_x, j_y)$, where $i_x \in [0,7]$, $j_y \in [0,5]$, is defined as a symbol representing the $i_x^{th}$ row and the $j_y^{th}$ column of the first symbol matrix. To enable the 12 RS symbols in the target symbol subset to be from 12 different RS codewords, the six RS symbols selected from the $0^{th}$ row to the $3^{rd}$ row of the first symbol matrix or the six RS symbols selected from the $4^{th}$ row to the $7^{th}$ row of to the first symbol matrix correspond $S(i_0, 0)$, $S(i_1, 1)$, $S(i_2, 2)$, $S(i_3, 3)$, $S(i_4, 4)$, and $S(i_5, 5)$ in the first symbol matrix, where $i_0$, $i_1$, $i_2$, and $i_3$ are not equal, $i_2$, $i_3$, $i_4$, and $i_5$ are not equal, $i_0$, $i_2$, and $i_4$ are not equal, $i_1$, $i_3$, and is are not equal, and $i_0$, $i_1$, $i_2$, $i_3$, $i_4$, and $i_5 \in [0,3]$ or $i_0$, $i_1$, $i_2$, $i_3$, $i_4$, and $i_5 \in [4,7]$, which is equivalent to a case in which every two symbols in the target symbol subset are from a same column in the first symbol matrix, one symbol is located in any row from the $0^{th}$ row to the $3^{rd}$ row of the first symbol matrix, and the other symbol is located in any row from the $4^{th}$ row to the $7^{th}$ row of the first symbol matrix. Further, six symbols from odd-numbered columns of the first symbol matrix in the target symbol subset are located in different rows of the first symbol matrix, and six symbols from even-numbered columns of the first symbol matrix are located in different rows of the first symbol matrix. Further, in the target symbol subset, at least one symbol is from a same row of the first symbol matrix, at most two symbols are from a same row of the first symbol matrix, two symbols from the same row are output from two different delay lines that are for convolutional interleaving, and a delay difference corresponding to the two delay lines is greater than or equal to $2*d*Q=44$ symbols. According to this rule, there are many specific mappings from the first symbol matrix to the second symbol matrix. Table 1 to Table 4 provide several specific mapping relationships. A number x in a $y^{th}$ row and a $z^{th}$ column in each table indicates that an RS symbol in a $y^{th}$ row and a $z^{th}$ column of the second symbol matrix is from an $x^{th}$ RS symbol in the first symbol matrix, where $0 \leq y < 4$, $0 \leq z < 12$, and $0 \leq x < 48$, the $x^{th}$ RS symbol in the first symbol matrix indicates a symbol in an $(x \% 8)^{th}$ row and an $(\lfloor x/8 \rfloor)^{th}$ column of the first symbol matrix. It should be noted that, when switching between any rows, switching between any columns, switching between any columns after switching between any rows, or switching between any columns before switching between any rows in Table 1 to Table 4 is performed, the foregoing mapping is still a valid mapping. It should be understood that x % 8 represents a remainder obtained when x is divided by 8, and $\lfloor x/8 \rfloor$ represents a quotient obtained when x is divided by 8. Similar representation manners are not described again in the following embodiments.

Based on a relationship between the first symbol matrix and the first data stream, and a relationship between the first data stream and a lane data stream, it is not difficult to learn that 12 symbols of each target symbol subset are from $K1=8$ lane data streams, and the eight lane data streams may be represented as lane data stream $j_0$, lane data stream $j_1$, lane data stream $j_2$, lane data stream $j_3$, lane data stream $j_4$, lane data stream $j_5$, lane data stream $j_6$, and lane data stream $j_7$, $\lfloor j_x/4 \rfloor = x$, where $x \in [0,7]$, and $\lfloor j_x/4 \rfloor$ represents rounding down to the nearest integer of $j_x/4$. Further, one symbol is obtained from each of four lane data streams, and two RS symbols are obtained from each of the remaining four lane data streams. Further, if two RS symbols are obtained from a lane data stream, spacing between the two RS symbols in the corresponding lane data stream is greater than or equal to $a*N*K2/n$, in other words, greater than or equal to $2*544*2/32=68$ RS symbols. Further, at most two RS symbols are from two aligned symbols in two different lane data streams.

TABLE 1

| 0 | 4 | 9 | 13 | 18 | 22 | 27 | 31 | 33 | 37 | 40 | 44 |
| 1 | 5 | 8 | 12 | 19 | 23 | 26 | 30 | 32 | 36 | 41 | 45 |

TABLE 1-continued

| 2 | 6 | 11 | 15 | 16 | 20 | 25 | 29 | 35 | 39 | 42 | 46 |
| 3 | 7 | 10 | 14 | 17 | 21 | 24 | 28 | 34 | 38 | 43 | 47 |

TABLE 2

| 0 | 4 | 9 | 13 | 19 | 23 | 26 | 30 | 33 | 37 | 40 | 44 |
| 1 | 5 | 8 | 12 | 18 | 22 | 27 | 31 | 32 | 36 | 41 | 45 |
| 2 | 6 | 11 | 15 | 17 | 21 | 24 | 28 | 35 | 39 | 42 | 46 |
| 3 | 7 | 10 | 14 | 16 | 20 | 25 | 29 | 34 | 38 | 43 | 47 |

TABLE 3

| 0 | 4 | 9 | 13 | 19 | 23 | 26 | 30 | 33 | 37 | 40 | 44 |
| 1 | 5 | 8 | 12 | 18 | 22 | 27 | 31 | 32 | 36 | 41 | 45 |
| 2 | 6 | 11 | 15 | 17 | 21 | 24 | 28 | 35 | 39 | 42 | 46 |
| 3 | 7 | 10 | 14 | 16 | 20 | 25 | 29 | 34 | 38 | 43 | 47 |

TABLE 4

| 0 | 4 | 9 | 13 | 19 | 23 | 26 | 30 | 33 | 37 | 40 | 44 |
| 1 | 5 | 8 | 12 | 18 | 22 | 27 | 31 | 32 | 36 | 41 | 45 |
| 2 | 6 | 11 | 15 | 16 | 20 | 25 | 29 | 35 | 39 | 42 | 46 |
| 3 | 7 | 10 | 14 | 17 | 21 | 24 | 28 | 34 | 38 | 43 | 47 |

16 target data streams are generated through block interleaving, and inner-code encoding is performed on each target symbol subset in the 16 target data streams, where an information bit length of the inner-code encoding is 120 bits. Specifically, an inner-code encoder separately encodes and adds redundancy to a total of 120 bits of each target symbol subset in the target data stream, to obtain 16 encoded data streams. In an embodiment, inner-code encoding is performed by using Hamming(128,120), and 8-bit redundancy is added to a total of 120 bits in 12 consecutive RS symbols in each target data stream, to obtain a 128-bit codeword. In another embodiment, inner-code encoding is performed by using BCH(136,120), and 16-bit redundancy is added to a total of 120 bits in 12 consecutive RS symbols in each target data stream, to obtain a 136-bit codeword.

After data processing is performed on inner-code encoded data streams, data processed data streams are sent to a channel transmission medium for transmission. The data processing may include modulation and mapping, channel interleaving, polarization distribution, DSP framing, and the like. For example, the inner-code encoded data streams may be interleaved, so as to improve a capability of a system to resist a burst error.

By using the data interleaving and encoding scheme in this embodiment, concatenated code of KP4 RS(544,514)+ Hamming(128,120) in the scheme is under AWGN, a corresponding pre-FEC BER for implementing a post-FEC bit error rate BER of 1E-15 is approximately 4.5E-3, and performance approximates to optimal performance of a concatenated FEC scheme.

Embodiment 2: Uniform interleaving is used for all services, an information bit length of inner-code encoding is 120 bits, and an inner-code parallelism degree is 32.

The convolution interleaver shown in FIG. 16(b) separately performs convolutional interleaving on 32 PCS lane data streams to obtain 32 first data streams. Refer to the PCS/FEC lane data streams shown in FIG. 5 to FIG. 9. It is not difficult to understand that the first data stream at most includes $G_{max}=8$ first data stream subsets, and at least includes $G_{min}=2$ first data stream subsets. To use a same interleaving solution for all services and reduce a convolutional interleaving delay, the first data streams are divided into $K1=G_{max}=8$ first data stream groups, any two data streams in each first data stream group are from a same RS codeword, and corresponding groups are specifically divided as follows: First data streams 0 to 3 are first data stream group 0, first data streams 4 to 7 are first data stream group 1, first data streams 8 to 11 are first data stream group 2, first data streams 12 to 15 are first data stream group 3, first data streams 16 to 19 are first data stream group 4, first data streams 20 to 23 are first data stream group 5, first data streams 24 to 27 are first data stream group 6, and the first data streams 28 to 31 are first data stream group 7. Therefore, in this embodiment, the block interleaving shown in FIG. 35 is used, and corresponding parameters are $K=K1=8$ and $T=32/K1=4$, and eight first data streams (any first data stream selected from each first data stream group) are used as eight input data streams of block interleaving i (where $0 \leq i < 4$).

Figure 39:
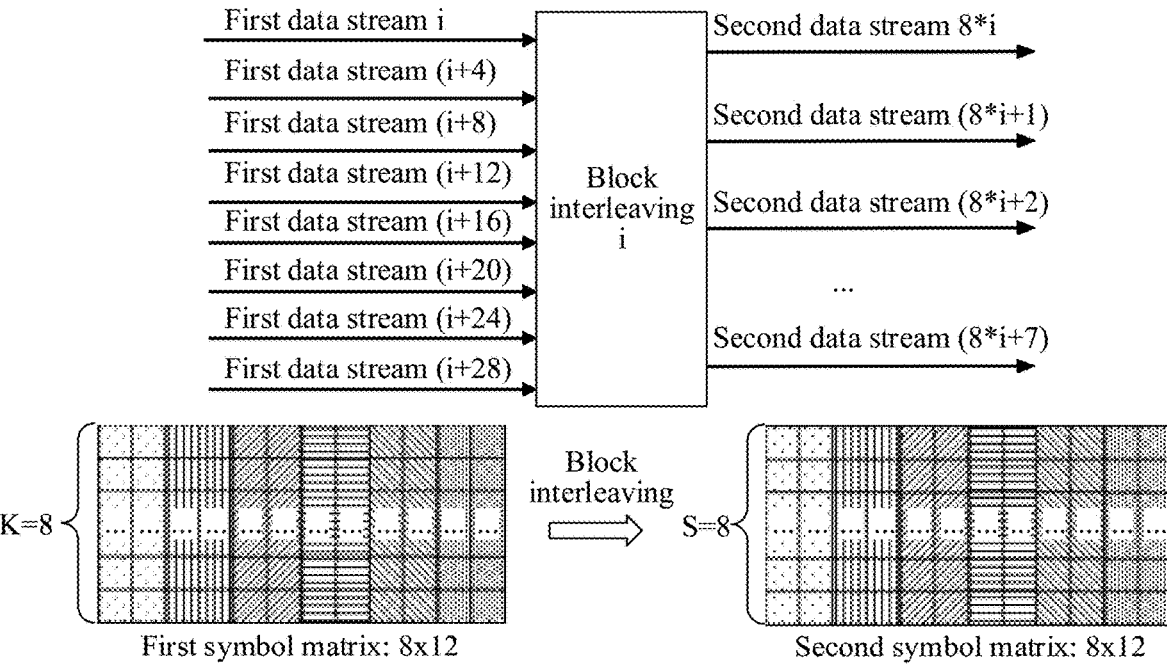
FIG. 39 is a schematic diagram of another embodiment of block interleaving.

FIG. 39 is a schematic diagram of another embodiment of block interleaving. As shown in FIG. 39, eight input data streams of block interleaving i (where $0 \leq i < 4$) are respectively first data stream i, first data stream (i+4), first data stream (i+8), first data stream (i+12), first data stream (i+16), first data stream (i+20), first data stream (i+24), and first data stream (i+28). 12 consecutive RS symbols are obtained from each input data stream, to form a first symbol matrix with eight rows and 12 columns, where 12 RS symbols in each row are respectively 12 RS symbols consecutively output from delay line 0, delay line 1, and delay line 2, of the convolution interleaver shown in FIG. 16($b$), on which polling is performed for $R=2$ times. With reference to FIG. 5 to FIG. 9, it is not difficult to learn that the first symbol matrix is from at least 12 different RS codewords, and at most $R*K1/K2=8$ RS symbols belong to a same RS codeword. Further, in the first symbol matrix, a $0^{th}$ row to a $3^{rd}$ row are from at least six different RS codewords, a $4^{th}$ row to a $7^{th}$ row are from at least six different RS codewords, and the two are not from same RS codewords. Further, RS codeword distribution in all odd-numbered columns or all even-numbered columns in the first symbol matrix may be consistent. Further, in the first symbol matrix, RS codeword distribution in all of a $0^{th}$ column to a $3^{rd}$ column may be consistent, RS codeword distribution in all of a $2^{nd}$ column to a $5^{th}$ column may be consistent, RS codeword distribution in all of a $6^{th}$ column to a $9^{th}$ column may be consistent, and RS codeword distribution in all of an $8^{th}$ column to an $11^{th}$ column may be consistent. Further, RS codeword distribution in a $j^{th}$ column, a $(j+1)^{th}$ column, a $(j+6)^{th}$ column, and a $(j+7)^{th}$ column (where $j \in \{0, 2, 4\}$) of the first symbol matrix may be consistent. Therefore, a total of 12 RS symbols (one symbol from each column of the first symbol matrix) may be selected and mapped to one row of the second symbol matrix, to obtain the second symbol matrix with eight rows and 12 columns. 12 RS symbols in a $t^{th}$ (where $0 \leq t < 8$) row of the second symbol matrix are 12 consecutive RS symbols in target data stream (i*8+t) output through block interleaving i. Therefore, one row of the second symbol matrix is defined as a target symbol subset. For ease of description, $S(i_x, j_y)$, where $i_x \in [0,7]$, $j_y \in [0,11]$, is defined as a symbol representing the $i_x^{th}$ row and the $j_y^{th}$ column of the first symbol matrix. To enable the 12 RS symbols in the target symbol subset to be from 12 different RS codewords, the 12 RS symbols correspond to $S(i_0, 0)$, $S(i_1, 1)$, $S(i_2, 2)$, . . . , $S(i_{10}, 10)$, and $S(i_{11}, 11)$ in the first symbol matrix. $i_0$, $i_1$, $i_2$, and $i_3$ are unequal to each other, $i_2$, $i_3$, $i_4$, and $i_5$ are unequal to each other, $i_6$, $i_7$, $i_8$, and $i_9$ are unequal to each other, $i_8$, $i_9$, $i_{10}$, and $i_{11}$ are unequal to each other, $i_0$, $i_1$, $i_6$, and $i_7$ are unequal to each other, $i_2$, $i_3$, $i_8$, and $i_9$ are unequal to each other, $i_4$, $i_5$, $i_{11}$, and $i_{12}$ are unequal to each other, $i_0$, $i_2$, $i_4$, $i_6$, $i_8$, and $i_{10}$ are unequal to each other, $i_1$, $i_3$, $i_5$, $i_7$, $i_9$, $i_{11}$ are unequal to each other, and $i_0$, $i_1$, $i_2$, $i_3$, $i_4$, $i_5$, $i_6$, $i_7$, $i_8$, $i_9$, $i_{10}$, and $i_{11} \in [0,7]$. This is equivalent to a case in which each symbol in the target symbol subset is from a same column in the first symbol matrix. Further, six symbols, from odd-numbered columns of the first symbol matrix, in the target symbol subset are located in different rows of the first symbol matrix, and six symbols, from even-numbered columns of the first symbol matrix, in the target symbol subset are located in different rows of the first symbol matrix. Further, symbols that are output from a delay line with a same delay value, that are from the first symbol matrix, and that are in the target symbol subset are located in different rows of the first symbol matrix. Further, in the target symbol subset, at least one symbol is from a same row of the first symbol matrix, at most two symbols are from a same row of the first symbol matrix, the two symbols from the same row are output from two different delay lines for convolutional interleaving, and a delay difference corresponding to the two delay lines is greater than or equal to $2*d*Q=44$ symbols. According to this rule, there are many specific mappings from the first symbol matrix to the second symbol matrix. Table 5 to Table 8 below provide several specific mapping relationships. Number x in a $y^{th}$ row and a $z^{th}$ column in each table indicates that an RS symbol in a $y^{th}$ row and a $z^{th}$ column of the second symbol matrix is from an $x^{th}$ RS symbol in the first symbol matrix, where $0 \leq y < 8$, $0 \leq z < 12$, and $0 \leq x < 96$, the $x^{th}$ RS symbol in the first symbol matrix indicates a symbol in an $(x \% 8)^{th}$ row and an $(\lfloor x/8 \rfloor)^{th}$ column of the first symbol matrix. It should be noted that, when switching between any rows, switching between any columns, switching between any columns after switching between any rows, or switching between any columns before switching between any rows is performed, the foregoing mapping is still a valid mapping.

According to an RS codeword distribution rule in the first symbol matrix, another mapping manner from the first symbol matrix to the target symbol subset is: A total of six columns (any column from a $(2*j)^{th}$ column and a $(2*j+1)^{th}$ column (where $j \in [0,5]$) of the first symbol matrix) are selected, and then a total of 12 RS symbols (two RS symbols from each of the selected six columns) are selected and mapped to the target symbol subset. The correspondingly selected 12 RSS correspond to $S(i_0, j_0)$, $S(i_1, j_0)$, $S(i_2, j_1)$, $S(i_3, j_1)$, $S(i_4, j_2)$, $S(i_5, j_2)$ $S(i_6, j_3)$, $S(i_7, j_3)$, $S(i_8, j_4)$, $S(i_9, j_4)$, $S(i_{10}, j_5)$, and $S(i_{11}, j_5)$ that are in the first symbol matrix. $i_0$, $i_1$, $i_2$, and $i_3$ are unequal to each other, $i_2$, $i_3$, $i_4$, and $i_8$ are unequal to each other, $i_6$, $i_7$, $i_8$, and $i_9$ are unequal to each other, $i_8$, $i_9$, $i_{10}$, and $i_{11}$ are unequal to each other, $i_0$, $i_1$, $i_6$, and $i_7$ are unequal to each other, $i_2$, $i_3$, $i_8$, and $i_9$ are unequal to each other, and $i_4$, $i_5$, $i_{10}$, and $i_{11}$ are unequal to each other. $i_0$, $i_1$, $i_2$, $i_3$, $i_4$, $i_5$, $i_6$, $i_7$, $i_8$, $i_9$, $i_{10}$, $i_{11}$, $i_{12}$, $i_{13}$, $i_{14}$, and $i_{15} \in [0,7]$. $j_0 \in [0,1]$, $j_1 \in [2,3]$, $j_2 \in [4,5]$, $j_3 \in [6,7]$, $j_4 \in [8,9]$, $j_5 \in [10,11]$, $j_6 \in [12,13]$, and $j_7 \in [14,15]$. This is equivalent to a case in which every two symbols in the target symbol subset are from a same column in the first symbol matrix, one symbol is located in any row from a $0^{th}$ row to a $3^{rd}$ row of the first symbol matrix, and the other symbol is located in any row from a $4^{th}$ row to a $7^{th}$ row of the first symbol matrix. Further, six symbols, from odd-numbered columns of the first symbol matrix, in the target symbol subset are located in different rows of the first symbol matrix, and six symbols, from even-numbered columns of the first symbol matrix, in the target symbol subset are located in different rows of the first symbol matrix. Further, symbols that are output from a delay line with a same delay value, that are from the first symbol matrix, and that are in the target symbol subset are located in different rows of the first symbol matrix. Further, in the target symbol subset, at most two symbols are from a same row of the first symbol matrix, the two symbols from the same row are output from two different delay lines for convolutional interleaving, and a delay difference corresponding to the two delay lines is greater than or equal to 2*d*Q=44 symbols. According to this rule, there are many specific mappings from the first symbol matrix to the second symbol matrix. Table 9 to Table 12 provide several specific mapping relationships. Number x in a $y^{th}$ row and a $z^{th}$ column in each table indicates that an RS symbol in a $y^{th}$ row and a $z^{th}$ column of the second symbol matrix is from an $x^{th}$ RS symbol in the first symbol matrix, where $0 \le y < 8$, $0 \le z < 12$, and $0 \le x < 96$, the $x^{th}$ RS symbol in the first symbol matrix indicates a symbol in an $(x \% 8)^{th}$ row and an $(\lfloor x/8 \rfloor)^{th}$ column of the first symbol matrix. It should be noted that, when switching between any rows, switching between any columns, switching between any columns after switching between any rows, or switching between any columns before switching between any rows is performed, the foregoing mapping is still a valid mapping.

Based on a relationship between the first symbol matrix and the first data stream, and a relationship between the first data stream and a lane data stream, it is not difficult to learn that 12 symbols of each target symbol subset are from K1=8 lane data streams, and the eight lane data streams may be represented as lane data stream $j_0$, lane data stream $j_1$, lane data stream $j_2$, lane data stream $j_3$, lane data stream $j_4$, lane data stream $j_5$, lane data stream $j_6$, and lane data stream $j_7$, $\lfloor j_x/4 \rfloor = x$, where $x \in [0,7]$, and $\lfloor j_x/4 \rfloor$ represents rounding down to the nearest integer of $j_x/4$. Further, one symbol is obtained from each of four lane data streams, and two RS symbols are obtained from each of the remaining four lane data streams. Further, if two RS symbols are obtained from a lane data stream, spacing between the two RS symbols in the corresponding lane data stream is greater than or equal to a*N*K2/n, in other words, greater than or equal to 2*544*2/32=68 RS symbols. Further, at most two RS symbols are from two aligned RS symbols in two different lane data streams.

TABLE 5

| | | | | | | | | | | | |
|---|---|---|---|---|---|---|---|---|---|---|---|
| 0 | 9 | 18 | 27 | 33 | 40 | 52 | 61 | 70 | 79 | 85 | 92 |
| 1 | 8 | 19 | 26 | 32 | 41 | 53 | 60 | 71 | 78 | 84 | 93 |
| 2 | 11 | 16 | 25 | 35 | 42 | 54 | 63 | 68 | 77 | 87 | 94 |
| 3 | 10 | 17 | 24 | 34 | 43 | 55 | 62 | 69 | 76 | 86 | 95 |
| 4 | 13 | 22 | 31 | 37 | 44 | 48 | 57 | 66 | 75 | 81 | 88 |
| 5 | 12 | 23 | 30 | 36 | 45 | 49 | 56 | 67 | 74 | 80 | 89 |
| 6 | 15 | 20 | 29 | 39 | 46 | 50 | 59 | 64 | 73 | 83 | 90 |
| 7 | 14 | 21 | 28 | 38 | 47 | 51 | 58 | 65 | 72 | 82 | 91 |

TABLE 6

| | | | | | | | | | | | |
|---|---|---|---|---|---|---|---|---|---|---|---|
| 0 | 9 | 18 | 27 | 33 | 40 | 52 | 61 | 70 | 79 | 85 | 92 |
| 1 | 8 | 19 | 26 | 32 | 41 | 53 | 60 | 71 | 78 | 84 | 93 |
| 2 | 11 | 17 | 24 | 35 | 42 | 54 | 63 | 69 | 76 | 87 | 94 |
| 3 | 10 | 16 | 25 | 34 | 43 | 55 | 62 | 68 | 77 | 86 | 95 |
| 4 | 13 | 22 | 31 | 37 | 44 | 48 | 57 | 66 | 75 | 81 | 88 |
| 5 | 12 | 23 | 30 | 36 | 45 | 49 | 56 | 67 | 74 | 80 | 89 |
| 6 | 15 | 21 | 28 | 39 | 46 | 50 | 59 | 65 | 72 | 83 | 90 |
| 7 | 14 | 20 | 29 | 38 | 47 | 51 | 58 | 64 | 73 | 82 | 91 |

TABLE 7

| | | | | | | | | | | | |
|---|---|---|---|---|---|---|---|---|---|---|---|
| 0 | 9 | 19 | 26 | 33 | 40 | 52 | 61 | 71 | 78 | 85 | 92 |
| 1 | 8 | 18 | 27 | 32 | 41 | 53 | 60 | 70 | 79 | 84 | 93 |
| 2 | 11 | 17 | 24 | 35 | 42 | 54 | 63 | 69 | 76 | 87 | 94 |
| 3 | 10 | 16 | 25 | 34 | 43 | 55 | 62 | 68 | 77 | 86 | 95 |
| 4 | 13 | 23 | 30 | 37 | 44 | 48 | 57 | 67 | 74 | 81 | 88 |
| 5 | 12 | 22 | 31 | 36 | 45 | 49 | 56 | 66 | 75 | 80 | 89 |
| 6 | 15 | 21 | 28 | 39 | 46 | 50 | 59 | 65 | 72 | 83 | 90 |
| 7 | 14 | 20 | 29 | 38 | 47 | 51 | 58 | 64 | 73 | 82 | 91 |

TABLE 8

| | | | | | | | | | | | |
|---|---|---|---|---|---|---|---|---|---|---|---|
| 0 | 9 | 19 | 26 | 33 | 40 | 52 | 61 | 71 | 78 | 85 | 92 |
| 1 | 8 | 18 | 27 | 32 | 41 | 53 | 60 | 70 | 79 | 84 | 93 |
| 2 | 11 | 16 | 25 | 35 | 42 | 54 | 63 | 68 | 77 | 87 | 94 |
| 3 | 10 | 17 | 24 | 34 | 43 | 55 | 62 | 69 | 76 | 86 | 95 |
| 4 | 13 | 23 | 30 | 37 | 44 | 48 | 57 | 67 | 74 | 81 | 88 |
| 5 | 12 | 22 | 31 | 36 | 45 | 49 | 56 | 66 | 75 | 80 | 89 |
| 6 | 15 | 20 | 29 | 39 | 46 | 50 | 59 | 64 | 73 | 83 | 90 |
| 7 | 14 | 21 | 28 | 38 | 47 | 51 | 58 | 65 | 72 | 82 | 91 |

TABLE 9

| | | | | | | | | | | | |
|---|---|---|---|---|---|---|---|---|---|---|---|
| 0 | 4 | 18 | 22 | 33 | 37 | 57 | 61 | 75 | 79 | 88 | 92 |
| 1 | 5 | 19 | 23 | 32 | 36 | 56 | 60 | 74 | 78 | 89 | 93 |
| 2 | 6 | 16 | 20 | 35 | 39 | 59 | 63 | 73 | 77 | 90 | 94 |
| 3 | 7 | 17 | 21 | 34 | 38 | 58 | 62 | 72 | 76 | 91 | 95 |
| 9 | 13 | 27 | 31 | 40 | 44 | 48 | 52 | 66 | 70 | 81 | 85 |
| 8 | 12 | 26 | 30 | 41 | 45 | 49 | 53 | 67 | 71 | 80 | 84 |
| 11 | 15 | 25 | 29 | 42 | 46 | 50 | 54 | 64 | 68 | 83 | 87 |
| 10 | 14 | 24 | 28 | 43 | 47 | 51 | 55 | 65 | 69 | 82 | 86 |

TABLE 10

| | | | | | | | | | | | |
|---|---|---|---|---|---|---|---|---|---|---|---|
| 0 | 4 | 18 | 22 | 33 | 37 | 57 | 61 | 75 | 79 | 88 | 92 |
| 1 | 5 | 19 | 23 | 32 | 36 | 56 | 60 | 74 | 78 | 89 | 93 |
| 2 | 6 | 17 | 21 | 35 | 39 | 59 | 63 | 72 | 76 | 90 | 94 |
| 3 | 7 | 16 | 20 | 34 | 38 | 58 | 62 | 73 | 77 | 91 | 95 |
| 9 | 13 | 27 | 31 | 40 | 44 | 48 | 52 | 66 | 70 | 81 | 85 |
| 8 | 12 | 26 | 30 | 41 | 45 | 49 | 53 | 67 | 71 | 80 | 84 |
| 11 | 15 | 24 | 28 | 42 | 46 | 50 | 54 | 65 | 69 | 83 | 87 |
| 10 | 14 | 25 | 29 | 43 | 47 | 51 | 55 | 64 | 68 | 82 | 86 |

TABLE 11

| | | | | | | | | | | | |
|---|---|---|---|---|---|---|---|---|---|---|---|
| 0 | 4 | 19 | 23 | 33 | 37 | 57 | 61 | 74 | 78 | 88 | 92 |
| 1 | 5 | 18 | 22 | 32 | 36 | 56 | 60 | 75 | 79 | 89 | 93 |
| 2 | 6 | 17 | 21 | 35 | 39 | 59 | 63 | 72 | 76 | 90 | 94 |
| 3 | 7 | 16 | 20 | 34 | 38 | 58 | 62 | 73 | 77 | 91 | 95 |
| 9 | 13 | 26 | 30 | 40 | 44 | 48 | 52 | 67 | 71 | 81 | 85 |
| 8 | 12 | 27 | 31 | 41 | 45 | 49 | 53 | 66 | 70 | 80 | 84 |
| 11 | 15 | 24 | 28 | 42 | 46 | 50 | 54 | 65 | 69 | 83 | 87 |
| 10 | 14 | 25 | 29 | 43 | 47 | 51 | 55 | 64 | 68 | 82 | 86 |

TABLE 12

| | | | | | | | | | | | |
|---|---|---|---|---|---|---|---|---|---|---|---|
| 0 | 4 | 19 | 23 | 33 | 37 | 57 | 61 | 74 | 78 | 88 | 92 |
| 1 | 5 | 18 | 22 | 32 | 36 | 56 | 60 | 75 | 79 | 89 | 93 |
| 2 | 6 | 16 | 20 | 35 | 39 | 59 | 63 | 73 | 77 | 90 | 94 |
| 3 | 7 | 17 | 21 | 34 | 38 | 58 | 62 | 72 | 76 | 91 | 95 |
| 9 | 13 | 26 | 30 | 40 | 44 | 48 | 52 | 67 | 71 | 81 | 85 |
| 8 | 12 | 27 | 31 | 41 | 45 | 49 | 53 | 66 | 70 | 80 | 84 |
| 11 | 15 | 25 | 29 | 42 | 46 | 50 | 54 | 64 | 68 | 83 | 87 |
| 10 | 14 | 24 | 28 | 43 | 47 | 51 | 55 | 65 | 69 | 82 | 86 |

32 target data streams are generated through block interleaving, and inner-code encoding is performed on each target symbol subset in the 32 target data streams, where an information bit length of the inner-code encoding is 120 bits.

Specifically, an inner-code encoder separately encodes and adds redundancy to a total of 120 bits of each target symbol subset in the target data stream, to obtain 32 encoded data streams. In an embodiment, inner-code encoding is performed by using Hamming(128,120), and 8-bit redundancy is added to a total of 120 bits in 12 consecutive RS symbols in each target data stream, to obtain a 128-bit codeword. In another embodiment, inner-code encoding is performed by using BCH(136,120), and 16-bit redundancy is added to a total of 120 bits in 12 consecutive RS symbols in each target data stream, to obtain a 136-bit codeword.

After data processing is performed on inner-code encoded data streams, data processed data streams are sent to a channel transmission medium for transmission. The data processing may include modulation and mapping, channel interleaving, polarization distribution, DSP framing, and the like. For example, the inner-code encoded data streams may be interleaved, so as to improve a capability of a system to resist a burst error.

By using the data interleaving and encoding scheme in this embodiment, concatenated code of KP4 RS(544,514)+ Hamming(128,120) in the scheme is under AWGN, a corresponding pre-FEC BER for implementing a post-FEC bit error rate BER of 1E-15 is approximately 4.5E-3, and performance approximates to optimal performance of a concatenated FEC scheme.

Embodiment 3: Uniform interleaving is used for all services, an information bit length of inner-code encoding is 160 bits, and an inner-code parallelism degree is 16.

In this embodiment, the structure shown in FIG. 11 is used for the convolutional interleaving, and the convolutional interleaving is separately performed on n=32 PCS lane data streams to obtain n=32 first data streams. Convolutional interleaving 0, convolutional interleaving 1, convolutional interleaving 2, . . . , convolutional interleaving 31 use a same interleaving structure. FIG. 18(a) shows a structure of a convolution interleaver that includes p=4 delay lines. The four delay lines respectively include 3Q storage units, 2Q storage units, Q storage units, and 0 storage units, and each storage unit is configured to store d=2 symbols. In other words, a delay value of delay line 0 is 6Q symbols, a delay value of delay line 1 is 4Q symbols, a delay value of delay line 2 is 2Q symbols, and a delay value of delay line 3 is 0 symbols, that is, no delay.

As shown in FIG. 18(a), $C_r(\ )$ represents one RS symbol in lane data stream r (where $0 \le r \le n-1$). For example, $C_r(8t)$ and $C_r(8t+1)$ represent two RS symbols that are currently input into delay line 0 and that are in the lane data stream, and $C_r(8t-24Q)$ and $C_r(8t-24Q+1)$ are two RS symbols output from delay line 0; $C_r(8t+2)$ and $C_r(8t+3)$ represent two RS symbols that are subsequently input into delay line 1 and that are in the lane data stream, and $C_r(8t-16Q+2)$ and $C_r(8t-16Q+3)$ are two RS symbols output from delay line 1; $C_r(8t+4)$ and $C_r(8t+5)$ represent two RS symbols that are subsequently input into delay line 2 and that are in the lane data stream, and $C_r(8t-8Q+4)$ and $C_r(8t-8Q+5)$ are two RS symbols output from delay line 2; $C_r(8t+6)$ and $C_r(8t+7)$ represent two RS symbols that are then subsequently input into delay line 3 and that are in the lane data stream, and $C_r(8t+6)$ and $C_r(8t+7)$ are two RS symbols output from delay line 3; and so on. With reference to FIG. 5 and FIG. 6, it can be seen that when 8Q+2≥68, that is, Q≥9, a total of eight RS symbols $C_r(8t-24Q)$, $C_r(8t-24Q+1)$, $C_r(8t-16Q+2)$, $C_r(8t-16Q+3)$, $C_r(8t-8Q+4)$, $C_r(8t-8Q+5)$, $C_r(8t+6)$ and $C_r(8t+7)$ output through the convolutional interleaving are from eight different RS codewords. Then, data of the two first data stream subsets is aggregated by using block interleaving, so that 16 consecutive RS symbols in the target data stream can be from 16 different RS codewords. Similarly, for another access service, with reference to subsequent block interleaving, when Q≥9, 16 consecutive RS symbols of the target data stream can be from 16 different RS codewords.

In an embodiment, that Q=9 is selected, and a specific structure of the convolution interleaver is shown in FIG. 18(b). An interleaving latency corresponding to the convolution interleaver is approximately 27*2*4/2=108 RS symbols.

The convolution interleaver shown in FIG. 18(b) separately performs convolutional interleaving on 32 PCS lane data streams to obtain 32 first data streams. Refer to the PCS/FEC lane data streams shown in FIG. 5 to FIG. 9. It is not difficult to understand that the first data stream at most includes $G_{max}=8$ first data stream subsets, and at least includes $G_{min}=2$ first data stream subsets. To use a same interleaving solution for all services and reduce a convolutional interleaving delay, the first data streams are divided into $K1=G_{max}=8$ first data stream groups, any two data streams in each first data stream group are from a same RS codeword, and corresponding groups are specifically divided as follows: First data streams 0 to 3 are first data stream group 0, first data streams 4 to 7 are first data stream group 1, first data streams 8 to 11 are first data stream group 2, first data streams 12 to 15 are first data stream group 3, first data streams 16 to 19 are first data stream group 4, first data streams 20 to 23 are first data stream group 5, first data streams 24 to 27 are first data stream group 6, and the first data streams 28 to 31 are first data stream group 7. Therefore, in this embodiment, the block interleaving shown in FIG. 35 is used, and corresponding parameters are K=K1=8 and T=32/K1=4, and eight first data streams (any first data stream selected from each first data stream group) are used as eight input data streams of block interleaving i (where $0 \le i < 4$).

Figure 40:
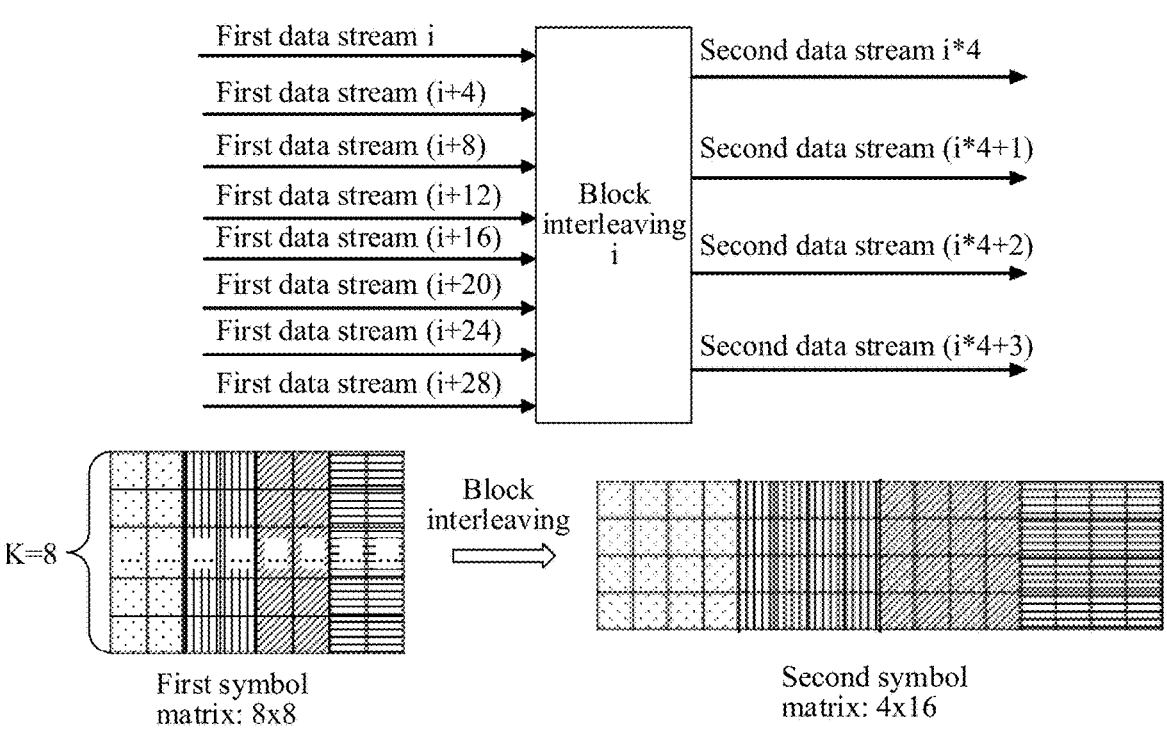
FIG. 40 is a schematic diagram of another embodiment of block interleaving.

FIG. 40 is a schematic diagram of another embodiment of block interleaving. As shown in FIG. 40, eight input data streams of block interleaving i (where $0 \le i < 4$) are respectively first data stream i, first data stream (i+4), first data stream (i+8), first data stream (i+12), first data stream (i+16), first data stream (i+20), first data stream (i+24), and first data stream (i+28). Consecutive eight RS symbols are obtained from each input data stream, to form a first symbol matrix with eight rows and eight columns, where eight RS symbols in each row are respectively eight RS symbols output from delay line 0, delay line 1, delay line 2, and delay line 3, of the convolution interleaver shown in FIG. 18(b), on which polling is performed for R=1 time. With reference to FIG. 5 to FIG. 9, it is not difficult to learn that the first symbol matrix is from 16 different RS codewords and every four RS symbols belong to a same codeword. Further, in the first symbol matrix, a $0^{th}$ row to a $3^{rd}$ row are from eight different RS codewords, a $4^{th}$ row to a $7^{th}$ row are from eight different RS codewords, and the two are not from same RS codewords. Further, RS codeword distribution in all odd-numbered columns or all even-numbered columns in the first symbol matrix may be consistent. Further, in the first symbol matrix, RS codeword distribution in a $0^{th}$ column to a $3^{rd}$ column may be consistent, RS codeword distribution in a $2^{nd}$ column to a $5^{th}$ column may be consistent, and RS codeword distribution in a $4^{th}$ column to a $7^{th}$ column may be consistent. Therefore, two RS symbols may be selected from each column of the first symbol matrix. One RS symbol is from any row of the $0^{th}$ row to the $3^{rd}$ row, and the other RS symbol is from any row of the $4^{th}$ row to the $7^{th}$ row. A total of 16 RS symbols are mapped to one row of the second symbol matrix, to obtain the second symbol matrix with four rows and 16 columns. 16 RS symbols in a $t^{th}$ (where $0 \le t < 4$) row of the second symbol matrix are 16 consecutive RS symbols in target data stream ($i*4+t$) output through block interleaving i. Therefore, one row of the second symbol matrix is defined as a target symbol subset. For ease of description, $S(i_x, j_y)$, where $i_x \in [0,7]$, $j_y \in [0,7]$, is defined as a symbol representing the $i_x{}^{th}$ row and the $j_y{}^{th}$ column of the first symbol matrix. To enable 16 RS symbols in the target symbol subset to be from 16 different RS codewords, the eight RS symbols selected from the $0^{th}$ row to the $3^{rd}$ row of the first symbol matrix or the eight RS symbols selected from the $4^{th}$ row to the $7^{th}$ row of the first symbol to matrix correspond $S(i_0, 0)$, $S(i_1, 1)$, $S(i_2, 2)$, $S(i_3, 3)$, $S(i_4, 4)$, $S(i_5, 5)$, $S(i_6, 6)$, and $S(i_7, 7)$ in the first symbol matrix, where $i_0$, $i_1$, $i_2$, and $i_3$ are not equal, $i_2$, $i_3$, $i_4$, and $i_5$ are not equal, $i_4$, $i_5$, $i_6$, and $i_7$ are not equal, $i_0$, $i_2$, $i_4$, and $i_6$ are not equal, $i_1$, $i_3$, $i_5$, and $i_7$ are not equal, and $i_0$, $i_1$, $i_2$, $i_3$, $i_4$, $i_5$, $i_6$, and $i_7 \in [0,3]$ or $i_0$, $i_1$, $i_2$, $i_3$, $i_4$, $i_5$, $i_6$, and $i_7 \in [4,7]$. This is equivalent to a case in which every two symbols in the target symbol subset are from a same column in the first symbol matrix, one symbol is located in any row from the $0^{th}$ row to the $3^{rd}$ row of the first symbol matrix, and the other symbol is located in any row from the $4^{th}$ row to the $7^{th}$ row of the first symbol matrix. Further, eight symbols, from odd-numbered columns of the first symbol matrix, in the target symbol subset are located in different rows of the first symbol matrix, and eight symbols, from even-numbered columns of the first symbol matrix, are located in different rows of the first symbol matrix. Further, in the target symbol subset, every two symbols are from a same row of the first symbol matrix, the two symbols from the same row are output from two different delay lines for convolutional interleaving, and a delay difference corresponding to the two delay lines is greater than or equal to $2*d*Q=44$ symbols. According to this rule, there are many specific mappings from the first symbol matrix to the second symbol matrix. Table 13 to Table 16 below provide several specific mapping relationships. Number x in a $y^{th}$ row and a $z^{th}$ column in each table indicates that an RS symbol in a $y^{th}$ row and a $z^{th}$ column of the second symbol matrix is from an $x^{th}$ RS symbol in the first symbol matrix, where $0 \le y < 4$, $0 \le z < 16$, and $0 \le x < 64$, the $x^{th}$ RS symbol in the first symbol matrix indicates a symbol in an $(x \% 8)^{th}$ row and an $(\lfloor x/8 \rfloor)^{th}$ column of the first symbol matrix. It should be noted that, when switching between any rows, switching between any columns, switching between any columns after switching between any rows, or switching between any columns before switching between any rows in the tables is performed, the foregoing mapping is still a valid mapping.

Based on a relationship between the first symbol matrix and a first data stream, and a relationship between the first data stream and a lane data stream, it is not difficult to learn that 16 symbols of each target symbol subset are from $K1=8$ lane data streams, where the eight lane data streams may be represented as lane data stream $j_0$, lane data stream $j_1$, lane data stream $j_2$, lane data stream $j_3$, lane data stream $j_4$, lane data stream $j_5$, lane data stream $j_6$, and lane data stream $j_7$. $\lfloor j_x/4 \rfloor = x$, where $x \in [0,7]$. $\lfloor j_x/4 \rfloor$ represents rounding down to the nearest integer of $j_x/4$. Further, if two symbols are obtained from each lane data stream, spacing between the two RS symbols in the corresponding lane data stream is greater than or equal to $a*N*K2/n$, in other words, greater than or equal to $2*544*2/32=68$ RS symbols. Further, at most two RS symbols are from two aligned RS symbols in two different lane data streams.

TABLE 13

| | | | | | | | | | | | | | | | |
|---|---|---|---|---|---|---|---|---|---|---|---|---|---|---|---|
| 0 | 4 | 9 | 13 | 18 | 22 | 27 | 31 | 33 | 37 | 40 | 44 | 51 | 55 | 58 | 62 |
| 1 | 5 | 8 | 12 | 19 | 23 | 26 | 30 | 32 | 36 | 41 | 45 | 50 | 54 | 59 | 63 |
| 2 | 6 | 11 | 15 | 16 | 20 | 25 | 29 | 35 | 39 | 42 | 46 | 49 | 53 | 56 | 60 |
| 3 | 7 | 10 | 14 | 17 | 21 | 24 | 28 | 34 | 38 | 43 | 47 | 48 | 52 | 57 | 61 |

TABLE 14

| | | | | | | | | | | | | | | | |
|---|---|---|---|---|---|---|---|---|---|---|---|---|---|---|---|
| 0 | 4 | 9 | 13 | 18 | 22 | 27 | 31 | 33 | 37 | 40 | 44 | 51 | 55 | 58 | 62 |
| 1 | 5 | 8 | 12 | 19 | 23 | 26 | 30 | 32 | 36 | 41 | 45 | 50 | 54 | 59 | 63 |
| 2 | 6 | 11 | 15 | 17 | 21 | 24 | 28 | 35 | 39 | 42 | 46 | 48 | 52 | 57 | 61 |
| 3 | 7 | 10 | 14 | 16 | 20 | 25 | 29 | 34 | 38 | 43 | 47 | 49 | 53 | 56 | 60 |

TABLE 15

| | | | | | | | | | | | | | | | |
|---|---|---|---|---|---|---|---|---|---|---|---|---|---|---|---|
| 0 | 4 | 9 | 13 | 19 | 23 | 26 | 30 | 33 | 37 | 40 | 44 | 50 | 54 | 59 | 63 |
| 1 | 5 | 8 | 12 | 18 | 22 | 27 | 31 | 32 | 36 | 41 | 45 | 51 | 55 | 58 | 62 |
| 2 | 6 | 11 | 15 | 17 | 21 | 24 | 28 | 35 | 39 | 42 | 46 | 48 | 52 | 57 | 61 |
| 3 | 7 | 10 | 14 | 16 | 20 | 25 | 29 | 34 | 38 | 43 | 47 | 49 | 53 | 56 | 60 |

TABLE 16

| | | | | | | | | | | | | | | | |
|---|---|---|---|---|---|---|---|---|---|---|---|---|---|---|---|
| 0 | 4 | 9 | 13 | 19 | 23 | 26 | 30 | 33 | 37 | 40 | 44 | 50 | 54 | 59 | 63 |
| 1 | 5 | 8 | 12 | 18 | 22 | 27 | 31 | 32 | 36 | 41 | 45 | 51 | 55 | 58 | 62 |
| 2 | 6 | 11 | 15 | 16 | 20 | 25 | 29 | 35 | 39 | 42 | 46 | 49 | 53 | 56 | 60 |
| 3 | 7 | 10 | 14 | 17 | 21 | 24 | 28 | 34 | 38 | 43 | 47 | 48 | 52 | 57 | 61 |

16 target data streams are generated through block interleaving, and inner-code encoding is performed on each target symbol subset in the 16 target data streams, where an information bit length of the inner-code encoding is 160 bits. Specifically, an inner-code encoder separately encodes and adds redundancy to a total of 160 bits of each target symbol subset in the target data stream, to obtain 16 encoded data streams. In an embodiment, inner-code encoding is performed by using Hamming(170,160), and 10-bit redundancy is added to a total of 160 bits in 16 consecutive RS symbols in each target data stream, to obtain a 170-bit codeword. In another embodiment, inner-code encoding is performed by using BCH(176,160), and 16-bit redundancy is added to a total of 160 bits in 16 consecutive RS symbols in each target data stream, to obtain a 176-bit codeword. After data processing is performed on inner-code encoded data streams, data processed data streams are sent to a channel transmission medium for transmission.

After the data processing is performed on the inner-code encoded data streams, the data processed data streams are sent to the channel transmission medium for transmission. The data processing may include modulation and mapping, channel interleaving, polarization distribution, DSP framing, and the like. For example, the inner-code encoded data streams may be interleaved, so as to improve a capability of a system to resist a burst error.

By using the data interleaving and encoding scheme in this embodiment, when Hamming(170,160) is used as inner code, concatenated code of KP4 RS(544,514)+Hamming (170,160) in the scheme is under AWGN, a corresponding pre-FEC BER for implementing a post-FEC bit error rate BER of 1E-15 is approximately 4.3E-3, and performance approximates to optimal performance of the concatenated FEC scheme. When the inner code uses BCH(176,160), concatenated code of KP4 RS(544,514)+BCH(176,160) in the scheme is under AWGN, a corresponding pre-FEC BER for implementing a post-FEC bit error rate BER of 1E-15 is approximately 8.3E-3, and performance approximates to optimal performance of the concatenated FEC scheme.

Embodiment 4: Uniform interleaving is used for all services, an information bit length of inner-code encoding is 160 bits, and an inner-code parallelism degree is 32.

The convolution interleaver shown in FIG. 18(*b*) separately performs convolutional interleaving on 32 PCS lane data streams to obtain 32 first data streams. Refer to the PCS/FEC lane data streams shown in FIG. 5 to FIG. 9. It is not difficult to understand that the first data stream at most includes $G_{max}=8$ first data stream subsets, and at least includes $G_{min}=2$ first data stream subsets. To use a same interleaving solution for all services and reduce a convolutional interleaving delay, the first data streams are divided into $K1=G_{max}=8$ first data stream groups, any two data streams in each first data stream group are from a same RS codeword, and corresponding groups are specifically divided as follows: First data streams 0 to 3 are first data stream group 0, first data streams 4 to 7 are first data stream group 1, first data streams 8 to 11 are first data stream group 2, first data streams 12 to 15 are first data stream group 3, first data streams 16 to 19 are first data stream group 4, first data streams 20 to 23 are first data stream group 5, first data streams 24 to 27 are first data stream group 6, and the first data streams 28 to 31 are first data stream group 7. Therefore, in this embodiment, block interleaving shown in FIG. 35 is used, and corresponding parameters are K=K1=8 and T=32/K1=4, and eight first data streams (any first data stream selected from each first data stream group) are used as eight input data streams of block interleaving i (where $0 \leq i < 4$).

Figure 41:
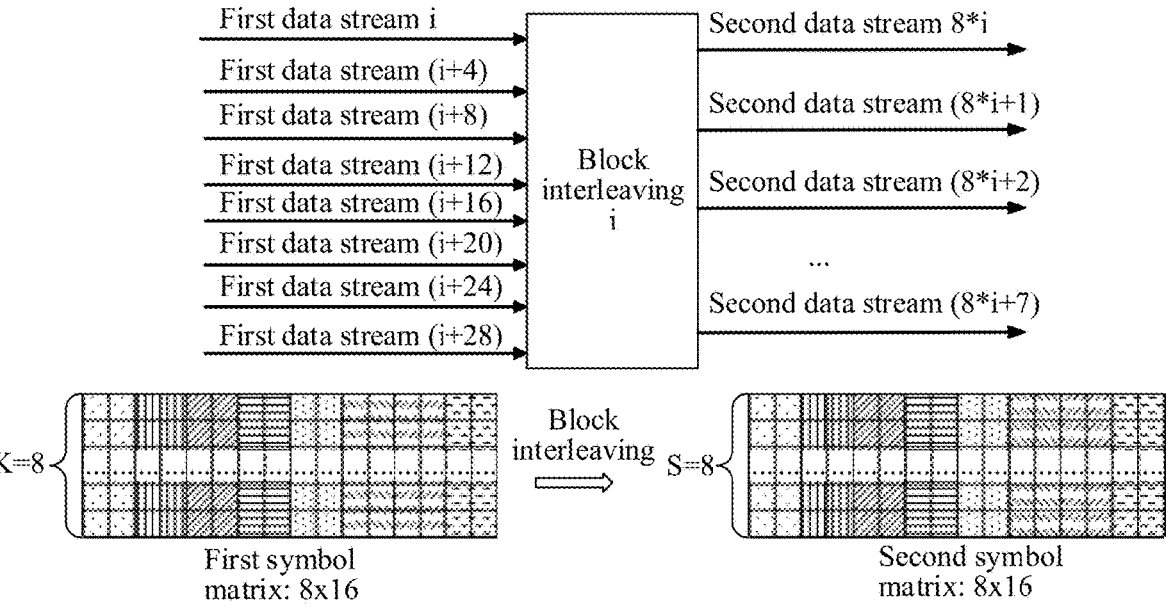
FIG. 41 is a schematic diagram of another embodiment of block interleaving.

FIG. 41 is a schematic diagram of another embodiment of block interleaving. As shown in FIG. 41, eight input data streams of block interleaving i (where $0 \leq i < 4$) are respectively first data stream i, first data stream (i+4), first data stream (i+8), first data stream (i+12), first data stream (i+16), first data stream (i+20), first data stream (i+24), and first data stream (i+28). Consecutive 16 RS symbols are obtained from each input data stream, to form a first symbol matrix with eight rows and 16 columns, where 16 RS symbols in each row are respectively 16 RS symbols consecutively output from delay line 0, delay line 1, delay line 2, and delay line 3, of the convolution interleaver shown in FIG. 18(*b*), on which polling is performed for R=2 times. With reference to FIG. 5 to FIG. 9, it is not difficult to learn that the first symbol matrix is from 16 different RS codewords, and every eight RS symbols belong to a same RS codeword. Further, in the first symbol matrix, a $0^{th}$ row to a $3^{rd}$ row are from at least eight different RS codewords, a $4^{th}$ row to a $7^{th}$ row are from at least eight different RS codewords, and the two are not from same RS codewords. Further, RS codeword distribution in all odd-numbered columns or all even-numbered columns in the first symbol matrix may be consistent. Further, in the first symbol matrix, RS codeword distribution in a $0^{th}$ column to a $3^{rd}$ column may be consistent, RS codeword distribution in a $2^{nd}$ column to a $5^{th}$ column may be consistent, RS codeword distribution in a $4^{th}$ column to a $7^{th}$ column may be consistent, RS codeword distribution in an $8^{th}$ column to an $11^{th}$ column may be consistent, RS codeword distribution in a $10^{th}$ column to a $13^{th}$ column may be consistent, and RS codeword distribution in a $12^{th}$ column to a $15^{th}$ column may be consistent. Further, RS codeword distribution in a $j^{th}$ column, a $(j+1)^{th}$ column, a $(j+8)^{th}$ column, and a $(j+9)^{th}$ column (where $j \in \{0, 2, 4, 6\}$) of the first symbol matrix may be consistent. Therefore, a total of 16 RS symbols (one symbol from each column of the first symbol matrix) may be selected and mapped to one row of a second symbol matrix, to obtain the second symbol matrix with eight rows and 16 columns. 16 RS symbols in a $t^{th}$ (where $0 \leq t < 8$) row of the second symbol matrix are 16 consecutive RS symbols in target data stream (i*8+t) output through block interleaving i. Therefore, one row of the second symbol matrix is defined as a target symbol subset. For ease of description, $S(i_x, j_y)$, where $i_x \in [0,7]$, $j_y \in [0,15]$, is defined as a symbol representing the $i_x^{th}$ row and the $j_y^{th}$ column of the first symbol matrix. To enable the 16 RS symbols in the target symbol subset to be from 16 different RS codewords, the 16 RS symbols correspond to $S(i_0, 0)$, $S(i_1, 1)$, $S(i_2, 2)$, ..., $S(i_{14}, 14)$, and $S(i_{15}, 15)$ in the first symbol matrix. $i_0$, $i_1$, $i_2$, and $i_3$ are unequal to each other, $i_2$, $i_3$, $i_4$, and $i_5$ are unequal to each other, $i_4$, $i_5$, $i_6$, and $i_7$ are unequal to each other, $i_8$, $i_9$, $i_{10}$, and $i_{11}$ are unequal to each other, $i_{10}$, $i_{11}$, $i_{12}$, and $i_{13}$ are unequal to each other, $i_{12}$, $i_{13}$, $i_{14}$, and $i_{15}$ are unequal to each other, $i_0$, $i_1$, $i_8$, and $i_9$ are unequal to each other, $i_2$, $i_3$, $i_{10}$, and $i_{11}$ are unequal to each other, $i_4$, $i_5$, $i_{12}$, and $i_{13}$ are unequal to each other, $i_6$, $i_7$, $i_{14}$, and $i_{15}$ are unequal to each other, $i_0$, $i_2$, $i_4$, $i_6$, $i_8$, $i_{10}$, $i_{12}$, and $i_{14}$ are unequal to each other, $i_1$, $i_3$, $i_5$, $i_7$, $i_9$, $i_{11}$, $i_{13}$, and $i_{15}$ are unequal to each other, and $i_0$, $i_1$, $i_2$, $i_3$, $i_4$, $i_5$, $i_6$, $i_7$, $i_8$, $i_9$, $i_{10}$, $i_{11}$, $i_{12}$, $i_{13}$, $i_{14}$, and $i_{15} \in [0,7]$. This is equivalent to a case in which each symbol in the target symbol subset is from a same column in the first symbol matrix. Further, eight symbols, from odd-numbered columns of the first symbol matrix, in the target symbol subset are located in different rows of the first symbol matrix, and eight symbols, from even-numbered columns of the first symbol matrix, in the target symbol subset are located in different rows of the first symbol matrix. Further, symbols that are output from a delay line with a same delay value, that are from the first symbol matrix, and that are in the target symbol subset are located in different rows of the first symbol matrix. Further, in the target symbol subset, every two symbols are from a same row of the first symbol matrix, the two symbols from the same row are output from two different delay lines for convolutional interleaving, and a delay difference corresponding to the two delay lines is greater than or equal to $2*d*Q=44$ symbols. According to this rule, there are many specific mappings from the first symbol matrix to the second symbol matrix. Table 17 to Table 20 below provide several specific mapping relationships. Number x in a $y^{th}$ row and a $z^{th}$ column in each table indicates that an RS symbol in a $y^{th}$ row and a $z^{th}$ column of the second symbol matrix is from an $x^{th}$ RS symbol in the first symbol matrix, where $0 \leq y < 8$, $0 \leq z < 16$, and $0 \leq x < 128$, the $x^{th}$ RS symbol in the first symbol matrix indicates a symbol in an $(x \% 8)^{th}$ row and an $(\lfloor x/8 \rfloor)^{th}$ column of the first symbol matrix. It should be noted that, when switching between any rows, switching between any columns, interleaving between any columns after switching between any rows, or switching between any columns before switching between any rows in the tables is performed, the foregoing mapping is still a valid mapping.

According to an RS codeword distribution rule in the first symbol matrix, another mapping manner from the first symbol matrix to the target symbol subset is: A total of eight columns (any column from a $(2*j)^{th}$ column and a $(2*j+1)^{th}$ column (where $j \in [0,7]$) of the first symbol matrix) are selected, and then a total of 16 RS symbols (two RS symbols from each of the selected eight columns) are selected and mapped to the target symbol subset. The correspondingly selected 16 RSs correspond to $S(i_0, j_0)$, $S(i_1, j_0)$, $S(i_2, j_1)$, $S(i_3, j_1)$, $S(i_4, j_2)$, $S(i_5, j_2)$, $S(i_6, j_3)$, $S(i_7, j_3)$, $S(i_8, j_4)$, $S(i_9, j_4)$, $S(i_{10}, j_5)$, $S(i_{11}, j_5)$, $S(i_{12}, j_6)$, $S(i_{13}, j_6)$, $S(i_{14}, j_7)$, and $S(i_{15}, j_7)$ that are in the first symbol matrix. $i_0$, $i_1$, $i_2$, and $i_3$ are unequal to each other, $i_2$, $i_3$, $i_4$, and $i_5$ are unequal to each other, $i_4$, $i_5$, $i_6$, and $i_7$ are unequal to each other, $i_8$, $i_9$, $i_{10}$, and $i_{11}$ are unequal to each other, $i_{10}$, $i_{11}$, $i_{12}$, and $i_{13}$ are unequal to each other, $i_{12}$, $i_{13}$, $i_{14}$, and $i_{15}$ are unequal to each other, $i_0$, $i_1$, $i_8$, and $i_9$ are unequal to each other, $i_2$, $i_3$, $i_{10}$, and $i_{11}$ are unequal to each other, $i_4$, $i_5$, $i_{12}$, and $i_{13}$ are unequal to each other, and $i_6$, $i_7$, $i_{14}$, and $i_{15}$ are unequal to each other. $i_0$, $i_1$, $i_2$, $i_3$, $i_4$, $i_5$, $i_6$, $i_7$, $i_8$, $i_9$, $i_{10}$, $i_{11}$, $i_{12}$, $i_{13}$, $i_{14}$, and $i_{15} \in [0,7]$ $j_0 \in [0,1]$, $j_1 \in [2,3]$, $j_2 \in [4,5]$, $j_3 \in [6,7]$, $j_4 \in [8,9]$, $j_5 \in [10,11]$, $j_6 \in [12,13]$, and $j_7 \in [14,15]$. This is equivalent to a case in which every two symbols in the target symbol subset are from a same column in the first symbol matrix, one symbol is located in any row from a $0^{th}$ row to a $3^{rd}$ row of the first symbol matrix, and the other symbol is located in any row from a $4^{th}$ row to a $7^{th}$ row of the first symbol matrix. Further, eight symbols, from odd-numbered columns of the first symbol matrix, in the target symbol subset are located in different rows of the first symbol matrix, and eight symbols, from even-numbered columns of the first symbol matrix, in the target symbol subset are located in different rows of the first symbol matrix. Further, symbols that are output from a delay line with a same delay value, that are from the first symbol matrix, and that are in the target symbol subset are located in different rows of the first symbol matrix. Further, in the target symbol subset, every two symbols are from a same row of the first symbol matrix, the two symbols from the same row are output from two different delay lines for convolutional interleaving, and a delay difference corresponding to the two delay lines is greater than or equal to $2*d*Q=44$ symbols. According to this rule, there are many specific mappings from the first symbol matrix to the second symbol matrix. Table 21 to Table 24 provide several specific mapping relationships. Number x in a $y^{th}$ row and a $z^{th}$ column in each table indicates that an RS symbol in a $y^{th}$ row and a $z^{th}$ column of the second symbol matrix is from an $x^{th}$ RS symbol in the first symbol matrix, where $0 \leq y < 8$, $0 \leq z < 16$, and $0 \leq x < 128$, the $x^{th}$ RS symbol in the first symbol matrix indicates a symbol in an $(x \% 8)^{th}$ row and an $(\lfloor x/8 \rfloor)^{th}$ column of the first symbol matrix. It should be noted that, when switching between any rows, switching between any columns, interleaving between any columns after switching between any rows, or switching between any columns before switching between any rows in the tables is performed, the foregoing mapping is still a valid mapping.

Based on a relationship between the first symbol matrix and a first data stream, and a relationship between the first data stream and a lane data stream, it is not difficult to learn that 16 symbols of each target symbol subset are from K1=8 lane data streams, where the eight lane data streams may be represented as lane data stream $j_0$, lane data stream $j_1$, lane data stream $j_2$, lane data stream $j_3$, lane data stream $j_4$, lane data stream $j_5$, lane data stream $j_6$, and lane data stream $j_7$. $\lfloor j_x/4 \rfloor = x$, where $x \in [0,7]$. $\lfloor j_x/4 \rfloor$ represents rounding down to the nearest integer of $j_x/4$. Further, if two symbols are obtained from each lane data stream, spacing between the two RS symbols in the corresponding lane data stream is greater than or equal to $a*N*K2/n$, in other words, greater than or equal to $2*544*2/32=68$ RS symbols. Further, at most two RS symbols are from two aligned RS symbols in two different lane data streams.

TABLE 17

| 0 | 9 | 18 | 27 | 33 | 40 | 51 | 58 | 68 | 77 | 86 | 95 | 101 | 108 | 119 | 126 |
|---|---|----|----|----|----|----|----|----|----|----|----|-----|-----|-----|-----|
| 2 | 11 | 16 | 25 | 35 | 42 | 49 | 56 | 70 | 79 | 84 | 93 | 103 | 110 | 117 | 124 |
| 1 | 8 | 19 | 26 | 32 | 41 | 50 | 59 | 69 | 76 | 87 | 94 | 100 | 109 | 118 | 127 |
| 3 | 10 | 17 | 24 | 34 | 43 | 48 | 57 | 71 | 78 | 85 | 92 | 102 | 111 | 116 | 125 |
| 4 | 13 | 22 | 31 | 37 | 44 | 55 | 62 | 64 | 73 | 82 | 91 | 97 | 104 | 115 | 122 |
| 6 | 15 | 20 | 29 | 39 | 46 | 53 | 60 | 66 | 75 | 80 | 89 | 99 | 106 | 113 | 120 |
| 5 | 12 | 23 | 30 | 36 | 45 | 54 | 63 | 65 | 72 | 83 | 90 | 96 | 105 | 114 | 123 |
| 7 | 14 | 21 | 28 | 38 | 47 | 52 | 61 | 67 | 74 | 81 | 88 | 98 | 107 | 112 | 121 |

TABLE 18

| 0 | 9 | 18 | 27 | 33 | 40 | 51 | 58 | 68 | 77 | 86 | 95 | 101 | 108 | 119 | 126 |
|---|---|----|----|----|----|----|----|----|----|----|----|-----|-----|-----|-----|
| 2 | 11 | 17 | 24 | 35 | 42 | 48 | 57 | 70 | 79 | 85 | 92 | 103 | 110 | 116 | 125 |
| 1 | 8 | 19 | 26 | 32 | 41 | 50 | 59 | 69 | 76 | 87 | 94 | 100 | 109 | 118 | 127 |

107                                                                                                           108

TABLE 18-continued

| | | | | | | | | | | | | | | | |
|---|---|---|---|---|---|---|---|---|---|---|---|---|---|---|---|
| 3 | 10 | 16 | 25 | 34 | 43 | 49 | 56 | 71 | 78 | 84 | 93 | 102 | 111 | 117 | 124 |
| 4 | 13 | 22 | 31 | 37 | 44 | 55 | 62 | 64 | 73 | 82 | 91 | 97 | 104 | 115 | 122 |
| 6 | 15 | 21 | 28 | 39 | 46 | 52 | 61 | 66 | 75 | 81 | 88 | 99 | 106 | 112 | 121 |
| 5 | 12 | 23 | 30 | 36 | 45 | 54 | 63 | 65 | 72 | 83 | 90 | 96 | 105 | 114 | 123 |
| 7 | 14 | 20 | 29 | 38 | 47 | 53 | 60 | 67 | 74 | 80 | 89 | 98 | 107 | 113 | 120 |

TABLE 19

| | | | | | | | | | | | | | | | |
|---|---|---|---|---|---|---|---|---|---|---|---|---|---|---|---|
| 0 | 9 | 19 | 26 | 33 | 40 | 50 | 59 | 68 | 77 | 87 | 94 | 101 | 108 | 118 | 127 |
| 2 | 11 | 17 | 24 | 35 | 42 | 48 | 57 | 70 | 79 | 85 | 92 | 103 | 110 | 116 | 125 |
| 1 | 8 | 18 | 27 | 32 | 41 | 51 | 58 | 69 | 76 | 86 | 95 | 100 | 109 | 119 | 126 |
| 3 | 10 | 16 | 25 | 34 | 43 | 49 | 56 | 71 | 78 | 84 | 93 | 102 | 111 | 117 | 124 |
| 4 | 13 | 23 | 30 | 37 | 44 | 54 | 63 | 64 | 73 | 83 | 90 | 97 | 104 | 114 | 123 |
| 6 | 15 | 21 | 28 | 39 | 46 | 52 | 61 | 66 | 75 | 81 | 88 | 99 | 106 | 112 | 121 |
| 5 | 12 | 22 | 31 | 36 | 45 | 55 | 62 | 65 | 72 | 82 | 91 | 96 | 105 | 115 | 122 |
| 7 | 14 | 20 | 29 | 38 | 47 | 53 | 60 | 67 | 74 | 80 | 89 | 98 | 107 | 113 | 120 |

20

TABLE 20

| | | | | | | | | | | | | | | | |
|---|---|---|---|---|---|---|---|---|---|---|---|---|---|---|---|
| 0 | 9 | 19 | 26 | 33 | 40 | 50 | 59 | 68 | 77 | 87 | 94 | 101 | 108 | 118 | 127 |
| 2 | 11 | 16 | 25 | 35 | 42 | 49 | 56 | 70 | 79 | 84 | 93 | 103 | 110 | 117 | 124 |
| 1 | 8 | 18 | 27 | 32 | 41 | 51 | 58 | 69 | 76 | 86 | 95 | 100 | 109 | 119 | 126 |
| 3 | 10 | 17 | 24 | 34 | 43 | 48 | 57 | 71 | 78 | 85 | 92 | 102 | 111 | 116 | 125 |
| 4 | 13 | 23 | 30 | 37 | 44 | 54 | 63 | 64 | 73 | 83 | 90 | 97 | 104 | 114 | 123 |
| 6 | 15 | 20 | 29 | 39 | 46 | 53 | 60 | 66 | 75 | 80 | 89 | 99 | 106 | 113 | 120 |
| 5 | 12 | 22 | 31 | 36 | 45 | 55 | 62 | 65 | 72 | 82 | 91 | 96 | 105 | 115 | 122 |
| 7 | 14 | 21 | 28 | 38 | 47 | 52 | 61 | 67 | 74 | 81 | 88 | 98 | 107 | 112 | 121 |

TABLE 21

| | | | | | | | | | | | | | | | |
|---|---|---|---|---|---|---|---|---|---|---|---|---|---|---|---|
| 0 | 4 | 18 | 22 | 33 | 37 | 51 | 55 | 73 | 77 | 91 | 95 | 104 | 108 | 122 | 126 |
| 1 | 5 | 19 | 23 | 32 | 36 | 50 | 54 | 72 | 76 | 90 | 94 | 105 | 109 | 123 | 127 |
| 2 | 6 | 16 | 20 | 35 | 39 | 49 | 53 | 75 | 79 | 89 | 93 | 106 | 110 | 120 | 124 |
| 3 | 7 | 17 | 21 | 34 | 38 | 48 | 52 | 74 | 78 | 88 | 92 | 107 | 111 | 121 | 125 |
| 9 | 13 | 27 | 31 | 40 | 44 | 58 | 62 | 64 | 68 | 82 | 86 | 97 | 101 | 115 | 119 |
| 8 | 12 | 26 | 30 | 41 | 45 | 59 | 63 | 65 | 69 | 83 | 87 | 96 | 100 | 114 | 118 |
| 11 | 15 | 25 | 29 | 42 | 46 | 56 | 60 | 66 | 70 | 80 | 84 | 99 | 103 | 113 | 117 |
| 10 | 14 | 24 | 28 | 43 | 47 | 57 | 61 | 67 | 71 | 81 | 85 | 98 | 102 | 112 | 116 |

TABLE 22

| | | | | | | | | | | | | | | | |
|---|---|---|---|---|---|---|---|---|---|---|---|---|---|---|---|
| 0 | 4 | 18 | 22 | 33 | 37 | 51 | 55 | 73 | 77 | 91 | 95 | 104 | 108 | 122 | 126 |
| 1 | 5 | 19 | 23 | 32 | 36 | 50 | 54 | 72 | 76 | 90 | 94 | 105 | 109 | 123 | 127 |
| 2 | 6 | 17 | 21 | 35 | 39 | 48 | 52 | 75 | 79 | 88 | 92 | 106 | 110 | 121 | 125 |
| 3 | 7 | 16 | 20 | 34 | 38 | 49 | 53 | 74 | 78 | 89 | 93 | 107 | 111 | 120 | 124 |
| 9 | 13 | 27 | 31 | 40 | 44 | 58 | 62 | 64 | 68 | 82 | 86 | 97 | 101 | 115 | 119 |
| 8 | 12 | 26 | 30 | 41 | 45 | 59 | 63 | 65 | 69 | 83 | 87 | 96 | 100 | 114 | 118 |
| 11 | 15 | 24 | 28 | 42 | 46 | 57 | 61 | 66 | 70 | 81 | 85 | 99 | 103 | 112 | 116 |
| 10 | 14 | 25 | 29 | 43 | 47 | 56 | 60 | 67 | 71 | 80 | 84 | 98 | 102 | 113 | 117 |

TABLE 23

| | | | | | | | | | | | | | | | |
|---|---|---|---|---|---|---|---|---|---|---|---|---|---|---|---|
| 0 | 4 | 19 | 23 | 33 | 37 | 50 | 54 | 73 | 77 | 90 | 94 | 104 | 108 | 123 | 127 |
| 1 | 5 | 18 | 22 | 32 | 36 | 51 | 55 | 72 | 76 | 91 | 95 | 105 | 109 | 122 | 126 |
| 2 | 6 | 17 | 21 | 35 | 39 | 48 | 52 | 75 | 79 | 88 | 92 | 106 | 110 | 121 | 125 |
| 3 | 7 | 16 | 20 | 34 | 38 | 49 | 53 | 74 | 78 | 89 | 93 | 107 | 111 | 120 | 124 |
| 9 | 13 | 26 | 30 | 40 | 44 | 59 | 63 | 64 | 68 | 83 | 87 | 97 | 101 | 114 | 118 |

TABLE 23-continued

| 8  | 12 | 27 | 31 | 41 | 45 | 58 | 62 | 65 | 69 | 82 | 86 | 96 | 100 | 115 | 119 |
| 11 | 15 | 24 | 28 | 42 | 46 | 57 | 61 | 66 | 70 | 81 | 85 | 99 | 103 | 112 | 116 |
| 10 | 14 | 25 | 29 | 43 | 47 | 56 | 60 | 67 | 71 | 80 | 84 | 98 | 102 | 113 | 117 |

TABLE 24

| 0  | 4  | 19 | 23 | 33 | 37 | 50 | 54 | 73 | 77 | 90 | 94 | 104 | 108 | 123 | 127 |
| 1  | 5  | 18 | 22 | 32 | 36 | 51 | 55 | 72 | 76 | 91 | 95 | 105 | 109 | 122 | 126 |
| 2  | 6  | 16 | 20 | 35 | 39 | 49 | 53 | 75 | 79 | 89 | 93 | 106 | 110 | 120 | 124 |
| 3  | 7  | 17 | 21 | 34 | 38 | 48 | 52 | 74 | 78 | 88 | 92 | 107 | 111 | 121 | 125 |
| 9  | 13 | 26 | 30 | 40 | 44 | 59 | 63 | 64 | 68 | 83 | 87 | 97  | 101 | 114 | 118 |
| 8  | 12 | 27 | 31 | 41 | 45 | 58 | 62 | 65 | 69 | 82 | 86 | 96  | 100 | 115 | 119 |
| 11 | 15 | 25 | 29 | 42 | 46 | 56 | 60 | 66 | 70 | 80 | 84 | 99  | 103 | 113 | 117 |
| 10 | 14 | 24 | 28 | 43 | 47 | 57 | 61 | 67 | 71 | 81 | 85 | 98  | 102 | 112 | 116 |

32 target data streams are generated through block interleaving, and inner-code encoding is performed on each target symbol subset in the 32 target data streams, where an information bit length of the inner-code encoding is 160 bits. Specifically, an inner-code encoder separately encodes and adds redundancy to a total of 160 bits of each target symbol subset in the target data stream, to obtain 32 encoded data streams. In an embodiment, inner-code encoding is performed by using Hamming(170,160), and 10-bit redundancy is added to a total of 160 bits in 16 consecutive RS symbols in each target data stream, to obtain a 170-bit codeword. In another embodiment, inner-code encoding is performed by using BCH(176,160), and 16-bit redundancy is added to a total of 160 bits in 16 consecutive RS symbols in each target data stream, to obtain a 176-bit codeword. After data processing is performed on inner-code encoded data streams, data processed data streams are sent to a channel transmission medium for transmission.

After the data processing is performed on the inner-code encoded data streams, the data processed data streams are sent to the channel transmission medium for transmission. The data processing may include modulation and mapping, channel interleaving, polarization distribution, DSP framing, and the like. For example, the inner-code encoded data streams may be interleaved, so as to improve a capability of a system to resist a burst error.

By using the data interleaving and encoding scheme in this embodiment, when Hamming(170,160) is used as inner code, concatenated code of KP4 RS(544,514)+Hamming (170,160) in the scheme is under AWGN, a corresponding pre-FEC BER for implementing a post-FEC bit error rate BER of 1E-15 is approximately 4.3E-3, and performance approximates to optimal performance of the concatenated FEC scheme. When the inner code uses BCH(176,160), concatenated code of KP4 RS(544,514)+BCH(176,160) in the scheme is under AWGN, a corresponding pre-FEC BER for implementing a post-FEC bit error rate BER of 1E-15 is approximately 8.3E-3, and performance approximates to optimal performance of the concatenated FEC scheme.

FIG. 42 is another schematic flowchart of interleaving according to an embodiment of this application.

Block 4201: Perform first block interleaving on n lane data streams to obtain T first data streams.

In this embodiment, C consecutive symbols in each first data stream after first block interleaving are from at least E different codewords, T=n/K1, C is a multiple of a, and E≥K2*a. The following describes a specific implementation of first block interleaving.

FIG. 43 is a schematic diagram of an embodiment of performing first block interleaving according to an embodiment of this application. As shown in FIG. 43, n lane data streams participating in the first block interleaving include a third symbol matrix, the third symbol matrix includes symbols of n rows and A columns, A symbols in different rows in the third symbol matrix are from different lane data streams, and A is a multiple of a. The T first data streams obtained through the first block interleaving include a fourth symbol matrix, the fourth symbol matrix includes T rows and C columns of symbols, C symbols in different rows in the fourth symbol matrix are respectively from different first data streams, T is a divisor of n, and n*A=T*C. Specifically, every T consecutive symbols in one column of the third symbol matrix are a symbol submatrix, and T symbols in each column of the fourth symbol matrix are in one-to-one correspondence with each symbol submatrix in the third symbol matrix.

In an embodiment, symbol submatrices in the third symbol matrix are arranged in a first sequence, a $1^{st}$ row to an $n^{th}$ row of each column in the third symbol matrix include a $1^{st}$ symbol submatrix to an $(n/T)^{th}$ symbol submatrix that are arranged in the first sequence, an $(n/T)^{th}$ symbol submatrix in a former column and the $1^{st}$ symbol submatrix in a latter column of two adjacent columns of the third symbol matrix are two consecutive symbol submatrices arranged in the first sequence, T symbols in a $1^{st}$ column of the fourth symbol matrix are from a $1^{st}$ symbol submatrix that is arranged in the first sequence and that is in the third symbol matrix, and the rest can be deduced by analogy until T symbols in a $C^{th}$ column in the fourth symbol matrix are from a last symbol submatrix that is arranged in the first sequence and that is in the third symbol matrix. That is, mapping of symbol submatrices of all columns in the third symbol matrix to the fourth symbol matrix is performed from top to bottom in each column and from left to right sequentially, that is, mapping is performed first from top to bottom and then from left to right.

In another embodiment, symbol submatrices in the third symbol matrix are arranged in a second sequence, a $1^{st}$ column to an $A^{th}$ row of every T rows in the third symbol matrix include a $1^{st}$ symbol submatrix to an $A^{th}$ symbol submatrix that are arranged in the second sequence, an $A^{th}$ symbol submatrix in first T rows and a $1^{st}$ symbol submatrix in second T rows of two consecutive T rows of the third symbol matrix are two consecutive symbol submatrices arranged in the second sequence, T symbols in a $1^{st}$ column of the fourth symbol matrix are from a $1^{st}$ symbol submatrix that is arranged in the second sequence and that is in the third symbol matrix, and the rest can be deduced by analogy until T symbols in a $C^{th}$ column in the fourth symbol matrix are from a last symbol submatrix that is arranged in the second sequence and that is in the third symbol matrix. That is, mapping of symbol submatrices of a total of n/T rows in the third symbol matrix to the fourth symbol matrix is performed from left to right in a same row and from top to bottom sequentially, that is, mapping is performed first from left to right and then from top to bottom.

It should be noted that, in actual application, the third symbol matrix and the fourth symbol matrix may alternatively not be presented in a form of matrices. For example, the third symbol matrix is presented as a third symbol set, and the third symbol set includes n*A symbol subsets that respectively correspond to symbols of n rows and A columns in the third symbol matrix. The fourth symbol matrix is presented as a fourth symbol set, and the fourth symbol set includes T*C symbol subsets that respectively correspond to symbols in T rows and C columns in the fourth symbol matrix.

Block 4202: Perform convolutional interleaving on the T first data streams to obtain T second data streams.

In this embodiment, H consecutive symbols in each of the second data streams are from at least F different codewords, F≥E, and at most K1/K2 symbols in the H consecutive symbols in each of the second data streams are from a same codeword.

It should be noted that an embodiment of the convolutional interleaving in this embodiment is similar to the second convolutional interleaving manner described in the embodiment shown in FIG. 10, and details are not described herein again. A difference lies in that each storage unit in the embodiment shown in FIG. 10 is configured to store d symbols, and each storage unit in this embodiment is configured to store C symbols. In an embodiment, if the convolution interleaver shown in FIG. 12(*a*) is used, a parameter of the convolution interleaver is to satisfy that C(p*Q+1)≥a*N*K1/(n/k2), so that H=p*C consecutive symbols in the first data stream output by the convolution interleaver are from at least F different outer-code codewords, where N is a codeword length of outer-code encoding. In another embodiment, if the convolution interleaver shown in FIG. 12(*b*) is used, a parameter of the convolution interleaver is to satisfy that C(p*Q−1)≥a*N*K1/(n/k2), so that H=p*C consecutive symbols in the first data stream output by the convolution interleaver are from at least F different outer-code codewords, where N is a codeword length of outer-code encoding.

Block 4203: Perform second block interleaving on each of the T second data streams to obtain S target data streams, so as to obtain a total of m target data streams.

Figure 44A:
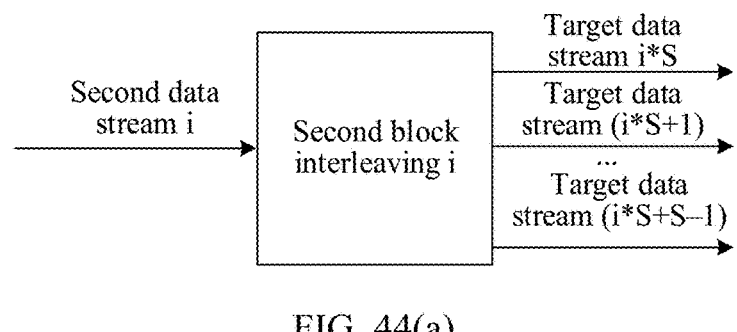
FIG. 44(*a*) is a schematic diagram of an embodiment of performing second block interleaving according to an embodiment of this application.
Figure 44B:
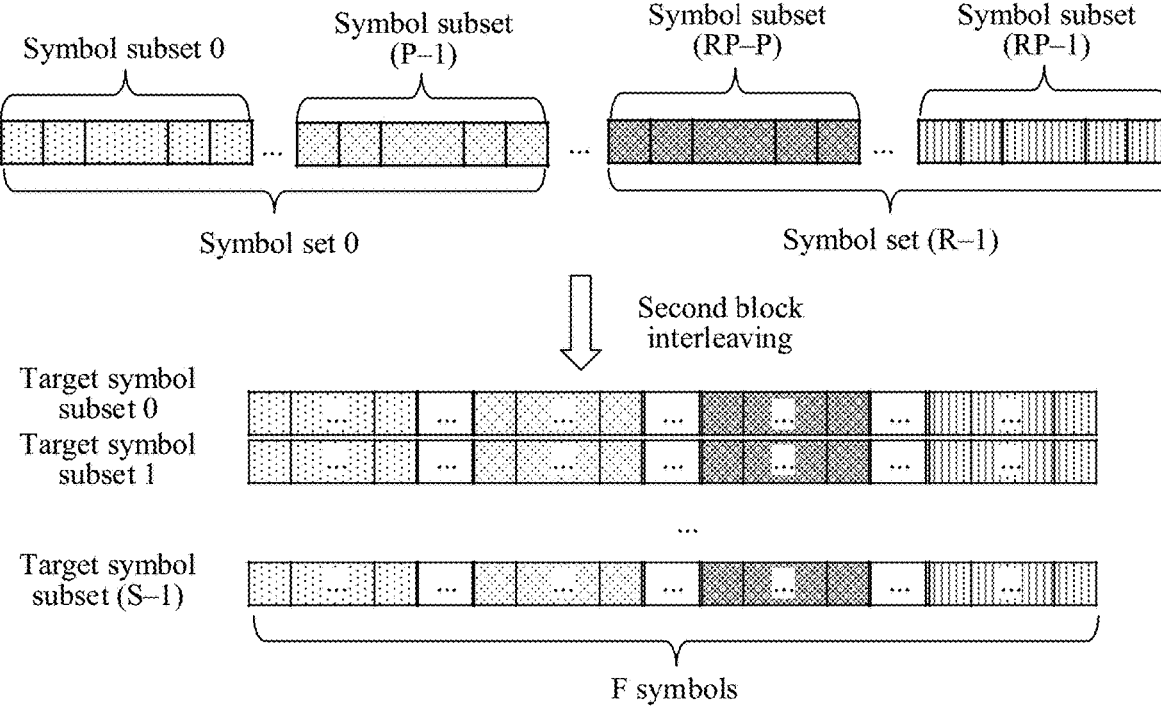

In this embodiment, m=T*S, and S≥k1/K2. The following describes a specific implementation of the second block interleaving. FIG. 44(*a*) is a schematic diagram of an embodiment of performing second block interleaving according to an embodiment of this application. As shown in FIG. 44(*a*), each second block interleaver performs block interleaving on an input second data stream to obtain S target data streams, so that a total of m=T*S target data streams are generated.

FIG. 44(*b*) is a schematic diagram of a specific implementation of performing second block interleaving according to an embodiment of this application. As shown in FIG. 44(*b*), each second data stream includes R symbol sets, each symbol set includes p symbol subsets, each symbol subset includes C symbols, the p symbol subsets are respectively output from p delay lines, symbols in each symbol set are from at least F different codewords, each target data stream includes F symbols, R*p*C=S*F, and R is an integer greater than or equal to. In other words, the second block interleaving is performed on the R symbol sets output from p delay lines, of the convolution interleaver, on which polling is performed for R times, to obtain the S target data streams. It should be understood that one block interleaving operation is performed to obtain only F consecutive symbols in the target data stream, and the target data stream is obtained through consecutive block interleaving. The F consecutive symbols in the target data stream are represented as a target symbol subset. Every F consecutive symbols in the target data stream are from at least $\lceil F/K2*a \rceil$ different symbol subsets, each of the $\lceil F/(K2*a) \rceil$ different symbol subsets has at most K2*a symbols, and $\lceil F/(K2*a) \rceil$ represents an integer obtained by rounding up a quotient of F/(K2*a). It should be further understood that, at most $\lceil F/R \rceil$ symbols in every F consecutive symbols in each target data stream are from a same symbol set, and $\lceil F/R \rceil$ represents an integer obtained by rounding up a quotient of F/R.

In an embodiment, every F consecutive symbols in the target data stream include a first group of symbols from a first symbol subset and a second group of symbols from a second symbol subset, and the first symbol subset and the second symbol subset belong to a same symbol set. The first symbol subset and the second symbol subset are respectively output from two adjacent delay lines, symbols in the first symbol subset and symbols in the second symbol subset are separately sequentially arranged, and a ranking of the first group of symbols in the first symbol subset is different from a ranking of the second group of symbols in the second symbol subset. That is, the first group of symbols and the second group of symbols have different positions in respective symbol subsets.

In another embodiment, every consecutive F symbols in the target data stream include a third group of symbols from a third symbol subset and a fourth group of symbols from a fourth symbol subset, the third symbol subset and the fourth symbol subset belong to different symbol sets, the third symbol subset and the fourth symbol subset are output from a same delay line, symbols in the third symbol subset and symbols in the fourth symbol subset are separately sequentially arranged, and a ranking of the third group of symbols in the third symbol subset is different from a ranking of the fourth group of symbols in the fourth symbol subset. That is, the third group of symbols and the fourth group of symbols have different positions in respective symbol subsets.

In the present invention, for a concatenated FEC transmission solution, a data interleaving and encoding method including first block interleaving, convolutional interleaving, second block interleaving, and encoding is designed, so that a same interleaving solution can be used for all access services, and the overall concatenated FEC solution has good performance and a low latency. Therefore, the concatenated FEC transmission solution can be applied to a plurality of transmission scenarios, and is particularly applicable to a transmission scenario that requires a low transmission latency, for example, a low-latency data center interconnection scenario.

The following further describes, with reference to some specific embodiments, a procedure of the interleaving processing method described in FIG. 42. It should be understood that an inner-code parallelism degree in each of the following embodiments is a quantity of target data streams. For example, inner-code parallelism degree 16 indicates that a quantity of target data streams is 16. It should be further understood that a target symbol subset in the following embodiments represents F consecutive symbols in the target data stream.

Embodiment 1: An information bit length of inner-code encoding is 120 bits, and an inner-code parallelism degree is 16.

A transmitter processing module performs alignment marker lock on lane data streams by using a known alignment marker of a PCS lane or an FEC lane of each service based on a type of an access service. Known alignment markers of 32 lanes are different and are related to the access service. The transmitter processing module then performs deskewing on a plurality of PCS lanes or FEC lanes in each service. After the deskewing, the plurality of PCS/FEC lanes in a same service are all AM aligned, and lane data streams between services only need to meet RS symbol alignment, that is, a difference between AMs is an integer number of RS symbols. For example, when an access service is a 2*400 GbE service, 32 de-skewed lane data streams are shown in FIG. 37. AM alignment is performed between 16 PCS lanes in each 400 GbE service, and a difference between AMs of two services is an integer number of RS symbols. Then, lane reordering is performed on data of the n=32 lanes based on the alignment markers, so that the data of the n=32 lanes can be arranged in a specified sequence. For example, when the access service is a 1*800 GbE service, 32 lane data streams are shown in FIG. 5. When the access service is a 2*400 GbE service, 32 lane data streams are shown in FIG. 6. When the access service is a 4*200 GbE service, 32 lane data streams are shown in FIG. 7. When the access service is an 8*100 GbE service and is in a "100G RS-FEC-Int" mode, 32 lane data streams are shown in FIG. 8. When the access service is an 8*100 GbE service and is in a "100G RS-FEC" mode, 32 lane data streams are shown in FIG. 9.

n=32 lane data streams on which the lane reordering is performed are sent to a designed first block interleaving module, convolutional interleaving module, and second block interleaving module for corresponding processing, and then are sent to an inner-code encoder for inner-code encoding. After data processing is performed on inner-code encoded data streams, data processed data streams are sent to a channel transmission medium for transmission. The data processing may include modulation and mapping, channel interleaving, polarization distribution, DSP framing, and the like.

In this embodiment, according to an RS distribution rule in lane data streams, the n lane data streams are divided into G lane data stream subsets, and any two lane data stream subsets are from different RS codewords. In this way, based on different access services, a quantity of lane data stream subsets included in the lane data streams is different. Refer to PCS/FEC lane data stream formats shown in FIG. 5 to FIG. 9. For example, when the access service is a 1*800 GbE service or a 2*400 GbE service, the 32 lane data streams include G=2 lane data stream subsets, to be specific, lane data streams 0 to 15 are a lane stream subset, and lane data streams 16 to 31 are a lane stream subset. For example, when the access service is a 4*200 GbE service, the 32 lane data streams include G=4 lane data stream subsets. For example, when the access service is a 1*800 GbE service, and 32 lane data streams include G=8 lane data stream subsets, the 32 lane data streams at most include $G_{max}=n/4=8$ lane data stream subsets and at least include $G_{min}=n/16=2$ lane data stream subsets. To enable the first block interleaving to be insensitive to the access service and an overall interleaving latency to be shortest, the first interleaving module corresponds to parameters $K1=G_{max}=8$ and $T=n/K1=4$.

Figure 45A:
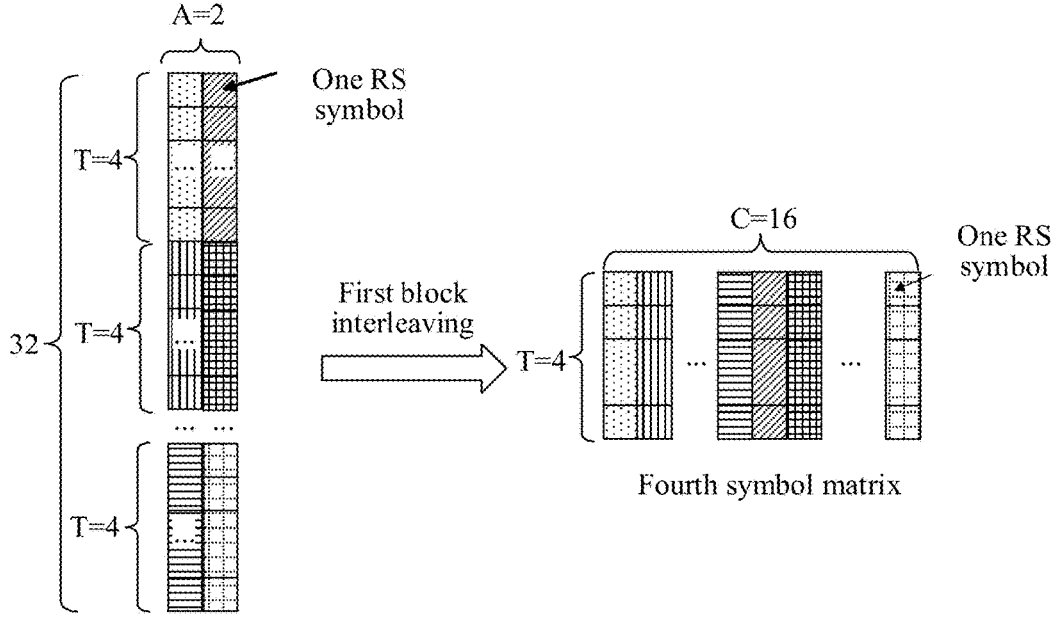
FIG. 45(*a*) is a schematic diagram of an embodiment of first block interleaving.

FIG. 45(a) is a schematic diagram of an embodiment of first block interleaving. As shown in FIG. 45(a), A=2 consecutive symbols are selected from each lane data stream to form a third symbol matrix with 32 rows and 2 columns, and block interleaving is performed to obtain a fourth symbol matrix with T=4 rows and C=16 columns. C=16 symbols in a $t^{th}$ row of the fourth symbol matrix are 16 consecutive symbols in first data stream t, where $0 \leq t < 3$. A symbol in an $i^{th}$ row and a $j^{th}$ column of the fourth symbol matrix is from an $x^{th}$ row and a $y^{th}$ column of the third symbol matrix, where that $x=j*4\% \ 32+i$ and $$y = \left\lfloor j * \frac{4}{32} \right\rfloor$$

(where $0 \leq i < 4$ and $0 \leq j < 16$) is satisfied, and $\lfloor j*4/32 \rfloor$ represents rounding down to the nearest integer of $j*4/32$. One row of the fourth symbol matrix is defined as one symbol subset. With reference to PCS/FEC lane data stream formats shown in FIG. 5 to FIG. 9, it may be learned that symbols of each symbol subset are from $K1=8$ different lane data streams, and the eight lane data streams may be represented as lane data stream $j_0$, lane data stream $j_1$, lane data stream $j_2$, lane data stream $j_3$, lane data stream $j_4$, lane data stream $j_5$, lane data stream $j_6$, lane data stream $j_7$. $\lfloor j_x/4 \rfloor = x$, where $x \in [0,7]$. $\lfloor j_x/4 \rfloor$ represents rounding down to the nearest integer of $j_x/4$, and each symbol subset is from at least $K2*a=4$ different RS codewords and from at most $K1*a=16$ different RS codewords, where $K2=G_{min}$.

Four first data streams obtained via the first block interleaving module are sent to the convolutional interleaving module, to obtain four second data streams. The convolutional interleaving module includes four convolution interleavers: convolution interleaver 0, convolution interleaver 1, convolution interleaver 2, and convolution interleaver 3. The four convolution interleavers use a same interleaving structure, and each convolution interleaver interleaves one first data stream to obtain one second data stream.

Figure 45B:
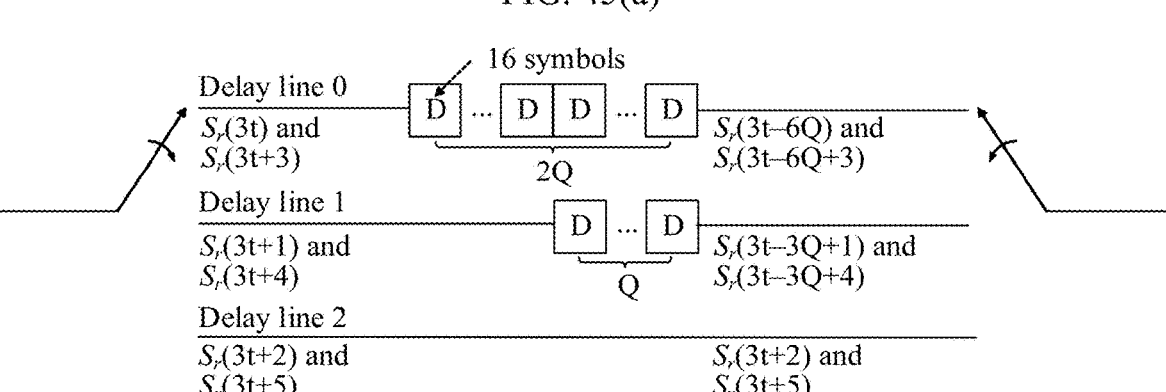

FIG. 45(b) is a schematic diagram of an embodiment of convolutional interleaving. As shown in FIG. 45(b), p=3 delay lines are included. The p=3 delay lines respectively include 2Q storage units, Q storage units, and 0 storage units. Each storage unit has d=C=16 symbols, in other words, is used to store one symbol subset that is in the first data stream. In other words, a delay value of delay line 0 is 32Q symbols, a delay value of delay line 1 is 16Q symbols, and a delay value of delay line 1 is 0 symbols, that is, no delay.

As shown in FIG. 45(b), $S_r( \ )$ represents a symbol subset in first data stream r (where $0 \leq r \leq T-1$) and includes C=16 symbols. For example, $S_r(3t)$ represents a symbol subset currently input from first data stream r to delay line 0, and $S_r(3t-6Q)$ is a symbol subset output from delay line 0; $S_r(3t+1)$ represents a symbol subset currently input from first data stream r to delay line 1, and $S_r(3t-3Q+1)$ is a symbol subset output from delay line 1; $S_r(3t+2)$ represents a symbol subset currently input from first data stream r to delay line 2, and $S_r(3t+2)$ is a symbol subset output from delay line 2; $S_r(3t+3)$ represents a symbol subset currently input from first data stream r to delay line 0, and $S_r(3t-6Q+4)$ is a symbol subset output from delay line 0; and so on. With reference to FIG. 5 and FIG. 6, it can be learned that when an access service is a 1*800 GbE service or a 2*400 GbE service, and $C(p*Q+1) \geq a*N*K1/b=544$, that is, $Q \geq 11$, three symbol subsets $S_r(3t-6Q)$, $S_r(3t-3Q+1)$, and $S_r(3t+2)$ that are consecutively output through the convolutional interleaving include 12 different RS codewords. With reference to FIG. 7 and FIG. 9, it can be learned that when an access service is a 4*200 GbE service or an 8*100 GbE service and is in a "100G RS-FEC" mode, and $C(p*2*Q+2) \geq a*N*K1/b=1088$, that is, $Q \geq 11$, three symbol subsets $S_r(3t-6Q)$, $S_r(3t-3Q+1)$, and $S_r(3t+2)$ that are consecutively output through the convolutional interleaving include 16 different RS codewords. With reference to FIG. 8, it can be learned that when an access service is an 8*100 GbE service and is in a "100G RS-FEC-int" mode, and $Q \geq 0$, three symbol subsets $S_r(3t-6Q)$, $S_r(3t-3Q+1)$, and $S_r(3t+2)$ that are consecutively output through the convolutional interleaving include 16 different RS codewords. Therefore, when $Q \geq 11$, it can be ensured that for all access services, three symbol subsets $S_r(3t-6Q)$, $S_r(3t-3Q+1)$, and $S_r(3t+2)$ that are consecutively output through the convolutional interleaving at least include 12 different RS codewords.

Figure 45C:
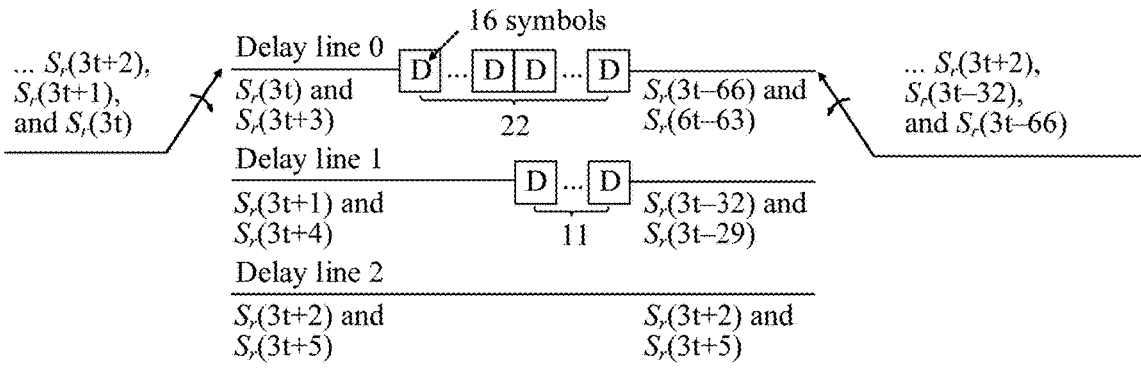

FIG. 45(c) is a schematic diagram of another embodiment of convolutional interleaving. As shown in FIG. 45(c), in an embodiment, that $Q=11$ is selected, and a corresponding interleaving latency is approximately $22*16*3/2=528$ RS symbols.

The convolution interleaver shown in FIG. 45(c) separately performs convolutional interleaving on four fourth data streams to obtain four second data streams. Three symbol subsets $S_r(3t-6Q)$, $S_r(3t-3Q+1)$, and $S_r(3t+2)$ that are respectively output from delay line 0, delay line 1, and delay line 2 of the convolution interleaver and that are in the second data stream are defined as a symbol set, and the symbol set includes a total of 48 RS symbols. 16 symbols in each symbol subset are sequentially represented as symbol 0 to symbol 15. With reference to distribution of RS codewords on PCS/FEC lanes of various services, the first block interleaving, and the convolutional interleaving in FIG. 5 to FIG. 9, it is not difficult to understand that each symbol subset is from at least four different RS codewords; and RS codewords corresponding to symbol 0 to symbol 3 are different from RS codewords corresponding to symbol 4 to symbol 7 in a same symbol subset, RS codewords corresponding to symbol 8 to symbol 11 are different from RS codewords corresponding to symbol 12 to symbol 15 in a same symbol subset, and RS codewords corresponding to symbol 0 to symbol 7 may be the same as RS codewords corresponding to symbol 8 to symbol 15 in a same symbol subset. Further, the symbol set is from at least 12 different RS codewords, and at most $K1/K2=4$ symbols in the symbol set belong to a same RS codeword. Further, RS codeword distribution corresponding to symbol 0 to symbol 7 in any two symbol subsets may be consistent, and RS codeword distribution corresponding to symbol 8 to symbol 15 in any two symbol subsets may be consistent.

Figure 45D:
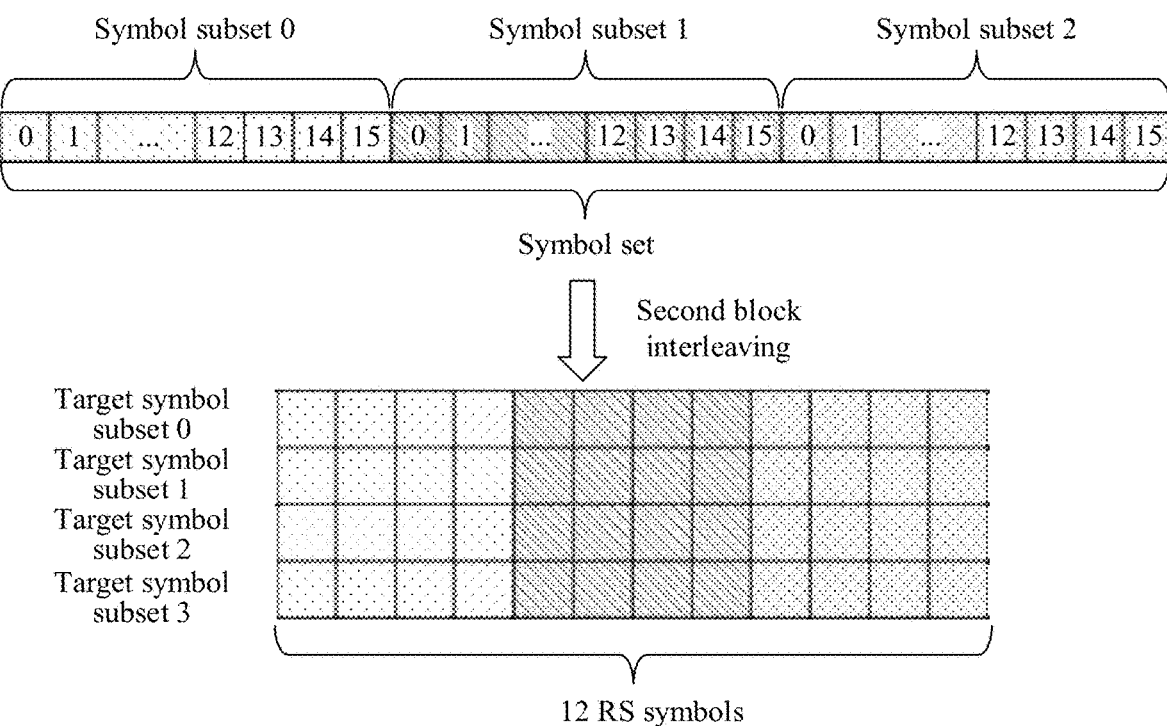

Four second block interleavers are used to separately interleave the four second data streams, to obtain $m=S*T=16$ target data streams. FIG. 45(d) is a schematic diagram of an embodiment of second block interleaving. As shown in FIG. 45(d), for second block interleaving i (where $0 \leq i < 4$), one symbol set is obtained from second data stream i, a total of 12 RS symbols (four RS symbols from each symbol subset) are selected and mapped to one target symbol subset, to obtain a total of $S=4$ target symbol subsets. 12 symbols in each target symbol subset are from 12 different RS codewords, and the four target symbol subsets are respectively 12 consecutive RS symbols from target data stream i*S to target data stream (i*S+3) that are output by block interleaver i. For ease of description, R(x, y) is defined as symbol y of symbol subset x (where $x \in [0,2]$ and $y \in [0, 15]$) For-symbols $R(x_1, y_1)$ and $R(x_2, y_2)$ respectively from any two symbol subsets, $x_1 \neq x_2$. If $y_1 \neq y_2$, it indicates that the two symbols are located at different positions of the symbol subsets. To enable the 12 RS symbols in the target symbol subset to be from 12 different RS codewords, the 12 RS symbols to correspond $R(0, i_0)$, $R(0, i_1)$, $R(0, i_2)$, $R(0, i_3)$, $R(1, i_4)$, $R(1, i_5)$, $R(1, i_6)$, $R(1, i_7)$, $R(2, i_8)$, $R(2, i_9)$, $R(2, i_{10})$, and $R(2, i_{11})$ that are in the symbol set, and meet the following cases: $i_0$, $i_4$, and $i_8$ are different from each other, $i_1$, $i_5$, and $i_8$ are different from each other, $i_2$, $i_6$, and $i_{10}$ are different from each other, $i_3$, $i_7$, and $i_{11}$ are different from each other, $i_0$, $i_2 \% 8$, $i_4$, and $i_6 \% 8$ are different from each other, $i_4$, $i_6 \% 8$, $i_8$, and $i_{12} \% 8$ are different from each other, $i_1$, $i_3 \% 8$, $i_5$, and $i_7 \% 8$ are different from each other, and $i_5$, $i_7 \% 8$, $i_9$, and $i_{11} \% 8$ are different from each other, where $i_0$, $i_4$, and $i_8 \in [0,3]$, $i_1$, $i_5$, and $i_9 \in [4,7]$, $i_2$, $i_6$, and $i_{10} \in [8,11]$, and $i_3$, $i_7$, $i_{11} \in [12,15]$. This is equivalent to a case in which the 12 RS symbols in the target symbol subset are symbols at different positions in the three symbol subsets, and every four RS symbols are from a same symbol subset. Further, the four symbols that are from the same symbol subset and that are in the target symbol subset are respectively any one of symbol 0 to symbol 3 in the symbol subset, any one of symbol 4 to symbol 7 in the symbol subset, any one of symbol 8 to symbol 11 in the symbol subset, and any one of symbol 12 to symbol 15 in the symbol subset. Further, eight RS symbols that are in the target symbol subset, that are from symbol subsets, and that are output from two delay lines whose delay difference is $Q*C=176$ are located at different positions of the corresponding symbol subsets. Further, at most two RS symbols in the target symbol subset are from a same lane data stream, and are mapped to two different symbol subsets through first block interleaving. The corresponding two symbol subsets are output from two different delay lines of the convolution interleaver, and a delay difference corresponding to the two delay lines is greater than or equal to $2*Q*C=352$ RS symbols.

According to this rule, there are a plurality of specific mappings from the symbol sets to the target symbol subset. Tables 1 to 4 provide several specific mapping relationships. Number x in a $y^{th}$ row and a $z^{th}$ column in each of Tables 1 to 4 indicates that a $z^{th}$ RS symbol in target data stream y is from a $(x \% 16)^{th}$ RS symbol in symbol subset $\lfloor x/16 \rfloor$, where $0 \leq y < 4$, $0 \leq z < 12$, and $0 \leq x < 48$. It should be noted that, when switching between any rows, switching between any columns, switching between any columns after switching between any rows, or switching between any columns before switching between any rows is performed, the foregoing mapping is still a valid mapping.

Based on a mapping relationship between each symbol subset and a lane data stream and a latency relationship between each symbol subset in the symbol set, it is not difficult to learn that a relationship between the target symbol subset and the lane data stream is as follows: Data of the target symbol subset is from $K1=8$ different lane data streams, and the eight lane data streams may be represented as lane data stream $j_0$, lane data stream $j_1$, lane data stream $j_2$, lane data stream $j_3$, lane data stream $j_4$, lane data stream $j_5$, lane data stream $j_6$, and lane data stream $j_7$. $\lfloor j_x/4 \rfloor = x$, where $x \in [0,7]$, and $\lfloor j_x/4 \rfloor$ represents rounding down to the nearest integer of $j_x/4$. Further, one RS symbol is selected from four lane data streams, and two RS symbols are selected from the remaining four lane data streams. Further, if two RS symbols are selected from a lane data stream, a spacing distance between the two RS symbols in the corresponding lane data stream is greater than a*N*K2/n, in other words, greater than or equal to 2*544*2/32=68 RS symbols. Further, at most two RS symbols are from two aligned RS symbols in two different lane data streams.

The 16 target data streams obtained through the block interleaving are separately sent to an inner-code encoder. Each target symbol subset is used as one piece of information data of inner-code encoding. The inner-code encoder generates redundant data, to obtain 16 encoded data streams. In an embodiment, inner-code encoding is performed by using Hamming(128,120), and 8-bit redundancy is added to a total of 120 bits in 12 RS symbols in each target symbol subset in the target data stream, to obtain a 128-bit codeword. In another embodiment, inner-code encoding is performed by using BCH(136,120), and 16-bit redundancy is added to a total of 120 bits in 12 RS symbols in each target symbol subset in the target data stream, to obtain a 136-bit codeword.

After data processing is performed on inner-code encoded data streams, the data processed data streams are sent to a channel transmission medium for transmission. The data processing may include modulation and mapping, channel interleaving, polarization distribution, DSP framing, and the like. For example, the inner-code encoded data streams may be interleaved, so as to improve a capability of a system to resist a burst error.

By using the data interleaving and encoding scheme in this embodiment, concatenated code of KP4 RS(544,514)+ Hamming(128,120) in the scheme is under AWGN, a corresponding pre-FEC BER for implementing a post-FEC bit error rate BER of 1E-15 is approximately 4.5E-3, and performance approximates to optimal performance of a concatenated FEC scheme.

Embodiment 2: An information bit length of inner-code encoding is 160 bits, and an inner-code parallelism degree is 16.

In this embodiment, first block interleaving is performed on n lane data streams by using the first block interleaving solution in Embodiment 1, to obtain T=4 first data streams, and then four convolution interleavers separately perform convolutional interleaving on the four first data streams to obtain four second data streams. Convolutional interleaving 0, convolutional interleaving 1, convolutional interleaving 2, and convolutional interleaving 3 use a same interleaving structure.

Figure 46A:
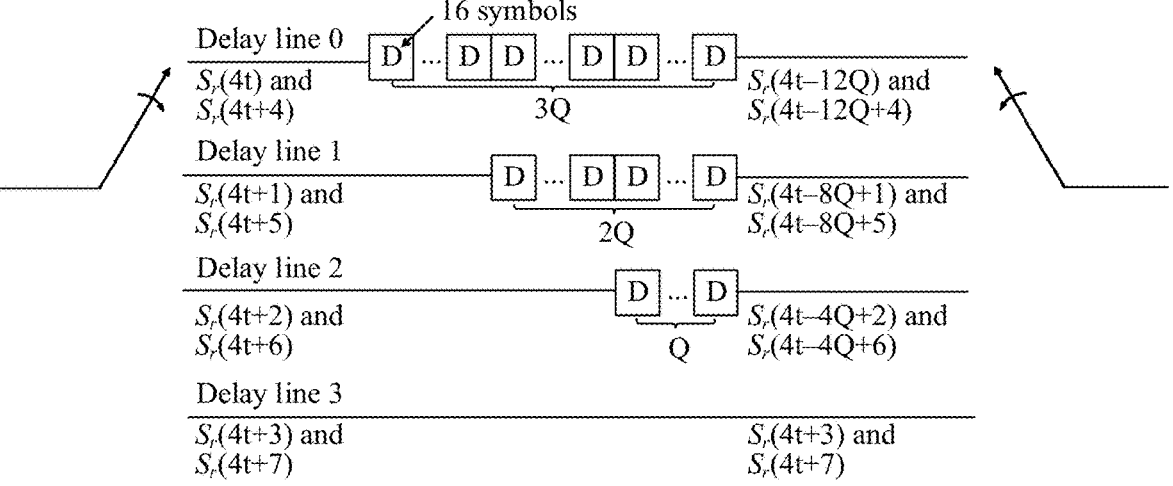
FIG. 46(*a*) is a schematic diagram of another embodiment of convolutional interleaving.
Figure 46B:
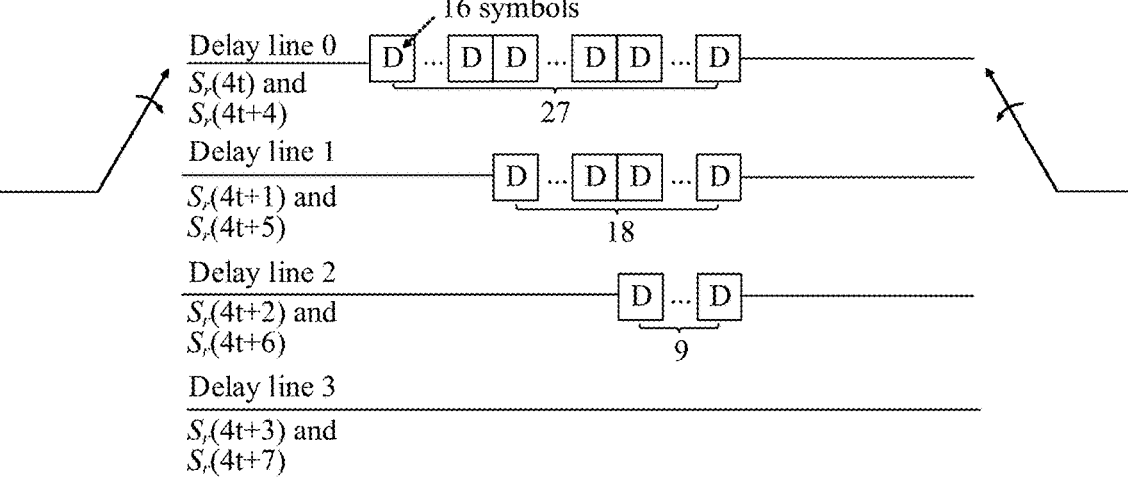

FIG. 46($a$) is a schematic diagram of another embodiment of convolutional interleaving. As shown in FIG. 46($a$), p=4 delay lines are included. The four delay lines respectively include 3Q storage units, 2Q storage units, Q storage units, and 0 storage units. Each storage unit has d=C=16 symbols, in other words, is used to store one symbol subset that is in the first data stream. In other words, a delay value of delay line 0 is 48Q symbols, a delay value of delay line 1 is 32Q symbols, a delay value of delay line 2 is 16Q symbols, and a delay value of delay line 3 is 0 symbols, that is, no delay.

As shown in FIG. 46($a$), $S_r($ $)$ represents one symbol subset in first data stream r (where $0 \le r \le T-1$). For example, $S_r(4t)$ represents a symbol subset currently input from first data stream r to delay line 0, and $S_r(4t-12Q)$ is a symbol subset output from delay line 0; $S_r(4t+1)$ represents a symbol subset currently input from first data stream r to delay line 1, and $S_r(4t-8Q+1)$ is a symbol subset output from delay line 1; $S_r(4t+2)$ represents a symbol subset currently input from first data stream r to delay line 2, and $S_r(4t-4Q+2)$ is a symbol subset output from delay line 2; $S_r(4t+3)$ represents a symbol subset currently input from first data stream r to delay line 3, and $S_r(4t+3)$ is a symbol subset output from delay line 3; $S_r(4t+4)$ represents a symbol subset that is currently input from first data stream r to delay line 0, and $S_r(4t-12Q+4)$ is a symbol subset output from delay line 0; and so on. With reference to FIG. 5 and FIG. 6, it can be learned that when an access service is a 1*800 GbE service or a 2*400 GbE service, and C(p*Q+1) $\ge 544$, that is, $Q \ge 9$, four symbol subsets $S_r(4t-12Q)$, $S_r(4t-8Q+1)$, $S_r(4t-4Q+2)$, and $S_r(4t+3)$ that are consecutively output through the convolutional interleaving include 16 different RS codewords. With reference to FIG. 7 and FIG. 9, it can be learned that when an access service is a 4*200 GbE service or an 8*100 GbE service and is in a "100G RS-FEC" mode, and C(p*2*Q+2) $\ge 1088$, that is, $Q \ge 9$, four symbol subsets $S_r(4t-12Q)$, $S_r(4t-8Q+1)$, $S_r(4t-4Q+2)$, and $S_r(4t+3)$ that are consecutively output through the convolutional interleaving include 16 different RS codewords. With reference to FIG. 8, it can be learned that when an access service is an 8*100 GbE service and is in a "100G RS-FEC-int" mode, and $Q \ge 0$, four symbol subsets $S_r(4t-12Q)$, $S_r(4t-8Q+1)$, $S_r(4t-4Q+2)$, and $S_r(4t+3)$ that are consecutively output through the convolutional interleaving include 16 different RS codewords. Therefore, when $Q \ge 9$, it can be ensured that for all access services, four symbol subsets $S_r(4t-12Q)$, $S_r(4t-8Q+1)$, $S_r(4t-4Q+2)$, and $S_r(4t+3)$ that are consecutively output through the convolutional interleaving include 16 different RS codewords.

FIG. 46($b$) is a schematic diagram of another embodiment of convolutional interleaving. As shown in FIG. 46($b$), in an embodiment, that Q=9 is selected, and a corresponding interleaving latency is approximately 27*16*3/2=648 RS symbols.

Four convolution interleavers shown in FIG. 46($b$) are used to separately perform convolutional interleaving on four fourth data streams to obtain four second data streams. Four symbol subsets $S_r(4t-12Q)$, $S_r(4t-8Q+1)$, $S_r(4t-4Q+2)$, and $S_r(4t+3)$ that are respectively output from delay line 0, delay line 1, delay line 2, and delay 3 of the convolution interleaver and that are in the second data stream are defined as a symbol set, and the symbol set includes a total of 64 RS symbols. 16 symbols in each symbol subset are sequentially represented as symbol 0 to symbol 15. With reference to distribution of RS codewords on PCS/FEC lanes of various services, the first block interleaving, and the convolutional interleaving in FIG. 5 to FIG. 9, it is not difficult to understand that each symbol subset is from at least four different RS codewords; and RS codewords corresponding to symbol 0 to symbol 3 are different from RS codewords corresponding to symbol 4 to symbol 7 in a same symbol subset, RS codewords corresponding to symbol 8 to symbol 11 are different from RS codewords corresponding to symbol 12 to symbol 15 in a same symbol subset, and RS codewords corresponding to symbol 0 to symbol 7 may be the same as RS codewords corresponding to symbol 8 to symbol 15 in a same symbol subset. Further, the symbol set is from 16 different RS codewords, and at most K1/K2=4 symbols in the symbol set belong to a same RS codeword. Further, RS codeword distribution corresponding to symbol 0 to symbol 7 in any two symbol subsets may be consistent, and RS codeword distribution corresponding to symbol 8 to symbol 15 in any two symbol subsets may be consistent.

Four second block interleavers are used to separately interleave the four second data streams, to obtain m=S*T=16 target data streams. FIG. 46($c$) is a schematic diagram of another embodiment of second block interleaving. As shown in FIG. 46($c$), for second block interleaving i (where $0 \le i < 4$), one symbol set is obtained from second data stream i, a total of 16 RS symbols (four RS symbols from each symbol subset) are selected and mapped to one target symbol subset, to obtain a total of S=4 target symbol subsets. 16 symbols in each target symbol subset are from 16 different RS codewords, and the four target symbol subsets are respectively 16 consecutive RS symbols from target data stream i*S to target data stream (i*S+3) that are output by block interleaver i. For ease of description, $R(x, y)$ is defined as symbol y of symbol subset x (where $x \in [0,3]$ and $y \in [0, 15]$). To enable the 16 RS symbols in the target symbol subset to be from 16 different RS codewords, the 16 RS symbols correspond to $R(0, i_0)$, $R(0, i_1)$, $R(0, i_2)$, $R(0, i_3)$, $R(1, i_4)$, $R(1, i_5)$ $R(1, i_6)$, $R(1, i_7)$, $R(2, i_8)$, $R(2, i_9)$, $R(2, i_{10})$, $R(2, i_{11})$, $R(3, i_{12})$, $R(3, i_{13})$, $R(3, i_{14})$, and $R(3, i_{15})$ that are in the symbol set, and meet the following cases: $i_0$, $i_4$, $i_8$, and $i_{12}$ are different from each other, $i_1$, $i_5$, $i_9$, and $i_{13}$ are different from each other, $i_2$, $i_6$, $i_{10}$, and $i_{14}$ are different from each other, $i_3$, $i_7$, $i_{11}$, and $i_{15}$ are different from each other, $i_0$, $i_2$% 8, $i_4$, and $i_6$% 8 are different from each other, $i_4$, $i_6$% 8, $i_8$, and $i_{12}$% 8 are different from each other, $i_8$, $i_{12}$% 8, $i_{14}$, and $i_{16}$% 8 are different from each other, $i_1$, $i_3$% 8, $i_5$, and $i_7$% 8 are different from each other, $i_5$, $i_7$% 8, $i_9$, and $i_{11}$% 8 are different from each other, and $i_9$, $i_{11}$% 8, $i_{13}$, and $i_{15}$% 8 are different from each other, where $i_0$, $i_4$, $i_8$, and $i_{12} \in [0,3]$, $i_1$, $i_5$, $i_9$, and $i_{13} \in [4,7]$, $i_2$, $i_6$, $i_{10}$, and $i_{14} \in [8,11]$, and $i_3$, $i_7$, $i_{11}$, and $i_{15} \in [12,15]$. This is equivalent to a case in which the 16 RS symbols in the target symbol subset are symbols at different positions in the four symbol subsets, and every four RS symbols are from a same symbol subset. Further, the four symbols that are from the same symbol subset and that are in the target symbol subset are respectively any one of symbol 0 to symbol 3 in the symbol subset, any one of symbol 4 to symbol 7 in the symbol subset, any one of symbol 8 to symbol 11 in the symbol subset, and any one of symbol 12 to symbol 15 in the symbol subset. Further, eight RS symbols, in the target symbol subset, from symbol subsets output from two delay lines whose delay difference is Q*C=144 are located at different positions of the corresponding symbol subsets. Further, at most two RS symbols in the target symbol subset are from a same lane data stream, and are mapped to two different symbol subsets through first block interleaving. The corresponding two symbol subsets are output from two different delay lines of the convolution interleaver, and a delay difference corresponding to the two delay lines is greater than or equal to 2*Q*C=288 RS symbols.

According to this rule, there are a plurality of specific mappings from the symbol sets to the target symbol subset. Tables 13 to 16 provide several specific mapping relationships. Number x in a $y^{th}$ row and a $z^{th}$ column in each table indicates that a $z^{th}$ RS symbol in target symbol subset y is from a $(x \% 16)^{th}$ RS symbol in symbol subset $\lfloor x/16 \rfloor$, where $0 \le y < 4$, $0 \le z < 16$, and $0 \le x < 64$. It should be noted that, when switching between any rows, switching between any columns, switching between any columns after switching between any rows, or switching between any columns before switching between any rows is performed, the foregoing mapping is still a valid mapping.

According to a mapping relationship between each symbol subset and a lane data stream and a latency relationship between each symbol subset in the symbol set, it is not difficult to learn that a relationship between data in the target symbol subset and the lane data stream is as follows: Data of the target symbol subset is from K1=8 different lane data streams, and the eight lane data streams may be represented as lane data stream $j_0$, lane data stream $j_1$, lane data stream $j_2$, lane data stream $j_3$, lane data stream $j_4$, lane data stream $j_5$, lane data stream $j_6$, and lane data stream $j_7$. $\lfloor j_x/4 \rfloor$=x, where $x \in [0,7]$, and $\lfloor j_x/4 \rfloor$ represents rounding down to the nearest integer of $j_x/4$. Further, if two RS symbols are selected from each lane data stream, a spacing distance between the two RS symbols in the corresponding lane data stream is greater than or equal to a*N*K2/n, in other words, greater than or equal to 2*544*2/32=68 RS symbols. Further, at most two RS symbols are from two aligned RS symbols in two different lane data streams.

The 16 target data streams obtained through the block interleaving are separately sent to an inner-code encoder. Each target symbol subset is used as one piece of information data of inner-code encoding. The inner-code encoder generates redundant data, to obtain 16 encoded data streams. In an embodiment, inner-code encoding is performed by using Hamming(170,160), and 10-bit redundancy is added to a total of 160 bits in 16 RS symbols in each target symbol subset, to obtain a 170-bit codeword. In another embodiment, inner-code encoding is performed by using BCH(176, 160), and 16-bit redundancy is added to a total of 160 bits in 16 RS symbols in each target symbol subset, to obtain a 176-bit codeword. After data processing is performed on inner-code encoded data streams, the data processed data streams are sent to a channel transmission medium for transmission.

By using the data interleaving and encoding scheme in this embodiment, when Hamming(170,160) is used as inner code, concatenated code of KP4 RS(544,514)+Hamming (170,160) in the scheme is under AWGN, a corresponding pre-FEC BER for implementing a post-FEC bit error rate BER of 1E-15 is approximately 4.3E-3, and performance approximates to optimal performance of the concatenated FEC scheme. When the inner code uses BCH(176,160), concatenated code of KP4 RS(544,514)+BCH(176,160) in the scheme is under AWGN, a corresponding pre-FEC BER for implementing a post-FEC bit error rate BER of 1E-15 is approximately 8.3E-3, and performance approximates to optimal performance of the concatenated FEC scheme.

Embodiment 3: An information bit length of inner-code encoding is 120 bits, and an inner-code parallelism degree is 32.

In this embodiment, first block interleaving is performed on n lane data streams by using the first block interleaving solution in Embodiment 1, to obtain T=4 first data streams, and then convolution interleavers shown in FIG. 45(c) separately perform convolutional interleaving on the four first data streams to obtain four second data streams. Three symbol subsets $S_r(3t-6Q)$, $S_r(3t-3Q+1)$, and $S_r(3t+2)$ that are respectively output from delay line 0, delay line 1, and delay line 2 of the convolution interleaver and that are in the second data stream are defined as a symbol set. Consecutive Q=2 symbol sets are selected from each second data stream, and are marked as symbol set 0 and symbol set 1. The symbol sets include a total of six symbol subsets: symbol subset 0, symbol subset 1, symbol subset 2, symbol subset 3, symbol subset 4, and symbol subset 5. In second block interleaving i (where $0 \le i < 4$), block interleaving is performed on two consecutive symbol sets in second data stream i to obtain eight target symbol subsets. Each target symbol subset includes 12 RS symbols, and the eight target symbol subsets are respectively 12 consecutive RS symbols from target data stream i*S to target data stream (i*S+7) that are output by block interleaver i, and each RS symbol in the target symbol subset is from a different RS codeword. With reference to distribution of RS codewords on PCS/FEC lanes of various services, the first block interleaving, and the convolutional interleaving in FIG. 5 to FIG. 9, it is not difficult to understand that each symbol subset is from at least four different RS codewords; and RS codewords corresponding to symbol 0 to symbol 3 are different from RS codewords corresponding to symbol 4 to symbol 7 in a same symbol subset, RS codewords corresponding to symbol 8 to symbol 11 are different from RS codewords corresponding to symbol 12 to symbol 15 in a same symbol subset, and RS codewords corresponding to symbol 0 to symbol 7 may be the same as RS codewords corresponding to symbol 8 to symbol 15 in a same symbol subset. Further, RS codeword distribution corresponding to symbol 0 to symbol 7 in any two symbol subsets may be consistent, and RS codeword distribution corresponding to symbol 8 to symbol 15 in any two symbol subsets may be consistent. Further, each symbol set is from at least 12 different RS codewords, at most four symbols in the symbol set belong to a same RS codeword, and RS codeword distribution in symbol set 0 and RS codeword distribution in symbol set 1 are consistent.

Figures 46C, 47:
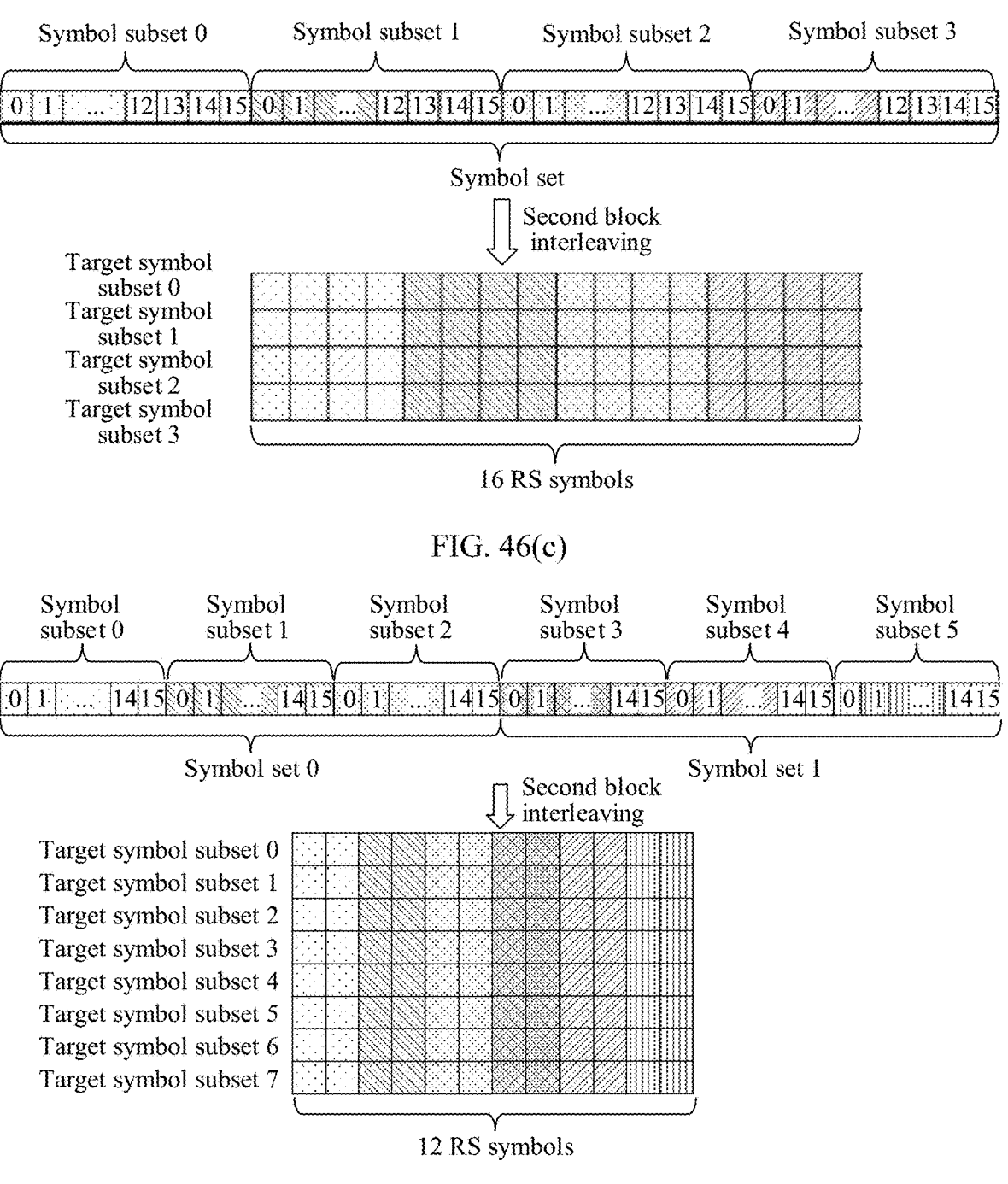
FIG. 47 is a schematic diagram of another embodiment of second block interleaving.

FIG. 47 is a schematic diagram of another embodiment of second block interleaving. As shown in FIG. 47, a total of 12 RS symbols (two RS symbols from each symbol subset) are selected and mapped to one target symbol subset, to obtain a total of eight target symbol subsets. For ease of description, $R(x, y)$ is defined as symbol y of symbol subset x (where $x \in [0,5]$ and $y \in [0,15]$). To enable the 12 RS symbols in the target symbol subset to be from 12 different RS codewords, the 12 RS symbols correspond to $R(0, i_0)$, $R(0, i_1)$, $R(1, i_2)$, $R(1, i_3)$, $R(2, i_4)$, and $R(2, i_5)$, and $R(3, i_6)$, $R(3, i_7)$, $R(4, i_8)$, $R(4, i_9)$, $R(5, i_{10})$, and $R(5, i_{11})$ that are in two symbol sets, and meet the following cases: $i_0$, $i_1$, $i_2$, $i_3$, $i_4$, $i_5$, $i_6$, $i_7$, $i_8$, $i_9$, $i_{10}$, and $i_{11}$ are different from each other, $i_0\%$ 8, $i_1\%$ 8, $i_2\%$ 8, and $i_3\%$ 8 are different from each other, $i_2\%$ 8, $i_3\%$ 8, $i_4\%$ 8, and $i_5\%$ 8 are different from each other, $i_6\%$ 8, $i_7\%$ 8, $i_8\%$ 8, and $i_9\%$ 8 are different from each other, $i_8\%$ 8, $i_9\%$ 8, $i_{10}\%$ 8, and $i_{11}\%$ 8 are different from each other, $i_0\%$ 8, $i_1\%$ 8, $i_6\%$ 8, and $i_7\%$ 8 are different from each other, $i_2\%$ 8, $i_3\%$ 8, $i_8\%$ 8, and $i_9\%$ 8 are different from each other, and $i_4\%$ 8, $i_5\%$ 8, $i_{10}\%$ 8, and $i_{11}\%$ 8 are different from each other, where $i_0$, $i_1$, $i_2$, $i_3$, $i_4$, $i_5$, $i_6$, $i_7$, $i_8$, $i_9$, $i_{10}$, and $i_{11} \in [0,15]$. This is equivalent to a case in which the 12 RS symbols in the target symbol subset are symbols at different positions in the six symbol subsets, and every two RS symbols are from a same symbol subset. Further, four RS symbols that are in the target symbol subset, that are from symbol subsets, and that are output from two delay lines whose delay difference is $Q*C=176$ are located at different positions of corresponding symbol subsets. Further, four RS symbols that are in the target symbol subset, that are from two symbol subsets, and that are output from a same delay line of a convolution interleaver are located at different positions of the corresponding symbol subsets. Further, at most two RS symbols in the target symbol subset are from a same lane data stream, and are mapped to two different symbol subsets through first block interleaving. The corresponding two symbol subsets are output from two different delay lines of the convolution interleaver, and a delay difference corresponding to the two delay lines is greater than or equal to $2*Q*C=352$ RS symbols. According to this rule, there are a plurality of specific mappings in which the two symbol sets are interleaved to the eight target symbol subsets. Tables 5 to 12 provide several specific mapping relationships. Number x in a $y^{th}$ row and a $z^{th}$ column in each table indicates that a $z^{th}$ RS symbol in target symbol subset y is from a $(x \% 16)^{th}$ RS symbol in symbol subset $\lfloor x/16 \rfloor$, where $0 \le y < 8$, $0 \le z < 12$, and $0 \le x < 96$. It should be noted that, when switching between any rows, switching between any columns, interleaving between any columns after switching between any rows, or switching between any columns before switching between any rows in the tables is performed, the foregoing mapping is still a valid mapping.

Based on a mapping relationship between each symbol subset and a lane data stream and a latency relationship between each symbol subset in the symbol set, it is not difficult to learn that a relationship between the target symbol subset and the lane data stream is as follows: Data of the target symbol subset is from $K1=8$ different lane data streams, and the eight lane data streams may be represented as lane data stream $j_0$, lane data stream $j_1$, lane data stream $j_2$, lane data stream $j_3$, lane data stream $j_4$, lane data stream $j_5$, lane data stream $j_6$, and lane data stream $j_7$. $\lfloor j_x/4 \rfloor = x$, where $x \in [0,7]$, and $\lfloor j_x/4 \rfloor$ represents rounding down to the nearest integer of $j_x/4$. Further, one RS symbol is selected from four lane data streams, and two RS symbols are selected from the remaining four lane data streams. Further, if two RS symbols are selected from a lane data stream, a spacing distance between the two RS symbols in the corresponding lane data stream is greater than or equal to $2*544*2/32=68$ RS symbols. Further, at most two RS symbols are from two aligned RS symbols in two different lane data streams.

The 32 target symbol subsets obtained through the block interleaving are separately sent to an inner-code encoder. Each target symbol subset is used as one piece of information data of inner-code encoding. The inner-code encoder generates redundant data, to obtain 32 encoded data streams. In an embodiment, inner-code encoding is performed by using Hamming(128,120), and 8-bit redundancy is added to a total of 120 bits in 12 RS symbols in the target symbol subset, to obtain a 128-bit codeword. In another embodiment, inner-code encoding is performed by using BCH(136, 120), and 16-bit redundancy is added to a total of 120 bits in 12 RS symbols in the target symbol subset, to obtain a 136-bit codeword.

After data processing is performed on inner-code encoded data streams, the data processed data streams are sent to a channel transmission medium for transmission. The data processing may include modulation and mapping, channel interleaving, polarization distribution, DSP framing, and the like. For example, the inner-code encoded data streams may be interleaved, so as to improve a capability of a system to resist a burst error.

Embodiment 4: An information bit length of inner-code encoding is 160 bits, and an inner-code parallelism degree is 32.

First block interleaving is performed on n lane data streams by using the first block interleaving solution in Embodiment 1, to obtain $T=4$ first data streams, and convolution interleavers shown in FIG. 46(*b*) separately perform convolutional interleaving on the four fourth data streams to obtain four second data streams. Four symbol subsets $S_r(4t-12Q)$, $S_r(4t-8Q+1)$, $S_r(4t-4Q+2)$, and $S_r(4t+3)$ that are respectively output from delay line 0, delay line 1, delay line 2, and delay 3 of the convolution interleaver and that are in the second data stream are defined as a symbol set, and the symbol set includes a total of 64 RS symbols. In second block interleaving i (where $0 \le i < 4$), block interleaving is performed on two consecutive symbol sets in second data stream i to obtain eight target symbol subsets. Each target symbol subset includes 16 RS symbols, and the eight target symbol subsets are respectively 16 consecutive RS symbols from target data stream $i*S$ to target data stream $(i*S+7)$ that are output by block interleaver i, and each RS symbol in the target symbol subset is from a different RS codeword. With reference to distribution of RS codewords on PCS/FEC lanes of various services, the first block interleaving, and the convolutional interleaving in FIG. 5 to FIG. 9, it is not difficult to understand that each symbol subset is from at least four different RS codewords; and RS codewords corresponding to symbol 0 to symbol 3 are different from RS codewords corresponding to symbol 4 to symbol 7 in a same symbol subset, RS codewords corresponding to symbol 8 to symbol 11 are different from RS codewords corresponding to symbol 12 to symbol 15 in a same symbol subset, and RS codewords corresponding to symbol 0 to symbol 7 may be the same as RS codewords corresponding to symbol 8 to symbol 15 in a same symbol subset. Further, RS codeword distribution corresponding to symbol 0 to symbol 7 in any two symbol subsets may be consistent, and RS codeword distribution corresponding to symbol 8 to symbol 15 in any two symbol subsets may be consistent. Further, each symbol set is from at least 12 different RS codewords, at most four symbols in the symbol set belong to a same RS codeword, and RS codeword distribution in symbol set 0 and RS codeword distribution in symbol set 1 are consistent.

Figure 48:
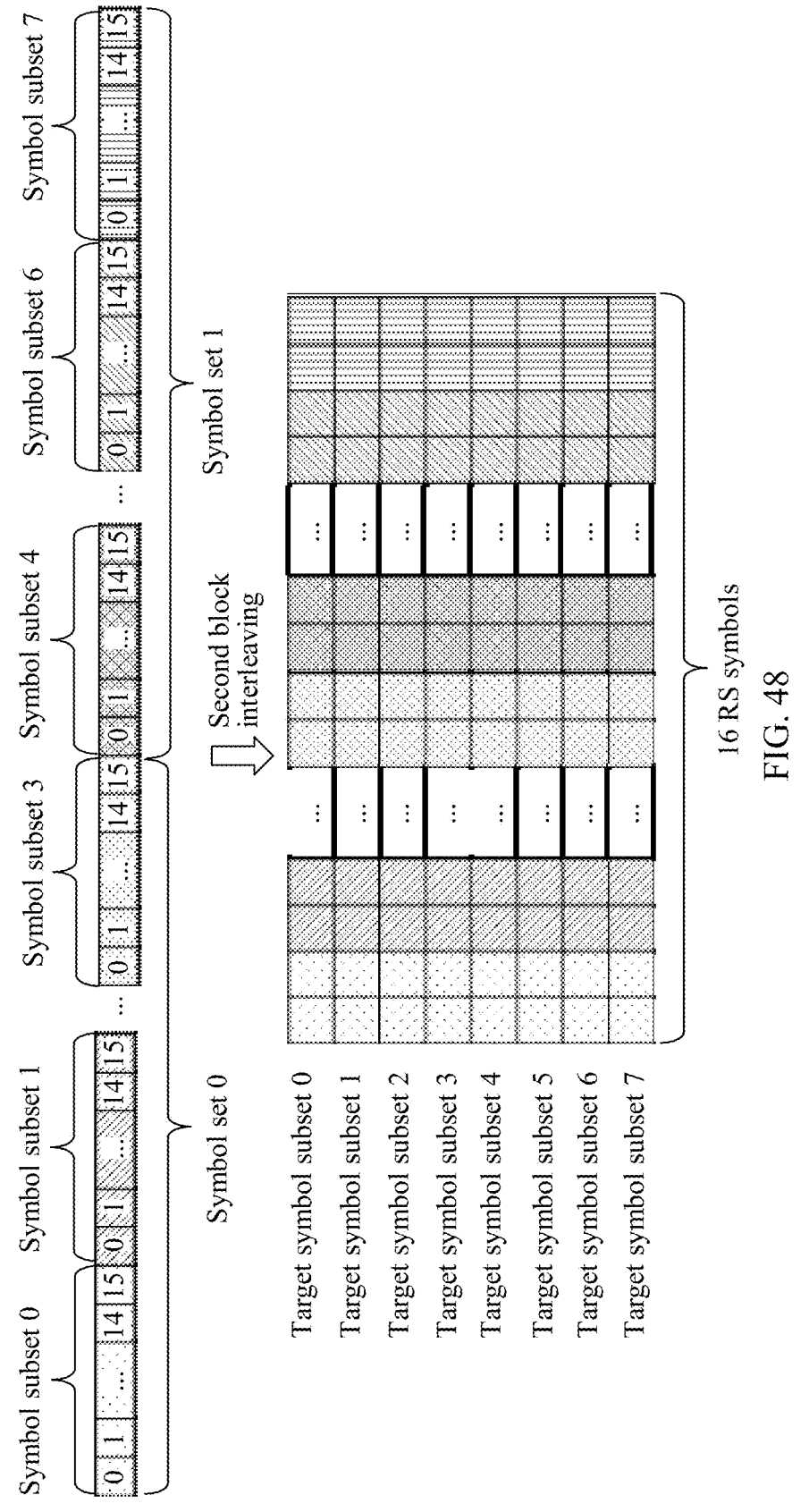
FIG. 48 is a schematic diagram of another embodiment of second block interleaving.

FIG. 48 is a schematic diagram of another embodiment of second block interleaving. As shown in FIG. 48, a total of 16 RS symbols (two RS symbols from each symbol subset) are selected and mapped to one target symbol subset, to obtain a total of eight target symbol subsets. For ease of description, R(x, y) is defined as symbol y of symbol subset x (where $x \in [0,7]$ and $y \in [0,15]$). To enable the 16 RS symbols in the target symbol subset to be from 16 different RS codewords, the 16 RS symbols correspond to $R(0, i_0)$, $R(0, i_1)$, $R(1, i_2)$, $R(1, i_3)$, $R(2, i_4)$, $R(2, i_5)$, $R(3, i_6)$, $R(3, i_7)$, $R(4, i_8)$, $R(4, i_9)$, and $R(5, i_{10})$ and $R(5, i_{11})$, $R(6, i_{12})$, $R(6, i_{13})$, $R(7, i_{14})$, and $R(7, i_{15})$ that are in two symbol sets, and meet the following cases: $i_0$, $i_1$, $i_2$, $i_3$, $i_4$, $i_5$, $i_6$, $i_7$, $i_8$, $i_9$, $i_{10}$, $i_{11}$, $i_{12}$, $i_{13}$, $i_{14}$, and $i_{15}$ are different from each other, $i_0\% 8$, $i_1\% 8$, $i_2\% 8$, and $i_3\% 8$ are different from each other, $i_2\% 8$, $i_3\% 8$, $i_4\% 8$, and $i_5\% 8$ are different from each other, $i_4\% 8$, $i_5\% 8$, $i_6\% 8$, and $i_7\% 8$ are different from each other, $i_8\% 8$, $i_9\% 8$, $i_{10}\% 8$, and $i_{11}\% 8$ are different from each other, $i_{10}\% 8$, $i_{11}\% 8$, $i_{12}\% 8$, and $i_{13}\% 8$ are different from each other, $i_{12}\% 8$, $i_{13}\% 8$, $i_{14}\% 8$, and $i_{15}\% 8$ are different from each other, $i_0\% 8$, $i_1\% 8$, $i_8\% 8$, and $i_9\% 8$ are different from each other, $i_2\% 8$, $i_3\% 8$, $i_{10}\% 8$, and $i_{11}\% 8$ are different from each other, $i_4\% 8$, $i_5\% 8$, $i_{12}\% 8$, and $i_{13}\% 8$ are different from each other, and $i_6\% 8$, $i_7\% 8$, $i_{14}\% 8$, and $i_{15}\% 8$ are different from each other, where $i_0$, $i_1$, $i_2$, $i_3$, $i_4$, $i_5$, $i_6$, $i_7$, $i_8$, $i_9$, $i_{10}$, $i_{11}$, $i_{12}$, $i_{13}$, $i_{14}$, and $i_{15} \in [0,15]$. This is equivalent to a case in which the 16 RS symbols in the target symbol subset are symbols at different positions in the eight symbol subsets, and every two RS symbols are from a same symbol subset. Further, four RS symbols that are in the target symbol subset, that are from symbol subsets, and that are output from two delay lines whose delay difference is $Q*C=144$ are located at different positions of corresponding symbol subsets. Further, four RS symbols that are in the target symbol subset, that are from two symbol subsets, and that are output from a same delay line of a convolution interleaver are located at different positions of the corresponding symbol subsets. Further, at most two RS symbols in the target symbol subset are from a same lane data stream, and are mapped to two different symbol subsets through first block interleaving. The corresponding two symbol subsets are output from two different delay lines of the convolution interleaver, and a delay difference corresponding to the two delay lines is greater than or equal to $2*Q*C=288$ RS symbols. According to this rule, there are a plurality of specific mappings in which the two symbol sets are interleaved to the eight target symbol subsets. Tables 17 to 24 provide several specific mapping relationships. Number x in a $y^{th}$ row and a $z^{th}$ column in each table indicates that a $z^{th}$ RS symbol in target symbol subset y is from a $(x \% 16)^{th}$ RS symbol in symbol subset $\lfloor x/16 \rfloor$, where $0 \le y < 8$, $0 \le z < 16$, and $0 \le x < 128$. It should be noted that, when interleaving between any rows, switching between any columns, switching between any columns after switching between any rows, or switching between any columns before switching between any rows is performed, the foregoing mapping is still a valid mapping.

According to a mapping relationship between each symbol subset and a lane data stream and a latency relationship between each symbol subset in the symbol set, it is not difficult to learn that a relationship between the target symbol subset and the lane data stream is as follows: Data of the target symbol subset is from K1=8 different lane data streams, and the eight lane data streams may be represented as lane data stream $j_0$, lane data stream $j_1$, lane data stream $j_2$, lane data stream $j_3$, lane data stream $j_4$, lane data stream $j_5$, lane data stream $j_6$, and lane data stream $j_7$. $\lfloor j_x/4 \rfloor = x$, where $x \in [0,7]$, and $\lfloor j_x/4 \rfloor$ represents rounding down to the nearest integer of $j_x/4$. Further, if two RS symbols are selected from each lane data stream, a spacing distance between the two RS symbols in the corresponding lane data stream is greater than or equal to $a*N*K2/n$, in other words, greater than or equal to $2*544*2/32=68$ RS symbols. Further, at most two RS symbols are from two aligned RS symbols in two different lane data streams.

The 32 target symbol subsets obtained through the block interleaving are respectively sent to 32 inner-code encoders. Each target symbol subset is used as one piece of information data of inner-code encoding. The inner-code encoders generate redundant data, to obtain 32 encoded data streams. In an embodiment, inner-code encoding is performed by using Hamming(170,160), and 10-bit redundancy is added to a total of 160 bits in 16 RS symbols in the target symbol subset, to obtain a 170-bit codeword. In another embodiment, inner-code encoding is performed by using BCH(176, 160), and 16-bit redundancy is added to a total of 160 bits in 16 RS symbols in the target symbol subset, to obtain a 176-bit codeword. After data processing is performed on inner-code encoded data streams, the data processed data streams are sent to a channel transmission medium for transmission.

By using the data interleaving and encoding scheme in this embodiment, when Hamming(170,160) is used as inner code, concatenated code of KP4RS(544,514)+Hamming (170,160) in the scheme is under AWGN, a corresponding pre-FEC BER for implementing a post-FEC bit error rate BER of 1E-15 is approximately 4.3E-3, and performance approximates to optimal performance of the concatenated FEC scheme. When the inner code uses BCH(176,160), concatenated code of KP4 RS(544,514)+BCH(176,160) in the scheme is under AWGN, a corresponding pre-FEC BER for implementing a post-FEC bit error rate BER of 1E-15 is approximately 8.3E-3, and performance approximates to optimal performance of the concatenated FEC scheme.

Embodiment 5: An information bit length of inner-code encoding is 120 bits, and an inner-code parallelism degree is 16.

It should be understood that, in Embodiment 1 to Embodiment 4, if a mapping relationship between a third symbol matrix and a fourth symbol matrix in first block interleaving is changed, an RS codeword symbol distribution rule in symbol subsets is changed, and therefore a relationship between symbol sets and a target symbol subset in second block interleaving is affected. Embodiment 5 provides specific implementations of a new first block interleaving solution and corresponding second block interleaving.

Figure 49:
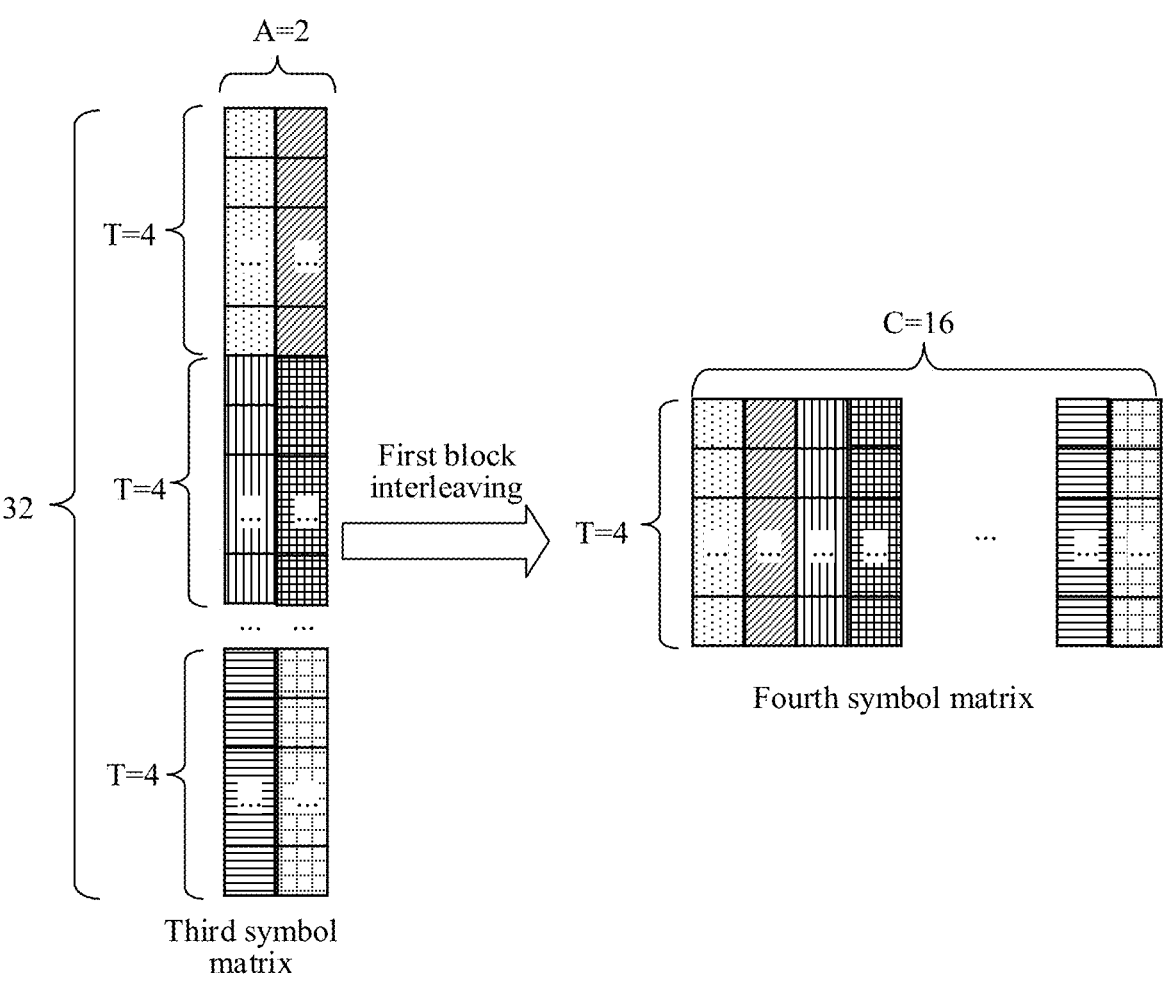
FIG. 49 is a schematic diagram of another embodiment of first block interleaving.

FIG. 49 is a schematic diagram of another embodiment of first block interleaving. As shown in FIG. 49, a symbol in an $i^{th}$ row and a $j^{th}$ column of a fourth symbol matrix is from an $x^{th}$ row and a $y^{th}$ column of a third symbol matrix, where that $$x = (j\%2)*4 + i \text{ and } y = \left\lfloor \frac{j}{2} \right\rfloor$$

(where $0 \le i < 4$ and $0 \le j < 16$) is satisfied, and $$\left\lfloor \frac{j}{2} \right\rfloor$$

represents rounding down to the nearest integer of $$\frac{j}{2}.$$

One row of the fourth symbol matrix is defined as one symbol subset, and four symbol subsets obtained through interleaving are 16 consecutive RS symbols on T=4 first data streams that are output through the first block interleaving. With reference to PCS/FEC lane data stream formats shown in FIG. 5 to FIG. 9, it may be learned that symbols of each symbol subset are from eight different lane data streams, and the eight lane data streams may be represented as lane data stream $j_0$, lane data stream $j_1$, lane data stream $j_2$, lane data stream $j_3$, lane data stream $j_4$, lane data stream $j_5$, lane data stream $j_6$, lane data stream $j_7$. $\lfloor j_x/4 \rfloor = x$, where $x \in [0,7]$, and $\lfloor j_x/4 \rfloor$ represents rounding down to the nearest integer of $j_x/4$. The symbols of each symbol subset are symbols from at least four different RS codewords.

The four first data streams are obtained through first block processing shown in FIG. 49, and then four second data streams are obtained through the convolutional interleaving shown in FIG. 45(c). Three symbol subsets $S_r(3t-6Q)$, $S_r(3t-3Q+1)$, and $S_r(3t+2)$ that are respectively output from delay line 0, delay line 1, and delay line 2 of the convolution interleaver and that are in the second data stream are defined as a symbol set, and the symbol set includes a total of 48 RS symbols. With reference to distribution of RS codewords on PCS/FEC lanes of various services, the first block interleaving, and the convolutional interleaving in FIG. 5 to FIG. 9, the following cases can be learned: It is not difficult to understand that each symbol subset is from at least four different RS codewords; and RS codewords corresponding to symbol 0 to symbol 7 are different from RS codewords corresponding to symbol 8 to symbol 15 in a same symbol subset. Further, RS codeword distribution corresponding to symbol 0 to symbol 7 in any two symbol subsets may be consistent, and RS codeword distribution corresponding to symbol 8 to symbol 15 in any two symbol subsets may be consistent. Further, the symbol set is from at least 12 different RS codewords, and at most four symbols in the symbol set belong to a same RS codeword.

Therefore, the block interleaving structure shown in FIG. 45(d) may be used to obtain one symbol set from the second data stream, a total of 12 RS symbols (four RS symbols from each symbol subset) are selected and mapped to one target symbol subset, to obtain four target symbol subsets in total.

The four target symbol subsets are respectively 12 consecutive RS symbols in four target symbol subsets output by a block interleaver. This is equivalent to a case in which each block interleaver outputs S=4 target symbol subsets. For ease of description, R(x, y) is defined as symbol y of symbol subset x (where $x \in [0,2]$ and $y \in [0,15]$). To enable the 12 RS symbols in the target symbol subset to be from 12 different RS codewords, the 12 RS symbols correspond to R(0, $i_0$), R(0, $i_1$), R(0, $i_2$), R(0, $i_3$), R(1, $i_4$), R(1, $i_5$), R(1, $i_6$), R(1, $i_7$), R(2, $i_8$), R(2, $i_9$), R(2, $i_{10}$), and R(2, $i_{11}$) that are in the symbol set, and meet the following cases: $i_0$, $i_1$, $i_4$, $i_5$, $i_8$, and $i_9$ are different from each other, $i_2$, $i_3$, $i_6$, $i_7$, $i_{10}$, and $i_{11}$ are different from each other, $i_0$, $i_1$, $i_4$, $i_5$, $i_8$, and $i_9 \in [0,7]$, and $i_2$, $i_3$, $i_6$, $i_7$, $i_{10}$, and $i_{11} \in [8,15]$. This is equivalent to a case in which the 12 RS symbols in the target symbol subset are symbols at different positions in the three symbol subsets; every four symbols are from a same symbol subset, two RS symbols thereof are from symbol 0 to symbol 7 in the same symbol subset, and the other two RS symbols are from symbol 8 to symbol 15 in the same symbol subset. Further, eight RS symbols that are in the target symbol subset, that are from symbol subsets, and that are output from two delay lines whose delay difference is Q*d=176 are located at different positions of the corresponding symbol subsets. Further, at most two RS symbols in the target symbol subset are from a same lane data stream, and are mapped to two different symbol subsets through the first block interleaving. The corresponding two symbol subsets are output from two different delay lines of two convolution interleavers, and a delay difference corresponding to the two delay lines is greater than or equal to 136 RS symbols. According to this rule, there are a plurality of specific mappings from the symbol sets to the target symbol subset. Tables 25 to 28 provide several specific mapping relationships. Number x in a $y^{th}$ row and a $z^{th}$ column in each of Tables 25 to 28 indicates that a $z^{th}$ RS symbol in target symbol subset y is from a (x % 16)$^{th}$ RS symbol in symbol subset $\lfloor x/16 \rfloor$, where $0 \le y < 4$, $0 \le z < 12$, and $0 \le x < 48$. It should be noted that, when switching between any rows, switching between any columns, switching between any columns after switching between any rows, or switching between any columns before switching between any rows is performed, the foregoing mapping is still a valid mapping.

Based on a mapping relationship between each symbol subset and a lane data stream and a latency relationship between each symbol subset in the symbol set, it is not difficult to learn that a relationship between the target symbol subset and the lane data stream is as follows: Data of the target symbol subset is from K1=8 different lane data streams, and the eight lane data streams may be represented as lane data stream $j_0$, lane data stream $j_1$, lane data stream $j_2$, lane data stream $j_3$, lane data stream $j_4$, lane data stream $j_5$, lane data stream $j_6$, and lane data stream $j_7$. $\lfloor j_x/4 \rfloor = x$, where $x \in [0,7]$, and $\lfloor j_x/4 \rfloor$ represents rounding down to the nearest integer of $j_x/4$. Further, one RS symbol is selected from four lane data streams, and two RS symbols are selected from the remaining four lane data streams. Further, if two RS symbols are selected from a lane data stream, a spacing distance between the two RS symbols in the corresponding lane data stream is greater than a*N*K2/n, in other words, greater than or equal to 2*544*2/32=68 RS symbols. Further, at most two RS symbols are from two aligned RS symbols in two different lane data streams.

TABLE 25

| 0 | 3 | 8 | 11 | 20 | 23 | 28 | 31 | 34 | 33 | 42 | 41 |
|---|---|---|----|----|----|----|----|----|----|----|----|
| 2 | 1 | 10 | 9 | 22 | 21 | 30 | 29 | 32 | 35 | 40 | 43 |
| 4 | 7 | 12 | 15 | 16 | 19 | 24 | 27 | 38 | 37 | 46 | 45 |
| 6 | 5 | 14 | 13 | 18 | 17 | 26 | 25 | 36 | 39 | 44 | 47 |

TABLE 26

| 0 | 3 | 8 | 11 | 20 | 23 | 28 | 31 | 34 | 33 | 42 | 41 |
|---|---|---|----|----|----|----|----|----|----|----|----|
| 2 | 1 | 10 | 9 | 22 | 21 | 30 | 29 | 32 | 35 | 40 | 43 |
| 4 | 7 | 12 | 15 | 18 | 17 | 26 | 25 | 38 | 37 | 46 | 45 |
| 6 | 5 | 14 | 13 | 16 | 19 | 24 | 27 | 36 | 39 | 44 | 47 |

TABLE 27

| 0 | 3 | 8 | 11 | 22 | 21 | 30 | 29 | 34 | 33 | 42 | 41 |
|---|---|---|----|----|----|----|----|----|----|----|----|
| 2 | 1 | 10 | 9 | 20 | 23 | 28 | 31 | 32 | 35 | 40 | 43 |
| 4 | 7 | 12 | 15 | 18 | 17 | 26 | 25 | 38 | 37 | 46 | 45 |
| 6 | 5 | 14 | 13 | 16 | 19 | 24 | 27 | 36 | 39 | 44 | 47 |

TABLE 28

| 0 | 3 | 8 | 11 | 22 | 21 | 30 | 29 | 34 | 33 | 42 | 41 |
|---|---|---|----|----|----|----|----|----|----|----|----|
| 2 | 1 | 10 | 9 | 20 | 23 | 28 | 31 | 32 | 35 | 40 | 43 |
| 4 | 7 | 12 | 15 | 16 | 19 | 24 | 27 | 38 | 37 | 46 | 45 |
| 6 | 5 | 14 | 13 | 18 | 17 | 26 | 25 | 36 | 39 | 44 | 47 |

The 16 target data streams obtained through the block interleaving are separately sent to an inner-code encoder. Each target symbol subset is used as one piece of information data of inner-code encoding. The inner-code encoder generates redundant data, to obtain 16 encoded data streams. In an embodiment, inner-code encoding is performed by using Hamming(128,120), and 8-bit redundancy is added to a total of 120 bits in 12 RS symbols in each target symbol subset in the target data stream, to obtain a 128-bit codeword. In another embodiment, inner-code encoding is performed by using BCH(136,120), and 16-bit redundancy is added to a total of 120 bits in 12 RS symbols in each target symbol subset in the target data stream, to obtain a 136-bit codeword.

After data processing is performed on inner-code encoded data streams, the data processed data streams are sent to a channel transmission medium for transmission. The data processing may include modulation and mapping, channel interleaving, polarization distribution, DSP framing, and the like. For example, the inner-code encoded data streams may be interleaved, so as to improve a capability of a system to resist a burst error.

Figure 50A:
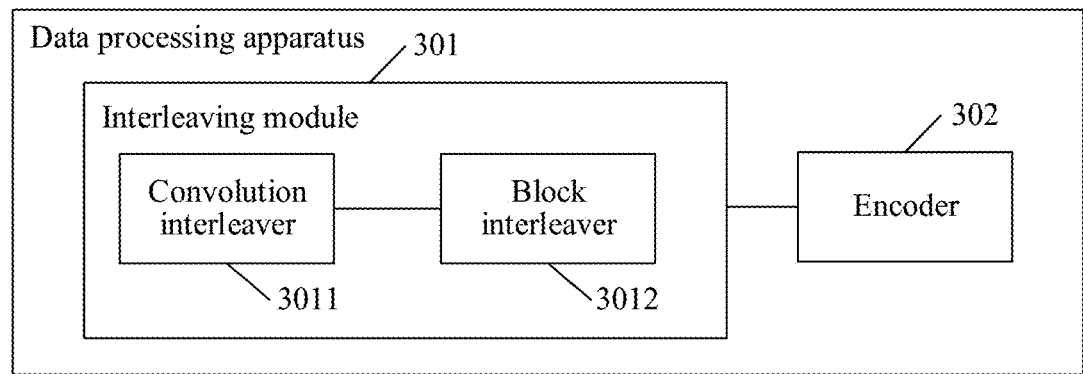
FIG. 50(*a*) is a schematic diagram of another structure of a data processing apparatus according to an embodiment of this application.

By using the data interleaving and encoding scheme in this embodiment, concatenated code of KP4 RS(544,514)+Hamming(128,120) in the scheme is under AWGN, a corresponding pre-FEC BER for implementing a post-FEC bit error rate BER of 1E-15 is approximately 4.5E-3, and performance approximates to optimal performance of a concatenated FEC scheme. FIG. 50(a) is a schematic diagram of another structure of a data processing apparatus according to an embodiment of this application. As shown in FIG. 50(a), the data processing apparatus includes an interleaving module 301 and an encoder 302. The interleaving module 301 is configured to perform an operation that is in the foregoing data processing method and that is of performing interleaving on n lane data streams to obtain m target data streams. The encoder 302 is configured to perform an operation of separately performing second FEC encoding on the m target data streams to obtain encoded data streams in the foregoing data processing method. Specifically, the interleaving module 301 includes a convolution interleaver 3011 and a block interleaver 3012. The convolution interleaver 3011 is configured to perform block 3401 in the embodiment shown in FIG. 34, and the block interleaver 3012 is configured to perform block 3402 in the embodiment shown in FIG. 34.

Figure 50B:
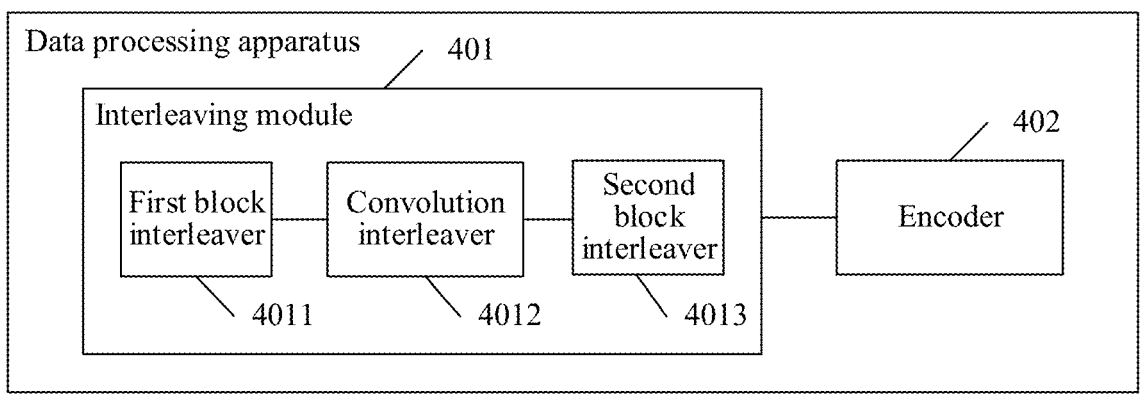

FIG. 50(b) is a schematic diagram of another structure of a data processing apparatus according to an embodiment of this application. As shown in FIG. 50(b), the data processing apparatus includes an interleaving module 401 and an encoder 402. The interleaving module 401 is configured to perform an operation that is in the foregoing data processing method and that is of performing interleaving on n lane data streams to obtain m target data streams. The encoder 402 is configured to perform an operation of separately performing second FEC encoding on the m target data streams to obtain encoded data streams in the foregoing data processing method. Specifically, the interleaving module 401 includes a first block interleaver 4011, a convolution interleaver 4012, and a second block interleaver 4013. The first block interleaver 4011 is configured to perform block 4201 in the embodiment shown in FIG. 42, the convolution interleaver 4012 is configured to perform block 4202 in the embodiment shown in FIG. 42, and the second block interleaver 4013 is configured to perform block 4203 in the embodiment shown in FIG. 42.

It should be understood that the apparatus provided in this application may alternatively be implemented in another manner. For example, the unit division in the foregoing apparatus is merely logical function division and may be other division in actual implementation. For example, a plurality of units or components may be combined or integrated into another system. In addition, functional units in embodiments of this application may be integrated into one processing unit, or may be independent physical units, or two or more functional units are integrated into one processing unit. The integrated unit may be implemented in a form of hardware, or may be implemented in a form of a software functional unit.

It should be noted that, in addition to the data processing method described in the foregoing embodiments, this application further provides another data processing method. The following describes the method in detail.

Figure 51:
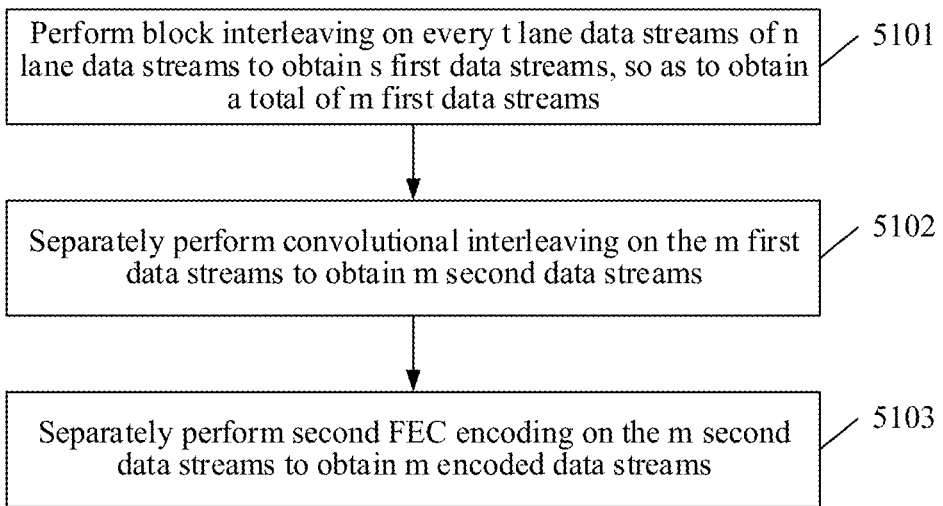
FIG. 51 is another schematic flowchart of a data processing method according to an embodiment of this application.

FIG. 51 is another schematic flowchart of a data processing method according to an embodiment of this application.

Block 5101: Perform block interleaving on every t lane data streams of n lane data streams to obtain s first data streams, so as to obtain a total of m first data streams.

In this embodiment, the lane data stream may be a PCS lane data stream or an FEC lane data stream. This is not specifically limited herein. All the n lane data streams are data streams obtained through first FEC encoding, namely, the foregoing outer-code encoded data streams, where n is an integer greater than 1. For example, RS code may be used in the outer-code encoding, and the n outer-code encoded data streams may include a plurality of RS codewords. In actual application, another encoding scheme may be used to perform the outer-code encoding. For ease of description, the following uses an RS codeword to represent a codeword generated through the outer-code encoding. It should be understood that every a codewords obtained through the outer-code encoding are distributed in b lane data streams, where a≤b≤n, n can be exactly divided by b, and a is an integer greater than or equal to 1. In different application scenarios shown in FIG. 5 to FIG. 9, values of a and b may also be different. The application scenario shown in FIG. 5 is used as an example, and n=32, a=2, and b=16, in other words, every two codewords are distributed in 16 lane data streams. Values of a and b in application scenarios in FIG. 6 to FIG. 9 may be deduced with reference to the accompanying drawings, and details are not described herein again. It should be noted that, in this application, a code length of outer code is measured in symbols, and the symbol may include one or more bits. For example, the outer code is KP4 RS(544,514) code that is used, the code length is N=544 symbols, and one symbol includes 10 bits.

Specifically, the n lane data streams may be divided into q groups, and each group includes t lane data streams, where q is an integer greater than or equal to 1, and n can be exactly divided by q. Correspondingly, the m first data streams obtained through the block interleaving may also be divided into q groups, and each group includes s first data streams. That is, n=q*t, and m=q*s. After block interleaving is performed on t lane data streams in each group, a corresponding group of s first data streams are obtained.

Figure 52:
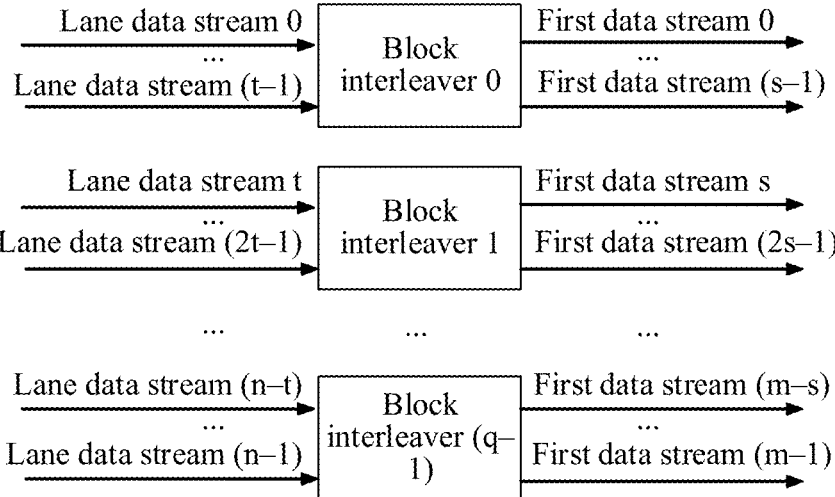
FIG. 52 is a schematic diagram of a structure in which block interleaving is performed on n lane data streams according to an embodiment of this application.

FIG. 52 is a schematic diagram of a structure in which block interleaving is performed on n lane data streams according to an embodiment of this application. As shown in FIG. 52, in an example, q block interleavers perform the block interleaving on the n lane data streams, and interleaver i obtains first data stream i*s to first data stream [(i+1)*s−1] through block interleaving on lane data stream i*t to lane data stream [(i+1)*t−1], where 0≤i<q.

Every a consecutive symbols in each lane data stream are from a different codewords, every L1 consecutive symbols in each lane data stream are from at least a different codewords, L1=N*a/b, and N represents a codeword length obtained by performing outer-code encoding. In this case, t lane data streams in any group are used as an example. First, a consecutive symbols are selected from each lane data stream to obtain a total of t*a symbols, and then any 4 bits are selected from each of the t*a symbols to obtain a total of D=Δ*t*a bits. The D bits are mapped to D consecutive bits in any first data stream obtained through block interleaving. Δ=M/s, and M represents a quantity of bits included in one symbol. For ease of description, the following uses M=10 as an example for description.

It should be noted that every d consecutive symbols in each first data stream obtained through block interleaving are from v different codewords, and every L2 consecutive symbols in each first data stream are from at least v different codewords. v can be exactly divided by a, d=D/M, and L2=t/s*L1.

In an embodiment, when sending device 01 sends a 1*800GE service, according to "Ethernet Technology Consortium 800G Specification" defined by the Ethernet Technology Consortium, RS-FEC of transmitter device 01 uses KP4 RS(544,514) code, which is referred to as outer code, and a plurality of RSs are allocated to 32 virtual PCS lanes. Specifically, as shown in FIG. 5, every 68 consecutive symbols in each of PCS lane data streams 0 to 15 or PCS lane data streams 16 to 31 form a total of 16*68=1088 symbols, where two RS codewords are included. a=2 adjacent symbols in each PCS lane data stream are from different RS codewords, two symbols at same positions in two adjacent PCS lane data streams are from different RS codewords, and every L1=68 consecutive symbols are from at least a=2 different RS codewords. The 32 PCS lane data streams are multiplexed and then sent to a transmitter processing module through a lane attachment unit interface AUI. It should be noted that 1088 symbols of two RS codewords are distributed in 16 lane data streams, and 68 symbols in the 1088 symbols are 68 consecutive symbols that are in one lane data stream. When L1=68 consecutive symbols in one lane data stream are from, for example, two dashed boxes in FIG. 5, the 68 symbols are from three or four different RS codewords. For brief description, in the following specification, the foregoing case is briefly expressed as: Every consecutive L1 symbols in each lane data stream are from a different codewords.

Based on the schematic diagram of data processing of the transmitter processing module shown in FIG. 3(h), a PMA unit of the transmitter processing module restores 32 PCS lane data streams by performing de-mux on the lane attachment unit interface AUI. Then, alignment marker lock on the lane data streams is performed by using known alignment markers of PCS lanes. Known alignment markers of 32 lanes are different (refer to "Ethernet Technology Consortium 800G Specification"). Then, lane reordering is performed on the n=32 PCS lane data streams based on the alignment markers, so that data of the n=32 PCS lanes can be arranged in a specified sequence. A specific arrangement manner is that a total of 16 lane data streams (lane data stream 2*i (where 0≤i<16)) are from same RS codewords, and a total of 16 lane data streams (lane data stream (2*i+1) (where 0≤i<16)) are from same RS codewords.

In another embodiment, when sending device 01 sends a 1*800GE service, based on the schematic diagram of data processing of the transmitter processing module shown in FIG. 3(h), a PMA unit of the transmitter processing module restores 32 PCS lane data streams by performing de-mux on data received through the lane attachment unit interface AUI. Then, alignment marker lock on the lane data streams is performed by using known alignment markers of PCS lanes. Known alignment markers of 32 lanes are different (refer to "Ethernet Technology Consortium 800G Specification"). Then, the transmitter processing module then performs lane reordering on data of the n=32 lanes based on the alignment markers, so that the n=32 lane data streams can be arranged in a specified sequence. A specific arrangement manner is that a total of 16 lane data streams (lane data streams 0 to 15) are from same RS codewords, and a total of 16 lane data streams (lane data streams 16 to 31) are from same RS codewords. It should be noted that the foregoing "a total of 16 lane data streams (lane data streams 0 to 15) are from same RS codewords" may be understood with reference to FIG. 5. More specifically, a total of 544 symbols (34 symbols in each of lane data streams 0 to 15) are from a same RS codeword; and a total of 1088 symbols (68 consecutive symbols in each of lane data streams 0 to 15) are from two RS codewords. Similarly, a total of 544 symbols (34 symbols in each of lane data streams 16 to 31) are from a same RS codeword; and a total of 1088 symbols (68 consecutive symbols in each of lane data streams 16 to 31) are from two other RS codewords. For brief description, in this application, the foregoing case is briefly expressed as follows: A total of 16 lane data streams (lane data stream 0 to lane data stream 15) in the 32 lane data streams are from same codewords, a total of 16 lane data streams (lane data stream 16 to lane data stream 31) in the 32 lane data streams are from same codewords, and lane data stream 0 to lane data stream 15 and lane data stream 16 to lane data stream 31 are from different codewords.

The following describes a specific implementation of several block interleaving.

Implementation 1: That n=32 is used as an example, 16 lane data streams in odd-numbered lanes of the 32 lane data streams are from same codewords, 16 lane data streams in even-numbered lanes of the 32 lane data streams are from same codewords, and data streams in odd-numbered lanes and data streams in even-numbered lanes are from different codewords. That is, a total of 16 lane data streams (stream 2*i) are from the same codewords, and a total of 16 lane data streams (stream (2*i+1)) are from the same codewords, where $0 \leq i < 16$.

Figure 53:
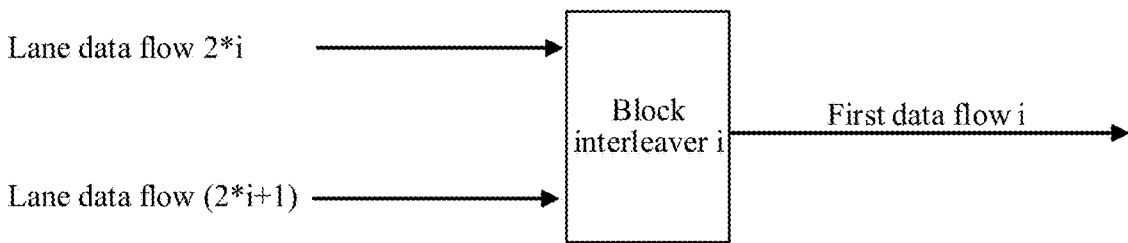
FIG. 53 is a schematic diagram of an application scenario of block interleaving according to an embodiment of this application.

FIG. 53 is a schematic diagram of an application scenario of block interleaving according to an embodiment of this application. One block interleaver shown in FIG. 53 is used to perform the block interleaving on two lane data streams to obtain one first data stream. A total of 16 block interleavers shown in FIG. 53 need to be used for block interleaving. Specifically, block interleaver i performs block interleaving on a $(2*i)^{th}$ lane data stream and a $(2*i+1)^{th}$ lane data stream to obtain one first data stream, so that a total of m=16 first data streams are obtained, where $0 \leq i < 16$. A specific mapping manner in the block interleaving is as follows: A total of four symbols (a=2 symbols from each of lane data stream 2*i and lane data stream (2*i+1)) are selected, and then are mapped to D=40 consecutive bits, namely, d=4 symbols, in first data stream i in any sequence. In one first data stream obtained through the block interleaving, every d=4 consecutive symbols are from v=4 different codewords, and every L2=136 consecutive symbols are from v=4 different codewords.

In one manner, 20 consecutive bits in each of lane data stream 2*i and lane data stream (2*i+1) are output through polling based on β bits, to obtain d=4 consecutive symbols that are in the first data stream. Specifically, if D=40 consecutive bits in the first data stream obtained through one block interleaving operation are represented as b0 to b39, mapping, of the outputting through polling based on the β bits, may be represented as follows: A $j^{th}$ bit in the 40 consecutive bits in the first data stream is from a $$\left( \left\lfloor \left\lfloor \frac{j}{\beta} \right\rfloor / 2 \right\rfloor * \beta + j \% \beta \right)^{th}$$

bit in 20 consecutive bits in a $$\left( 2 * i + \left\lfloor \frac{j}{\beta} \right\rfloor \% 2 \right)^{th}$$

lane data stream, where β may be a divisor of 20, in other words, β=1, 2, 4, 5, 10, or 20, and $\lfloor x \rfloor$ represents rounding down, where $0 \leq j < 40$.

Figure 54:
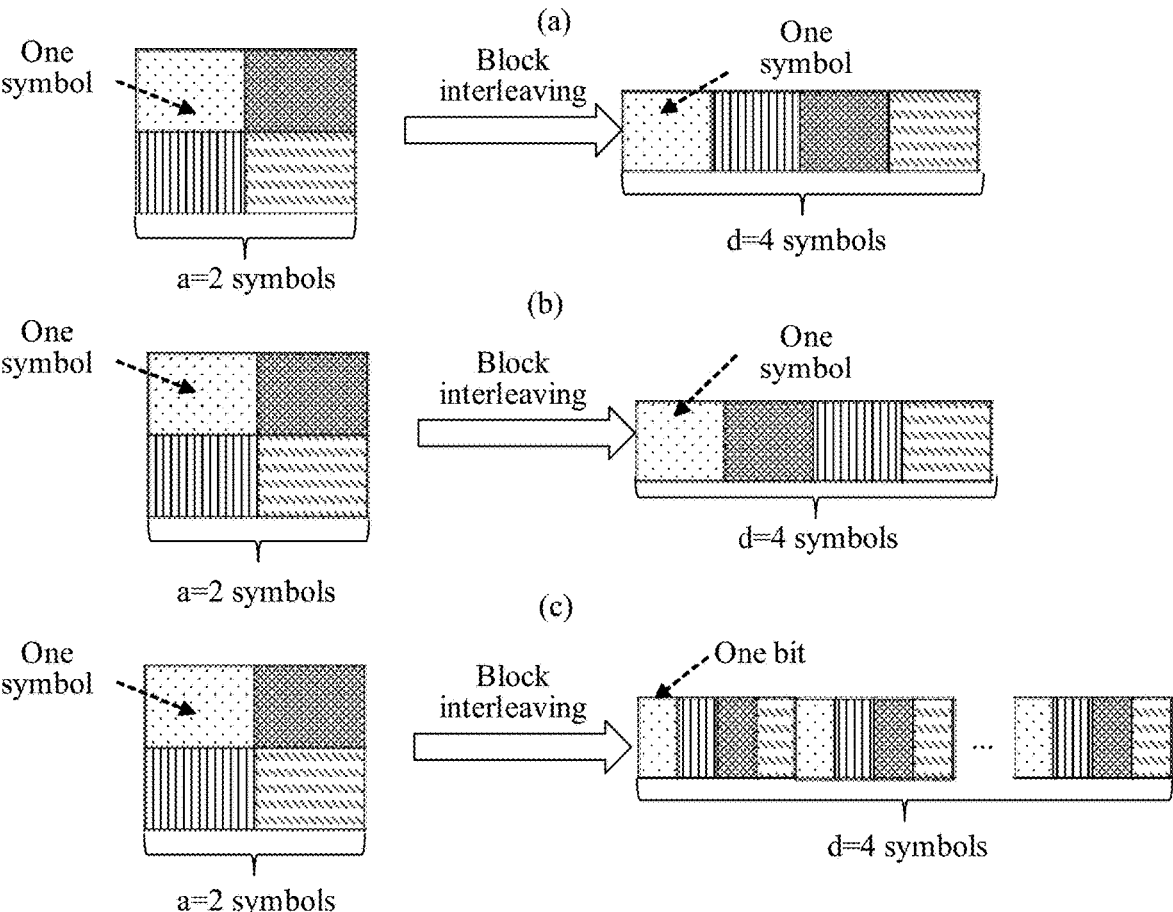
FIG. 54 is a schematic diagram of several specific embodiments of block interleaving according to an embodiment of this application.

FIG. 54 is a schematic diagram of specific embodiments of block interleaving according to an embodiment of this application. An example in (a) in FIG. 54 represents an embodiment of block interleaving corresponding to a case in which β=10. An example in (b) in FIG. 54 represents an embodiment of block interleaving corresponding to a case in which β=20. An example in (c) in FIG. 54 represents an embodiment of block interleaving corresponding to a case in which β=1.

Implementation 2: That n=32 is used as an example, 16 lane data streams in odd-numbered lanes of the 32 lane data streams are from same codewords, 16 lane data streams in even-numbered lanes of the 32 lane data streams are from same codewords, and data streams in odd-numbered lanes and data streams in even-numbered lanes are from different codewords. That is, a total of 16 lane data streams (stream 2*i) are from the same codewords, and a total of 16 lane data streams (stream (2*i+1)) are from the same codewords, and $0 \leq i < 16$.

Figure 55:
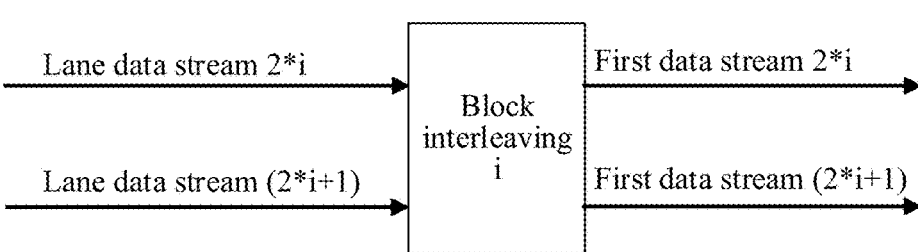
FIG. 55 is a schematic diagram of another application scenario of block interleaving according to an embodiment of this application.

FIG. 55 is a schematic diagram of another application scenario of block interleaving according to an embodiment of this application. One block interleaver shown in FIG. 55 is used to perform block interleaving on two lane data streams to obtain two first data streams. A total of 16 block interleavers shown in FIG. 55 need to be used for block interleaving. Specifically, block interleaver i performs block interleaving on a $(2*i)^{th}$ lane data stream and a $(2*i+1)^{th}$ lane data stream to obtain a $(2*i)^{th}$ first data stream and a $(2*i+1)^{th}$ first data stream, where $0 \leq i < 16$. A specific mapping manner of the block interleaving is as follows: A total of four symbols (a=2 consecutive symbols from each of lane data stream 2*i and lane data stream (2*i+1)) are obtained, and a total of D=20 bits (any Δ=M/s=10/2=5 bits from each symbol) are selected and mapped to D=20 consecutive bits, namely, d=2 symbols, in first data stream 2*i or second data stream (2*i+1) in any sequence. After the block interleaving, every D=20 consecutive bits in the first data stream are from v=4 different codewords, and further, every L2=68 symbols in each first data stream is from four different codewords.

Figures 56, 57:
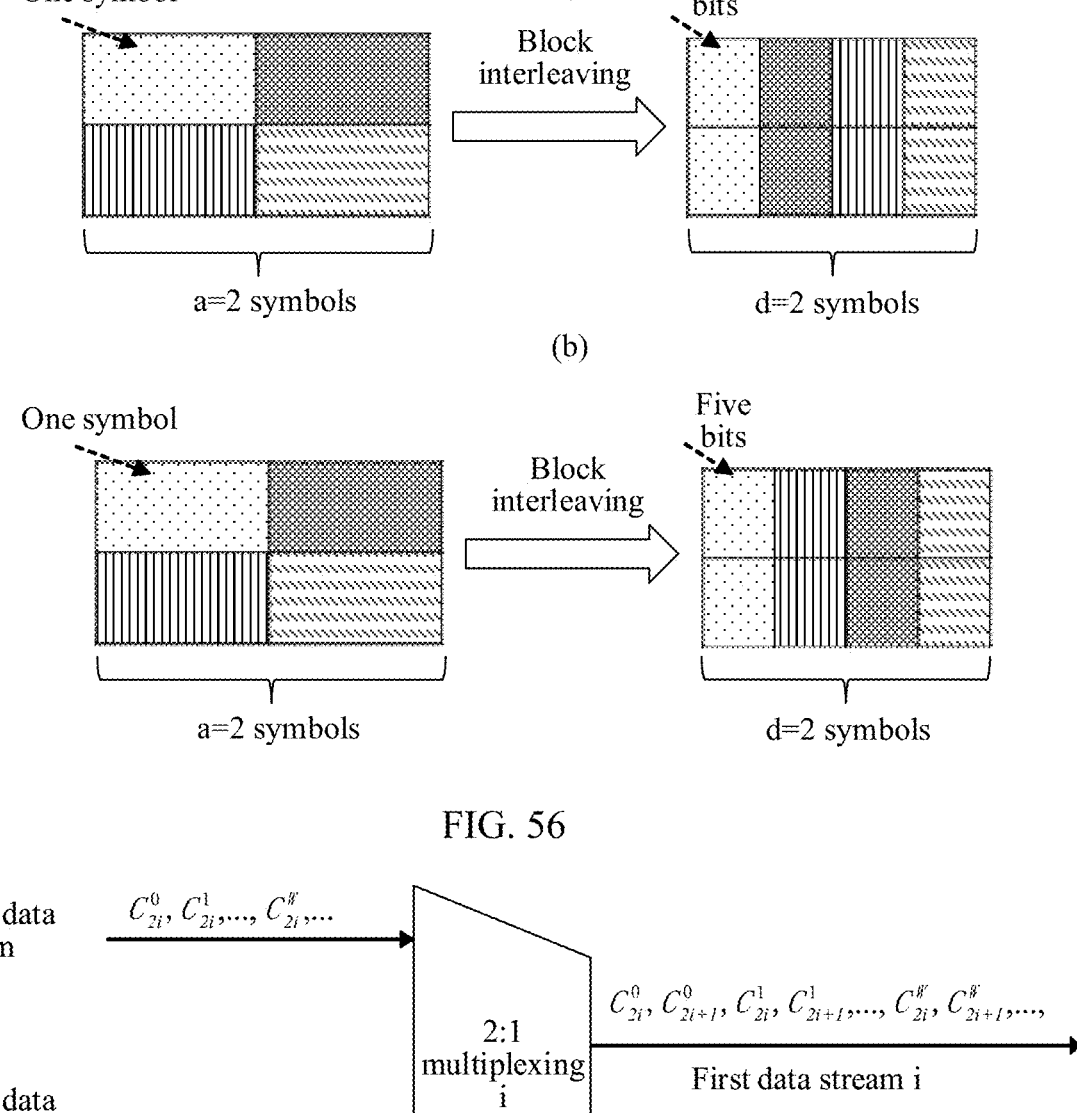
FIG. 56 is a schematic diagram of several specific embodiments of block interleaving according to an embodiment of this application.
FIG. 57 is a schematic diagram of another application scenario of block interleaving according to an embodiment of this application.

FIG. 56 is a schematic diagram of several specific embodiments of block interleaving according to an embodiment of this application.

$$B_f^{2*i+g}$$

represents an $f^{th}$ bit in 20 consecutive bits in first data stream (2*i+g) generated through one block interleaving operation performed by block interleaving i. An example (a) in FIG. 56 shows that $B_f^{2*i+g}$ is from a $$\left( 5 * g + \left\lfloor \frac{f \% 10}{5} \right\rfloor * 10 + f \% 5 \right)^{th}$$

bit in 20 consecutive bits in a $$\left( 2 * i + \left\lfloor \frac{f}{10} \right\rfloor \right)^{th}$$

lane data stream, where $0 \leq f < 20$ and $0 \leq g < 2$. An example in (b) in FIG. 56 shows that $B_f^{2*i+g}$ is from a $$\left( 5 * g + \left\lfloor \frac{f}{10} \right\rfloor * 10 + f \% 5 \right)^{th}$$

bit in 20 consecutive bits in a $$\left( 2 * i + \left\lfloor \frac{f}{5} \right\rfloor \% 2 \right)^{th}$$

lane data stream, where $0 \leq f < 20$ and $0 \leq g < 2$.

Implementation 3: That n=32 is used as an example, 16 lane data streams in odd-numbered lanes of the 32 lane data streams are from same codewords, 16 lane data streams in even-numbered lanes of the 32 lane data streams are from same codewords, and data streams in odd-numbered lanes and data streams in even-numbered lanes are from different codewords. That is, a total of 16 lane data streams (stream 2*i) are from the same codewords, and a total of 16 lane data streams (stream (2*i+1)) are from the same codewords, and 0≤i<16.

FIG. 57 is a schematic diagram of another application scenario of block interleaving according to an embodiment of this application. In this application scenario, the block interleaving is specifically implemented in a multiplexing form. One multiplexer shown in FIG. 57 is configured to multiplex two lane data streams to obtain one first data stream. A total of 16 multiplexers shown in FIG. 57 need to be used for multiplexing. Specifically, multiplexer i multiplexes a $(2*i)^{th}$ lane data stream and a $(2*i+1)^{th}$ lane data stream to obtain one first data stream, where 0≤i<16. A specific mapping manner of the multiplexing is as follows:

$$C_{2i}^{j}$$

represents a $j^{th}$ group of β consecutive bits in a $(2*i)^{th}$ lane data stream, $$C_{2i+1}^{j}$$

represents a $j^{th}$ group of β consecutive bits in a $(2*i+1)^{th}$ lane data stream, where j≥0, and $$C_{2i}^{j}$$

and $$C_{2i+1}^{j}$$

are consecutive in the first data stream obtained through the multiplexing. That is, after the 2:1 multiplexing, a data sequence of the first data stream is $$C_{2i}^{0}, C_{2i+1}^{0}, C_{2i}^{1}, C_{2i+1}^{1}, \ldots, C_{2i}^{w}, C_{2i+1}^{w},$$

where 0≤i≤15, and B=1, 2, 4, 5, 10, or 20. For example, when β=1, it indicates that first data stream i is obtained by using bit multiplexing (bit-mux) on the $(2*i)^{th}$ lane data stream and the $(2*i+1)^{th}$ lane data stream. For another example, when β=10, it indicates that first data stream i is obtained by using RS symbol multiplexing (symbol-mux) on the $(2*i)^{th}$ lane data stream and the $(2*i+1)^{th}$ lane data stream. For another example, when B=20, it indicates that first data stream i is obtained by using 2 RS symbol multiplexing (symbol-mux) on the $(2*i)^{th}$ lane data stream and the $(2*i+1)^{th}$ lane data stream. After the 2:1 multiplexing, every d=4 consecutive symbols in the first data stream are from four different RS codewords.

Implementation 4: That n=32 is used as an example. A total of 16 lane data streams (lane data stream 0 to lane data stream 15) in the 32 lane data streams are from same codewords, a total of 16 lane data streams (lane data stream 16 to lane data stream 31) in the 32 lane data streams are from same codewords, and lane data stream 0 to lane data stream 15 and lane data stream 16 to lane data stream 31 are from different codewords.

Figures 58, 59, 60:
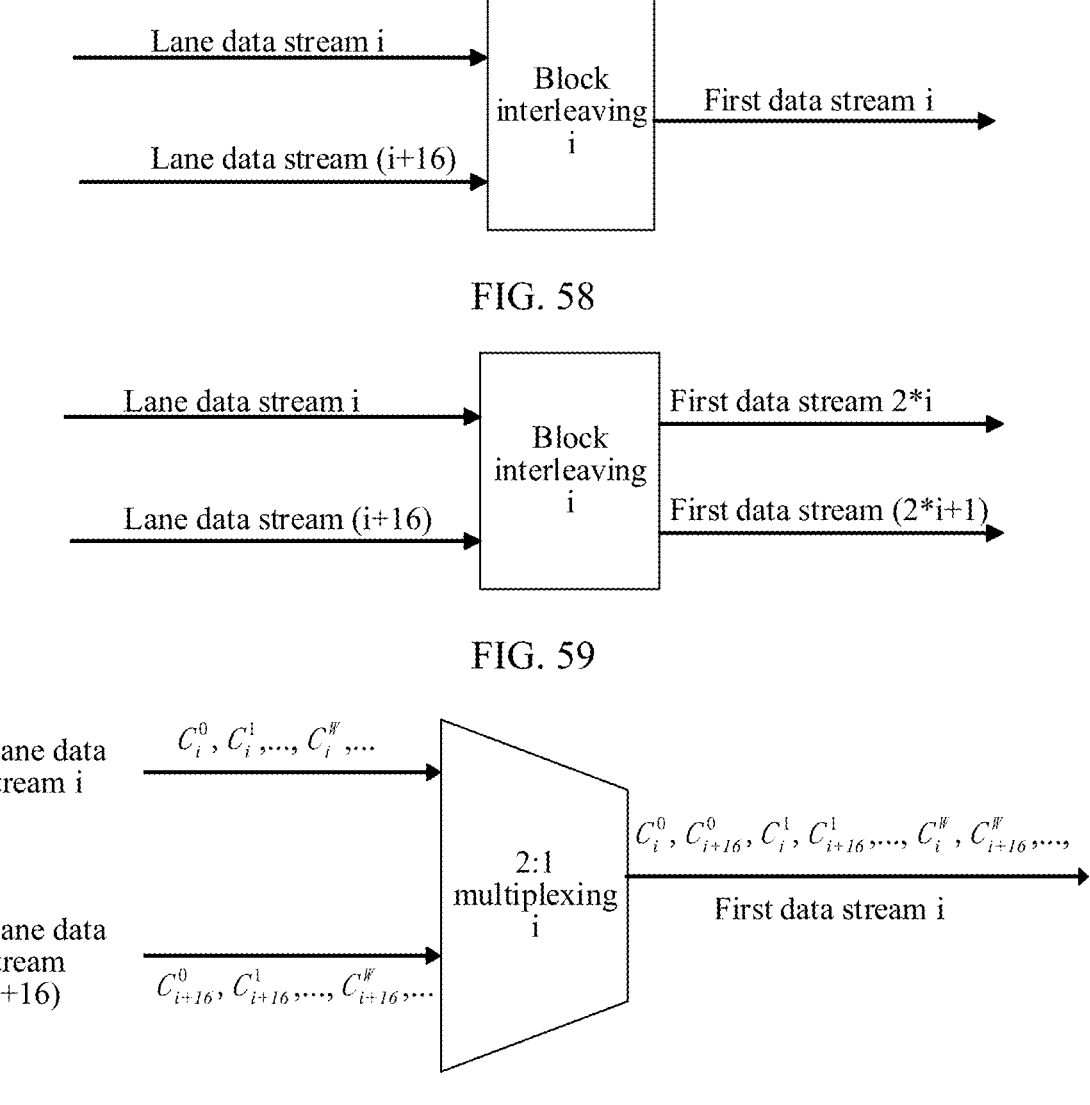
FIG. 58 is a schematic diagram of another application scenario of block interleaving according to an embodiment of this application.
FIG. 59 is a schematic diagram of another application scenario of block interleaving according to an embodiment of this application.
FIG. 60 is a schematic diagram of another application scenario of block interleaving according to an embodiment of this application.

FIG. 58 is a schematic diagram of another application scenario of block interleaving according to an embodiment of this application. One block interleaver shown in FIG. 58 is used to perform block interleaving on two lane data streams to obtain one first data stream. A total of 16 block interleavers shown in FIG. 58 need to be used for block interleaving. Specifically, block interleaver i performs block interleaving on an $i^{th}$ lane data stream and an $(i+16)^{th}$ lane data stream to obtain one first data stream, so that a total of m=16 first data streams are obtained, where 0≤i<16. A specific mapping manner in the block interleaving is as follows: A total of four symbols (a=2 symbols from each of lane data stream i and lane data stream (i+16)) are selected, and then are mapped to D=40 consecutive bits, namely, d=4 symbols, in first data stream i in any sequence. In one first data stream obtained through the block interleaving, every d=4 consecutive symbols are from v=4 different codewords, and every L2=136 consecutive symbols are from v=4 different codewords.

In one manner, two consecutive symbols in each of lane data stream i and lane data stream (i+16) are output through polling based on β bits, to obtain d=4 consecutive symbols that are in the first data stream. Specifically, D=40 consecutive bits in the first data stream obtained through one block interleaving operation are represented as b0 to b39. In this case, mapping, of the outputting through polling based on the B bits may be represented as follows: A $j^{th}$ bit in the 40 consecutive bits in the first data stream is from a $$\left( \left\lfloor \left\lfloor \frac{j}{\beta} \right\rfloor / 2 \right\rfloor * \beta + j \% \beta \right)^{th}$$

bit in 20 consecutive bits in a $$\left( 2*i + \left\lfloor \frac{j}{\beta} \right\rfloor \%2 \right)^{th}$$

lane data stream, $\lfloor x \rfloor$ represents rounding down, where 0≤j<40, and β is 1, 2, 4, 5, 10, or 20.

Implementation 5: That n=32 is used as an example. A total of 16 lane data streams (lane data stream 0 to lane data stream 15) in the 32 lane data streams are from same codewords, a total of 16 lane data streams (lane data stream 16 to lane data stream 31) in the 32 lane data streams are from same codewords, and lane data stream 0 to lane data stream 15 and lane data stream 16 to lane data stream 31 are from different codewords.

FIG. 59 is a schematic diagram of another application scenario of block interleaving according to an embodiment of this application. One block interleaver shown in FIG. 59 is used to perform block interleaving on two lane data streams to obtain two first data streams. A total of 16 block interleavers shown in FIG. 59 need to be used for block interleaving. Specifically, block interleaver i performs block interleaving on an $i^{th}$ lane data stream and an $(i+16)^{th}$ lane data stream to obtain a $(2*i)^{th}$ first data stream and a $(2*i+1)^{th}$ first data stream, where 0≤i<16. A specific mapping manner of the block interleaving is as follows: A total of four RS symbols (a=2 RS symbols from each of lane data stream i and lane data stream (i+16)) are selected, and a total of D=20 bits (any Δ=M/s=10/2=5 bits of data from each symbol) are selected and mapped to D=20 consecutive bits, namely, d=2 symbols, in first data stream 2*i or second data stream (2*i+1) in any sequence. After the block interleaving, every D=20 consecutive bits in the first data stream are from v=4 different codewords, and further, every L2=68 symbols in each first data stream is from four different codewords.

In an embodiment, $$B_f^{2*i+g}$$

represents an $f^{th}$ bit in 20 consecutive bits in first data stream (2*i+g) generated through a block interleaving operation performed through block interleaving i.

$$B_f^{2*i+g}$$

is from a $$\left(5*g+\left\lfloor\frac{f\%10}{5}\right\rfloor*10+f\%5\right)^{th}$$

bit in 20 consecutive bits in a $$\left(i+16*\left\lfloor\frac{f}{10}\right\rfloor\right)^{th}$$

lane data stream, where 0≤f<20 and 0≤g<2.

In an embodiment, $$B_f^{2*i+g}$$

represents an $f^{th}$ bit in 20 consecutive bits in first data stream (2*i+g) generated through a block interleaving operation performed through block interleaving i.

$$B_f^{2*i+g}$$

is from a $$\left(5*g+\left\lfloor\frac{f}{10}\right\rfloor*10+f\%5\right)^{th}$$

bit in 20 consecutive bits in a $$\left(i+16*\left\lfloor\frac{f}{10}\right\rfloor\right)^{th}$$

lane data stream, where 0≤f<20 and 0≤g<2.

Implementation 6: That n=32 is used as an example. A total of 16 lane data streams (lane data stream 0 to lane data stream 15) in the 32 lane data streams are from same codewords, a total of 16 lane data streams (lane data stream 16 to lane data stream 31) in the 32 lane data streams are from same codewords, and lane data stream 0 to lane data stream 15 and lane data stream 16 to lane data stream 31 are from different codewords.

FIG. 60 is a schematic diagram of another application scenario of block interleaving according to an embodiment of this application. In this application scenario, the block interleaving is specifically implemented in a multiplexing form. One multiplexer shown in FIG. 60 is configured to multiplex two lane data streams to obtain one first data stream. A total of 16 multiplexers shown in FIG. 60 need to be used for multiplexing. Specifically, multiplexer i multiplexes an $i^{th}$ lane data stream and an $(i+16)^{th}$ lane data stream to obtain one first data stream, where 0≤i<16. A specific mapping manner of the multiplexing is as follows:

$$C_i^j$$

represents a $j^{th}$ group of β consecutive bits in an $i^{th}$ lane data stream, $$C_{i+16}^j$$

represents a $j^{th}$ group of β consecutive bits in an $(i+16)^{th}$ lane data stream, where j≥0, and $$C_i^j$$

and $$C_{i+16}^j$$

are consecutive in the first data stream obtained through the multiplexing. That is, after the 2:1 multiplexing, a data sequence of the first data stream is $$C_i^0, C_{i+16}^0, C_i^1, C_{i+16}^1, \dots, C_i^w, C_{i+16}^w,$$

..., where 0≤i≤15, and B=1, 2, 4, 5, 10, or 20. For example, when β=1, it indicates that first data stream i is obtained by using bit multiplexing (bit-mux) on the $i^{th}$ lane data stream and the $(i+16)^{th}$ lane data stream. For another example, when β=10, it indicates that first data stream i is obtained by using RS symbol multiplexing (symbol-mux) on the $i^{th}$ lane data stream and the $(i+16)^{th}$ lane data stream. For still another example, when β=20, it indicates that first data stream i is obtained by using 2 RS symbol multiplexing (symbol-mux) on the $i^{th}$ lane data stream and the $(i+16)^{th}$ lane data stream. After the 2:1 multiplexing, every d=4 consecutive symbols in the first data stream are from four different RS codewords.

It should be noted that multiplexer i multiplexes the $i^{th}$ lane data stream and the $(i+16)^{th}$ lane data stream to obtain one first data stream, in other words, two input data streams of multiplexer i are the $i^{th}$ lane data stream and the $(i+16)^{th}$ lane data stream, and the multiplexing may alternatively be implemented in another specific manner. In a specific implementation, multiplexer i multiplexes the $i^{th}$ lane data stream and the $(31-i)^{th}$ lane data stream to obtain one first data stream. It should be noted that two input data streams of any multiplexer are applicable as long as the two input data streams meet the following constraint: One input data stream is from one of lane data stream 0 to lane data stream 15, and the other input data stream is from one of lane data stream 16 to lane data stream 31. A specific implementation thereof may be simply extended based on the foregoing embodiment. A person of ordinary skill in the art may know the specific implementation thereof, and details are not described herein again.

Implementation 7: That n=32 is used as an example. A total of 16 lane data streams (lane data stream 0 to lane data stream 15) in the 32 lane data streams are from same codewords, a total of 16 lane data streams (lane data stream 16 to lane data stream 31) in the 32 lane data streams are from same codewords, and lane data stream 0 to lane data stream 15 and lane data stream 16 to lane data stream 31 are from different codewords. More specifically, with reference to FIG. 5 for understanding, a total of 544 symbols (34 symbols in each of lane data streams 0 to 15) are from a same RS codeword; and a total of 1088 symbols (68 consecutive symbols in each of lane data streams 0 to 15) are from two RS codewords. Similarly, a total of 544 symbols (34 symbols in each of lane data streams 16 to 31) are from a same RS codeword; and a total of 1088 symbols (68 consecutive symbols in each of lane data streams 16 to 31) are from two other RS codewords.

FIG. 61 is a schematic diagram of still another application scenario of block interleaving according to an embodiment of this application. One block interleaver shown in FIG. 61 is used to perform block interleaving on four lane data streams to obtain one first data streams. A total of 8 block interleavers shown in FIG. 61 need to be used for block interleaving. In the four lane data streams, two lane data streams are from two of lane data stream 0 to lane data stream 15, and the other two lane data streams are from two of lane data stream 16 to lane data stream 31. The block interleaver selects a total of eight symbols (a=2 consecutive symbols from each of the four lane data streams), and then maps the eight symbols into D=80 consecutive bits, namely, d=8 symbols, in the first data stream. In the first data stream obtained through the block interleaving, every d=8 consecutive symbols are from at least v=4 different codewords, and every L2=272 consecutive symbols are from at least v=4 different codewords. Further, in the first data stream obtained through the block interleaving, every four consecutive symbols in every d=8 consecutive symbols are from four different RS codewords, to be specific, in every eight consecutive symbols, a $0^{th}$ symbol to a $3^{rd}$ symbol are from different RS codewords, and a $4^{th}$ symbol to a $7^{th}$ symbol are from different RS codewords. A specific implementation is that block interleaver i performs block interleaving on a $(2*i)^{th}$ lane data stream, a $(2*i+1)^{th}$ lane data stream, a $(2*i+16)^{th}$ lane data stream, and a $(2*i+17)^{th}$ lane data stream to obtain one first data stream, so that a total of m=8 first data streams are obtained, where $0 \leq i \leq 7$.

A specific interleaving manner of the block interleaving is that a total of eight symbols (a=2 consecutive symbols from each of the $(2*i)^{th}$ lane data stream, the $(2*i+1)^{th}$ lane data stream, the $(2*i+16)^{th}$ lane data stream, and the $(2*i+17)^{th}$ lane data stream (where $0 \leq i < 8$) are selected, and then interleaved into D=80 consecutive bits, namely, d=8 symbols, in first data stream i. In a specific implementation, in the eight consecutive symbols in first data stream i, the $0^{th}$ and $1^{st}$ symbols are from the $(2*i)^{th}$ lane data stream, the $2^{nd}$ and $3^{rd}$ symbols are from the $(2*i+16)^{th}$ lane data stream, the $4^{th}$ and $5^{th}$ symbols are from the $(2*i+1)^{th}$ lane data stream, and the $6^{th}$ and $7^{th}$ symbols are from the $(2*i+17)^{th}$ lane data stream.

FIG. 62 is a schematic diagram of still another application scenario of block interleaving according to an embodiment of this application. It should be noted that the block interleaving may alternatively be implemented by using symbol multiplexing (symbol-mux) shown in FIG. 62, where $$C_{2*i}^{j}$$

represents two consecutive symbols in a $j^{th}$ group in a $(2*i)^{th}$ lane data stream, $$C_{2*i+16}^{j}$$

represents two consecutive symbols in a $j^{th}$ group in a $(2*i+16)^{th}$ lane data stream, $$C_{2*i+1}^{j}$$

represents two consecutive symbols in a $j^{th}$ group in a $(2*i+1)^{th}$ lane data stream, $$C_{2*i+17}^{j}$$

represents two consecutive symbols in a $j^{th}$ group in a $(2*i+17)^{th}$ lane data stream, where $j \geq 0$, and $$C_{2*i}^{j}, C_{2*i+16}^{j}, C_{2*i+1}^{j},$$

and $$C_{2*i+17}^{j}$$

are consecutive in a first data stream obtained through the multiplexing. That is, a data sequence of first data stream i after 4:1 symbol multiplexing is $$C_{2*i}^{0}, C_{2*i+16}^{0}, C_{2*i+1}^{0}, C_{2*i+17}^{0}, \dots, C_{2*i}^{j}, C_{2*i+16}^{j}, C_{2*i+1}^{j}, C_{2*i+17}^{j},$$

..., where $0 \leq i \leq 7$.

It should be noted that the 4:1 symbol multiplexing (symbol-mux) may alternatively be implemented by using multi-level symbol multiplexing. For example, first, a $(2*i)^{th}$ lane data stream and a $(2*i+16)^{th}$ lane data stream are multiplexed to obtain a first multiplexing data stream, and 2:1 symbol multiplexing is performed on a $(2*i+1)^{th}$ lane data stream and a $(2*i+17)^{th}$ lane data stream to obtain a second multiplexing data stream; then, 2:1 symbol multiplexing is performed on the first multiplexing data stream and the first multiplexing data stream to obtain first data stream i.

Implementation 8: Based on Implementation 7, Implementation 8 provides another specific implementation of block interleaving.

A total of eight symbols (a=2 consecutive symbols from each of a $(2*i)^{th}$ lane data stream, a $(2*i+1)^{th}$ lane data stream, a $(2*i+16)^{th}$ lane data stream, and a $(2*i+17)^{th}$ lane data stream (where $0 \leq i < 8$)) are selected, and then interleaved into D=80 consecutive bits, namely, d=8 symbols, in first data stream i. In some specific application scenarios, lane data alignment is alignment performed based on two RS symbols. In this case, a $0^{th}$ symbol in the two consecutive symbols obtained from the $(2*i)^{th}$ lane data stream and a $0^{th}$ symbol in the two consecutive symbols obtained from the $(2*i+1)^{th}$ lane data stream are from different RS codewords. A $1^{st}$ symbol in the two consecutive symbols obtained from the $(2*i)^{th}$ lane data stream, and a $1^{st}$ symbol in the two consecutive symbols obtained from the $(2*i+1)^{th}$ lane data stream are from different RS codewords. A $0^{th}$ symbol in the two consecutive symbols obtained from the $(2*i+16)^{th}$ lane data stream, and a $0^{th}$ symbol in the two consecutive symbols obtained from the $(2*i+17)^{th}$ lane data stream are from different RS codewords. A $1^{st}$ symbol in the two consecutive symbols obtained from the $(2*i+16)^{th}$ lane data stream, and a $1^{st}$ symbol in the two consecutive symbols obtained from the $(2*i+17)^{th}$ lane data stream are from different RS codewords.

Figures 63, 64:
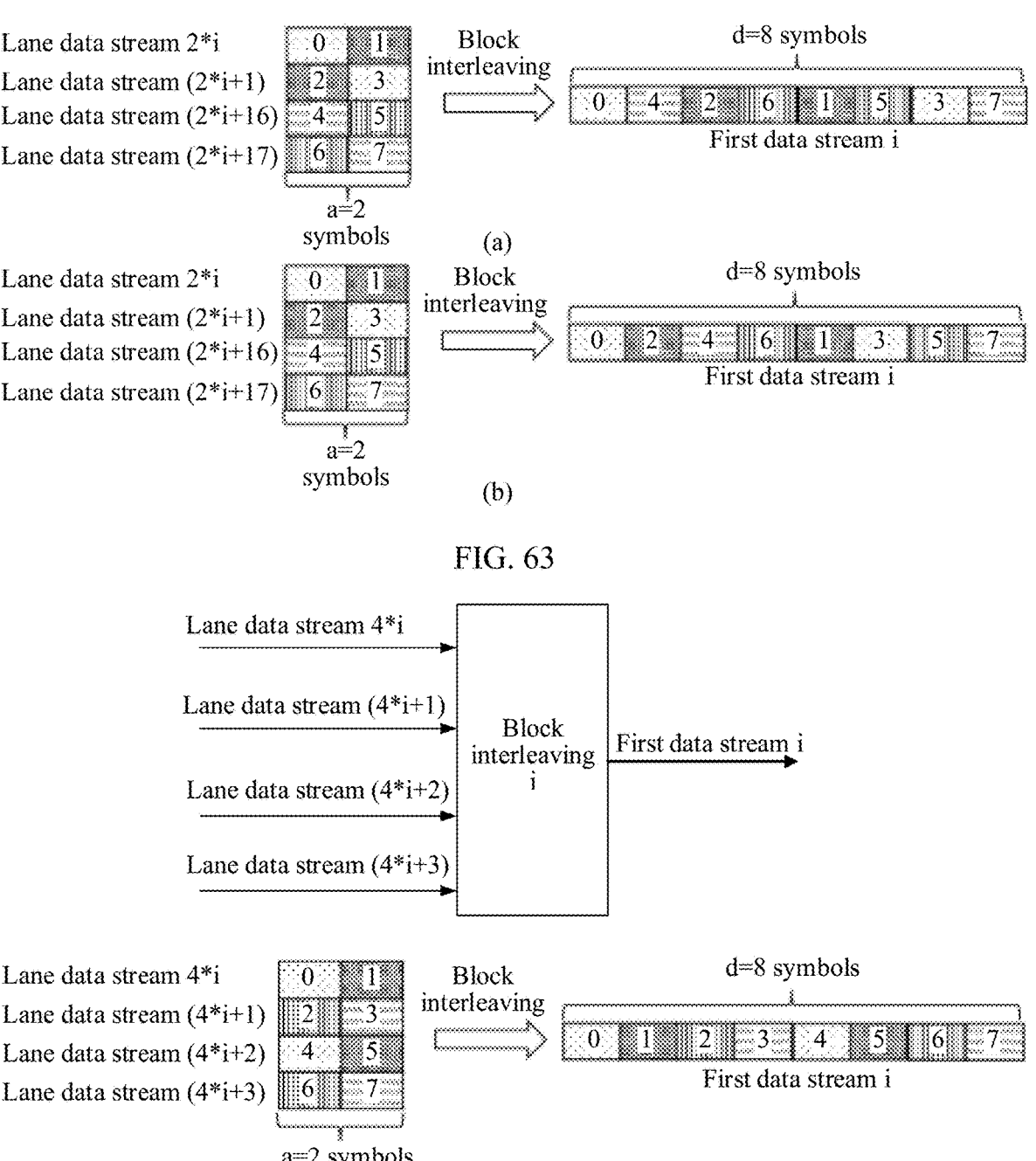
FIG. 63 is a schematic diagram of still another application scenario of block interleaving according to an embodiment of this application.
FIG. 64 is a schematic diagram of still another application scenario of block interleaving according to an embodiment of this application.

FIG. 63 is a schematic diagram of still another application scenario of block interleaving according to an embodiment of this application. With reference to the foregoing features, another specific implementation of the block interleaving is as an example shown in (a) in FIG. 63. In eight consecutive symbols in first data stream i, $0^{th}$ and $4^{th}$ symbols are from a $(2*i)^{th}$ lane data stream, 181 and $5^{th}$ symbols are from a $(2*i+16)^{th}$ lane data stream, $2^{nd}$ and $6^{th}$ symbols are from a $(2*i+1)^{th}$ lane data stream, and $3^{rd}$ and $7^{th}$ symbols are from a $(2*i+17)^{th}$ lane data stream. It should be noted that, the foregoing implementation is equivalent to the following case: One symbol is obtained from each of the four lane data streams, and interleaving is performed to obtain four consecutive symbols in data stream i, where in the four consecutive symbols in first data stream i, the $0^{th}$ symbol is from the $(2*i)^{th}$ lane data stream, the $1^{st}$ symbol is from the $(2*i+16)^{th}$ lane data stream, the $2^{nd}$ symbol is from the $(2*i+1)^{th}$ lane data stream, and the $3^{rd}$ symbol is from the $(2*i+17)^{th}$ lane data stream.

Still another specific implementation of the block interleaving is as an example shown in (b) in FIG. 63. In eight consecutive symbols in first data stream i, $0^{th}$ and $4^{th}$ symbols are from a $(2*i)^{th}$ lane data stream, $1^{st}$ and $5^{th}$ symbols are from a $(2*i+1)^{th}$ lane data stream, $2^{nd}$ and $6^{th}$ symbols are from a $(2*i+16)^{th}$ lane data stream, and $3^{rd}$ and $7^{th}$ symbols are from a $(2*i+17)^{th}$ lane data stream. It should be noted that, the foregoing implementation is equivalent to the following case: One symbol is obtained from each of the four lane data streams, and interleaving is performed to obtain four consecutive symbols in data stream i, where in the four consecutive symbols in first data stream i, the $0^{th}$ symbol is from the $(2*i)^{th}$ lane data stream, the $1^{st}$ symbol is from the $(2*i+1)^{th}$ lane data stream, the $2^{nd}$ symbol is from the $(2*i+16)^{th}$ lane data stream, and the $3^{rd}$ symbol is from the $(2*i+17)^{th}$ lane data stream.

It should be noted that the block interleaving may alternatively be implemented by using symbol multiplexing (symbol-mux). In the symbol multiplexing, one symbol is obtained from each of the four lane data streams, where $$C_{2*i}^j$$

represents a $j^{th}$ symbol in a $(2*i)^{th}$ lane data stream, $$C_{2*i+16}^j$$

represents a $j^{th}$ symbol in a $(2*i+16)^{th}$ lane data stream, $$C_{2*i+1}^j$$

represents a $j^{th}$ symbol in a $(2*i+1)^{th}$ lane data stream, $$C_{2*i+17}^j$$

represents a $j^{th}$ symbol in a $(2*i+17)^{th}$ lane data stream, where $j \geq 0$, and $$C_{2*i}^j, C_{2*i+16}^j, C_{2*i+1}^j,$$

and $$C_{2*i+17}^j$$

are consecutive in the first data stream obtained through 4:1 symbol multiplexing. That is, a data sequence of first data stream i after the 4:1 symbol multiplexing is $$C_{2*i}^0, C_{2*i+16}^0, C_{2*i+1}^0, C_{2*i+17}^0, \ldots, C_{2*i}^j, C_{2*i+16}^j, C_{2*i+1}^j, C_{2*i+17}^j,$$

. . . , where $0 \leq i \leq 7$.

$$C_{2*i}^j, C_{2*i+16}^j, C_{2*i+1}^j,$$

and $$C_{2*i+17}^j$$

are from four different RS codewords. Another specific symbol multiplexing is that one symbol is obtained from each of the four lane data streams, and $$C_{2*i}^j, C_{2*i+1}^j, C_{2*i+16}^j,$$

and $$C_{2*i+17}^j$$

are consecutive in the first data stream obtained through 4:1 symbol multiplexing. That is, a data sequence of first data stream i after the 4:1 symbol multiplexing is $$C_{2*i}^0, C_{2*i+1}^0, C_{2*i+16}^0, C_{2*i+17}^0, \ldots, C_{2*i}^j, C_{2*i+1}^j, C_{2*i+16}^j, C_{2*i+17}^j,$$

..., where $0 \leq i \leq 7$.

Implementation 9: That n=32 is used as an example, 16 lane data streams in odd-numbered lanes of the 32 lane data streams are from same codewords, 16 lane data streams in even-numbered lanes of the 32 lane data streams are from same codewords, and data streams in odd-numbered lanes and data streams in even-numbered lanes are from different codewords. That is, a total of 16 lane data streams (stream 2*i) are from the same codewords, and a total of 16 lane data streams (stream (2*i+1)) are from the same codewords, and $0 \leq i < 16$.

FIG. 64 is a schematic diagram of still another application scenario of block interleaving according to an embodiment of this application. One block interleaver shown in FIG. 64 is used to perform block interleaving on four lane data streams to obtain one first data stream. A total of 8 block interleavers shown in FIG. 64 need to be used for block interleaving. In the four lane data streams, two lane data streams are from two odd-numbered lane data streams of lane data stream 0 to lane data stream 31, and the other two lane data streams are from two even-numbered lane data streams of lane data stream 0 to lane data stream 31. The block interleaver selects a total of eight symbols (a=2 consecutive symbols from each of the four lane data streams), and then maps the eight symbols into D=80 consecutive bits, namely, d=8 symbols, in the first data stream. In one first data stream obtained through block interleaving, every d=8 consecutive symbols are from at least v=4 different codewords, and every L2=272 consecutive symbols are from at least v=4 different codewords. Further, in the first data stream obtained through the block interleaving, every four consecutive symbols in every d=8 consecutive symbols are from four different RS codewords, to be specific, in every eight consecutive symbols, a $0^{th}$ symbol to a $3^{rd}$ symbol are from different RS codewords, and a $4^{th}$ symbol to a $7^{th}$ symbol are from different RS codewords. A specific implementation is that block interleaver i performs block interleaving on a $(4*i)^{th}$ lane data stream, a $(4*i+1)^{th}$ lane data stream, a $(4*i+2)^{th}$ lane data stream, and a $(4*i+3)^{th}$ lane data stream to obtain one first data stream, so that a total of m=8 first data streams are obtained, where $0 \leq i \leq 7$.

A specific interleaving manner of the block interleaving is that a total of eight symbols (a=2 consecutive symbols from each of the $(4*i)^{th}$ lane data stream, the $(4*i+1)^{th}$ lane data stream, the $(4*i+2)^{th}$ lane data stream, and the $(4*i+3)^{th}$ lane data stream (where $0 \leq i < 8$) are selected, and then interleaved into D=80 consecutive bits, namely, d=8 symbols, in first data stream i. In a specific implementation, in the eight consecutive symbols in first data stream i, the $0^{th}$ and $1^{st}$ symbols are from the $(4*i)^{th}$ lane data stream, the $2^{nd}$ and $3^{rd}$ symbols are from the $(4*i+1)^{th}$ lane data stream, the $4^{th}$ and $5^{th}$ symbols are from the $(4*i+2)^{th}$ lane data stream, and the $6^{th}$ and $7^{th}$ symbols are from the $(4*i+3)^{th}$ lane data stream.

FIG. 65 is a schematic diagram of still another application scenario of block interleaving according to an embodiment of this application. It should be noted that the block interleaving may alternatively be implemented by using symbol multiplexing (symbol-mux) shown in FIG. 65, where $$C_{4*i}^j$$

represents two consecutive symbols in a $j^{th}$ group in a $(4*i)^{th}$ lane data stream, $$C_{4*i+1}^j$$

represents two consecutive symbols in a $j^{th}$ group in a $(4*i+1)^{th}$ lane data stream, $$C_{4*i+2}^j$$

represents two consecutive symbols in a $j^{th}$ group in a $(4*i+2)^{th}$ lane data stream, $$C_{4*i+3}^j$$

represents two consecutive symbols in a $j^{th}$ group in a $(4*i+3)^{th}$ lane data stream, where $j \geq 0$, and $$C_{4*i}^j, C_{4*i+1}^j, C_{4*i+2}^j,$$

and $$C_{4*i+3}^j$$

are consecutive in a first data stream obtained through the multiplexing. That is, a data sequence of first data stream i after the 4:1 symbol multiplexing is $$C_{4*i}^0, C_{4*i+1}^0, C_{4*i+2}^0, C_{4*i+3}^0, \ldots, C_{4*i}^j, cC_{4*i+1}^j, C_{4*i+2}^j, C_{4*i+3}^j,$$

..., where $0 \leq i \leq 7$.

It should be noted that the 4:1 symbol multiplexing (symbol-mux) may alternatively be implemented by using multi-level symbol multiplexing. For example, first, a $(4*i)^{th}$ lane data stream and a $(4*i+1)^{th}$ lane data stream are multiplexed to obtain a first multiplexing data stream, and 2:1 symbol multiplexing is performed on $(4*i+2)^{th}$ lane data stream and a $(4*i+3)^{th}$ lane data stream to obtain a second multiplexing data stream; then, 2:1 symbol multiplexing is performed on the first multiplexing data stream and the first multiplexing data stream to obtain first data stream i.

Implementation 10: Based on Implementation 9, Implementation 10 provides another specific implementation of block interleaving.

A total of eight symbols (a=2 consecutive symbols from each of a $(4*i)^{th}$ lane data stream, a $(4*i+1)^{th}$ lane data stream, a $(4*i+2)^{th}$ lane data stream, and a $(4*i+3)^{th}$ lane data stream (where $0 \leq i < 8$)) are selected, and then interleaved into D=80 consecutive bits, namely, d=8 symbols, in first data stream i. In some specific application scenarios, lane data alignment is alignment performed based on two RS symbols. In this case, a $0^{th}$ symbol in the two consecutive symbols obtained from the $(4*i)^{th}$ lane data stream and a $0^{th}$ symbol in the two consecutive symbols obtained from the $(4*i+2)^{th}$ lane data stream are from different RS codewords. A $1^{st}$ symbol in the two consecutive symbols obtained from the $(4*i)^{th}$ lane data stream, and a $1^{st}$ symbol in the two consecutive symbols obtained from the $(4*i+2)^{th}$ lane data stream are from different RS codewords. A $0^{th}$ symbol in the two consecutive symbols obtained from the $(4*i+1)^{th}$ lane data stream, and a $0^{th}$ symbol in the two consecutive symbols obtained from the $(4*i+3)^{th}$ lane data stream are from different RS codewords. A $1^{st}$ symbol in the two consecutive symbols obtained from the $(4*i+1)^{th}$ lane data stream, and a $1^{st}$ symbol in the two consecutive symbols obtained from the $(4*i+3)^{th}$ lane data stream are from different RS codewords.

FIG. 66 is a schematic diagram of still another application scenario of block interleaving according to an embodiment of this application. With reference to the foregoing features, another specific implementation of the block interleaving is as an example shown in (a) in FIG. 66. In eight consecutive symbols in first data stream i, $0^{th}$ and $4^{th}$ symbols are from a $(4*i)^{th}$ lane data stream, $1^{st}$ and $5^{th}$ symbols are from a $(4*i+1)^{th}$ lane data stream, $2^{nd}$ and $6^{th}$ symbols are from a $(4*i+2)^{th}$ lane data stream, and $3^{rd}$ and $7^{th}$ symbols are from a $(4*i+3)^{th}$ lane data stream. It should be noted that, the foregoing implementation is equivalent to the following case: One symbol is obtained from each of the four lane data streams, and interleaving is performed to obtain four consecutive symbols in data stream i, where in the four consecutive symbols in first data stream i, the $0^{th}$ symbol is from the $(4*i)^{th}$ lane data stream, the $1^{st}$ symbol is from the $(4*i+1)^{th}$ lane data stream, the $2^{nd}$ symbol is from the $(4*i+2)^{th}$ lane data stream, and the $3^{rd}$ symbol is from the $(4*i+3)^{th}$ lane data stream.

Still another specific implementation of the block interleaving is as an example shown in (b) in FIG. 66. In eight consecutive symbols in first data stream i, $0^{th}$ and $4^{th}$ symbols are from a $(4*i)^{th}$ lane data stream, $1^{st}$ and $5^{th}$ symbols are from a $(4*i+2)^{th}$ lane data stream, $2^{nd}$ and $6^{th}$ symbols are from a $(4*i+1)^{th}$ lane data stream, and $3^{rd}$ and $7^{th}$ symbols are from a $(4*i+3)^{th}$ lane data stream. It should be noted that, the foregoing implementation is equivalent to the following case: One symbol is obtained from each of the four lane data streams, and interleaving is performed to obtain four consecutive symbols in data stream i, where in the four consecutive symbols in first data stream i, the $0^{th}$ symbol is from the $(4*i)^{th}$ lane data stream, the $1^{st}$ symbol is from the $(4*i+2)^{th}$ lane data stream, the $2^{nd}$ symbol is from the $(4*i+1)^{th}$ lane data stream, and the $3^{rd}$ symbol is from the $(4*i+3)^{th}$ lane data stream.

It should be noted that the block interleaving may alternatively be implemented by using symbol multiplexing (symbol-mux). In the symbol multiplexing, one symbol is obtained from each of the four lane data streams, where $$C_{4*i}^{j}$$

represents a $j^{th}$ symbol in a $(4*i)^{th}$ lane data stream, $$C_{4*i+1}^{j}$$

represents a $j^{th}$ symbol in a $(4+i+1)^{th}$ lane data stream, $$C_{4*i+2}^{j}$$

represents a $j^{th}$ symbol in a $(4*i+2)^{th}$ lane data stream, $$C_{4*i+3}^{j}$$

represents a $j^{th}$ symbol in a $(4*i+3)^{th}$ lane data stream, where $j \geq 0$, and $$C_{4*i}^{j}, C_{4*i+1}^{j}, C_{4*i+2}^{j},$$

and $$C_{4*i+3}^{j}$$

are consecutive in the first data stream obtained through 4:1 symbol multiplexing. That is, a data sequence of first data stream i after the 4:1 symbol multiplexing is $$C_{4*i}^{0}, C_{4*i+1}^{0}, C_{4*i+2}^{0}, C_{4*i+3}^{0}, \ldots, C_{4*i}^{j}, C_{4*i+1}^{j}, C_{4*i+2}^{j}, C_{4*i+3}^{j},$$

..., where $0 \leq i \leq 7$.

$$C_{4*i}^{j}, C_{4*i+1}^{j}, C_{4*i+2}^{j},$$

and $$C_{4*i+3}^{j}$$

are from four different RS codewords. Another specific symbol multiplexing is that one symbol is obtained from each of the four lane data streams, and $$C_{4*i}^{j}, C_{4*i+2}^{j}, C_{4*i+1}^{j},$$

and $$C_{4*i+3}^{j}$$

are consecutive in the first data stream obtained through 4:1 symbol multiplexing. That is, a data sequence of first data stream i after the 4:1 symbol multiplexing is $$C_{4*i}^{0}, C_{4*i+2}^{0}, C_{4*i+1}^{0}, C_{4*i+3}^{0}, \ldots, C_{4*i}^{j}, C_{4*i+2}^{j}, C_{4*i+1}^{j}, C_{4*i+3}^{j},$$

..., where $0 \leq i \leq 7$.

It should be noted that, in some specific implementation scenarios, when sending device 01 sends a 1*800GE service, after PMA 4:1 multiplexing is performed, 32 PCS lane data streams are sent to a transmitter processing module through a lane attachment unit interface AUI. During the PMA 4:1 multiplexing, two of four input data streams are from two of $0^{th}$ to $15^{th}$ PCS lane data streams, and the other two are from two of $16^{th}$ to $31^{st}$ PCS lane data streams. During data processing of the transmitter processing module, with reference to the foregoing feature in which "during the PMA 4:1 multiplexing, two of four input data streams are from two of $0^{th}$ to $15^{th}$ PCS lane data streams, and the other two are from two of $16^{th}$ to $31^{st}$ PCS lane data streams", de-mux is performed first to restore the 32 PCS lane data streams, where each physical lane data stream is de-multiplexed de-mux to obtain four PCS lane data streams, and then, alignment marker lock of the lane data streams is performed by using known alignment markers of PCS lanes. Then, lane reordering does not need to be performed, and block interleaving (or symbol multiplexing) in Implementation 7, Implementation 8, Implementation 9, or Implementation 10 is directly performed on the four PCS lane data streams obtained through de-multiplexing de-mux the physical lane data stream, and block interleaving (or symbol multiplexing) is performed on the four lane data streams to obtain one first data stream, so that eight consecutive symbols in the first data stream are from at least four RS codewords. For a specific implementation thereof, refer to FIG. 61, FIG. 62, FIG. 63, FIG. 64, FIG. 65, or FIG. 66. A person of ordinary skill in the art may know the specific implementation thereof, and details are not described herein again.

Implementation 11: That n=32 is used as an example. A total of 16 lane data streams (lane data stream 0 to lane data stream 15) in the 32 lane data streams are from same codewords, a total of 16 lane data streams (lane data stream 16 to lane data stream 31) in the 32 lane data streams are from same codewords, and lane data stream 0 to lane data stream 15 and lane data stream 16 to lane data stream 31 are from different codewords. More specifically, with reference to FIG. 5 for understanding, a total of 544 symbols (34 symbols in each of lane data streams 0 to 15) are from a same RS codeword; and a total of 1088 symbols (68 consecutive symbols in each of lane data streams 0 to 15) are from two RS codewords. Similarly, a total of 544 symbols (34 symbols in each of lane data streams 16 to 31) are from a same RS codeword; and a total of 1088 symbols (68 consecutive symbols in each of lane data streams 16 to 31) are from two other RS codewords.

Figure 67:
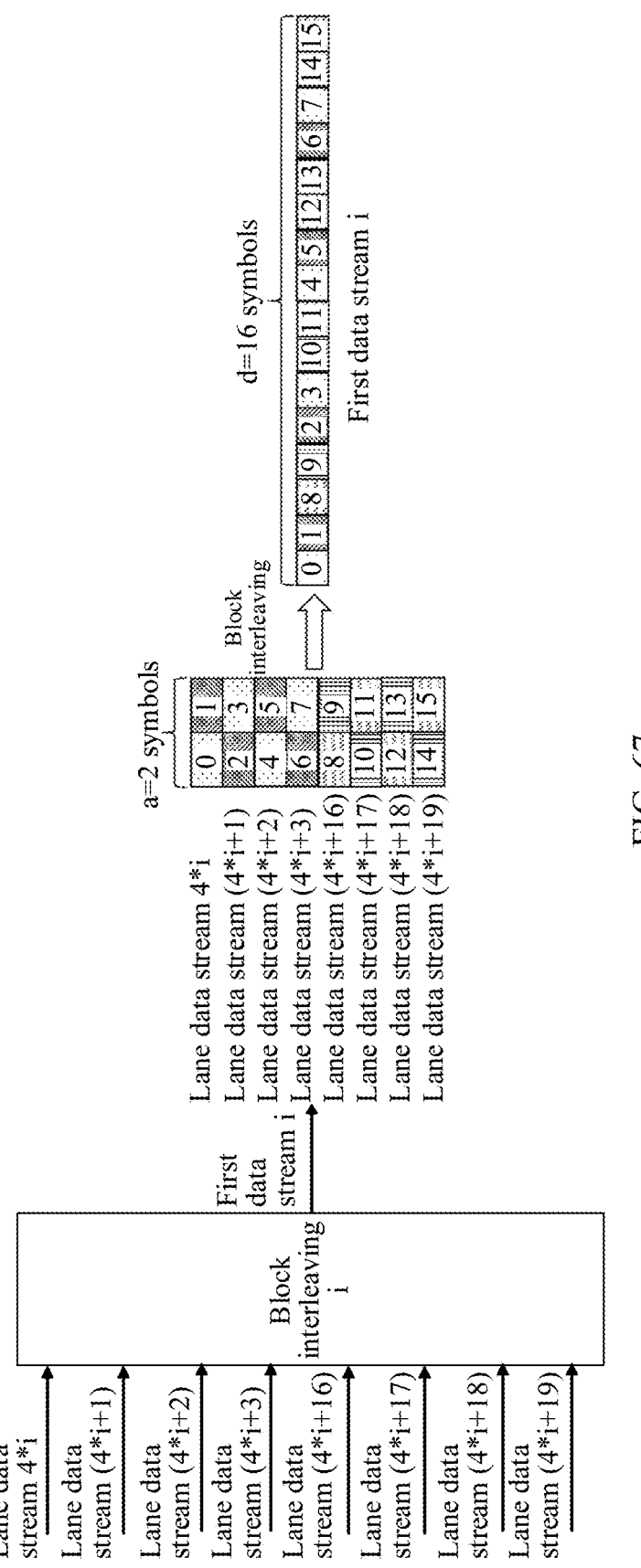
FIG. 67 is a schematic diagram of still another application scenario of block interleaving according to an embodiment of this application.

FIG. 67 is a schematic diagram of still another application scenario of block interleaving according to an embodiment of this application. One block interleaver shown in FIG. 67 is used to perform block interleaving on eight lane data streams to obtain one first data streams. A total of 4 block interleavers shown in FIG. 67 need to be used for block interleaving. In the eight lane data streams, four lane data streams are four of lane data stream 0 to lane data stream 15, and the other four lane data streams are four of lane data stream 16 to lane data stream 31. The block interleaver selects a total of 16 symbols (a=2 consecutive symbols from each of the eight lane data streams), and then maps the 16 symbols into D=160 consecutive bits, namely, d=16 symbols, in the first data stream. In one first data stream obtained through block interleaving, every d=16 consecutive symbols are from at least v=4 different codewords, and every L2=544 consecutive symbols are from at least v=4 different codewords. Further, in one first data stream obtained through block interleaving, every four consecutive symbols in every d=16 consecutive symbols are from four different RS codewords, to be specific, in every 16 consecutive symbols, a $0^{th}$ symbol to a $3^{rd}$ symbol are from different RS codewords, a $4^{th}$ symbol to a $7^{th}$ symbol are from different RS codewords, an $8^{th}$ symbol to an $11^{th}$ symbol are from different RS codewords, and a $12^{th}$ symbol to a $15^{th}$ symbol are from different RS codewords. In a specific implementation, block interleaver i performs block interleaving on a $(4*i)^{th}$ lane data stream, a $(4*i+1)^{th}$ lane data stream, a $(4*i+2)^{th}$ lane data stream, a $(4*i+3)^{th}$ lane data stream, a $(4*i+16)^{th}$ lane data stream, a $(4*i+17)^{th}$ lane data stream, a $(4*i+18)^{th}$ lane data stream, and a $(4*i+19)^{th}$ lane data stream to obtain one first data stream, so that a total of m=4 first data streams are obtained, where $0 \le i \le 3$.

A specific interleaving manner of the block interleaving is as follows: A total of 16 symbols (a=2 consecutive symbols from each of the $(4*i)^{th}$ lane data stream, the $(4*i+1)^{th}$ lane data stream, the $(4*i+2)^{th}$ lane data stream, the $(4*i+3)^{th}$ lane data stream, the $(4*i+16)^{th}$ lane data stream, the $(4*i+17)^{th}$ lane data stream, the $(4*i+18)^{th}$ lane data stream, and the $(4*i+19)^{th}$ lane data stream (where $0 \le i < 3$) are selected, and then are interleaved into 16 consecutive symbols in first data stream i. In a specific implementation, in the 16 consecutive symbols in first data stream i, the $0^{th}$ and $1^{st}$ symbols are from the $(4*i)^{th}$ lane data stream, the $2^{nd}$ and $3^{rd}$ symbols are from the $(4*i+16)^{th}$ lane data stream, the $4^{th}$ and $5^{th}$ symbols are from the $(4*i+1)^{th}$ lane data stream, the $6^{th}$ and $7^{th}$ symbols are from the $(4*i+17)^{th}$ lane data stream, the $8^{th}$ and $9^{th}$ symbols are from the $(4*i+2)^{th}$ lane data stream, the $10^{th}$ and $11^{th}$ symbols are from the $(4*i+18)^{th}$ lane data stream, the $12^{th}$ and $13^{th}$ symbols are from the $(4*i+3)^{th}$ lane data stream, and the $14^{th}$ and $15^{th}$ symbols are from the $(4*i+19)^{th}$ lane data stream.

Figure 68:
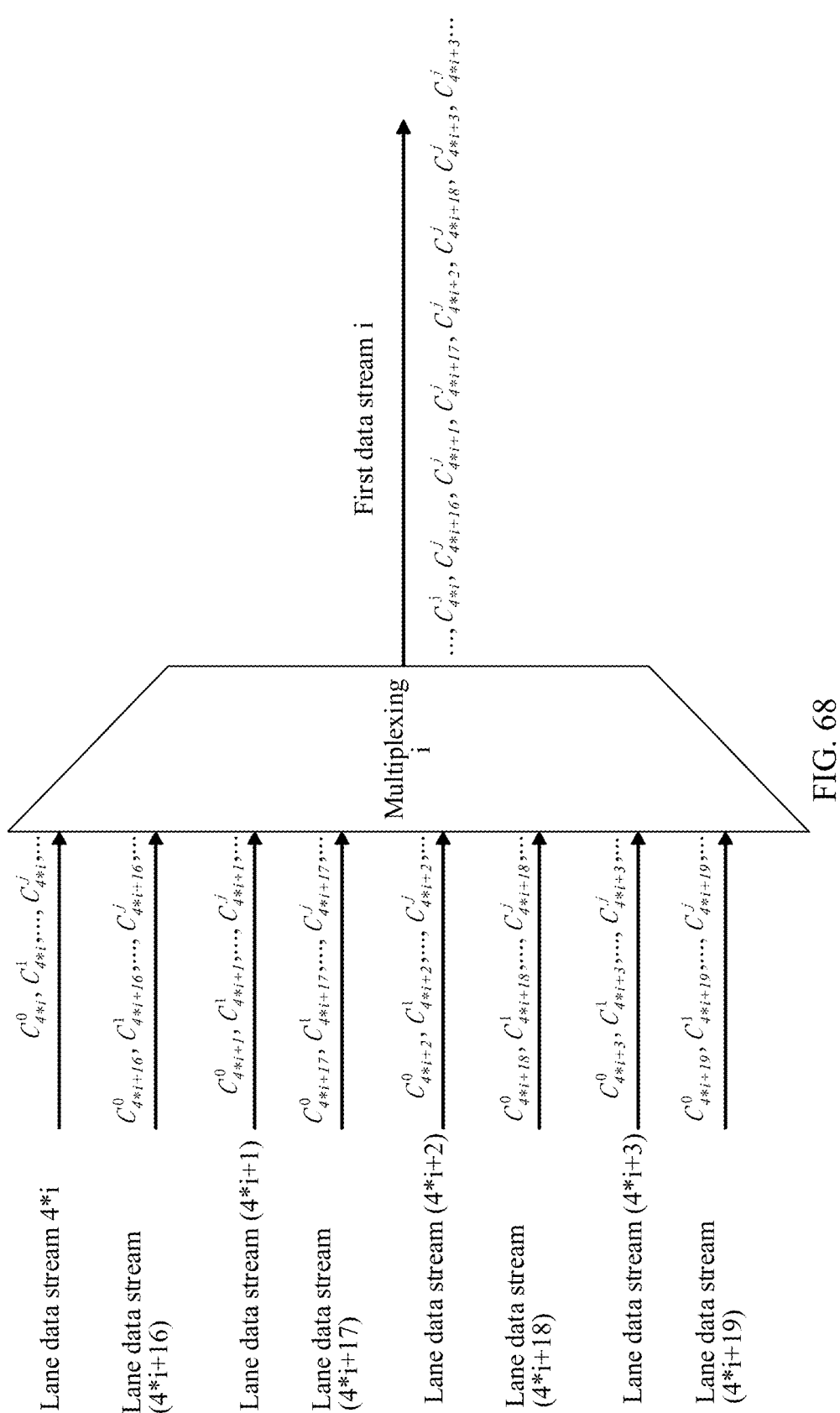
FIG. 68 is a schematic diagram of still another application scenario of block interleaving according to an embodiment of this application.

FIG. 68 is a schematic diagram of still another application scenario of block interleaving according to an embodiment of this application. It should be noted that the block interleaving may alternatively be implemented by using symbol multiplexing (symbol-mux) shown in FIG. 68, where $$C^{j}_{4*i}$$

represents two consecutive symbols in a $j^{th}$ group in a $(4*i)^{th}$ lane data stream, $$C^{j}_{4*i+16}$$

represents two consecutive symbols in a $j^{th}$ group in a $(4*i+16)^{th}$ lane data stream, $$C^{j}_{1}$$

represents two consecutive symbols in a $j^{th}$ group in a $(4*i+1)^{th}$ lane data stream, $$C^{j}_{4*i+17}$$

represents two consecutive symbols in a $j^{th}$ group in a $(4*i+17)^{th}$ lane data stream, $$C_{4*i+2}^{j}$$

represents two consecutive symbols in a $j^{th}$ group in a $(4*i+2)^{th}$ lane data stream, $$C_{4*i+18}^{j}$$

represents two consecutive symbols in a $j^{th}$ group in a $(4*i+18)^{th}$ lane data stream, $$C_{4*i+3}^{j}$$

represents two consecutive symbols in a $j^{th}$ group in a $(4*i+3)^{th}$ lane data stream, $$C_{4*i+19}^{j}$$

represents two consecutive symbols in a $j^{th}$ group in a $4*i+19^{th}$ lane data stream, where $j \geq 0$, and $$C_{4*i}^{j}, C_{4*i+16}^{j}, C_{4*i+1}^{j}, C_{4*i+17}^{j}, C_{4*i+2}^{j}, C_{4*i+18}^{j}, C_{4*i+3}^{j},$$

and $$C_{4*i+19}^{j}$$

are consecutive in first data stream i obtained through multiplexing. That is, a data sequence of first data stream i after 8:1, symbol multiplexing is $$C_{4*i}^{0}, C_{4*i+16}^{0}, C_{4*i+1}^{0}, C_{4*i+17}^{0}, \ldots, C_{4*i}^{j},$$

$$C_{4*i+16}^{j}, C_{4*i+1}^{j}, C_{4*i+17}^{j}, C_{4*i+2}^{j}, C_{4*i+18}^{j}, C_{4*i+3}^{j},$$

and $$C_{4*i+19}^{j},$$

. . . , where $0 \leq i \leq 3$.

It should be noted that the foregoing 8:1 symbol multiplexing may alternatively be implemented by using multilevel symbol multiplexing, for example, by using three-level 2:1 symbol multiplexing.

Implementation 12: Based on Implementation 11, Implementation 12 provides another specific implementation of block interleaving.

A total of 16 symbols (a=2 consecutive symbols from each of the $(4*i)^{th}$ lane data stream, the $(4*i+1)^{th}$ lane data stream, the $(4*i+2)^{th}$ lane data stream, the $(4*i+3)^{th}$ lane data stream, the $(4*i+16)^{th}$ lane data stream, the $(4*i+17)^{th}$ lane data stream, the $(4*i+18)^{th}$ lane data stream, and the $(4*i+19)^{th}$ lane data stream (where $0 \leq i < 3$)) are selected, and then are interleaved into 16 consecutive symbols in first stream i. In some specific application scenarios, lane data alignment is alignment performed based on two RS symbols. In this case, a $0^{th}$ symbol in the two consecutive symbols obtained from the $(4*i)^{th}$ lane data stream and a $0^{th}$ symbol in the two consecutive symbols obtained from the $(4*i+1)^{th}$ lane data stream are from different RS codewords, and a $1^{st}$ symbol in the two consecutive symbols obtained from the $(4*i)^{th}$ lane data stream and a $1^{st}$ symbol in the two consecutive symbols obtained from the $(4*i+1)^{th}$ lane data stream are from different RS codewords. A $0^{th}$ symbol in the two consecutive symbols obtained from the $(4*i+2)^{th}$ lane data stream and a $0^{th}$ symbol in the two consecutive symbols obtained from the $(4*i+3)^{th}$ lane data stream are from different RS codewords, and a $1^{st}$ symbol in the two consecutive symbols obtained from the $(4*i+2)^{th}$ lane data stream and a $1^{st}$ symbol in the two consecutive symbols obtained from the $(4*i+3)^{th}$ lane data stream are from different RS codewords. A $0^{th}$ symbol in the two consecutive symbols obtained from the $(4*i+16)^{th}$ lane data stream and a $0^{th}$ symbol in the two consecutive symbols obtained from the $(4*i+17)^{th}$ lane data stream are from different RS codewords, and a $1^{st}$ symbol in the two consecutive symbols obtained from the $(4*i+16)^{th}$ lane data stream and a $1^{st}$ symbol in the two consecutive symbols obtained from the $(4*i+17)^{th}$ lane data stream are from different RS codewords. A $0^{th}$ symbol in the two consecutive symbols obtained from the $(4*i+18)^{th}$ lane data stream and a $0^{th}$ symbol in the two consecutive symbols obtained from the $(4*i+19)^{th}$ lane data stream are from different RS codewords, and a $1^{st}$ symbol in the two consecutive symbols obtained from the $(4*i+18)^{th}$ lane data stream and a $1^{st}$ symbol in the two consecutive symbols obtained from the $(4*i+19)^{th}$ lane data stream are from different RS codewords.

Figure 69:
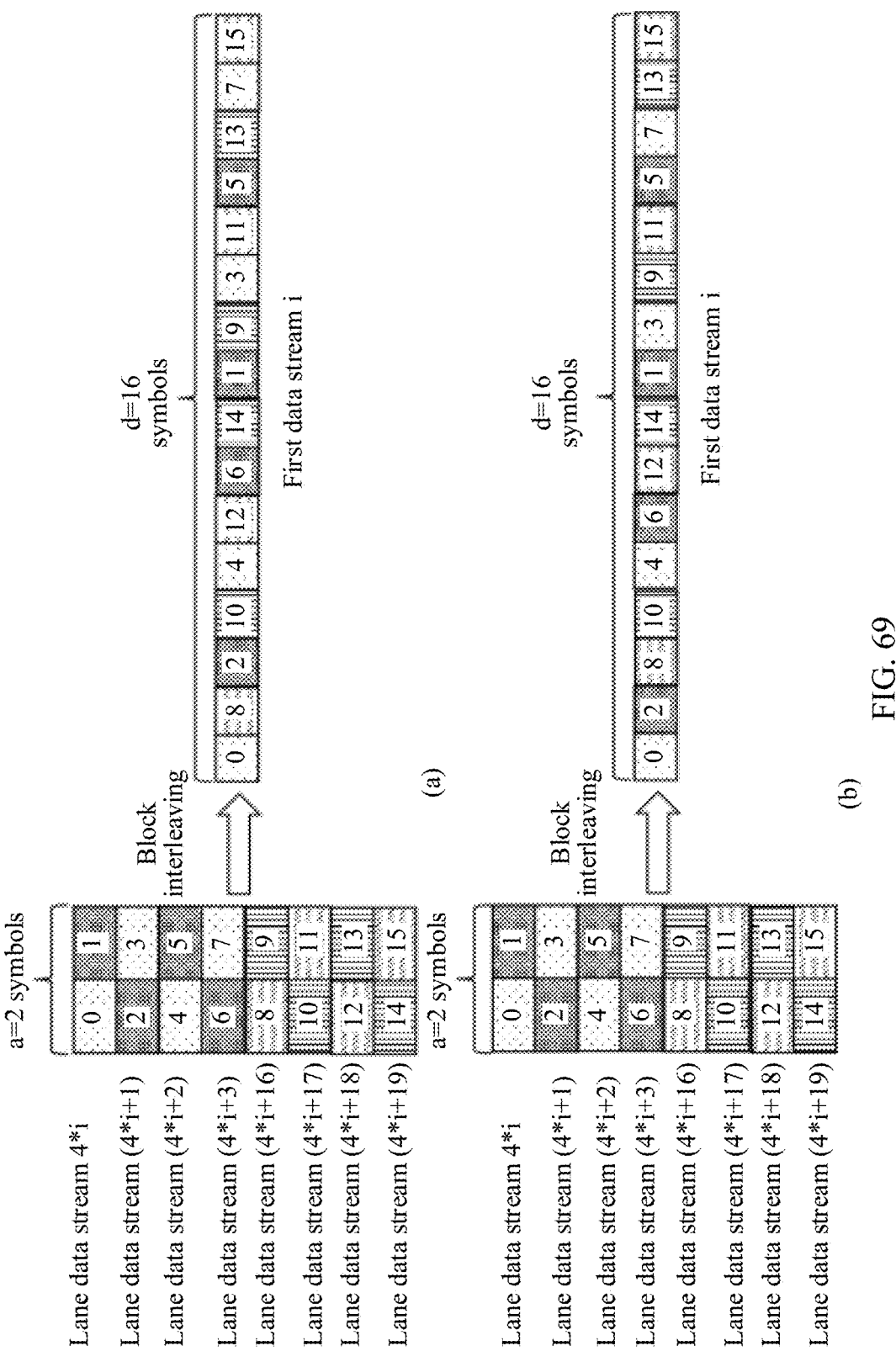
FIG. 69 is a schematic diagram of still another application scenario of block interleaving according to an embodiment of this application.

FIG. 69 is a schematic diagram of still another application scenario of block interleaving according to an embodiment of this application. With reference to the foregoing features, another specific implementation of the block interleaving is as an example shown in (a) in FIG. 69. In 16 consecutive symbols in first data stream i, $0^{th}$ and $8^{th}$ symbols are from the $(4*i)^{th}$ lane data stream, $1^{st}$ and $9^{th}$ symbols are from the $(2*i+16)^{th}$ lane data stream, $2^{nd}$ and $10^{th}$ symbols are from the $(4*i+1)^{th}$ lane data stream, $3^{rd}$ and $11^{th}$ symbols are from the $(4*i+17)^{th}$ lane data stream, $4^{th}$ and $12^{th}$ symbols are from the $(4*i+2)^{th}$ lane data stream, $5^{th}$ and $13^{th}$ symbols are from the $(4*i+18)^{th}$ lane data stream, $6^{th}$ and $14^{th}$ symbols are from the $(4*i+3)^{th}$ lane data stream, and $7^{th}$ and $15^{th}$ symbols are from the $(4*i+19)^{th}$ lane data stream. It should be noted that, the foregoing implementation is equivalent to the following case: One symbol is obtained from each of the eight lane data streams, and interleaving is performed to obtain eight consecutive symbols in data stream i, where in the eight consecutive symbols in first data stream i, the $0^{th}$ symbol is from the $(4*i)^{th}$ lane data stream, the $1^{st}$ symbol is from the $(4*i+16)^{th}$ lane data stream, the $2^{nd}$ symbol is from the $(4*i+1)^{th}$ lane data stream, the $3^{rd}$ symbol is from the $(4*i+17)^{th}$ lane data stream, the $4^{th}$ symbol is from the $(4*i+2)^{th}$ lane data stream, the $5^{th}$ symbol is from the $(4*i+18)^{th}$ lane data stream, the $6^{th}$ symbol is from the $(4*i+3)^{th}$ lane data stream, and the $7^{th}$ symbol is from the $(4*i+19)^{th}$ lane data stream.

Still another specific implementation of the block interleaving is as an example shown in (b) in FIG. 69. In 16 consecutive symbols in first data stream i, $0^{th}$ and $8^{th}$ symbols are from the $(4*i)^{th}$ lane data stream, $1^{st}$ and $9^{th}$ symbols are from the $(4*i+1)^{th}$ lane data stream, $2^{nd}$ and $10^{th}$ symbols are from the $(4*i+16)^{th}$ lane data stream, $3^{rd}$ and $11^{th}$ symbols are from the $(4*i+17)^{th}$ lane data stream, $4^{th}$ and $12^{th}$ symbols are from the $(4*i+2)^{th}$ lane data stream, $5^{th}$ and $13^{th}$ symbols are from the $(4*i+3)^{th}$ lane data stream, $6^{th}$ and $14^{th}$ symbols are from the $(4*i+18)^{th}$ lane data stream, and $7^{th}$ and $15^{th}$ symbols are from the $(4*i+19)^{th}$ lane data stream. It should be noted that, the foregoing implementation is equivalent to the following case: One symbol is obtained from each of the eight lane data streams, and interleaving is performed to obtain eight consecutive symbols in data stream i, where in the eight consecutive symbols in first data stream i, the $0^{th}$ symbol is from the $(4*i)^{th}$ lane data stream, the $1^{st}$ symbol is from the $(4*i+1)^{th}$ lane data stream, the $2^{nd}$ symbol is from the $(4*i+16)^{th}$ lane data stream, the $3^{rd}$ symbol is from the $(4*i+17)^{th}$ lane data stream, the $4^{th}$ symbol is from the $(4*i+2)^{th}$ lane data stream, the $5^{th}$ symbol is from the $(4*i+3)^{th}$ lane data stream, the $6^{th}$ symbol is from the $(4*i+18)^{th}$ lane data stream, and the $7^{th}$ symbol is from the $(4*i+19)^{th}$ lane data stream.

It should be noted that the block interleaving may alternatively be implemented by using symbol multiplexing. In symbol multiplexing, one symbol is obtained from each of the eight lane data streams.

$$C^{j}_{4*i}$$

represents a $j^{th}$ symbol in a $(4*i)^{th}$ lane data stream, $$C^{j}_{4*i+16}$$

represents a $j^{th}$ symbol in a $(4*i+16)^{th}$ lane data stream, $$C^{j}_{4*i+1}$$

represents a $j^{th}$ symbol in a $(4*i+1)^{th}$ lane data stream, $$C^{j}_{4*i+17}$$

represents a $j^{th}$ symbol in a $(4*i+17)^{th}$ lane data stream, $$C^{j}_{4*i+2}$$

represents a $j^{th}$ symbol in a $(4*i+2)^{th}$ lane data stream, $$C^{j}_{4*i+18}$$

represents a $j^{th}$ symbol in a $(4*i+18)^{th}$ lane data stream, $$C^{j}_{4*i+3}$$

represents a $j^{th}$ symbol in a $(4*i+3)^{th}$ lane data stream, and $$C^{j}_{4*i+19}$$

represents a $j^{th}$ symbol in a $(4*i+19)^{th}$ lane data stream, where $j\geq0$, and $$C^{j}_{4*i}, C^{j}_{4*i+16}, C^{j}_{4*i+1}, C^{j}_{4*i+17}, C^{j}_{4*i+2}, C^{j}_{4*i+18}, C^{j}_{4*i+3},$$

and $$C^{j}_{4*i+19}$$

are consecutive in the first data stream obtained through 8:1 symbol multiplexing. That is, a data sequence of first data stream i after the 8:1 symbol multiplexing is $$C^{0}_{4*i}, C^{0}_{4*i+16}, C^{0}_{4*i+1}, C^{0}_{4*i+17}, C^{0}_{4*i+2}, C^{0}_{4*i+18}, C^{0}_{4*i+3}, C^{0}_{4*i+19},$$
$$\ldots, C^{j}_{4*i}, C^{j}_{4*i+16}, C^{j}_{4*i+1}, C^{j}_{4*i+17}, C^{j}_{4*i+2}, C^{j}_{4*i+18}, C^{j}_{4*i+3}, C^{j}_{4*i+19},$$

$\ldots$, where $0\leq i\leq3$.

$$C^{0}_{4*i}, C^{0}_{4*i+16}, C^{0}_{4*i+1},$$

and $$C^{0}_{4*i+17}$$

are from four different RS codewords, and $$C^{j}_{4*i+2}, C^{j}_{4*i+18}, C^{j}_{4*i+3},$$

and $$C^{j}_{4*i+19}$$

are from four different RS codewords. Another specific symbol multiplexing is that one symbol is obtained from each of the eight lane data streams, and $$C^{j}_{4*i}, C^{j}_{4*i+1}, C^{j}_{4*i+16}, C^{j}_{4*i+17}, C^{j}_{4*i+2}, C^{j}_{4*i+3}, C^{j}_{4*i+18},$$

and $$C^{j}_{4*i+19}$$

are consecutive in the first data stream obtained through 8:1 symbol multiplexing. That is, a data sequence of first data stream i after the 8:1 symbol multiplexing is $$C_{4*i}^0, C_{4*i+1}^0, C_{4*i+16}^0, C_{4*i+17}^0, C_{4*i+2}^0, C_{4*i+3}^0, C_{4*i+18}^0, C_{4*i+19}^0,$$

$$\ldots, C_{4*i}^j, C_{4*i+1}^j, C_{4*i+16}^j, C_{4*i+17}^j, C_{4*i+2}^j, C_{4*i+18}^j, C_{4*i+19}^j,$$

. . . , where $0 \le i \le 3$.

Implementation 13: That n=32 is used as an example, 16 lane data streams in odd-numbered lanes of the 32 lane data streams are from same codewords, 16 lane data streams in even-numbered lanes of the 32 lane data streams are from same codewords, and data streams in odd-numbered lanes and data streams in even-numbered lanes are from different codewords. That is, a total of 16 lane data streams (stream 2*i) are from the same codewords, and a total of 16 lane data streams (stream (2*i+1)) are from the same codewords, and $0 \le i < 16$.

Figure 70:
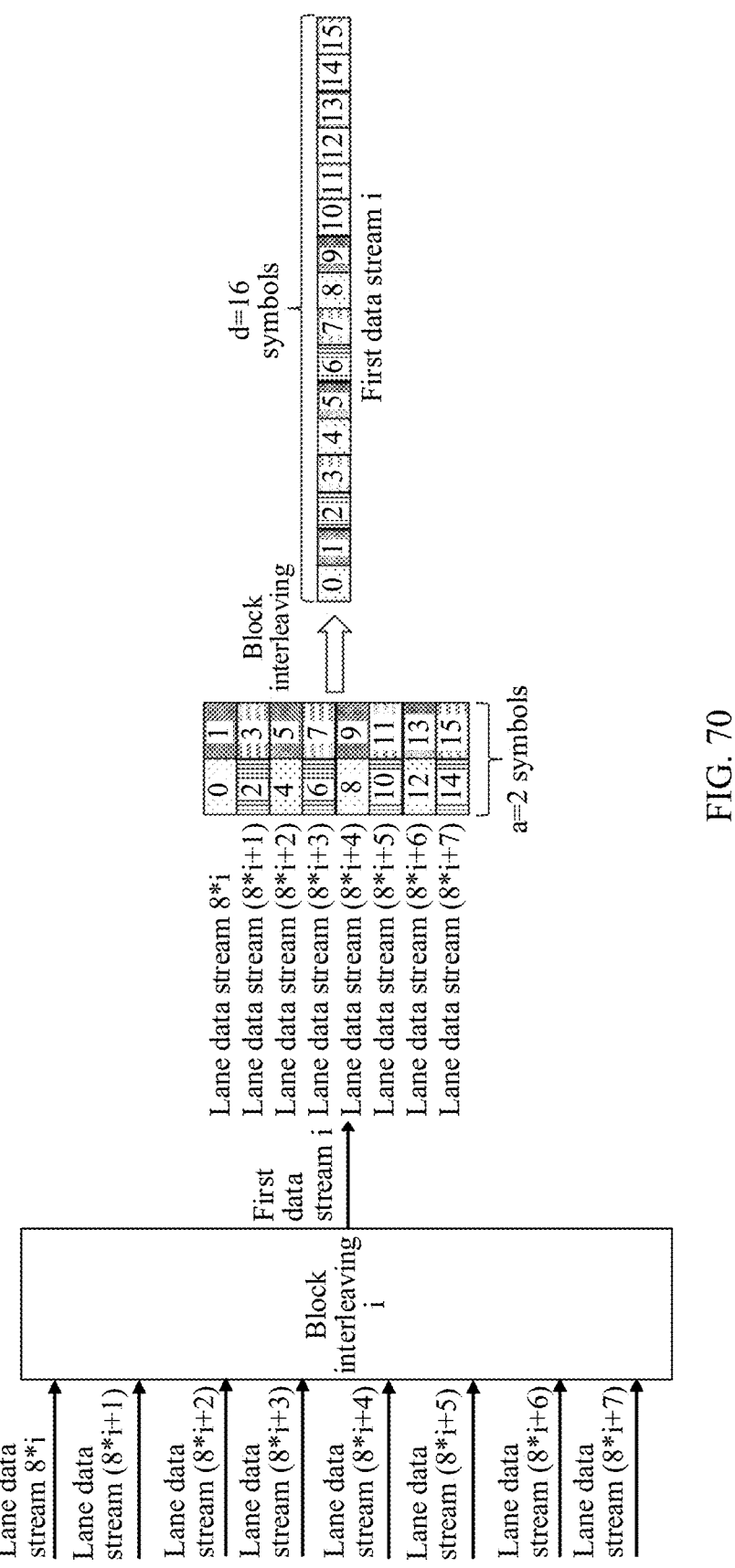
FIG. 70 is a schematic diagram of still another application scenario of block interleaving according to an embodiment of this application.

FIG. 70 is a schematic diagram of still another application scenario of block interleaving according to an embodiment of this application. One block interleaver shown in FIG. 70 is used to perform block interleaving on eight lane data streams to obtain one first data streams. A total of 4 block interleavers shown in FIG. 70 need to be used for block interleaving. In the eight lane data streams, four lane data streams are four odd-numbered lane data streams of lane data stream 0 to lane data stream 31, and the other four lane data streams are four even-numbered lane data streams of lane data stream 0 to lane data stream 31. The block interleaver selects a total of 16 symbols (a=2 consecutive symbols from each of the eight lane data streams), and then maps the 16 symbols into D=160 consecutive bits, namely, d=16 symbols, in the first data stream. In one first data stream obtained through block interleaving, every d=16 consecutive symbols are from at least v=4 different codewords, and every L2=544 consecutive symbols are from at least v=4 different codewords. Further, in one first data stream obtained through block interleaving, every four consecutive symbols in every d=16 consecutive symbols are from four different RS codewords, to be specific, in every 16 consecutive symbols, a $0^{th}$ symbol to a $3^{rd}$ symbol are from different RS codewords, a $4^{th}$ symbol to a $7^{th}$ symbol are from different RS codewords, an $8^{th}$ symbol to an $11^{th}$ symbol are from different RS codewords, and a $12^{th}$ symbol to a $15^{th}$ symbol are from different RS codewords. In a specific implementation, block interleaver i performs block interleaving on a $(8*i)^{th}$ lane data stream, a $(8*i+1)^{th}$ lane data stream, a $(8*i+2)^{th}$ lane data stream, a $(8*i+3)^{th}$ lane data stream, a $(8*i+4)^{th}$ lane data stream, a $(8*i+5)^{th}$ lane data stream, a $(8*i+6)^{th}$ lane data stream, and a $(8*i+7)^{th}$ lane data stream to obtain one first data stream, so that a total of m=4 first data streams are obtained, where $0 \le i \le 3$.

A specific interleaving manner of block interleaving is as follows: A total of 16 symbols (a=2 consecutive symbols from each of the $(8*i)^{th}$ lane data stream, the $(8*i+1)^{th}$ lane data stream, the $(8*i+2)^{th}$ lane data stream, the $(8*i+3)^{th}$ lane data stream, the $(8*i+4)^{th}$ lane data stream, the $(8*i+5)^{th}$ lane data stream, the $(8*i+6)^{th}$ lane data stream, and the $(8*i+7)^{th}$ lane data stream (where $0 \le i < 3$)) are selected, and then are interleaved into 16 consecutive symbols in first data stream i. In a specific implementation, in the 16 consecutive symbols in first data stream i, the $0^{th}$ and $1^{st}$ symbols are from the $(8*i)^{th}$ lane data stream, the $2^{nd}$ and $3^{rd}$ symbols are from the $(8*i+1)^{th}$ lane data stream, the $4^{th}$ and $5^{th}$ symbols are from the $(8*i+2)^{th}$ lane data stream, the $6^{th}$ and $7^{th}$ symbols are from the $(8*i+3)^{th}$ lane data stream, the $8^{th}$ and $9^{th}$ symbols are from the $(8*i+4)^{th}$ lane data stream, the $10^{th}$ and $11^{th}$ symbols are from the $(8*i+5)^{th}$ lane data stream, the $12^{th}$ and $13^{th}$ symbols are from the $(8*i+6)^{th}$ lane data stream, and the $14^{th}$ and $15^{th}$ symbols are from the $(8*i+7)^{th}$ lane data stream.

Figure 71:
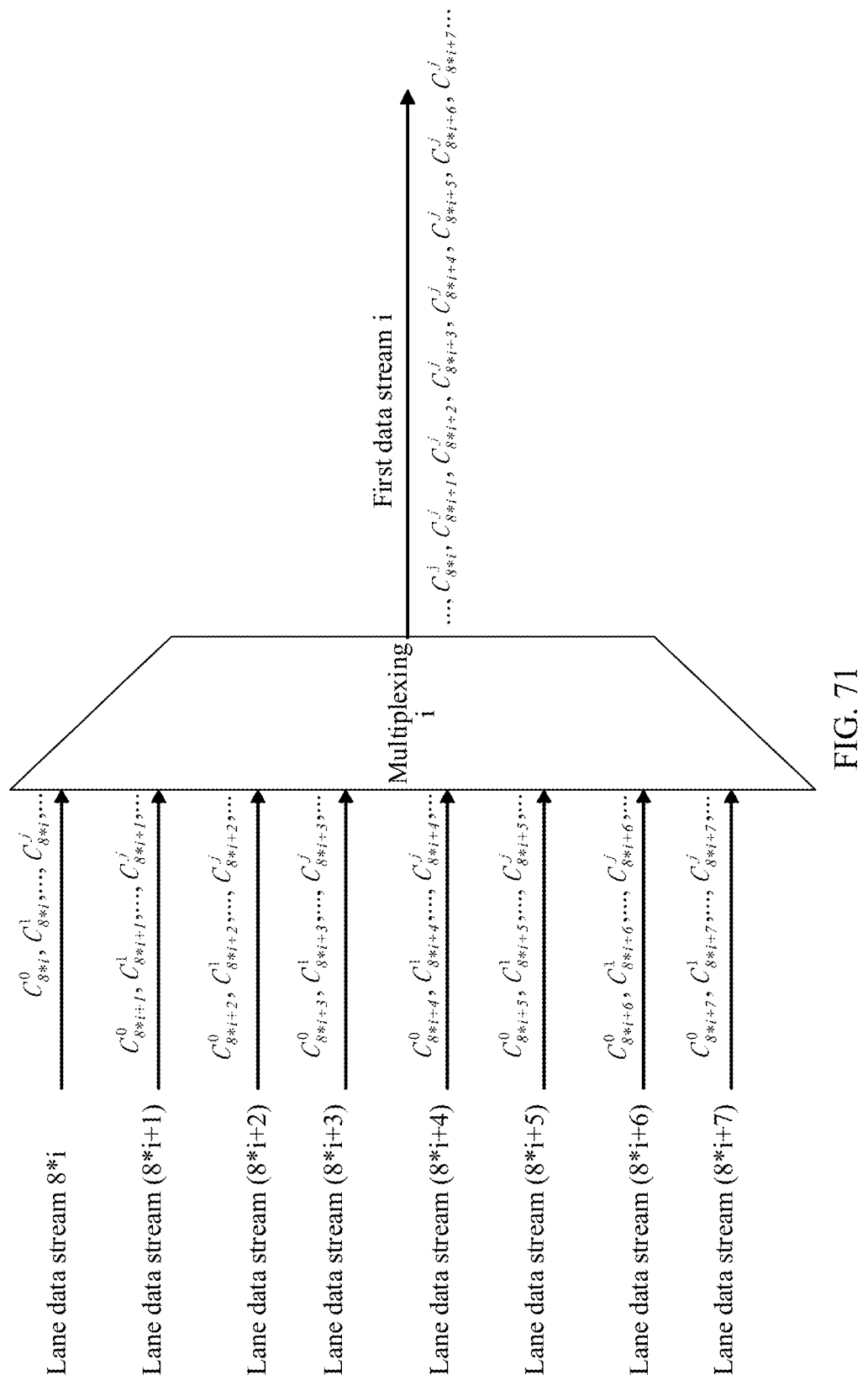
FIG. 71 is a schematic diagram of still another application scenario of block interleaving according to an embodiment of this application.

FIG. 71 is a schematic diagram of still another application scenario of block interleaving according to an embodiment of this application. It should be noted that the block interleaving may alternatively be implemented by using symbol multiplexing (symbol-mux) shown in FIG. 71, where $$C_{8*i}^j$$

represents two consecutive symbols in a $j^{th}$ group in a $(8*i)^{th}$ lane data stream, $$C_{8*i+1}^j$$

represents two consecutive symbols in a $j^{th}$ group in a $(8*i+1)^{th}$ lane data stream, $$C_{8*i+2}^j$$

represents two consecutive symbols in a $j^{th}$ group in a $(8*i+2)^{th}$ lane data stream, $$C_{8*i+3}^j$$

represents two consecutive symbols in a $j^{th}$ group in a $(8*i+3)^{th}$ lane data stream, $$C_{8*i+4}^j$$

represents two consecutive symbols in a $j^{th}$ group in a $(8*i+4)^{th}$ lane data stream, $$C_{8*i+5}^j$$

represents two consecutive symbols in a $j^{th}$ group in a $(8*i+5)^{th}$ lane data stream, $$C_{8*i+6}^j$$

represents two consecutive symbols in a $j^{th}$ group in a $(8*i+6)^{th}$ lane data stream, $$C_{8*i+7}^j$$

represents two consecutive symbols in a $j^{th}$ group in a $8*i+7^{th}$ lane data stream, where $j \geq 0$, and $$C_{8*i}^j, C_{8*i+1}^j, C_{8*i+2}^j, C_{8*i+3}^j, C_{8*i+4}^j, C_{8*i+5}^j, C_{8*i+6}^j,$$

and $$C_{8*i+7}^j$$

are consecutive in first data stream i obtained through multiplexing. That is, a data sequence of first data stream i after 8:1 symbol multiplexing is $$C_{8*i}^0, C_{8*i+1}^0, C_{8*i+2}^0, C_{8*i+3}^0, C_{8*i+4}^0, C_{8*i+5}^0, C_{8*i+6}^0, C_{8*i+7}^0, \ldots,$$
$$C_{8*i}^j, C_{8*i+1}^j, C_{8*i+2}^j, C_{8*i+3}^j, C_{8*i+4}^j, C_{8*i+5}^j, C_{8*i+6}^j, C_{8*i+7}^j,$$

. . . , where $0 \leq i \leq 3$.

It should be noted that the foregoing 8:1 symbol multiplexing may alternatively be implemented by using multilevel symbol multiplexing, for example, by using three-level 2:1 symbol multiplexing.

Implementation 14: Based on Implementation 13, Implementation 14 provides another specific implementation of block interleaving.

A total of 16 symbols (a=2 consecutive symbols from each of the $(8*i)^{th}$ lane data stream, the $(8*i+1)^{th}$ lane data stream, the $(8*i+2)^{th}$ lane data stream, the $(8*i+3)^{th}$ lane data stream, the $(8*i+4)^{th}$ lane data stream, the $(8*i+5)^{th}$ lane data stream, the $(8*i+6)^{th}$ lane data stream, and the $(8*i+7)^{th}$ lane data stream (where $0 \leq i < 3$) are selected, and then are interleaved into 16 consecutive symbols in first data stream i. In some specific application scenarios, lane data alignment is alignment performed based on two RS symbols. In this case, a $0^{th}$ symbol in the two consecutive symbols obtained from the $(8*i)^{th}$ lane data stream and a $0^{th}$ symbol in the two consecutive symbols obtained from the $(8*i+2)^{th}$ lane data stream are from different RS codewords, and a $1^{st}$ symbol in the two consecutive symbols obtained from the $(8*i)^{th}$ lane data stream and a $1^{st}$ symbol in the two consecutive symbols obtained from the $(8*i+2)^{th}$ lane data stream are from different RS codewords. A $0^{th}$ symbol in the two consecutive symbols obtained from the $(8*i+1)^{th}$ lane data stream and a $0^{th}$ symbol in the two consecutive symbols obtained from the $(8*i+3)^{th}$ lane data stream are from different RS codewords, and a $1^{st}$ symbol in the two consecutive symbols obtained from the $(8*i+1)^{th}$ lane data stream and a $1^{st}$ symbol in the two consecutive symbols obtained from the $(8*i+3)^{th}$ lane data stream are from different RS codewords. A $0^{th}$ symbol in the two consecutive symbols obtained from a $(8*i+4)^{th}$ lane data stream and a $0^{th}$ symbol in the two consecutive symbols obtained from a $(8*i+6)^{th}$ lane data stream are from different RS codewords, and a $1^{st}$ symbol in the two consecutive symbols obtained from a $(8*i+4)^{th}$ lane data stream and a $1^{st}$ symbol in the two consecutive symbols obtained from a $(8*i+6)^{th}$ lane data stream are from different RS codewords. A $0^{th}$ symbol in the two consecutive symbols obtained from the $(8*i+5)^{th}$ lane data stream and a $0^{th}$ symbol in the two consecutive symbols obtained from the $(8*i+7)^{th}$ lane data stream are from different RS codewords, and a $1^{st}$ symbol in the two consecutive symbols obtained from the $(8*i+5)^{th}$ lane data stream and a $1^{st}$ symbol in the two consecutive symbols obtained from the $(8*i+7)^{th}$ lane data stream are from different RS codewords.

Figure 72:
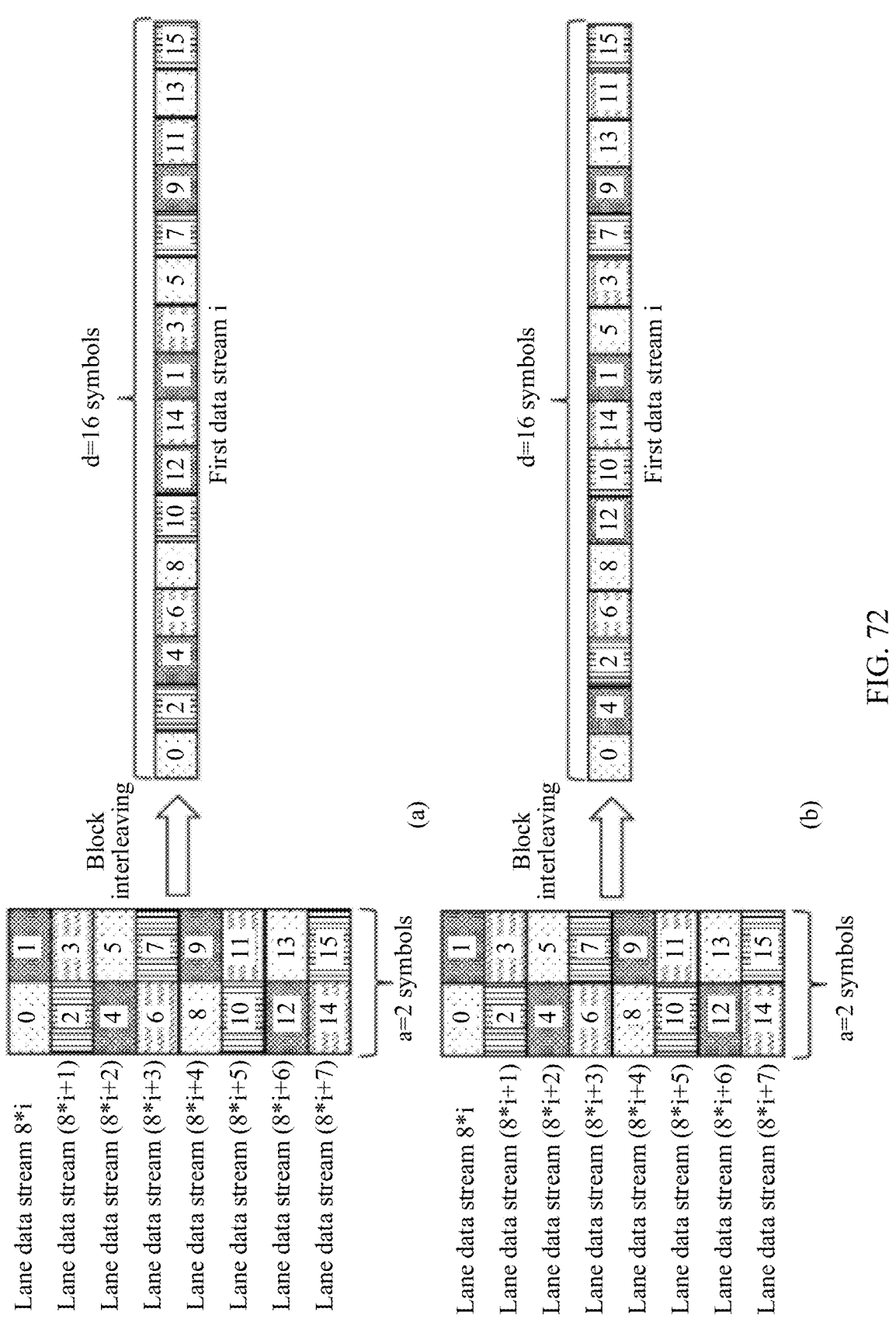
FIG. 72 is a schematic diagram of still another application scenario of block interleaving according to an embodiment of this application.

FIG. 72 is a schematic diagram of still another application scenario of block interleaving according to an embodiment of this application. With reference to the foregoing features, another specific implementation of the block interleaving is as an example shown in (a) in FIG. 72. In 16 consecutive symbols in first data stream i, $0^{th}$ and $8^{th}$ symbols are from the $(8*i)^{th}$ lane data stream, $1^{st}$ and $9^{th}$ symbols are from the $(8*i+1)^{th}$ lane data stream, $2^{nd}$ and $10^{th}$ symbols are from the $(8*i+2)^{th}$ lane data stream, $3^{rd}$ and $11^{th}$ symbols are from the $(8*i+3)^{th}$ lane data stream, $4^{th}$ and $12^{th}$ symbols are from the $(8*i+4)^{th}$ lane data stream, $5^{th}$ and $13^{th}$ symbols are from the $(8*i+5)^{th}$ lane data stream, $6^{th}$ and $14^{th}$ symbols are from the $(8*i+6)^{th}$ lane data stream, and $7^{th}$ and $15^{th}$ symbols are from the $(8*i+7)^{th}$ lane data stream. It should be noted that, the foregoing implementation is equivalent to the following case: One symbol is obtained from each of the eight lane data streams, and interleaving is performed to obtain eight consecutive symbols in data stream i, where in the eight consecutive symbols in first data stream i, the $0^{th}$ symbol is from the $(8*i)^{th}$ lane data stream, the $1^{st}$ symbol is from the $(8*i+1)^{th}$ lane data stream, the $2^{nd}$ symbol is from the $(8*i+2)^{th}$ lane data stream, the $3^{rd}$ symbol is from the $(8*i+3)^{th}$ lane data stream, the $4^{th}$ symbol is from the $(8*i+4)^{th}$ lane data stream, the $5^{th}$ symbol is from the $(8*i+5)^{th}$ lane data stream, the $6^{th}$ symbol is from the $(8*i+6)^{th}$ lane data stream, and the $7^{th}$ symbol is from the $(8*i+7)^{th}$ lane data stream.

Still another specific implementation of the block interleaving is as an example shown in (b) in FIG. 72. In 16 consecutive symbols in first data stream i, $0^{th}$ and $8^{th}$ symbols are from the $(8*i)^{th}$ lane data stream, $1^{st}$ and $9^{th}$ symbols are from the $(8*i+2)^{th}$ lane data stream, $2^{nd}$ and $10^{th}$ symbols are from the $(8*i+1)^{th}$ lane data stream, $3^{rd}$ and $11^{th}$ symbols are from the $(8*i+3)^{th}$ lane data stream, $4^{th}$ and $12^{th}$ symbols are from the $(8*i+4)^{th}$ lane data stream, $5^{th}$ and $13^{th}$ symbols are from the $(8*i+6)^{th}$ lane data stream, $6^{th}$ and $14^{th}$ symbols are from the $(8*i+5)^{th}$ lane data stream, and $7^{th}$ and $15^{th}$ symbols are from the $(8*i+7)^{th}$ lane data stream. It should be noted that, the foregoing implementation is equivalent to the following case: One symbol is obtained from each of the eight lane data streams, and interleaving is performed to obtain eight consecutive symbols in data stream i, where in the eight consecutive symbols in first data stream i, the $0^{th}$ symbol is from the $(8*i)^{th}$ lane data stream, the $1^{st}$ symbol is from the $(8*i+2)^{th}$ lane data stream, the $2^{nd}$ symbol is from the $(8*i+1)^{th}$ lane data stream, the $3^{rd}$ symbol is from the $(8*i+3)^{th}$ lane data stream, the $4^{th}$ symbol is from the $(8*i+4)^{th}$ lane data stream, the $5^{th}$ symbol is from the $(8*i+6)^{th}$ lane data stream, the $6^{th}$ symbol is from the $(8*i+5)^{th}$ lane data stream, and the $7^{th}$ symbol is from the $(8*i+7)^{th}$ lane data stream.

It should be noted that the block interleaving may alternatively be implemented by using symbol multiplexing.

$$C_{8*i}^j$$

represents a $j^{th}$ symbol in a $(8*i)^{th}$ lane data stream, $$C_{8*i+1}^j$$

represents a $j^{th}$ symbol in a $(8*i+1)^{th}$ lane data stream, $$C^j_{8*i+2}$$

represents a $j^{th}$ symbol in a $(8*i+2)^{th}$ lane data stream, $$C^j_{8*i+3}$$

represents a $j^{th}$ symbol in a $(8*i+3)^{th}$ lane data stream, $$C^j_{8*i+4}$$

represents a $j^{th}$ symbol in a $(8*i+4)^{th}$ lane data stream, $$C^j_{8*i+5}$$

represents a $j^{th}$ symbol in a $(8*i+5)^{th}$ lane data stream, $$C^j_{8*i+6}$$

represents a $j^{th}$ symbol in a $(8*i+6)^{th}$ lane data stream, and $$C^j_{8*i+7}$$

represents a $j^{th}$ symbol in a $(8*i+7)^{th}$ lane data stream, where $j \geq 0$, and $$C^j_{8*i}, C^j_{8*i+1}, C^j_{8*i+2}, C^j_{8*i+3}, C^j_{8*i+4}, C^j_{8*i+5}, C^j_{8*i+6},$$

and $$C^j_{8*i+7}$$

are consecutive in first data stream i obtained through multiplexing. That is, a data sequence of first data stream i after 8:1 symbol multiplexing is $$C^0_{8*i}, C^0_{8*i+1}, C^0_{8*i+2}, C^0_{8*i+3}, C^0_{8*i+4}, C^0_{8*i+5}, C^0_{8*i+6}, C^0_{8*i+7},$$

$$\dots, C^j_{8*i}, C^j_{8*i+1}, C^j_{8*i+2}, C^j_{8*i+3}, C^j_{8*i+4}, C^j_{8*i+5}, C^j_{8*i+6}, C^j_{8*i+7},$$

. . . , where $0 \leq i \leq 3$. Another specific symbol multiplexing is that one symbol is obtained from each of the eight lane data streams, and $$C^j_{8*i}, C^j_{8*i+2}, C^j_{8*i+1}, C^j_{8*i+3}, C^j_{8*i+4}, C^j_{8*i+6}, C^j_{8*i+5},$$

and $$C^j_{8*i+7}$$

are consecutive in the first data stream obtained through 8:1 symbol multiplexing. That is, a data sequence of first data stream i after the 8:1 symbol multiplexing is $$C^0_{4*i}, C^0_{4*i+1}, C^0_{4*i+16}, C^0_{4*i+17}, C^0_{4*i+2}, C^0_{4*i+3}, C^0_{4*i+18}, C^0_{4*i+19}, \dots, C^j_{4*i}$$

$$C^j_{4*i+17}, C^j_{4*i+2}, C^j_{4*i+3}, C^j_{4*i+18}, C^j_{4*i+19},$$

. . . , where $0 \leq i \leq 3$.

It should be noted that, in some specific implementation scenarios, when sending device 01 sends a 1*800GE service, after PMA 4:1 multiplexing is performed, 32 PCS lane data streams are sent to a transmitter processing module through a lane attachment unit interface AUI. During the PMA 4:1 multiplexing, two of four input data streams are from two of $0^{th}$ to $15^{th}$ PCS lane data streams, and the other two are from two of $16^{th}$ to $31^{st}$ PCS lane data streams. During data processing of the transmitter processing module, with reference to the foregoing feature in which "during the PMA 4:1 multiplexing, two of four input data streams are from two of $0^{th}$ to $15^{th}$ PCS lane data streams, and the other two are from two of $16^{th}$ to $31^{st}$ PCS lane data streams", de-mux is performed first to restore the 32 PCS lane data streams, where each physical lane data stream is de-multiplexed de-mux to obtain four PCS lane data streams, and then, alignment marker lock of the lane data streams is performed by using known alignment markers of PCS lanes. Then, lane reordering does not need to be performed, and block interleaving (or symbol multiplexing) in Implementation 11, Implementation 12, Implementation 13, or Implementation 14 is directly performed on the eight PCS lane data streams obtained through de-multiplexing de-mux the two physical lane data streams, and block interleaving (or symbol multiplexing) is performed on the eight lane data streams to obtain one first data stream, so that 16 consecutive symbols in the first data stream are from at least four RS codewords. For a specific implementation thereof, refer to FIG. 67, FIG. 68, FIG. 69, FIG. 70, FIG. 71, or FIG. 72. A person of ordinary skill in the art may know the specific implementation thereof, and details are not described herein again.

Block 5102: Separately perform convolutional interleaving on the m first data streams to obtain m second data streams.

FIG. 73 is a schematic diagram of a structure in which convolutional interleaving is separately performed on m first data streams according to an embodiment of this application. As shown in FIG. 73, the convolutional interleaving may be separately performed on the m first data streams via m convolution interleavers. Each convolution interleaver performs convolutional interleaving on an input first data stream in a unit of d symbols, to obtain a second data stream whose data sequence is disordered, where the d symbols are obtained by a block interleaver by performing one block interleaving operation, and d=D/M.

It should be noted that, in this embodiment, each convolution interleaver performs the convolutional interleaving on the input first data stream in a similar manner. Specifically, each convolution interleaver includes p delay lines, and each convolution interleaver delays the input first data stream based on the p delay lines to obtain the second data stream. p is an integer greater than 1, a quantity of storage units included in each delay line is different, a delay line with a smallest quantity of storage units includes 0 storage units, and a difference between quantities of storage units of every two adjacent delay lines is Q. Each storage unit is configured to store d symbols. Symbols in each lane data stream are sequentially input to the p delay lines based on sequence numbers of the p delay lines, d symbols are input to each delay line for a single time and d symbols are output from the delay line for a single time, and p*d consecutive symbols in the second data stream include the d symbols output from the delay line. Q is an integer greater than or equal to 1. For example, the p delay lines respectively include 0 storage units, Q storage units, 2Q storage units, . . . , (p−1)Q storage units, and each storage unit is configured to store d symbols. In this case, the p delay lines respectively correspond to p delay values, and the delay values include 0 symbols, Q×d symbols, 2Q×d symbols, . . . , (p−1)Q×d symbols. It should be understood that, a larger quantity of symbols included in the delay value of the delay line indicates a longer delay (also referred to as latency) of the delay line for a data stream. It should be understood that when the delay line does not include a storage unit, a delay of the delay line is 0 symbols, in other words, transparent transmission with no delay is performed.

It should be noted that, at a same moment, an input switch and an output switch of the convolution interleaver are located on a same delay line. After d symbols are input to a current delay line for a single time and d symbols are output from the current delay line for a single time, positions of the switches are updated to a next delay line, to ensure that symbols in each lane data stream are sequentially input to the p delay lines based on sequence numbers of the p delay lines, and p*d consecutive symbols in a first data stream include d symbols output from each delay line. A specific data read/write operation is as follows: d symbols are read out from a storage unit that is closest to an output port and that is on the current delay line. d symbols stored in each storage unit that is on the current delay line are transferred to a next storage unit. Then, d symbols are written into a storage unit that is closest to an input port and that is on the current delay line. Then, switching to a next delay line is performed and the foregoing operations are repeated, and the rest can be deduced by analogy.

Figures 12A, 12B:
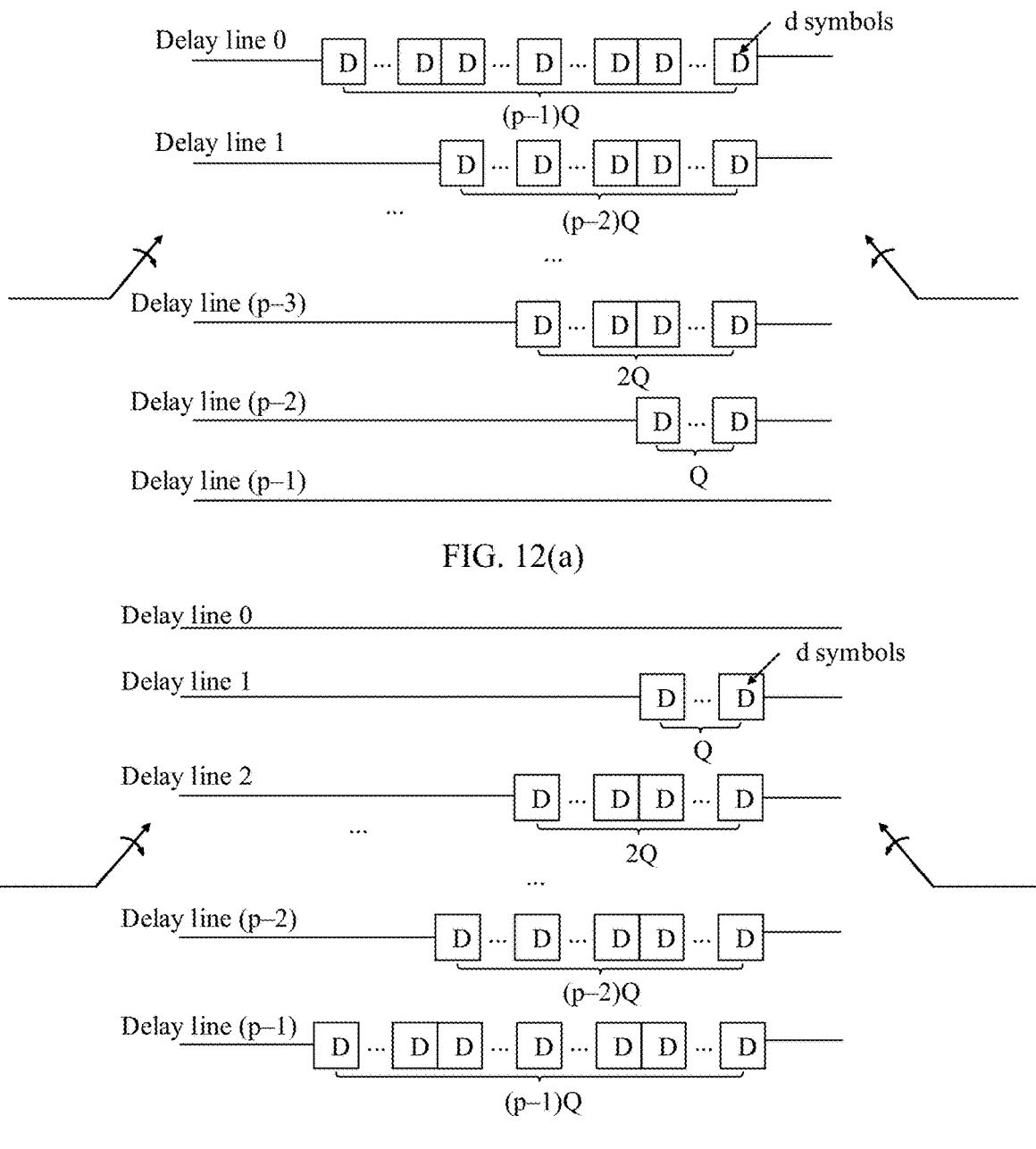
FIG. 12(*a*) is a schematic diagram of a first structure of a convolution interleaver according to an embodiment of this application.

In an embodiment, a structure of the convolution interleaver is shown in FIG. 12(a), and quantities of storage units in the p delay lines are in descending order based on sequence numbers of the p delay lines. To be specific, delay line 0 has (p−1)Q storage units, Q storage units are sequentially reduced for each delay line, and delay line (p−1) has 0 storage units. In this example, d(p*Q+1)≥L2, and L2=t/s*L1, so that d*p consecutive symbols in second data stream r output by convolution interleaver r are from at most v*p different codewords, and 0≤r≤m−1.

In another embodiment, a structure of the convolution interleaver is shown in FIG. 12(b), and quantities of storage units in the p delay lines are in ascending order based on sequence numbers of the p delay lines. To be specific, delay line 0 has 0 storage units, Q storage units are sequentially increased for each delay line, and delay line (p−1) has (p−1)Q storage units. In this example, d(p*Q−1)≥L2, and L2=t/s*L1, so that d*p consecutive symbols in second data stream r output by convolution interleaver r are from at most v*p different codewords, and 0≤r≤n−1.

It should be understood that when same parameters p, Q, and d are used, convolutional interleaving in FIG. 12(a) and convolutional interleaving in FIG. 12(b) are reverse operations of each other. In other words, when a transmitter processing module uses the convolutional interleaving structure shown in FIG. 12(a), convolutional de-interleaving corresponding to a receiver processing module uses the structure shown in FIG. 12(b). Similarly, when a transmitter processing module uses the convolutional interleaving structure shown in FIG. 12(b), convolutional de-interleaving corresponding to a receiver processing module uses the structure shown in FIG. 12(a).

It should be further understood that any one of n convolution interleavers may use one of FIG. 12(a) or FIG. 12(b). In actual application, the n convolution interleavers may all use the structure shown in FIG. 12(a); the n convolution interleavers may all use the structure shown in FIG. 12(b); or some convolution interleavers may use the structure shown in FIG. 12(a), and the remaining convolution interleavers use the structure shown in FIG. 12(b).

For ease of description, the following embodiments related to convolutional interleaving are described by using an example in which n convolution interleavers all use the structure shown in FIG. 12(a). Certainly, the example may be simply extended to another structure listed above, specific implementation thereof may be known to a person of ordinary skill in the art, and details are not described herein. The following describes several specific embodiments of the convolutional interleaving.

Embodiment 1: Convolutional interleaving provided in Embodiment 1 is implemented based on the block interleaving provided in Implementation 1 in block 5101.

FIG. 74 is a schematic diagram of an embodiment of a convolution interleaver according to an embodiment of this application. As shown in FIG. 74, the convolution interleaver includes p=3 delay lines. The p=3 delay lines respectively include 2Q storage units, Q storage units, and 0 storage units, and each storage unit is configured to store d=4 symbols (40 bits). In other words, a delay value of delay line 0 is 8Q symbols, a delay value of delay line 1 is 4Q symbols, and a delay value of delay line 2 is 0 symbols, that is, no delay.

As shown in FIG. 74, $C_r(\ )$ represents one symbol (10 bits) in first data stream r (where 0≤r≤m−1). For example, $C_r(12t)$, $C_r(12t+1)$, $C_r(12t+2)$, and $C_r(12t+3)$ represent four symbols that are currently input from first data stream r to delay line 0, and $C_r(12t-24Q)$, $C_r(12t-24Q+1)$, $C_r(12t-24Q+2)$, and $C_r(12t-24Q+3)$ are four symbols output from delay line 0; $C_r(12t+4)$, $C_r(12t+5)$, $C_r(12t+6)$, and $C_r(12t+7)$ represent four symbols that are subsequently input from first data stream r to delay line 1, and $C_r(12t-12Q+4)$, $C_r(12t-12Q+5)$, $C_r(12t-12Q+6)$, and $C_r(12t-12Q+7)$ are four symbols output from delay line 1; $C_r(12t+8)$, $C_r(12t+9)$, $C_r(12t+10)$, and $C_r(12t+11)$ represent four symbols that are subsequently input from first data stream r to delay line 2, and $C_r(12t+8)$, $C_r(12t+9)$, $C_r(12t+10)$, and $C_r(12t+11)$ are four symbols output from delay line 2; $C_r(12t+12)$, $C_r(12t+13)$, $C_r(12t+14)$, and $C_r(12t+15)$ represent four symbols that are subsequently input from first data stream r to delay line 0, and $C_r(12t-24Q+12)$, $C_r(12t-24Q+13)$, $C_r(12t-24Q+14)$, and $C_r(12t-24Q+15)$ are four symbols output from delay line 0; and so on. With reference to an RS distribution rule in the first data stream, when d(pQ+1)≥136, that is, Q≥11, a total of 12 symbols $C_r(12t-24Q)$, $C_r(12t-24Q+1)$, $C_r(12t-24Q+2)$, $C_r(12t-24Q+3)$, $C_r(12t-12Q+4)$, $C_r(12t-12Q+5)$, $C_r(12t-12Q+6)$, $C_r(12t-12Q+7)$, $C_r(12t+8)$, $C_r(12t+9)$, $C_r(12t+10)$, and $C_r(12t+11)$ that are output through convolutional interleaving are from 12 different RS codewords.

Figures 75, 76, 77:
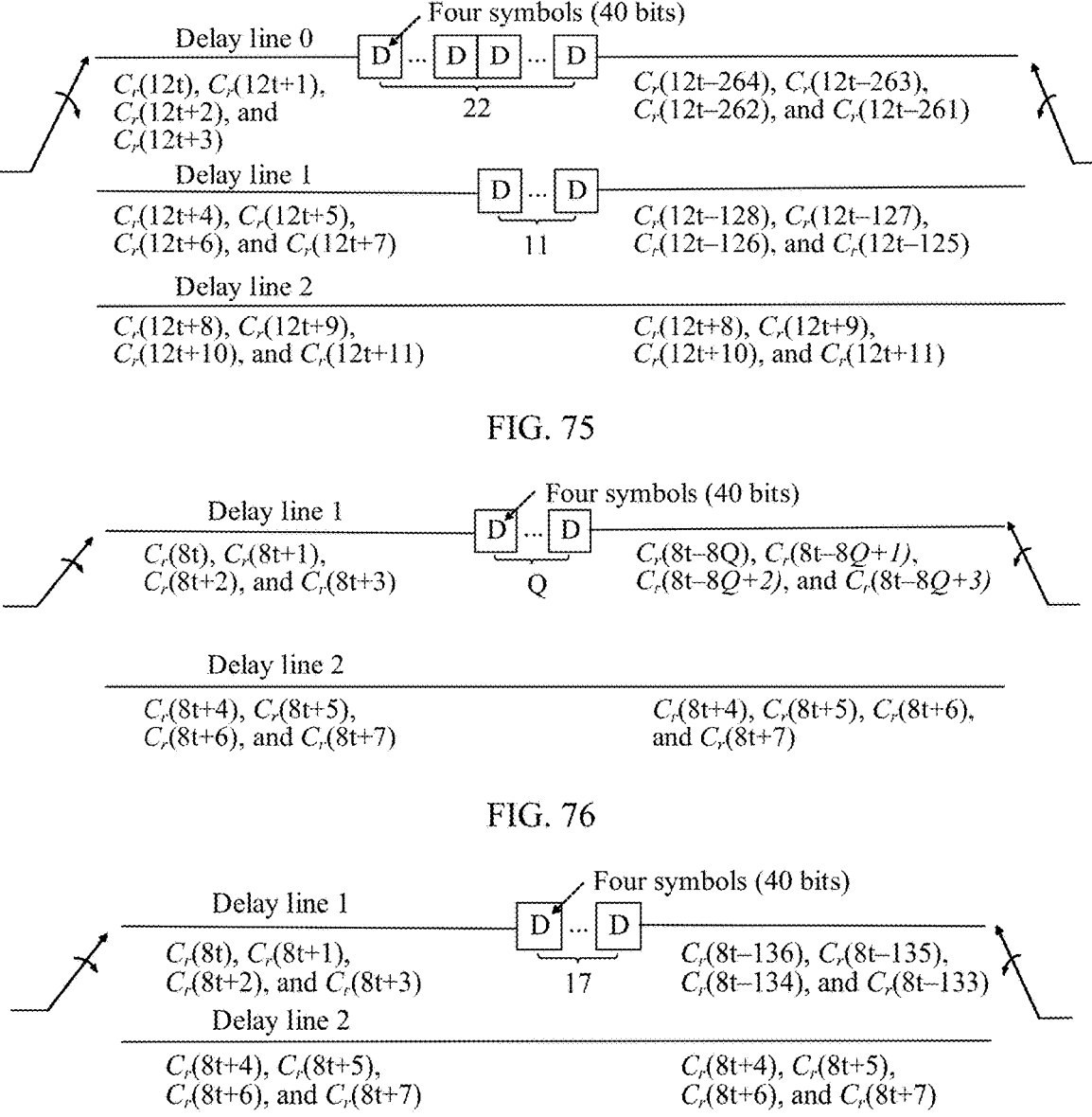
FIG. 75 is a schematic diagram of another embodiment of a convolution interleaver according to an embodiment of this application.
FIG. 76 is a schematic diagram of another embodiment of a convolution interleaver according to an embodiment of this application.
FIG. 77 is a schematic diagram of another embodiment of a convolution interleaver according to an embodiment of this application.

In an embodiment, FIG. 75 is a schematic diagram of another embodiment of a convolution interleaver according to an embodiment of this application. As shown in FIG. 75, based on the embodiment shown in FIG. 74, that Q=11 is selected, and a corresponding interleaving latency is approximately 22*4*3/2=132 RS symbols, which is equivalent to a total interleaving and de-interleaving latency of 50 ns of a 1*800GE service.

Embodiment 2: In this embodiment, a newly designed convolution interleaver is used based on Embodiment 1, to obtain a solution with a lower latency but second optimal error correction performance.

FIG. 76 is a schematic diagram of another embodiment of a convolution interleaver according to an embodiment of this application. As shown in FIG. 76, the convolution interleaver includes p=2 delay lines. The p=2 delay lines respectively include Q storage units and 0 storage units, and each storage unit is configured to store d=4 symbols (40 bits). In other words, a delay value of delay line 0 is 4Q symbols, and a delay value of delay line 1 is 0 symbols, that is, no delay.

As shown in FIG. 76, $C_r(\ )$ represents one symbol (10 bits) in first data stream r (where 0≤r≤m−1). For example, $C_r(8t)$, $C_r(8t+1)$, $C_r(8t+2)$, and $C_r(8t+3)$ represent four symbols (40 bits) currently input from first data stream r to delay line 0, and $C_r(8t−8Q)$, $C_r(8t−8Q+1)$, $C_r(8t−8Q+2)$, and $C_r(8t−8Q+3)$ are four symbols output from delay line 0; $C_r(8t+4)$, $C_r(8t+5)$, $C_r(8t+6)$, and $C_r(8t+7)$ represent four symbols that are subsequently input from first data stream r to delay line 1, and $C_r(8t+4)$, $C_r(8t+5)$, $C_r(8t+6)$, and $C_r(8t+7)$ are RS symbols output from delay line 1. $C_r(8t+8)$, $C_r(8t+9)$, $C_r(8t+10)$, and $C_r(8t+11)$ represent four symbols that are subsequently input from first data stream r to delay line 0, and $C_r(8t−8Q+8)$, $C_r(8t−8Q+9)$, $C_r(8t−8Q+10)$, and $C_r(8t−8Q+11)$ are four RS symbols output from delay line 0; and so on. With reference to an RS distribution rule in the first data stream, when d(pQ+1)≥136, that is, Q≥17, a total of eight symbols $C_r(8t−8Q)$, $C_r(8t−8Q+1)$, $C_r(8t−8Q+2)$, $C_r(8t−8Q+3)$, $C_r(8t+4)$, $C_r(8t+5)$, $C_r(8t+6)$, and $C_r(8t+7)$ that are output through convolutional interleaving are from eight different RS codewords.

In an embodiment, FIG. 77 is a schematic diagram of another embodiment of a convolution interleaver according to an embodiment of this application. As shown in FIG. 77, based on the embodiment shown in FIG. 76, that Q=17 is selected, and a corresponding interleaving latency is approximately 17*4*2/2=68 RS symbols, which is equivalent to a total interleaving and de-interleaving latency of 26 ns of a 1*800GE service.

Embodiment 3: Convolutional interleaving provided in Embodiment 3 is implemented based on the block interleaving provided in Implementation 2 in block 5101.

Figure 78:
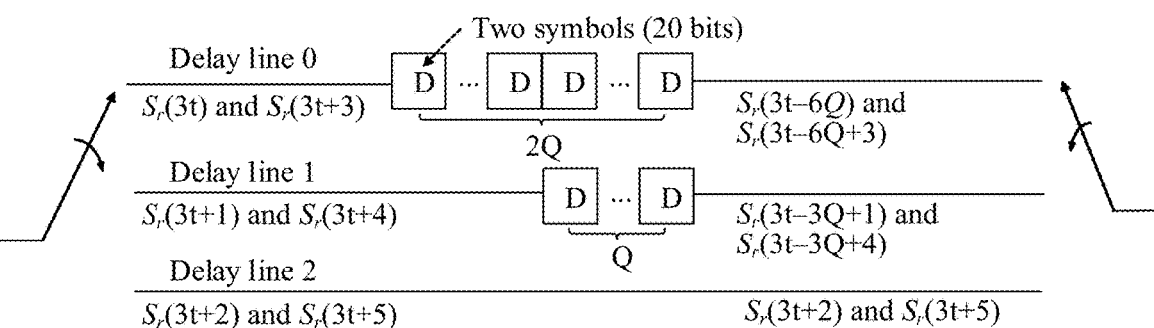
FIG. 78 is a schematic diagram of another embodiment of a convolution interleaver according to an embodiment of this application.

FIG. 78 is a schematic diagram of another embodiment of a convolution interleaver according to an embodiment of this application. As shown in FIG. 78, the convolution interleaver includes p=3 delay lines. The p=3 delay lines respectively include 2Q storage units, Q storage units, and 0 storage units, and each storage unit is configured to store d=2 symbols. In other words, a delay value of delay line 0 is 4Q symbols, a delay value of delay line 1 is 2Q symbols, and a delay value of delay line 2 is 0 symbols, that is, no delay.

As shown in FIG. 78, S, ( ) represents two consecutive symbols (a total of 20 bits) in first data stream r (where 0≤r≤m−1), and the 20 bits are 20 bits obtained by performing one block interleaving operation by a block interleaving module provided in this embodiment. A convolutional interleaving process is as follows: $S_r(3t)$ represents two symbols currently input from first data stream r to delay line 0, and $S_r(3t−6Q)$ is two RS symbols output from delay line 0; $S_r(3t+1)$ represents two symbols currently input from first data stream r to delay line 1, and $S_r(3t−3Q+1)$ is two symbols output from delay line 1; $S_r(3t+2)$ represents two symbols currently input from first data stream r to delay line 2, and $S_r(3t+2)$ is two symbols output from delay line 2; $S_r(3t+3)$ represents two symbols currently input from first data stream r to delay line 0, and $S_r(3t−6Q+3)$ is two symbols output from delay line 0; and so on. With reference to an RS distribution rule in the first data stream, when d(pQ+1)≥68, that is, Q≥11, a total of 12 symbols $S_r(3t−6Q)$, $S_r(3t−3Q+1)$, $S_r(3t+2)$, $S_r(3t−6Q+3)$, $S_r(3t−3Q+4)$, and $S_r(3t+5)$ that are consecutively output through convolutional interleaving are from 12 different RS codewords.

Figure 79:
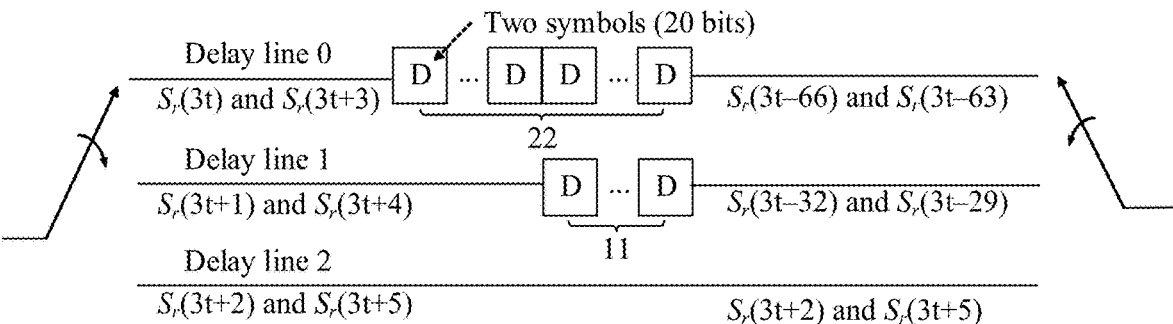
FIG. 79 is a schematic diagram of another embodiment of a convolution interleaver according to an embodiment of this application.

In an embodiment, FIG. 79 is a schematic diagram of another embodiment of a convolution interleaver according to an embodiment of this application. As shown in FIG. 79, based on the embodiment shown in FIG. 78, that Q=11 is selected, and a corresponding interleaving latency is approximately 22*2*3/2=66 RS symbols, which is equivalent to a total interleaving and de-interleaving latency of 50 ns of a 1*800GE service.

Embodiment 4: In this embodiment, a newly designed convolution interleaver is used based on Embodiment 2.

Figure 80:
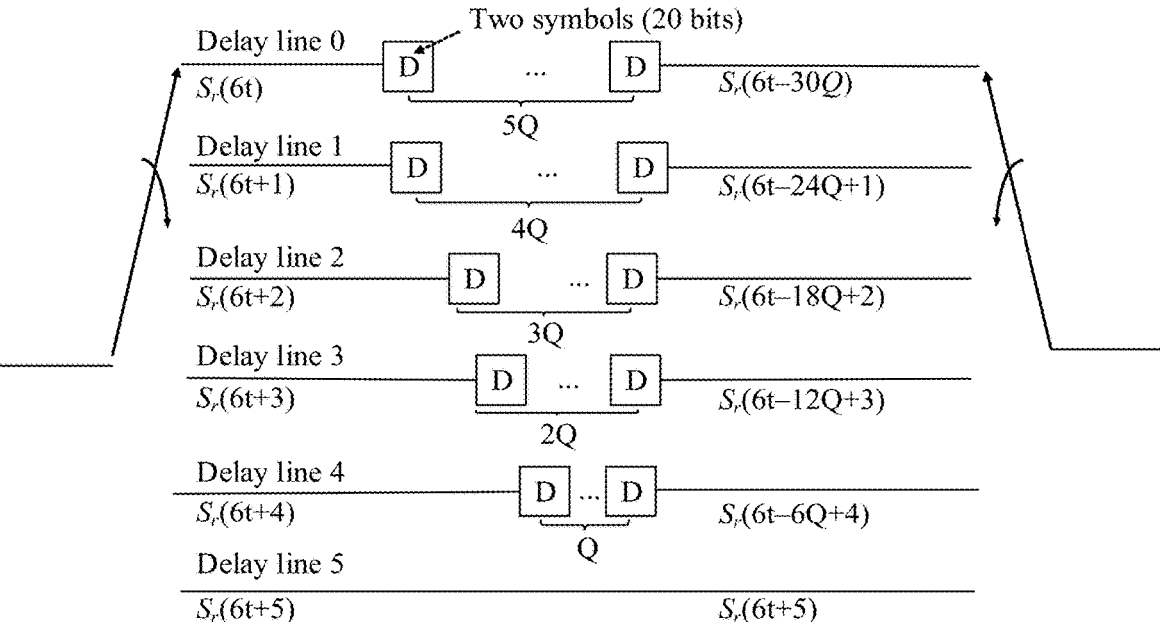
FIG. 80 is a schematic diagram of another embodiment of a convolution interleaver according to an embodiment of this application.

FIG. 80 is a schematic diagram of another embodiment of a convolution interleaver according to an embodiment of this application. As shown in FIG. 80, the convolution interleaver includes p=6 delay lines. The p=6 delay lines respectively include 5Q storage units, 4Q storage units, 3Q storage units, 2Q storage units, Q storage units, and 0 storage units, and each storage unit is configured to store d=2 symbols (20 bits). That is, a delay value of delay line 0 is 10Q symbols, a delay value of delay line 1 is 8Q symbols, a delay value of delay line 2 is 6Q symbols, a delay value of delay line 3 is 4Q symbols, a delay value of delay line 4 is 2Q symbols, and a delay value of delay line 5 is 0 symbols, that is, no delay.

As shown in FIG. 80, $S_r(\ )$ represents two consecutive symbols (a total of 20 bits) in first data stream r (where 0≤r≤m−1), and the 20 bits are 20 bits obtained by performing one block interleaving operation by a block interleaving module provided in this embodiment. A convolutional interleaving process is as follows: $S_r(6t)$ represents two symbols currently input from first data stream r to delay line 0, and $S_r(6t−30Q)$ is two RS symbols output from delay line 0; $S_r(6t+1)$ represents two symbols currently input from first data stream r to delay line 1, and $S_r(6t−24Q+1)$ is two symbols output from delay line 1; $S_r(6t+2)$ represents two symbols currently input from first data stream r to delay line 2, and $S_r(6t−18Q+2)$ is two symbols output from delay line 2; $S_r(6t+3)$ represents two symbols currently input from first data stream r to delay line 3, and $S_r(6t−12Q+3)$ is two symbols output from delay line 3; $S_r(6t+4)$ represents two symbols currently input from first data stream r to delay line 4, and $S_r(6t−6Q+4)$ is two symbols output from delay line 4; $S_r(6t+5)$ represents two symbols currently input from first data stream r to delay line 5, and $S_r(6t+5)$ is two symbols output from delay line 5; $S_r(6t+6)$ represents two symbols currently input from first data stream r to delay line 0, and $S_r(6t−30Q+6)$ is two symbols output from delay line 0; and so on. With reference to an RS distribution rule in the first data stream, when d(2pQ+1)≥68, that is, Q≥3, a total of 12 symbols $S_r(6t−30Q)$, $S_r(6t−24Q+1)$, $S_r(6t−18Q+2)$, $S_r(6t−$ 12Q+3), $S_r$(6t−6Q+4), and $S_r$(6t+5) that are consecutively output through convolutional interleaving are from 12 different RS codewords.

Figure 81:
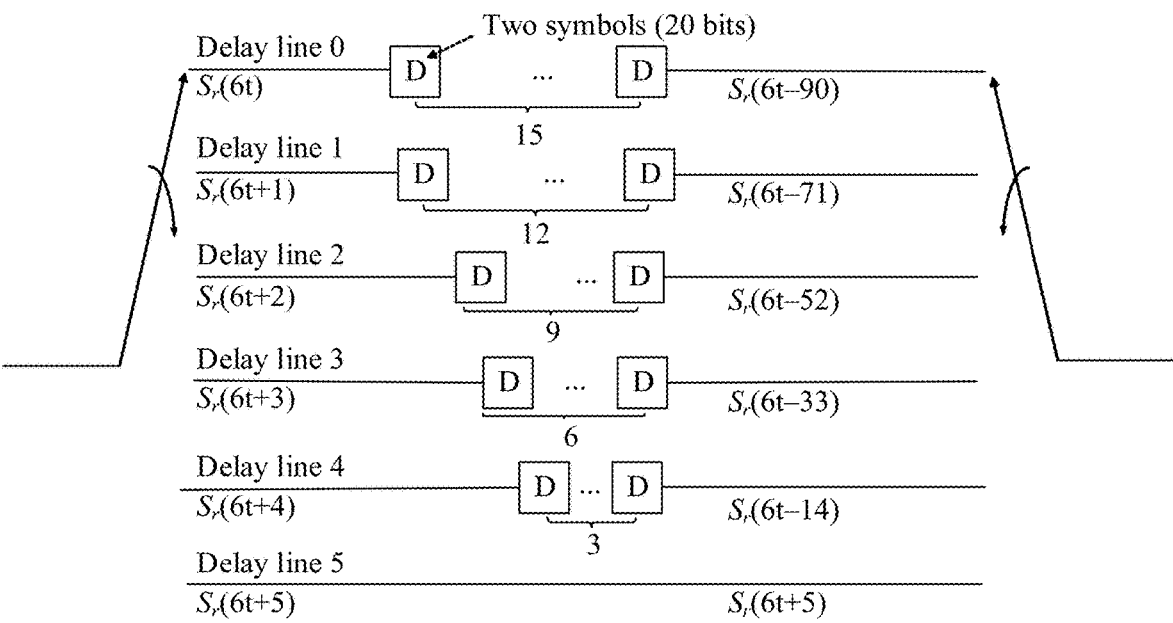
FIG. 81 is a schematic diagram of another embodiment of a convolution interleaver according to an embodiment of this application.

FIG. 81 is a schematic diagram of another embodiment of a convolution interleaver according to an embodiment of this application. As shown in FIG. 81, based on the embodiment shown in FIG. 80, that Q=3 is selected, and a corresponding interleaving latency is approximately 15*2*6/2=90 RS symbols, which is equivalent to a total interleaving and de-interleaving latency of 67 ns of a 1*800GE service.

Embodiment 5: Convolutional interleaving provided in this embodiment is implemented based on block interleaving (or symbol multiplexing) provided in Implementation 1, 3, 4, or 5 in block 5101. A convolution interleaver includes p=4 delay lines. The p=4 delay lines respectively include 3Q storage units, 2Q storage units, Q storage units, and 0 storage units, and each storage unit is configured to store d=4 symbols (40 bits). With reference to an RS distribution rule in a first data stream, when d(p*Q+1)≥136, that is, Q≥9, or when v(p*Q−1)≥136, that is, Q≥9, 16 symbols output from four delay lines, of the convolution interleaver, on which polling is performed for one time are from 16 different RS codewords.

It should be noted that the block interleaving provided in Implementation 3, Implementation 4, and Implementation 6 in block 5101 may be implemented based on the convolutional interleaving provided in Embodiment 1 and Embodiment 2 in block 5102. The block interleaving provided in Implementation 5 in block 5101 may be implemented based on the convolutional interleaving provided in Embodiment 3 and Embodiment 4 in block 5102.

It should be noted that every d consecutive symbols in each first data stream obtained through block interleaving are from at least v different codewords, and every L2 consecutive symbols in each first data stream are from at least v different codewords. In some implementation scenarios, for example, Implementations 7 to 10 in block 5101, v<d. In a specific embodiment, each convolution interleaver performs convolutional interleaving on an input first data stream in a unit of v symbols, to obtain a second data stream whose data sequence is disordered. It should be noted that each storage unit in the convolutional interleaving stores the v symbols. The following describes two specific embodiments of the convolutional interleaving.

Embodiment 6: Convolutional interleaving provided in this embodiment is implemented based on block interleaving (or symbol multiplexing) provided in Implementation 7, 8, 9, or 10 in block 5101. Based on Embodiment 1, with reference to FIG. 72 and an RS distribution rule in a first data stream, when v(p*Q+1)>272, in other words, 12*Q+4≥272, that is, Q≥23, a total of 12 symbols $C_r$(12t−24Q), $C_r$(12t−24Q+1), $C_r$(12t−24Q+2), $C_r$(12t−24Q+3), $C_r$(12t−12Q+4), $C_r$(12t−12Q+5), $C_r$(12t−12Q+6), $C_r$(12t−12Q+7), $C_r$(12t+8), $C_r$(12t+9), $C_r$(12t+10), and $C_r$(12t+11) that are output through the convolutional interleaving are from 12 different RS codewords.

Figure 82:
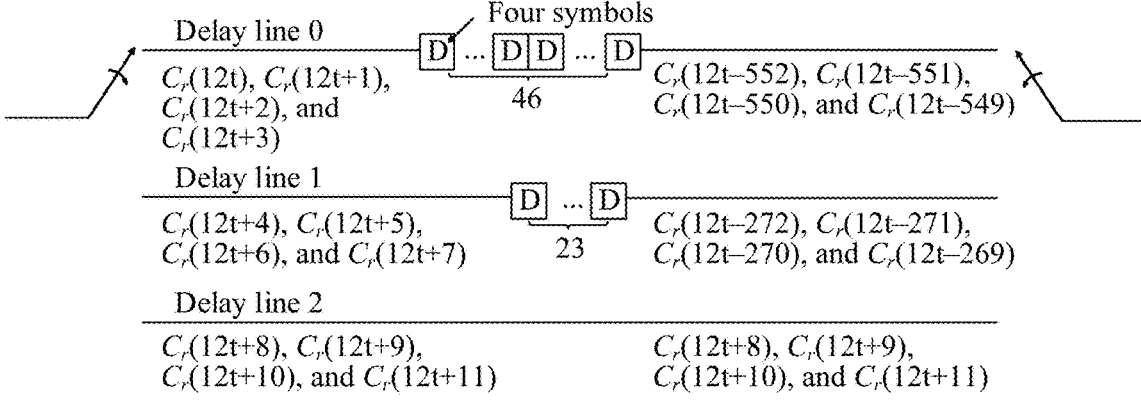
FIG. 82 is a schematic diagram of another embodiment of a convolution interleaver according to an embodiment of this application.

FIG. 82 is a schematic diagram of another embodiment of a convolution interleaver according to an embodiment of this application. In an embodiment, based on the embodiment shown in FIG. 74, that Q=23 is selected. A specific convolution interleaver is shown in FIG. 82, and a corresponding interleaving latency is approximately 2*23*4*3/2=276 RS symbols, which is equivalent to a total interleaving and de-interleaving latency of approximately 52 ns of a 1*800GE service.

Embodiment 7: Convolutional interleaving provided in this embodiment is implemented based on block interleaving (or symbol multiplexing) provided in Implementation 11, 12, 13, or 14 in block 5101. Based on Embodiment 1, with reference to FIG. 74 and an RS distribution rule in a first data stream, when v(p*Q+1)≥544, in other words, 12*Q+4≥544, that is, Q≥45, a total of 12 symbols $C_r$(12t−24Q), $C_r$(12t−24Q+1), $C_r$(12t−24Q+2), $C_r$(12t−24Q+3), $C_r$(12t−12Q+4), $C_r$(12t−12Q+5), $C_r$(12t−12Q+6), $C_r$(12t−12Q+7), $C_r$(12t+8), $C_r$(12t+9), $C_r$(12t+10), and $C_r$(12t+11) that are output through convolutional interleaving are from 12 different RS codewords.

Figure 83:
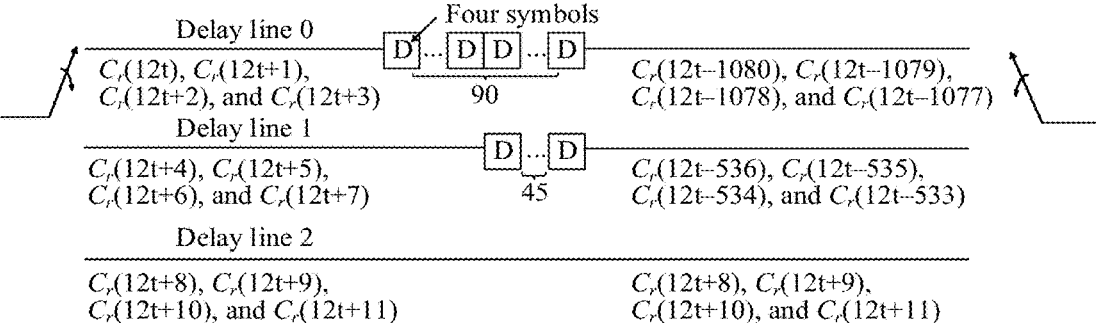
FIG. 83 is a schematic diagram of another embodiment of a convolution interleaver according to an embodiment of this application.

FIG. 83 is a schematic diagram of another embodiment of a convolution interleaver according to an embodiment of this application. In an embodiment, based on the embodiment shown in FIG. 74, that Q=45 is selected. A specific convolution interleaver is shown in FIG. 83, and a corresponding interleaving latency is approximately 2*45*4*3/2=540 RS symbols, which is equivalent to a total interleaving and de-interleaving latency of approximately 51 ns of a 1*800GE service.

Embodiment 8: Convolutional interleaving provided in this embodiment is implemented based on block interleaving (or symbol multiplexing) provided in Implementation 7, 8, 9, or 10 in block 5101. A convolution interleaver includes p=4 delay lines. The p=4 delay lines respectively include 3Q storage units, 2Q storage units, Q storage units, and 0 storage units, and each storage unit is configured to store v=4 symbols (40 bits). With reference to an RS distribution rule in a first data stream, when v(p*Q+1)≥272, that is, Q≥17, or when v(p*Q−1)≥272, that is, Q≥18, 16 symbols output from four delay lines, of the convolution interleaver, on which polling is performed for one time are from 16 different RS codewords.

Embodiment 9: Convolutional interleaving provided in this embodiment is implemented based on block interleaving (or symbol multiplexing) provided in Implementation 11, 12, 13, or 14 in block 5101. A convolution interleaver includes p=4 delay lines. The p=4 delay lines respectively include 3Q storage units, 2Q storage units, Q storage units, and 0 storage units, and each storage unit is configured to store v=4 symbols (40 bits). With reference to an RS distribution rule in a first data stream, when v(p*Q+1)≥544, that is, Q≥34, or when v(p*Q−1)≥272, that is, Q≥35, 16 symbols output from four delay lines, of the convolution interleaver, on which polling is performed for one time are from 16 different RS codewords.

It should be noted that in the foregoing nine embodiments, each storage unit stores an integer number of RS symbols. When an information length of an inner-code codeword is an integer number of RS symbols, and further, the information length of the inner-code codeword is an integer multiple of v*p, a receiver processing module may automatically perform convolution de-interleaving synchronization after inner code synchronization. For a case in which the length of inner code information is not an integer number of RS symbols, a convolutional interleaving solution that facilitates a receiver processing module in performing convolutional de-interleaving synchronization is provided. The following describes eight specific embodiments of the convolutional interleaving.

Embodiment 10: Convolutional interleaving provided in this embodiment is implemented based on block interleaving (or symbol multiplexing) provided in Implementation 1, 3, 4, or 6 in block 5101. A convolution interleaver includes p=4 delay lines. The p=4 delay lines respectively include 3Q storage units, 2Q storage units, Q storage units, and 0 storage units, and each storage unit is configured to store v=34 bits. With reference to an RS distribution rule in a first data stream, when the convolution interleaver shown in FIG. 12(*a*) is used, and v(p*Q+1)≥1360, that is, Q≥10, or when the convolution interleaver shown in FIG. 12(*b*) is used, and v(p*Q−1)≥1360, that is, Q≥11, 136 bits output from four delay lines, of the convolution interleaver, on which polling is performed for one time are from 16 different RS codewords. When Q=10, a corresponding convolution and de-convolution latency is approximately 75 ns.

Embodiment 11: Convolutional interleaving provided in this embodiment is implemented based on block interleaving (or symbol multiplexing) provided in Implementation 1, 3, 4, or 6 in block 5101. A convolution interleaver includes p=2 delay lines. The p=2 delay lines respectively include Q storage units and 0 storage units, and each storage unit is configured to store v=68 bits. With reference to an RS distribution rule in a first data stream, when the convolution interleaver shown in FIG. 12(*a*) is used, and v(p*Q+1) ≥1360, that is, Q≥10, or when the convolution interleaver shown in FIG. 12(*b*) is used, and v(p*Q−1)≥1360, that is, Q≥11, 136 bits output from two delay lines, of the convolution interleaver, on which polling is performed for one time are from at least eight different RS codewords. When Q=10, a corresponding convolution and de-convolution latency is approximately 26 ns.

Embodiment 12: Convolutional interleaving provided in this embodiment is implemented based on block interleaving (or symbol multiplexing) provided in Implementation 2 or 5 in block 5101. A convolution interleaver includes p=4 delay lines. The p=4 delay lines respectively include 3Q storage units, 2Q storage units, Q storage units, and 0 storage units, and each storage unit is configured to store v=34 bits. With reference to an RS distribution rule in a first data stream, when the convolution interleaver shown in FIG. 12(*a*) is used, and v(p*Q+1)≥680, that is, Q≥5, or when the convolution interleaver shown in FIG. 12(*b*) is used, and v(p*Q−1)≥680, that is, Q≥6, 136 bits output from four delay lines, of the convolution interleaver, on which polling is performed for one time are from 16 different RS codewords. When Q=5, a corresponding convolution and de-convolution latency is approximately 75 ns.

Embodiment 13: Convolutional interleaving provided in this embodiment is implemented based on block interleaving (or symbol multiplexing) provided in Implementation 2 or 4 in block 5101. A convolution interleaver includes p=2 delay lines. The p=2 delay lines respectively include Q storage units and 0 storage units, and each storage unit is configured to store v=68 bits. With reference to an RS distribution rule in a first data stream, when the convolution interleaver shown in FIG. 12(*a*) is used, and v(p*Q+1)≥680, that is, Q≥5, or when the convolution interleaver shown in FIG. 12(*b*) is used, and v(p*Q−1)≥680, that is, Q≥6, 136 bits output from two delay lines, of the convolution interleaver, on which polling is performed for one time are from at least eight different RS codewords. When Q=5, a corresponding convolution and de-convolution latency is approximately 26 ns.

Embodiment 14: Convolutional interleaving provided in this embodiment is implemented based on block interleaving (or symbol multiplexing) provided in Implementation 7, 8, 9, or 10 in block 5101. A convolution interleaver includes p=4 delay lines. The p=4 delay lines respectively include 3Q storage units, 2Q storage units, Q storage units, and 0 storage units, and each storage unit is configured to store v=34 bits. With reference to an RS distribution rule in a first data stream, when the convolution interleaver shown in FIG. 12(*a*) is used, and v(p*Q+1)≥2720, that is, Q≥20, or when the convolution interleaver shown in FIG. 12(*b*) is used, and v(p*Q−1)≥2720, that is, Q≥21, 136 bits output from four delay lines, of the convolution interleaver, on which polling is performed for one time are from 16 different RS codewords. When Q=20, a corresponding convolution and de-convolution latency is approximately 75 ns.

Embodiment 15: Convolutional interleaving provided in this embodiment is implemented based on block interleaving (or symbol multiplexing) provided in Implementation 7, 8, 9, or 10 in block 5101. A convolution interleaver includes p=2 delay lines. The p=2 delay lines respectively include Q storage units and 0 storage units, and each storage unit is configured to store v=68 bits. With reference to an RS distribution rule in a first data stream, when v(p*Q+1) ≥2720, that is, Q≥20, or when v(p*Q−1)≥2720, that is, Q≥21, 136 bits output from two delay lines, of the convolution interleaver, on which polling is performed for one time are from at least eight different RS codewords. When Q=40, a corresponding convolution and de-convolution latency is approximately 26 ns.

Embodiment 16: Convolutional interleaving provided in this embodiment is implemented based on block interleaving (or symbol multiplexing) provided in Implementation 11, 12, 13, or 14 in block 5101. A convolution interleaver includes p=4 delay lines. The p=4 delay lines respectively include 3Q storage units, 2Q storage units, Q storage units, and 0 storage units, and each storage unit is configured to store v=34 bits. With reference to an RS distribution rule in a first data stream, when the convolution interleaver shown in FIG. 12(*a*) is used, and v(p*Q+1)≥5440, that is, Q≥40, or when the convolution interleaver shown in FIG. 12(*b*) is used, and v(p*Q−1)≥5440, that is, Q≥41, 136 bits output from four delay lines, of the convolution interleaver, on which polling is performed for one time are from 16 different RS codewords. When Q=40, a corresponding convolution and de-convolution latency is approximately 75 ns.

Embodiment 17: Convolutional interleaving provided in this embodiment is implemented based on block interleaving (or symbol multiplexing) provided in Implementation 11, 12, 13, or 14 in block 5101. A convolution interleaver includes p=2 delay lines. The p=4 delay lines respectively include Q storage units and 0 storage units, and each storage unit is configured to store v=68 bits. With reference to an RS distribution rule in a first data stream, when the convolution interleaver shown in FIG. 12(*a*) is used, and v(p*Q+1) ≥5440, that is, Q≥40, or when the convolution interleaver shown in FIG. 12(*b*) is used, and v(p*Q−1)≥5440, that is, Q≥41, 136 bits output from two delay lines, of the convolution interleaver, on which polling is performed for one time are from at least eight different RS codewords. When Q=40, a corresponding convolution and de-convolution latency is approximately 26 ns.

5103: Separately perform second FEC encoding on the m second data streams to obtain m encoded data streams.

An embodiment of the second FEC encoding may be specifically shown in FIG. 15. The second FEC encoding, namely, inner-code encoding mentioned above, is separately performed on the m second data streams. Every K consecutive symbols in each second data stream are mapped to information data of an inner-code codeword, and redundant data is added through the inner-code encoding, to obtain an encoded data stream. Information data whose inner-code length is K symbols is from at most K different RS codewords, where K≥pd, and the K symbols are K symbols output from p delay lines, of the convolution interleaver shown in FIG. 12(*a*) or FIG. 12(*b*), on which polling is performed for K/pd times. After data processing is performed on the encoded data streams, data processed data streams are sent to a channel transmission medium for transmission. The data processing may include channel interleaving and modulation and mapping, to improve a capability of a system to resist a burst error.

In some implementation scenarios, for example, Implementations 7 to 10 in block 5101, v<d. In a specific embodiment, every K consecutive symbols in each second data stream are mapped to information data of an inner-code codeword, and redundant data is added through inner-code encoding, to obtain an encoded data stream. Information data whose inner-code length is K symbols is from at most K different RS codewords, where K≥pv, and the K symbols are K symbols output from p delay lines, of the convolution interleaver, on which polling is performed for K/pv times.

The inner-code encoding is separately performed on 16 second data streams, eight second data streams, or four second data streams, and an information bit length of the inner-code encoding is 120 bits. Specifically, an inner-code encoder separately adds redundancy to a total of 120 bits in 12 consecutive symbols in the second data stream, to obtain an inner-code codeword data stream. Embodiments shown in FIG. 74 and FIG. 75 are used as an example. The 12 symbols are 12 consecutive symbols output from three delay lines, of the convolution interleaver, on which polling is performed for one time. This manner may facilitate the receiver processing module shown in FIG. 3(*h*) in performing convolutional de-interleaving synchronization after the receiver processing module completes inner code synchronization. In an embodiment, the inner-code encoding is performed by using Hamming(128, 120), and 8-bit redundancy is added to a total of 120 bits in 12 consecutive symbols in each second data stream, to obtain a 128-bit codeword.

Based on the convolutional interleaving provided in any implementation of block 5102, the inner-code encoding is separately performed on the m second data streams, where an information bit length of the inner-code encoding is 136 bits. Specifically, the inner-code encoder separately adds redundancy to 136 consecutive bits in the second data stream, to obtain an inner-code codeword data stream. In an embodiment, the inner-code encoding is performed by using Hamming(144,136), and 8-bit redundancy is added to 136 consecutive bits in each second data stream, to obtain a 144-bit codeword.

Based on the convolutional interleaving in Implementations 10 to 17 provided in block 5102, the inner-code encoding is separately performed on the m second data streams, where an information bit length of the inner-code encoding is 136 bits. Specifically, data of 136 bits output from p=4 or 2 delay lines, of the convolution interleaver, on which polling is performed for one time is used as inner-code information data, and then 8-bit parity data is added, to obtain an inner-code codeword whose length is 144 bits. In this way, the receiver processing module can automatically complete convolution de-interleaving synchronization after completing inner code synchronization.

Figure 84:
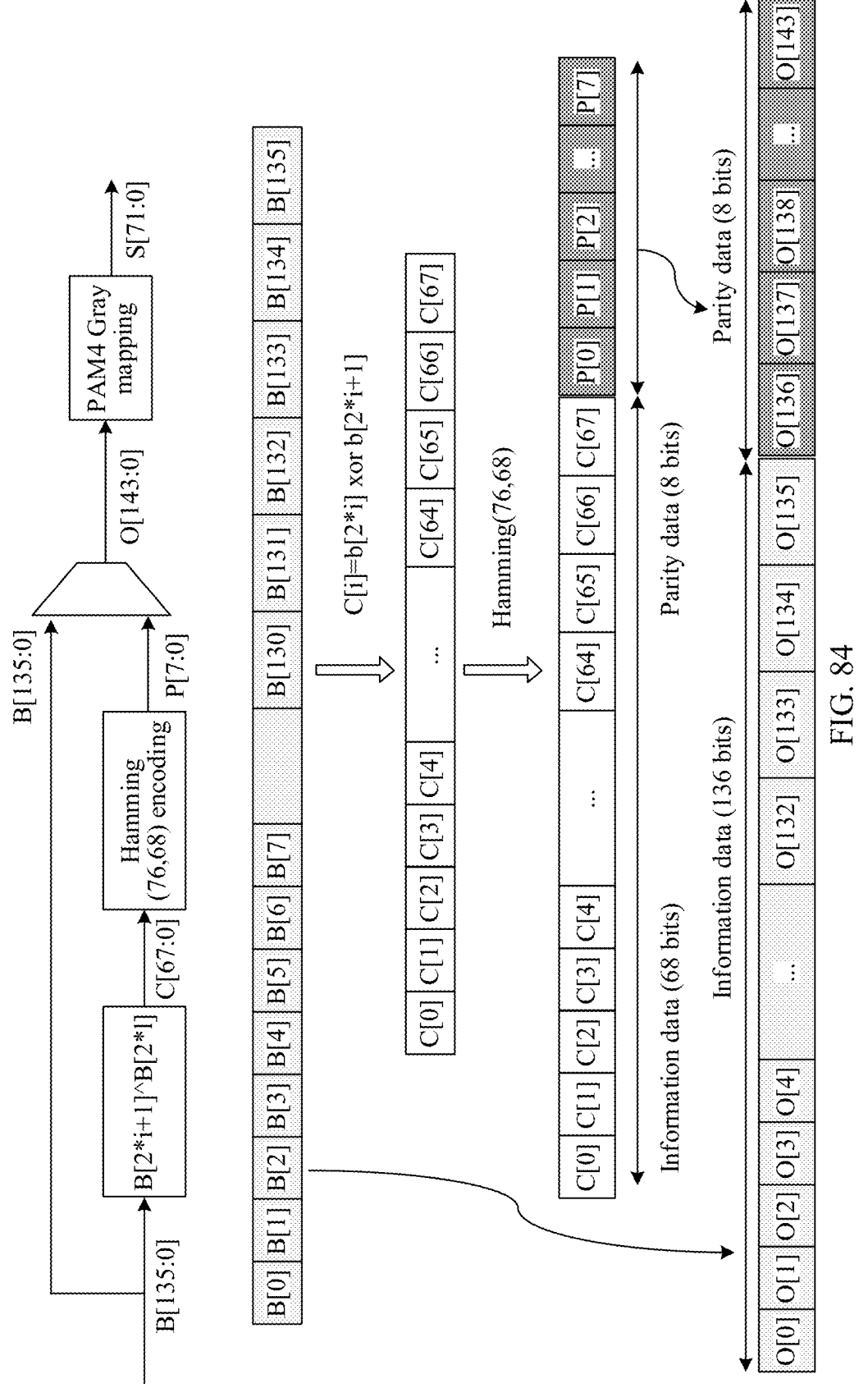
FIG. 84 is a schematic diagram of an embodiment of inner-code encoding according to an embodiment of this application.

FIG. 84 is a schematic diagram of an embodiment of inner-code encoding according to an embodiment of this application. As shown in FIG. 84, in an embodiment, the inner-code encoding is performed by using Hamming(144, 136) that is obtained by shortening, by 111 bits, Hamming (255,247) generated by using a Galois field GF(2^8). Another embodiment is shown in FIG. 84. To-be-encoded 136-bit data is represented as B[135:0]. Bitwise XOR is performed on every two consecutive bits of the to-be-encoded 136-bit data to obtain 1-bit data C[i], and 68-bit data is obtained in total, and is represented as C[67:0], where C[i]=B[2*i]^B[2*i+1], and 0≤i≤67. Then, Hamming(76,68) encoding is performed by using C[67:0] as information data to obtain 8-bit parity data that is represented as P[7:0]. Finally, a total of 144 bits, B[135:0] and P[7:0], are concatenated into output of the inner-code encoding, where 144-bit data is represented as O[143:0]. O[135:0] is from B[135:0], O[143:136] is from P[7:0], and Hamming(76,68) is obtained by shortening, by 52 bits, extended Hamming(128,120), with 1-bit CRC, generated by using a Galois field GF(2^7). Finally, PAM4 Gray mapping is performed on every two consecutive bits in O[143:0] to obtain 72 PAM4 symbols that are represented as S[71:0].

After data processing is performed on inner-code encoded data streams, the data processed data streams are sent to a channel transmission medium for transmission. The data processing may include modulation and mapping, channel interleaving, and the like. For example, channel interleaving may be performed on the inner-code encoded data streams, so as to improve a capability of a system to resist a burst error. Embodiments shown in FIG. 74 and FIG. 75 are used as an example. When sending device 01 sends a 1*800GE service, concatenated code of KP4 RS(544,514)+Hamming (128,120) is under AWGN, a corresponding pre-FEC BER for implementing a post-FEC bit error rate BER of 1E-15 is approximately 4.8E-3, performance approximates to optimal performance of the concatenated FEC scheme, and a latency of the interleaver is only 55 ns. Embodiments shown in FIG. 76 and FIG. 77 are used as an example. When sending device 01 sends a 1*800GE service, concatenated code of KP4 RS(544,514)+Hamming(128,120) is under AWGN, a corresponding pre-FEC BER for implementing a post-FEC bit error rate BER of 1E-15 is approximately 3.8E-3, and a latency of the interleaver is only 26 ns. Embodiments shown in FIG. 78 and FIG. 79 are used as an example. When sending device 01 sends a 1*800GE service, concatenated code of KP4 RS(544,514)+Hamming(128,120) is under AWGN, a corresponding pre-FEC BER for implementing a post-FEC bit error rate BER of 1E-15 is approximately 4.8E-3, performance approximates to optimal performance of the concatenated FEC scheme, and a latency of the interleaver is only 50 ns. Embodiments shown in FIG. 80 and FIG. 81 are used as an example. When sending device 01 sends a 1*800GE service, concatenated code of KP4 RS(544,514)+Hamming(128,120) is under AWGN, a corresponding pre-FEC BER for implementing a post-FEC bit error rate BER of 1E-15 is approximately 4.8E-3, performance approximates to optimal performance of the concatenated FEC scheme, and a latency of the interleaver is only 67 ns. The block interleaving (symbol multiplexing) in Implementation 7 or 8 in block 5101 and the convolutional interleaving in Embodiment 5 in block 5102 are used as an example. When sending device 01 sends a 1*800GE service, concatenated code of KP4 RS(544,514)+Hamming(128, 120) is under AWGN, a corresponding pre-FEC BER for implementing a post-FEC bit error rate BER of 1E-15 is approximately 4.8E-3, performance approximates to optimal performance of the concatenated FEC scheme, and a latency of the interleaver is only 52 ns. The block interleaving (symbol multiplexing) in Implementation 9 or 10 in block 5101 and the convolutional interleaving in Embodiment 6 in block 5102 are used as an example. When sending device 01 sends a 1*800GE service, concatenated code of KP4 RS(544,514)+Hamming(128,120) is under AWGN, a corresponding pre-FEC BER for implementing a post-FEC bit error rate BER of 1E-15 is approximately 4.8E-3, performance approximates to optimal performance of the concatenated FEC scheme, and a latency of the interleaver is only 52 ns.

In an embodiment, when sending device 01 sends a 2*400GE service, a format of data streams on 32 PCS lanes in the sending device is shown in FIG. 6, where PCS lane data streams 0-15 and PCS lane data streams 16-32 respectively belong to two different 400GE services. A PMA unit of the transmitter processing module restores 32 PCS lane data streams by performing de-mux on the lane attachment unit interface AUI. Then, alignment marker lock on the lane data streams is performed by using known alignment markers of PCS lanes. Then, lane reordering is performed on the n=32 PCS lane data streams based on the alignment markers, so that data of n=32 PCS lanes can be arranged in a specified sequence. In a specific arrangement manner, lane data stream 0 to lane data stream 15 belong to a same 400GE service, and lane data stream 16 to lane data stream 31 belong to another 400GE service. Sorted 32 lane data streams are sent to the block interleaving provided in Implementation 1, Implementation 2, and Implementation 3 in block 5101 and the convolutional interleaving in block 5102, and then Hamming(128,120) is used for inner-code encoding. In another specific arrangement manner, lane data stream 0 to lane data stream 7 and lane data stream 16 to lane data stream 23 belong to a same 400GE service, and lane data stream 8 to lane data stream 15 and lane data stream 24 to lane data stream 31 belong to another 400GE service. Sorted 32 lane data streams are sent to the block interleaving provided in Implementation 4, Implementation 5, and Implementation 6 in block 5101 and the convolutional interleaving in block 5102, and then Hamming(128, 120) is used for inner-code encoding. In this scenario, embodiments shown in FIG. 74 and FIG. 75 are used as an example, 12 symbols of each inner code are from six different RS codewords, a corresponding pre-FEC BER for implementing a post-FEC bit error rate BER of 1E-15 is approximately 3.5E-3, and a latency of the interleaver is still maintained as only 50 ns. Embodiments shown in FIG. 78 and FIG. 79 are used as an example, 12 symbols of each inner code are from six different RS codewords, a corresponding pre-FEC BER for implementing a post-FEC bit error rate BER of 1E-15 is approximately 3.5E-3, and a latency of the interleaver is still maintained as only 50 ns. Embodiments shown in FIG. 80 and FIG. 81 are used as an example. 12 symbols of each inner code are from six different RS codewords, a corresponding pre-FEC BER for implementing a post-FEC bit error rate BER of 1E-15 is approximately 3.4E-3, and a latency of the interleaver is still maintained as only 50 ns. Alternatively, the block interleaving and the convolutional interleaving in this embodiment are used, and a parameter in the convolutional interleaving is set as Q≥6, so that the 12 symbol information data of each inner code can be from 12 different RS codewords, a corresponding pre-FEC BER for implementing a post-FEC bit error rate BER of 1E-15 is approximately 4.8E-3, and a latency of the interleaver is increased to 135 ns.

In another embodiment, when sending device 01 sends a 4*200GE service, a format of data streams on 32 PCS lanes in the sending device is shown in FIG. 7, where PCS lane data streams 0-7, PCS lane data streams 8-15, PCS lane data streams 16-23, and PCS lane data streams 24-31 respectively belong to four different 200GE services. A PMA unit of the transmitter processing module restores 32 PCS lane data streams by performing de-mux on data received through the lane attachment unit interface AUI. Then, alignment marker lock on the lane data streams is performed by using known alignment markers of PCS lanes. Then, lane reordering is performed on the n=32 PCS lane data streams based on the alignment markers, so that data of n=32 PCS lanes can be arranged in a specified sequence. In a specific arrangement manner, lane data streams 0-7, lane data streams 8-15, lane data streams 16-23, and lane data streams 24-32 respectively belong to four different 200GE services. Sorted 32 lane data streams are sent to the block interleaving provided in Implementation 1, Implementation 2, and Implementation 3 in block 5101 and the convolutional interleaving in block 5102, and then Hamming(128, 120) is used for inner-code encoding. Another specific arrangement manner is as follows: Lane data streams 0-3 and lane data streams 16-19, lane data streams 4-7 and lane data streams 20-23, lane data streams 8-11 and lane data streams 24-28, and lane data streams 12-15 and lane data streams 28-31 respectively belong to four different 200GE services. Sorted 32 lane data streams are sent to the block interleaving provided in Implementation 3, Implementation 4, and Implementation 5 in block 5101 and the convolutional interleaving in block 5102, and then Hamming(128, 120) is used for inner-code encoding.

In this scenario, embodiments shown in FIG. 74 and FIG. 75 are used as an example, 12 symbols of each inner code are from four different RS codewords, a corresponding pre-FEC BER for implementing a post-FEC bit error rate BER of 1E-15 is approximately 2.8E-3, and a latency of the interleaver is still maintained as only 50 ns. Embodiments shown in FIG. 78 and FIG. 79 are used as an example, 12 symbols of each inner code are from four different RS codewords, a corresponding pre-FEC BER for implementing a post-FEC bit error rate BER of 1E-15 is approximately 2.8E-3, and a latency of the interleaver is still maintained as only 50 ns. Embodiments shown in FIG. 80 and FIG. 81 are used as an example, 12 symbols of each inner code are from four different RS codewords, a corresponding pre-FEC BER for implementing a post-FEC bit error rate BER of 1E-15 is approximately 2.8E-3, and a latency of the interleaver is still maintained as only 50 ns. Alternatively, block interleaving and convolutional interleaving in this embodiment are used, and a parameter in the convolutional interleaving is set as Q≥6, so that the 12 symbol information data of each inner code can be from six RS codewords, a corresponding pre-FEC BER for implementing a post-FEC bit error rate BER of 1E-15 is approximately 3.4E-3, and a latency of the interleaver is increased to 135 ns. Alternatively, block interleaving and convolutional interleaving in this embodiment are used, and a parameter in the convolutional interleaving is set as Q≥12, so that the 12 symbol information data of each inner code can be from 12 RS codewords, a corresponding pre-FEC BER for implementing a post-FEC bit error rate BER of 1E-15 is approximately 4.8E-3, and a latency of the interleaver is increased to 270 ns.

In the present invention, for a concatenated FEC transmission solution, a data interleaving and encoding method including block interleaving and convolutional interleaving is designed, so that an overall concatenated FEC solution has good performance and an extremely low latency. Therefore, the concatenated FEC transmission solution can be applied to a plurality of transmission scenarios, and is particularly applicable to a transmission scenario that requires a low transmission latency, for example, a low-latency data center interconnection scenario. Compared with that in a conventional technology, the overall concatenated FEC solution can provide a shorter latency when processing a 1*800GE service with a same error correction capability, and can use the same interleaving solution for a 2*400GE or 4*200GE service to obtain sub-optimal error correction performance and a better latency. Therefore, this solution can be well applicable to a latency-sensitive scenario, such as an internal interconnection network of a data center.

The following describes a data processing apparatus provided in an embodiment of this application.

Figure 85:
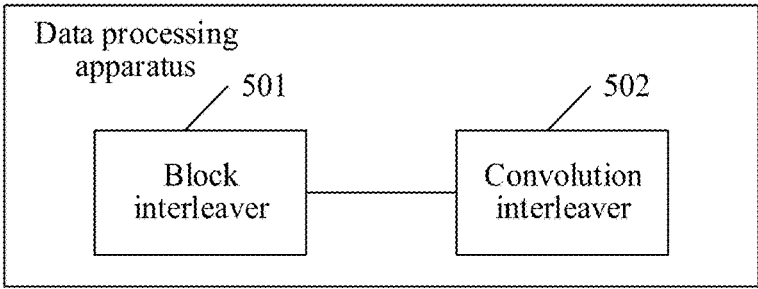
FIG. 85 is a schematic diagram of a structure of a data processing apparatus according to an embodiment of this application.

FIG. 85 is a schematic diagram of a structure of a data processing apparatus according to an embodiment of this application. As shown in FIG. 85, the data processing apparatus includes a block interleaver 501 and a convolution interleaver 502. The block interleaver 501 is configured to perform the operations in block 5101. The convolution interleaver 502 is configured to perform the operations in block 5102. For details, refer to related descriptions of the block interleaving operation and the convolutional interleaving operation in the foregoing data processing method. Details are not described herein again.

It should be understood that the apparatus provided in this application may alternatively be implemented in another manner. For example, the unit division in the foregoing apparatus is merely logical function division and may be other division in actual implementation. For example, a plurality of units or components may be combined or integrated into another system. In addition, functional units in embodiments of this application may be integrated into one processing unit, or may be independent physical units, or two or more functional units are integrated into one processing unit. The integrated unit may be implemented in a form of hardware, or may be implemented in a form of a software functional unit.

Figure 86:
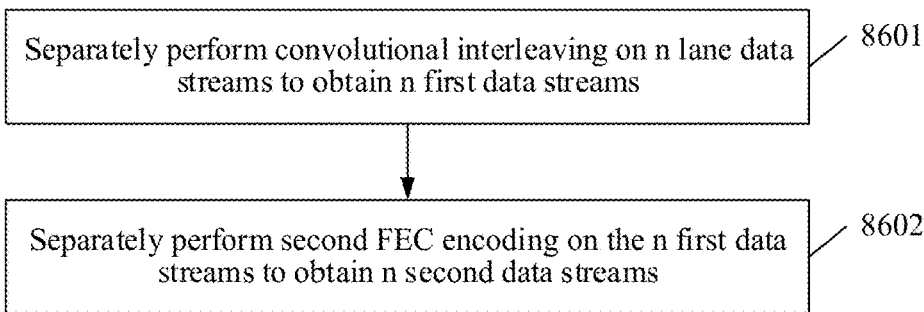
FIG. 86 is another schematic flowchart of a data processing method according to an embodiment of this application.

It should be noted that, in addition to the data processing method described in the foregoing embodiments, this application further provides another data processing method. A specific processing procedure of the data processing method may be shown in FIG. 3(*i*). In some specific implementation scenarios, when sending device 01 sends a 1*800GE service, for 32 PCS lane data streams, when 32/n PCS lane data streams are multiplexed into one data stream PMA lane data stream through PMA (32: n) processing, among the 32/n multiplexed PCS lane data streams, half of the PCS lane data streams are from PCS lane data streams 0-15, and the other half of the PCS lane data streams are from PCS lane data streams 16-32. Therefore, data of each PAM lane data stream is obtained by interleaving four RS codewords. A physical medium attachment (PMA) sublayer of a transmitter processing module processes data from an AUI-n interface to obtain n lane data streams. The PMA sublayer herein only needs to perform signal recovery operations such as clock data recovery (CDR) and PAM4 symbol demodulation on data from each physical lane of the AUI-n interface to obtain one lane data stream, and does not need to perform other complex operations such as AM locking, lane deskewing, and lane reordering. Then, convolutional interleaving is performed on each first data stream to obtain n first data streams, and finally inner-code encoding is performed on the n first data streams to obtain n second data streams. FIG. 86 is another schematic flowchart of a data processing method according to an embodiment of this application.

Block 8601: Separately perform convolutional interleaving on n lane data streams to obtain n first data streams.

Specifically, the n lane data streams are separately delayed based on p delay lines to obtain the n first data streams. First FEC encoding is performed on each lane data stream, in other words, outer-code encoding is performed on each lane data stream. It should be understood that a convolutional interleaving manner used in this embodiment is similar to the convolutional interleaving manner used in the embodiment shown in FIG. 51. For details, refer to related descriptions of the embodiment shown in FIG. 51.

In an example, when n=8, a corresponding convolution interleaver may use Implementation 6 provided in block 5102. An inner-code encoding scheme uses data of 120 bits output from p=3 delay lines, of the convolution interleaver, on which polling is performed for one time as inner-code information data, and 8-bit parity data is added, to obtain an inner-code codeword whose length is 128 bits. Alternatively, a corresponding convolution interleaver may use Implementation 8 provided in block 5102. An inner-code encoding scheme uses data of 160 bits output from p=4 delay lines, of the convolution interleaver, on which polling is performed for one time as inner-code information data, and 10-bit parity data is added, to obtain an inner-code codeword whose length is 170 bits, or 16-bit parity data is added, to obtain an inner-code codeword whose length is 176 bits. Alternatively, a corresponding convolution interleaver may use Implementations 14 and 15 provided in block 5102. An inner-code encoding scheme uses data of 136 bits output from p=2 or 4 delay lines, of the convolution interleaver, on which polling is performed for one time as inner-code information data, and 8-bit parity data is added, to obtain a codeword whose code length is 144 bits.

In another example, when n=4, a corresponding convolution interleaver may use Implementation 7 provided in block 5102. An inner-code encoding scheme uses data of 120 bits output from p=3 delay lines, of the convolution interleaver, on which polling is performed for one time as inner-code information data, and 8-bit parity data is added, to obtain an inner-code codeword whose length is 128 bits. Alternatively, a corresponding convolution interleaver may use Implementation 9 provided in block 5102. An inner-code encoding scheme uses data of 160 bits output from p=4 delay lines, of the convolution interleaver, on which polling is performed for one time as inner-code information data, and 10-bit parity data is added, to obtain an inner-code codeword whose length is 170 bits, or 16-bit parity data is added, to obtain an inner-code codeword whose length is 176 bits. Alternatively, a corresponding convolution interleaver may use Implementations 16 and 17 provided in block 5102. An inner-code encoding scheme uses data of 136 bits output from p=2 or 4 delay lines, of the convolution interleaver, on which polling is performed for one time as inner-code information data, and 8-bit parity data is added, to obtain a codeword whose code length is 144 bits.

Block 8602: Separately perform second FEC encoding on the n first data streams to obtain n second data streams.

It should be understood that the second FEC encoding in this embodiment is the inner-code encoding described above. A length of information data of the inner-code codeword may be equal to p*U by using both the convolutional interleaving and the inner-code encoding scheme, where p is a quantity of delay lines in the convolution interleaver, and U is a quantity of bits stored in each storage unit in the convolution interleaver. In this way, the information data of the inner-code codeword is aligned with p*U bits output from the p delay lines, of the convolution interleaver, on which polling is performed for one time. Therefore, when no synchronization header sequence is additionally added to encoded data streams, a receiver module may automatically complete convolution de-interleaving synchronization after completing inner code self-synchronization by using the inner-code codeword, thereby resolving a problem of convolution interleaver synchronization.

This application further provides a data processing apparatus corresponding to the embodiment shown in FIG. 86.

Figure 87:
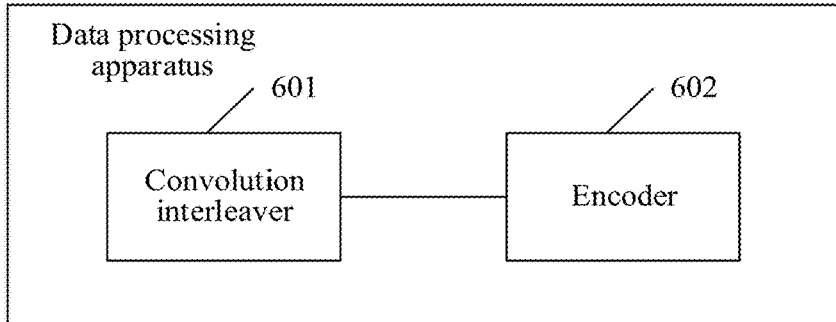
FIG. 87 is a schematic diagram of another structure of a data processing apparatus according to an embodiment of this application.

FIG. 87 is a schematic diagram of another structure of a data processing apparatus according to an embodiment of this application. As shown in FIG. 87, the data processing apparatus includes a convolution interleaver 601 and an encoder 602. The convolution interleaver 601 is configured to perform the operations in block 8601. The encoder 602 is configured to perform the operations in block 8602. For details, refer to related descriptions of the block interleaving operation and the convolutional interleaving operation in the foregoing data processing method. Details are not described herein again.

It should be understood that the apparatus provided in this application may alternatively be implemented in another manner. For example, the unit division in the foregoing apparatus is merely logical function division and may be other division in actual implementation. For example, a plurality of units or components may be combined or integrated into another system. In addition, functional units in embodiments of this application may be integrated into one processing unit, or may be independent physical units, or two or more functional units are integrated into one processing unit. The integrated unit may be implemented in a form of hardware, or may be implemented in a form of a software functional unit.

Figure 88:
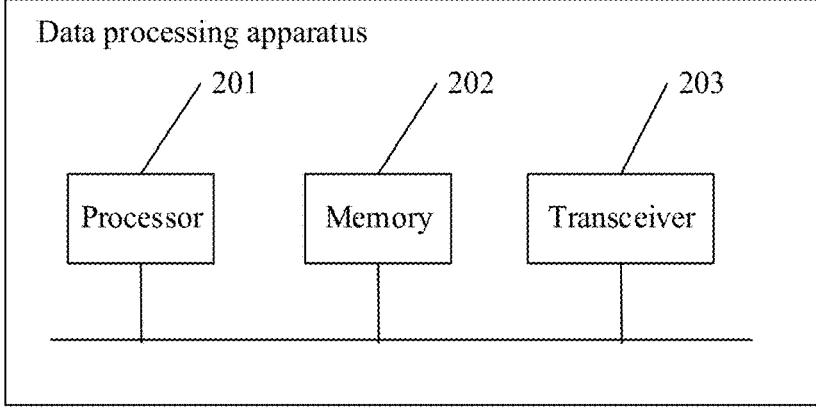
FIG. 88 is a schematic diagram of another structure of a data processing apparatus according to an embodiment of this application.

FIG. 88 is a schematic diagram of another structure of a data processing apparatus according to an embodiment of this application. As shown in FIG. 88, the data processing apparatus includes a processor 201, a memory 202, and a transceiver 203. The processor 201, the memory 202, and the transceiver 203 are interconnected through lines. The memory 202 is configured to store program instructions and data. Specifically, the transceiver 203 is configured to receive n lane data streams. The processor 201 is configured to perform the operations in the data processing method. In an embodiment, the processor 201 may include the convolution interleaver 101 and the multiplexer 201 shown in FIG. 33. In another embodiment, the processor 201 may include the interleaving module 301 and the encoder 302 shown in FIG. 50(*a*). In still another embodiment, the processor 201 may include the interleaving module 401 and the encoder 402 shown in FIG. 50(*b*). In still another embodiment, the processor 201 may include the block interleaver 501 and the convolution interleaver 502 shown in FIG. 85. In still another embodiment, the processor 201 may include the convolution interleaver 601 and the encoder 602 shown in FIG. 87.

It should be noted that, the processor shown in FIG. 88 may use a general-purpose central processing unit (CPU), a general-purpose processor, a digital signal processor (DSP), an application-specific integrated circuit (ASIC), a field programmable gate array (FPGA) or another programmable logic device, a transistor logic device, a hardware component, or any combination thereof. The memory shown in FIG. 88 may store an operating system and another application program. When the technical solutions provided in embodiments of this application are implemented by using software or firmware, program code used for implementing the technical solutions provided in embodiments of this application is stored in the memory and is executed by the processor. In an embodiment, the processor may include the memory inside. In another embodiment, the processor and the memory are two independent structures.

It may be clearly understood by a person skilled in the art that, for the purpose of convenient and brief description, for a detailed working process of the foregoing system, apparatuses, and units, refer to a corresponding process in the foregoing method embodiments, and details are not described herein again.

A person of ordinary skill in the art may understand that all or some of the steps of the foregoing embodiments may be implemented by hardware or a program instructing related hardware. The program may be stored in a computer-readable storage medium. The storage medium mentioned above may be a read-only memory, a random access memory, or the like. Whether the functions are performed by hardware or software depends on particular applications and design constraint conditions of the technical solutions. A person skilled in the art may use different methods to implement the described functions for each particular application, but it should not be considered that the implementation goes beyond the scope of this application.

When software is used to implement the functions, all or some of the method blocks described in the foregoing embodiments may be implemented in a form of a computer program product. The computer program product includes one or more computer instructions. When the computer program instructions are loaded and executed on a computer, the procedure or functions according to embodiments of this application are all or partially generated. The computer may be a general-purpose computer, a dedicated computer, a computer network, or other programmable apparatuses. The computer instructions may be stored in a computer-readable storage medium or may be transmitted from a computer-readable storage medium to another computer-readable storage medium. For example, the computer instructions may be transmitted from a website, computer, server, or data center to another website, computer, server, or data center in a wired (for example, a coaxial cable, an optical fiber, or a digital subscriber line (DSL)) or wireless (for example, infrared, radio, or microwave) manner. The computer-readable storage medium may be any usable medium accessible by the computer, or a data storage device, for example, a server or a data center, integrating one or more usable media. The usable medium may be a magnetic medium (for example, a floppy disk, a hard disk, or a magnetic tape), an optical medium (for example, DVD), a semiconductor medium (for example, a solid-state drive Solid-State Drive (SSD)), or the like.

The invention claimed is:

1. A data processing method, comprising:

performing, by a block interleaver, block interleaving on every t lane data streams of n lane data streams to obtain s first data streams, so as to obtain a total of m first data streams, wherein n=q*t, m=q*s, n is an integer greater than 1, n is exactly divided by q, q is an integer greater than or equal to 1, t is an integer greater than or equal to 1, s is an integer greater than or equal to 1, first forward error correction (FEC) encoding is performed on all the n lane data streams, every a codewords obtained through the first FEC encoding are distributed in b lane data streams, a≤b≤n, n is exactly divided by b, a is an integer greater than or equal to 1, every a consecutive symbols in each lane data stream are from a different codewords, every L1 consecutive symbols in each lane data stream are from at least a different codewords, L1=N*a/b, N represents a length of the codeword, the t lane data streams comprise a total of t*a symbols with a consecutive symbols in each lane data stream, the t*a symbols comprise a total of D bits with Δ bits in each symbol, and D=Δ*t*a, the D bits are consecutive in any one of the s first data streams, $\Delta$=M/s, and M represents a quantity of bits comprised in one symbol; and performing, by a convolution interleaver, convolutional interleaving on the m first data streams separately to obtain m second data streams.

2. The data processing method according to claim 1, wherein every d consecutive symbols in each first data stream are from v different codewords, every L2 consecutive symbols in each first data stream are from at least v different codewords, v is exactly divided by a, L2=t/s*L1, and d=D/M.

3. The method according to claim 1, wherein n=32, 16 lane data streams in odd-numbered lanes of the n lane data streams are from same codewords, 16 lane data streams in even-numbered lanes of the n lane data streams are from same codewords, and a data stream in an odd-numbered lane of the n lane data streams and a data stream in an even-numbered lane of the n lane data streams are from different codewords.

4. The method according to claim 3, wherein t=8, s=1, and the performing block interleaving on every t lane data streams of n lane data streams to obtain s first data streams comprises:

performing block interleaving on a total of eight lane data streams: an $(8*i)^{th}$ lane data stream, an $(8*i+1)^{th}$ lane data stream, an $(8*i+2)^{th}$ lane data stream, an $(8*i+3)^{th}$ lane data stream, an $(8*i+4)^{th}$ lane data stream, an $(8*i+5)^{th}$ lane data stream, an $(8*i+6)^{th}$ lane data stream, and an $(8*i+7)^{th}$ lane data stream, to obtain one first data stream, wherein $0 \leq i \leq 3$, a total of 16 symbols are consecutive in the first data stream obtained through the block interleaving with two consecutive symbols comprised in each of the eight lane data streams, every 16 consecutive symbols in the first data stream obtained through the block interleaving are from at least four different codewords, every 544 consecutive symbols are from at least four different codewords, a $0^{th}$ symbol, a $1^{st}$ symbol, a $2^{nd}$ symbol, and a $3^{rd}$ symbol in every 16 consecutive symbols in the first data stream obtained through the block interleaving are from different codewords, a $4^{th}$ symbol, a $5^{th}$ symbol, a $6^{th}$ symbol, and a $7^{th}$ symbol in every 16 consecutive symbols in the first data stream obtained through the block interleaving are from different codewords, an $8^{th}$ symbol, a $9^{th}$ symbol, a $10^{th}$ symbol, and an $11^{th}$ symbol in every 16 consecutive symbols in the first data stream obtained through the block interleaving are from different codewords, and a $12^{th}$ symbol, a $13^{th}$ symbol, a $14^{th}$ symbol, and a $15^{th}$ symbol in every 16 consecutive symbols in the first data stream obtained through the block interleaving are from different codewords.

5. The method according to claim 3, wherein t=8, s=1, and the performing block interleaving on every t lane data streams of n lane data streams to obtain s first data streams comprises:

performing block interleaving on a total of eight lane data streams: an $(8*i)^{th}$ lane data stream, an $(8*i+1)^{th}$ lane data stream, an $(8*i+2)^{th}$ lane data stream, an $(8*i+3)^{th}$ lane data stream, an $(8*i+4)^{th}$ lane data stream, an $(8*i+5)^{th}$ lane data stream, an $(8*i+6)^{th}$ lane data stream, and an $(8*i+7)^{th}$ lane data stream, to obtain one first data stream, wherein $0 \leq i \leq 3$, a total of 16 symbols are consecutive in the first data stream obtained through the block interleaving, a $j^{th}$ group of two consecutive symbols comprised in each of the eight lane data streams are consecutive in the first data stream obtained through the block interleaving, $j \geq 0$, every 16 consecutive symbols in the first data stream obtained through the block interleaving are from at least four different codewords, every 544 consecutive symbols are from at least four different codewords, a $0^{th}$ symbol, a $1^{st}$ symbol, a $2^{nd}$ symbol, and a $3^{rd}$ symbol in every 16 consecutive symbols in the first data stream obtained through the block interleaving are from different codewords, a $4^{th}$ symbol, a $5^{th}$ symbol, a $6^{th}$ symbol, and a $7^{th}$ symbol in every 16 consecutive symbols in the first data stream obtained through the block interleaving are from different codewords, an $8^{th}$ symbol, a $9^{th}$ symbol, a $10^{th}$ symbol, and an $11^{th}$ symbol in every 16 consecutive symbols in the first data stream obtained through the block interleaving are from different codewords, and a $12^{th}$ symbol, a $13^{th}$ symbol, a $14^{th}$ symbol, and a $15^{th}$ symbol in every 16 consecutive symbols in the first data stream obtained through the block interleaving are from different codewords.

6. The method according to claim 3, wherein t=8, s=1, and the performing block interleaving on every t lane data streams of n lane data streams to obtain s first data streams comprises:

performing block interleaving on a total of eight lane data streams: an $(8*i)^{th}$ lane data stream, an $(8*i+1)^{th}$ lane data stream, an $(8*i+2)^{th}$ lane data stream, an $(8*i+3)^{th}$ lane data stream, an $(8*i+4)^{th}$ lane data stream, an $(8*i+5)^{th}$ lane data stream, an $(8*i+6)^{th}$ lane data stream, and an $(8*i+7)^{th}$ lane data stream, to obtain one first data stream, wherein $0 \leq i \leq 3$, a total of eight symbols are consecutive in the first data stream obtained through the block interleaving, a $j^{th}$ symbol comprised in each of the eight lane data streams are consecutive, $j \geq 0$, every eight consecutive symbols in the first data stream obtained through the block interleaving are from four different codewords, a $0^{th}$ symbol, a $1^{st}$ symbol, a $2^{nd}$ symbol, and a $3^{rd}$ symbol in every eight consecutive symbols in the first data stream obtained through the block interleaving are from different codewords, and a $4^{th}$ symbol, a $5^{th}$ symbol, a $6^{th}$ symbol, and a $7^{th}$ symbol in every eight consecutive symbols in the first data stream obtained through the block interleaving are from different codewords.

7. The method according to claim 1, wherein n=32, 16 consecutive lane data streams sorted in the front of the n lane data streams are from same codewords, 16 consecutive lane data streams sorted in the back of the n lane data streams are from same codewords, and the 16 consecutive lane data streams sorted in the front of the n lane data streams and the 16 consecutive lane data streams sorted in the back of the n lane data streams are from different codewords.

8. The method according to claim 7, wherein t=2, s=1, and the performing block interleaving on every t lane data streams of n lane data streams to obtain s first data streams comprises:

performing block interleaving on an $i^{th}$ lane data stream and an $(i+16)^{th}$ lane data stream to obtain one first data stream, wherein $0 \leq i < 16$, two consecutive symbols in the $i^{th}$ lane data stream and two consecutive symbols in the $(i+16)^{th}$ lane data stream are consecutive in the first data stream obtained through the block interleaving, and every four consecutive symbols in the first data stream obtained through the block interleaving are from four different codewords.

9. The method according to claim 7, wherein t=2, s=1, and the performing block interleaving on every t lane data streams of n lane data streams to obtain s first data streams comprises:

performing block interleaving on an $i^{th}$ lane data stream and an $(i+16)^{th}$ lane data stream to obtain one first data stream, wherein 0≤i<16, a $j^{th}$ group of consecutive β bits in the $i^{th}$ lane data stream and a $j^{th}$ group of consecutive β bits in the $(i+16)^{th}$ lane data stream are consecutive in the first data stream obtained through the block interleaving, j≥0, β is 1, 2, 4, 5, 10, or 20, and every four consecutive symbols in the first data stream obtained through the block interleaving are from four different codewords.

10. The method according to claim 7, wherein t=2, s=2, and the performing block interleaving on every t lane data streams of n lane data streams to obtain s first data streams comprises:

performing block interleaving on an $i^{th}$ lane data stream and an $(i+16)^{th}$ lane data stream to obtain a $(2*i)^{th}$ first data stream and a $(2*i+1)^{th}$ first data stream, wherein 0≤i<16, a total of 20 bits are consecutive in the $(2*i)^{th}$ first data stream, the 20 bits consecutive in the $(2*i)^{th}$ first data stream have five bits in each of four symbols with two consecutive symbols in the $i^{th}$ lane data stream and two consecutive symbols in the $(i+16)^{th}$ lane data stream, every 20 consecutive bits in the $(2*i)^{th}$ first data stream are from four different codewords, a total of 20 bits are consecutive in the $(2*i+1)^{th}$ first data stream, the 20 bits consecutive in the $(2*i+1)^{th}$ first data stream have five bits in each of the four symbols with two consecutive symbols in the $i^{th}$ lane data stream and two consecutive symbols in the $(i+16)^{th}$ lane data stream, and every 20 consecutive bits in the $(2*i+1)^{th}$ first data stream are from four different codewords.

11. The method according to claim 7, wherein t=8, s=1, and the performing block interleaving on every t lane data streams of n lane data streams to obtain s first data streams comprises:

performing block interleaving on a total of eight lane data streams: a $(4*i)^{th}$ lane data stream, a $(4*i+1)^{th}$ lane data stream, a $(4*i+2)^{th}$ lane data stream, a $(4*i+3)^{th}$ lane data stream, a $(4*i+16)^{th}$ lane data stream, a $(4*i+17)^{th}$ lane data stream, a $(4*i+18)^{th}$ lane data stream, and a $(4*i+19)^{th}$ lane data stream, to obtain one first data stream, wherein 0≤i≤3, a total of 16 symbols are consecutive in the first data stream obtained through the block interleaving with two consecutive symbols comprised in each of the eight lane data streams, every 16 consecutive symbols in the first data stream obtained through the block interleaving are from at least four different codewords, every 544 consecutive symbols are from at least four different codewords, a $0^{th}$ symbol, a $1^{st}$ symbol, a $2^{nd}$ symbol, and a $3^{rd}$ symbol in every 16 consecutive symbols in the first data stream obtained through the block interleaving are from different codewords, a $4^{th}$ symbol, a $5^{th}$ symbol, a $6^{th}$ symbol, and a $7^{th}$ symbol in every 16 consecutive symbols in the first data stream obtained through the block interleaving are from different codewords, an $8^{th}$ symbol, a $9^{th}$ symbol, a $10^{th}$ symbol, and an $11^{th}$ symbol in every 16 consecutive symbols in the first data stream obtained through the block interleaving are from different codewords, and a $12^{th}$ symbol, a $13^{th}$ symbol, a $14^{th}$ symbol, and a $15^{th}$ symbol in every 16 consecutive symbols in the first data stream obtained through the block interleaving are from different codewords.

12. The method according to claim 7, wherein t=8, s=1, and the performing block interleaving on every t lane data streams of n lane data streams to obtain s first data streams comprises:

performing block interleaving on a total of eight lane data streams: a $(4*i)^{th}$ lane data stream, a $(4*i+1)^{th}$ lane data stream, a $(4*i+2)^{th}$ lane data stream, a $(4*i+3)^{th}$ lane data stream, a $(4*i+16)^{th}$ lane data stream, a $(4*i+17)^{th}$ lane data stream, a $(4*i+18)^{th}$ lane data stream, and a $(4*i+19)^{th}$ lane data stream, to obtain one first data stream, wherein 0≤i≤3, a total of 16 symbols are consecutive in the first data stream obtained through the block interleaving, a $j^{th}$ group of two consecutive symbols comprised in each of the eight lane data streams are consecutive in the first data stream obtained through the block interleaving, j≥0, every 16 consecutive symbols in the first data stream obtained through the block interleaving are from at least four different codewords, every 544 consecutive symbols are from at least four different codewords, a $0^{th}$ symbol, a $1^{st}$ symbol, a $2^{nd}$ symbol, and a $3^{rd}$ symbol in every 16 consecutive symbols in the first data stream obtained through the block interleaving are from different codewords, a $4^{th}$ symbol, a $5^{th}$ symbol, a $6^{th}$ symbol, and a $7^{th}$ symbol in every 16 consecutive symbols in the first data stream obtained through the block interleaving are from different codewords, an $8^{th}$ symbol, a $9^{th}$ symbol, a $10^{th}$ symbol, and an $11^{th}$ symbol in every 16 consecutive symbols in the first data stream obtained through the block interleaving are from different codewords, and a $12^{th}$ symbol, a $13^{th}$ symbol, a $14^{th}$ symbol, and a $15^{th}$ symbol in every 16 consecutive symbols in the first data stream obtained through the block interleaving are from different codewords.

13. The method according to claim 7, wherein t=8, s=1, and the performing block interleaving on every t lane data streams of n lane data streams to obtain s first data streams comprises:

performing block interleaving on a total of eight lane data streams: a $(4*i)^{th}$ lane data stream, a $(4*i+1)^{th}$ lane data stream, a $(4*i+2)^{th}$ lane data stream, a $(4*i+3)^{th}$ lane data stream, a $(4*i+16)^{th}$ lane data stream, a $(4*i+17)^{th}$ lane data stream, a $(4*i+18)^{th}$ lane data stream, and a $(4*i+19)^{th}$ lane data stream, to obtain one first data stream, wherein 0≤i≤3, a total of eight symbols are consecutive in the first data stream obtained through the block interleaving, a $j^{th}$ symbol comprised in each of the eight lane data streams are consecutive, j≥0, every eight consecutive symbols in the first data stream obtained through the block interleaving are from at least four different codewords, a $0^{th}$ symbol, a $1^{st}$ symbol, a $2^{nd}$ symbol, and a $3^{rd}$ symbol in every eight consecutive symbols in the first data stream obtained through the block interleaving are from different codewords, and a $4^{th}$ symbol, a $5^{th}$ symbol, a $6^{th}$ symbol, and a $7^{th}$ symbol in every eight consecutive symbols in the first data stream obtained through the block interleaving are from different codewords.

14. The method according to claim 1, wherein the performing convolutional interleaving on one first data stream to obtain one second data stream comprises:

delaying one first data stream based on p delay lines to obtain one second data stream, wherein p is an integer greater than 1, a quantity of storage units comprised in each delay line is different, a delay line with a smallest quantity of storage units comprises 0 storage units, a difference between quantities of storage units of every two adjacent delay lines is Q, each storage unit is configured to store four symbols, symbols in each lane data stream are sequentially input to the p delay lines based on sequence numbers of the p delay lines, four symbols are input to each delay line for a single time and four symbols are output from the delay line for a single time, p*4 consecutive symbols in the second data stream comprise the four symbols output from the delay line, and Q satisfies $4(p*Q-1)\geq272$, $4(p*Q+1)\geq272$, $4(p*Q-1)\geq544$, or $4(p*Q+1)\geq544$.

15. The method according to claim 14, wherein after the performing convolutional interleaving on the m first data streams separately to obtain m second data streams, the method further comprises:

performing second FEC encoding on the m second data streams separately to obtain m encoded data streams, wherein information data whose length is K symbols in each of the encoded data streams is from at most K different codewords, and $K\geq p*4$.

16. The data processing method according to claim 1, wherein t is an integer greater than or equal to 2, and a is an integer greater than or equal to 2.

17. The data processing method according to claim 1, wherein t is 2, 4, or 8.

18. The data processing method according to claim 1, wherein s is 1.

19. A data processing apparatus, comprising a block interleaver and a convolution interleaver, wherein the block interleaver is configured to perform block interleaving on every t lane data streams of n lane data streams to obtain s first data streams, so as to obtain a total of m first data streams, wherein n=q*t, m=q*s, n is an integer greater than 1, n is exactly divided by q, q is an integer greater than or equal to 1, t is an integer greater than or equal to 1, s is an integer greater than or equal to 1, first forward error correction (FEC) encoding is performed on all the n lane data streams, every a codewords obtained through the first FEC encoding are distributed in b lane data streams, $a\leq b\leq n$, n is exactly divided by b, a is an integer greater than or equal to 1, every a consecutive symbols in each lane data stream are from a different codewords, every L1 consecutive symbols in each lane data stream are from at least a different codewords, L1=N*a/b, N represents a length of the codeword, the t lane data streams comprise a total of t*a symbols with a consecutive symbols in each lane data stream, the t*a symbols comprise a total of D bits with Δ bits in each symbol, and D=Δ*t*a, the D bits are consecutive in any one of the s first data streams, Δ=M/s, and M represents a quantity of bits comprised in one symbol; and the convolution interleaver is configured to perform convolutional interleaving on the m first data streams separately to obtain m second data streams.

20. The data processing apparatus according to claim 19, wherein every d consecutive symbols in each first data stream are from v different codewords, every L2 consecutive symbols in each first data stream are from at least v different codewords, v is exactly divided by a, L2=t/s*L1, and d=D/M.

21. The data processing apparatus according to claim 19, wherein n=32, 16 lane data streams in odd-numbered lanes of the n lane data streams are from same codewords, 16 lane data streams in even-numbered lanes of the n lane data streams are from same codewords, and a data stream in an odd-numbered lane of the n lane data streams and a data stream in an even-numbered lane of the n lane data streams are from different codewords.

22. The data processing apparatus according to claim 21, wherein t=8, s=1, and the block interleaver is configured to:

perform block interleaving on a total of eight lane data streams: an $(8*i)^{th}$ lane data stream, an $(8*i+1)^{th}$ lane data stream, an $(8*i+2)^{th}$ lane data stream, an $(8*i+3)^{th}$ lane data stream, an $(8*i+4)^{th}$ lane data stream, an $(8*i+5)^{th}$ lane data stream, an $(8*i+6)^{th}$ lane data stream, and an $(8*i+7)^{th}$ lane data stream, to obtain one first data stream, wherein $0\leq i\leq3$, a total of 16 symbols are consecutive in the first data stream obtained through the block interleaving with two consecutive symbols comprised in each of the eight lane data streams, every 16 consecutive symbols in the first data stream obtained through the block interleaving are from at least four different codewords, every 544 consecutive symbols are from at least four different codewords, a $0^{th}$ symbol, a $1^{st}$ symbol, a $2^{nd}$ symbol, and a $3^{rd}$ symbol in every 16 consecutive symbols in the first data stream obtained through the block interleaving are from different codewords, a $4^{th}$ symbol, a $5^{th}$ symbol, a $6^{th}$ symbol, and a $7^{th}$ symbol in every 16 consecutive symbols in the first data stream obtained through the block interleaving are from different codewords, an $8^{th}$ symbol, a $9^{th}$ symbol, a $10^{th}$ symbol, and an $11^{th}$ symbol in every 16 consecutive symbols in the first data stream obtained through the block interleaving are from different codewords, and a $12^{th}$ symbol, a $13^{th}$ symbol, a $14^{th}$ symbol, and a $15^{th}$ symbol in every 16 consecutive symbols in the first data stream obtained through the block interleaving are from different codewords.

23. The data processing apparatus according to claim 21, wherein t=8, s=1, and the block interleaver is configured to:

perform block interleaving on a total of eight lane data streams: an $(8*i)^{th}$ lane data stream, an $(8*i+1)^{th}$ lane data stream, an $(8*i+2)^{th}$ lane data stream, an $(8*i+3)^{th}$ lane data stream, an $(8*i+4)^{th}$ lane data stream, an $(8*i+5)^{th}$ lane data stream, an $(8*i+6)^{th}$ lane data stream, and an $(8*i+7)^{th}$ lane data stream, to obtain one first data stream, wherein $0\leq i\leq3$, a total of 16 symbols are consecutive in the first data stream obtained through the block interleaving, a $j^{th}$ group of two consecutive symbols comprised in each of the eight lane data streams are consecutive in the first data stream obtained through the block interleaving, $j\geq0$, every 16 consecutive symbols in the first data stream obtained through the block interleaving are from at least four different codewords, every 544 consecutive symbols are from at least four different codewords, a $0^{th}$ symbol, a $1^{st}$ symbol, a $2^{nd}$ symbol, and a $3^{rd}$ symbol in every 16 consecutive symbols in the first data stream obtained through the block interleaving are from different codewords, a $4^{th}$ symbol, a $5^{th}$ symbol, a $6^{th}$ symbol, and a $7^{th}$ symbol in every 16 consecutive symbols in the first data stream obtained through the block interleaving are from different codewords, an $8^{th}$ symbol, a $9^{th}$ symbol, a $10^{th}$ symbol, and an $11^{th}$ symbol in every 16 consecutive symbols in the first data stream obtained through the block interleaving are from different codewords, and a $12^{th}$ symbol, a $13^{th}$ symbol, a $14^{th}$ symbol, and a $15^{th}$ symbol in every 16 consecutive symbols in the first data stream obtained through the block interleaving are from different codewords.

24. The data processing apparatus according to claim 21, wherein t=8, s=1, and the block interleaver is configured to:

perform block interleaving on a total of eight lane data streams: an $(8*i)^{th}$ lane data stream, an $(8*i+1)^{th}$ lane data stream, an $(8*i+2)^{th}$ lane data stream, an $(8*i+3)^{th}$ lane data stream, an $(8*i+4)^{th}$ lane data stream, an $(8*i+5)^{th}$ lane data stream, an $(8*i+6)^{th}$ lane data stream, and an $(8*i+7)^{th}$ lane data stream, to obtain one first data stream, wherein $0 \le i \le 3$, a total of eight symbols are consecutive in the first data stream obtained through the block interleaving, a $j^{th}$ symbol comprised in each of the eight lane data streams are consecutive, $j \ge 0$, every eight consecutive symbols in the first data stream obtained through the block interleaving are from four different codewords, a $0^{th}$ symbol, a $1^{st}$ symbol, a $2^{nd}$ symbol, and a $3^{rd}$ symbol in every eight consecutive symbols in the first data stream obtained through the block interleaving are from different codewords, and a $4^{th}$ symbol, a $5^{th}$ symbol, a $6^{th}$ symbol, and a $7^{th}$ symbol in every eight consecutive symbols in the first data stream obtained through the block interleaving are from different codewords.

25. The data processing apparatus according to claim 19, wherein n=32, 16 consecutive lane data streams sorted in the front of the n lane data streams are from same codewords, 16 consecutive lane data streams sorted in the back of the n lane data streams are from same codewords, and the 16 consecutive lane data streams sorted in the front of the n lane data streams and the 16 consecutive lane data streams sorted in the back of the n lane data streams are from different codewords.

26. The data processing apparatus according to claim 25, wherein t=2, s=1, and the block interleaver is configured to:
perform block interleaving on an $i^{th}$ lane data stream and an $(i+16)^{th}$ lane data stream to obtain one first data stream, wherein $0 \le i < 16$, two consecutive symbols in the $i^{th}$ lane data stream and two consecutive symbols in the $(i+16)^{th}$ lane data stream are consecutive in the first data stream obtained through the block interleaving, and every four consecutive symbols in the first data stream obtained through the block interleaving are from four different codewords.

27. The data processing apparatus according to claim 25, wherein t=2, s=1, and the block interleaver is configured to:
perform block interleaving on an $i^{th}$ lane data stream and an $(i+16)^{th}$ lane data stream to obtain one first data stream, wherein $0 \le i < 16$, a $j^{th}$ group of consecutive $\beta$ bits in the $i^{th}$ lane data stream and a $j^{th}$ group of consecutive $\beta$ bits in the $(i+16)^{th}$ lane data stream are consecutive in the first data stream obtained through the block interleaving, $j \ge 0$, $\beta$ is 1, 2, 4, 5, 10, or 20, and every four consecutive symbols in the first data stream obtained through the block interleaving are from four different codewords.

28. The data processing apparatus according to claim 25, wherein t=2, s=2, and the block interleaver is configured to:
perform block interleaving on an $i^{th}$ lane data stream and an $(i+16)^{th}$ lane data stream to obtain a $(2*i)^{th}$ first data stream and a $(2*i+1)^{th}$ first data stream, wherein $0 \le i < 16$, a total of 20 bits are consecutive in the $(2*i)^{th}$ first data stream, the 20 bits consecutive in the $(2*i)^{th}$ first data stream have five bits in each of four symbols with two consecutive symbols in the $i^{th}$ lane data stream and two consecutive symbols in the $(i+16)^{th}$ lane data stream, every 20 consecutive bits in the $(2*i)^{th}$ first data stream are from four different codewords, a total of 20 bits are consecutive in the $(2*i+1)^{th}$ first data stream, the 20 bits consecutive in the $(2*i+1)^{th}$ first data stream have five bits in each of the four symbols with two consecutive symbols in the $i^{th}$ lane data stream and two consecutive symbols in the $(i+16)^{th}$ lane data stream, and every 20 consecutive bits in the $(2*i+1)^{th}$ first data stream are from four different codewords.

29. The data processing apparatus according to claim 25, wherein t=8, s=1, and the block interleaver is configured to:
perform block interleaving on a total of eight lane data streams: a $(4*i)^{th}$ lane data stream, a $(4*i+1)^{th}$ lane data stream, a $(4*i+2)^{th}$ lane data stream, a $(4*i+3)^{th}$ lane data stream, a $(4*i+16)^{th}$ lane data stream, a $(4*i+17)^{th}$ lane data stream, a $(4*i+18)^{th}$ lane data stream, and a $(4*i+19)^{th}$ lane data stream, to obtain one first data stream, wherein $0 \le i \le 3$, a total of 16 symbols are consecutive in the first data stream obtained through the block interleaving with two consecutive symbols comprised in each of the eight lane data streams, every 16 consecutive symbols in the first data stream obtained through the block interleaving are from at least four different codewords, every 544 consecutive symbols are from at least four different codewords, a $0^{th}$ symbol, a $1^{st}$ symbol, a $2^{nd}$ symbol, and a $3^{rd}$ symbol in every 16 consecutive symbols in the first data stream obtained through the block interleaving are from different codewords, a $4^{th}$ symbol, a $5^{th}$ symbol, a $6^{th}$ symbol, and a $7^{th}$ symbol in every 16 consecutive symbols in the first data stream obtained through the block interleaving are from different codewords, an $8^{th}$ symbol, a $9^{th}$ symbol, a $10^{th}$ symbol, and an $11^{th}$ symbol in every 16 consecutive symbols in the first data stream obtained through the block interleaving are from different codewords, and a $12^{th}$ symbol, a $13^{th}$ symbol, a $14^{th}$ symbol, and a $15^{th}$ symbol in every 16 consecutive symbols in the first data stream obtained through the block interleaving are from different codewords.

30. The data processing apparatus according to claim 25, wherein t=8, s=1, and the block interleaver is configured to:
perform block interleaving on a total of eight lane data streams: a $(4*i)^{th}$ lane data stream, a $(4*i+1)^{th}$ lane data stream, a $(4*i+2)^{th}$ lane data stream, a $(4*i+3)^{th}$ lane data stream, a $(4*i+16)^{th}$ lane data stream, a $(4*i+17)^{th}$ lane data stream, a $(4*i+18)^{th}$ lane data stream, and a $(4*i+19)^{th}$ lane data stream, to obtain one first data stream, wherein $0 \le i \le 3$, a total of 16 symbols are consecutive in the first data stream obtained through the block interleaving, a $j^{th}$ group of two consecutive symbols comprised in each of the eight lane data streams are consecutive in the first data stream obtained through the block interleaving, $j \ge 0$, every 16 consecutive symbols in the first data stream obtained through the block interleaving are from at least four different codewords, every 544 consecutive symbols are from at least four different codewords, a $0^{th}$ symbol, a $1^{st}$ symbol, a $2^{nd}$ symbol, and a $3^{rd}$ symbol in every 16 consecutive symbols in the first data stream obtained through the block interleaving are from different codewords, a $4^{th}$ symbol, a $5^{th}$ symbol, a $6^{th}$ symbol, and a $7^{th}$ symbol in every 16 consecutive symbols in the first data stream obtained through the block interleaving are from different codewords, an $8^{th}$ symbol, a $9^{th}$ symbol, a $10^{th}$ symbol, and an $11^{th}$ symbol in every 16 consecutive symbols in the first data stream obtained through the block interleaving are from different codewords, and a $12^{th}$ symbol, a $13^{th}$ symbol, a $14^{th}$ symbol, and a $15^{th}$ symbol in every 16 consecutive symbols in the first data stream obtained through the block interleaving are from different codewords.

31. The data processing apparatus according to claim 25, wherein t=8, s=1, and the block interleaver is configured to:

perform block interleaving on a total of eight lane data streams: a $(4*i)^{th}$ lane data stream, a $(4*i+1)^{th}$ lane data stream, a $(4*i+2)^{th}$ lane data stream, a $(4*i+3)^{th}$ lane data stream, a $(4*i+16)^{th}$ lane data stream, a $(4*i+17)^{th}$ lane data stream, a $(4*i+18)^{th}$ lane data stream, and a $(4*i+19)^{th}$ lane data stream, to obtain one first data stream, wherein $0 \leq i \leq 3$, a total of eight symbols are consecutive in the first data stream obtained through the block interleaving, a $j^{th}$ symbol comprised in each of the eight lane data streams are consecutive, $j \geq 0$, every eight consecutive symbols in the first data stream obtained through the block interleaving are from at least four different codewords, a $0^{th}$ symbol, a $1^{st}$ symbol, a $2^{nd}$ symbol, and a $3^{rd}$ symbol in every eight consecutive symbols in the first data stream obtained through the block interleaving are from different codewords, and a $4^{th}$ symbol, a $5^{th}$ symbol, a $6^{th}$ symbol, and a $7^{th}$ symbol in every eight consecutive symbols in the first data stream obtained through the block interleaving are from different codewords.

32. The data processing apparatus according to claim 19, wherein the convolution interleaver is configured to:

delay one first data stream based on p delay lines to obtain one second data stream, wherein p is an integer greater than 1, a quantity of storage units comprised in each delay line is different, a delay line with a smallest quantity of storage units comprises 0 storage units, a difference between quantities of storage units of every two adjacent delay lines is Q, each storage unit is configured to store four symbols, symbols in each lane data stream are sequentially input to the p delay lines based on sequence numbers of the p delay lines, four symbols are input to each delay line for a single time and four symbols are output from the delay line for a single time, p*4 consecutive symbols in the second data stream comprise the four symbols output from the delay line, and Q satisfies $4(p*Q-1) \geq 272$, $4(p*Q+1) \geq 272$, $4(p*Q-1) \geq 544$, or $4(p*Q+1) \geq 544$.

33. The data processing apparatus according to claim 32, wherein the data processing apparatus further comprises an encoder, and after the m second data streams are obtained, the encoder is configured to:

perform second FEC encoding on the m second data streams separately to obtain m encoded data streams, wherein information data whose length is K symbols in each of the encoded data streams is from at most K different codewords, and $K \geq p*4$.

34. The data processing apparatus according to claim 19, wherein t is an integer greater than or equal to 2, and a is an integer greater than or equal to 2.

35. The data processing apparatus according to claim 19, wherein t is 2, 4, or 8.

36. The data processing apparatus according to claim 19, wherein s is 1.

37. A non-transitory computer-readable storage medium, wherein the computer-readable storage medium stores computer-executable instructions; and the computer-executable instructions are run on one or more processors to perform operations comprising:

performing block interleaving on every t lane data streams of n lane data streams to obtain s first data streams, so as to obtain a total of m first data streams, wherein n=q*t, m=q*s, n is an integer greater than 1, n is exactly divided by q, q is an integer greater than or equal to 1, t is an integer greater than or equal to 1, s is an integer greater than or equal to 1, first forward error correction (FEC) encoding is performed on all the n lane data streams, every a codewords obtained through the first FEC encoding are distributed in b lane data streams, $a \leq b \leq n$, n is exactly divided by b, a is an integer greater than or equal to 1, every a consecutive symbols in each lane data stream are from a different codewords, every L1 consecutive symbols in each lane data stream are from at least a different codewords, L1=N*a/b, N represents a length of the codeword, the t lane data streams comprise a total of t*a symbols with a consecutive symbols in each lane data stream, the t*a symbols comprise a total of D bits with $\Delta$ bits in each symbol, and D=$\Delta$*t*a, the D bits are consecutive in any one of the s first data streams, $\Delta$=M/s, and M represents a quantity of bits comprised in one symbol; and performing convolutional interleaving on the m first data streams separately to obtain m second data streams.

* * * * *